(12) United States Patent
Yamazaki et al.

(10) Patent No.: US 7,564,058 B2
(45) Date of Patent: Jul. 21, 2009

(54) DISPLAY DEVICE, MANUFACTURING METHOD THEREOF, AND TELEVISION SET

(75) Inventors: Shunpei Yamazaki, Setagaya (JP); Hironobu Shoji, Machida (JP); Shinji Maekawa, Atsugi (JP); Osamu Nakamura, Atsugi (JP); Tatsuya Honda, Atsugi (JP); Gen Fujii, Atsugi (JP); Yukie Suzuki, Isehara (JP); Ikuko Kawamata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 102 days.

(21) Appl. No.: 11/187,988

(22) Filed: Jul. 25, 2005

(65) Prior Publication Data

US 2006/0027804 A1 Feb. 9, 2006

(30) Foreign Application Priority Data

Aug. 3, 2004 (JP) .............................. 2004-227242
Aug. 11, 2004 (JP) .............................. 2004-234617

(51) Int. Cl.
*H01L 27/14* (2006.01)
(52) U.S. Cl. ................................. 257/72; 257/E27.131
(58) Field of Classification Search ................. 257/347, 257/72, E27.131
See application file for complete search history.

(56) References Cited

U.S. PATENT DOCUMENTS

| 4,797,108 A | 1/1989 | Crowther |
| 5,028,551 A | 7/1991 | Dohjo et al. |

(Continued)

FOREIGN PATENT DOCUMENTS

JP 05-35207 2/1993

OTHER PUBLICATIONS

European Search Report dated Dec. 7, 2005 for Application No. 05015701.5.

(Continued)

*Primary Examiner*—Bradley K Smith
*Assistant Examiner*—Amar Movva
(74) *Attorney, Agent, or Firm*—Eric J. Robinson; Robinson Intellectual Property Law Office, P.C.

(57) ABSTRACT

A manufacturing method of a display device having TFTs capable of high-speed operation with few variations of threshold voltage is provided, in which materials are used with high efficiency and a small number of photomasks is required. The display device of the invention comprises a gate electrode layer and a pixel electrode layer formed over an insulating surface, a gate insulating layer formed over the gate electrode layer, a crystalline semiconductor layer formed over the gate insulating layer, a semiconductor layer having one conductivity type formed in contact with the crystalline semiconductor layer, a source electrode layer and a drain electrode layer formed in contact with the semiconductor layer having one conductivity type, an insulating later formed over the source electrode layer, the drain electrode layer, and the pixel electrode layer, a first opening formed in the insulating layer to reach the source electrode layer or the drain electrode layer, a second opening formed in the gate insulating layer and the insulating layer to reach the pixel electrode layer, and a wiring layer formed in the first opening and the second opening to electrically connect the source electrode layer or the drain electrode layer to the pixel electrode layer.

29 Claims, 71 Drawing Sheets

U.S. PATENT DOCUMENTS

| | | |
|---|---|---|
| 5,151,806 A | 9/1992 | Kawamoto et al. |
| 5,640,067 A | 6/1997 | Yamauchi et al. |
| 6,037,197 A | 3/2000 | Yamazaki et al. |
| 6,121,660 A | 9/2000 | Yamazaki et al. |
| 6,388,270 B1 | 5/2002 | Yamazaki et al. |
| 6,433,363 B1 * | 8/2002 | Yamazaki et al. ............. 257/66 |
| 6,448,116 B1 * | 9/2002 | Wong ......................... 438/155 |
| 6,476,416 B1 | 11/2002 | Ikeda |
| 6,639,244 B1 * | 10/2003 | Yamazaki et al. ............. 257/72 |
| 6,709,901 B1 | 3/2004 | Yamazaki et al. |
| 2002/0043662 A1 | 4/2002 | Yamazaki et al. |
| 2003/0148561 A1 | 8/2003 | Nakajima |
| 2003/0213959 A1 * | 11/2003 | Lai ............................. 257/67 |
| 2003/0234424 A1 * | 12/2003 | Suzawa et al. ............. 257/347 |
| 2004/0189188 A1 * | 9/2004 | Fan et al. .................... 313/504 |

OTHER PUBLICATIONS

Sakamoto, H., et al., "*53.1:2.6 inch HDTV Panel Using CG Silicon*," SID Digest '00, SID International Symposium Digest of Technical Papers, 2000, pp, 1190-1193.

Kumakawa, Nikkei Microdevice, Flat-Panel Display 2002, "Advancements in the Visibility of Moving Images of OCB," Oct. 26, 2001, pp. 102-109, (Partial Translation of pp. 102-103).

Office Action (Application No. 05015701.5) dated Oct. 1, 2007.

\* cited by examiner

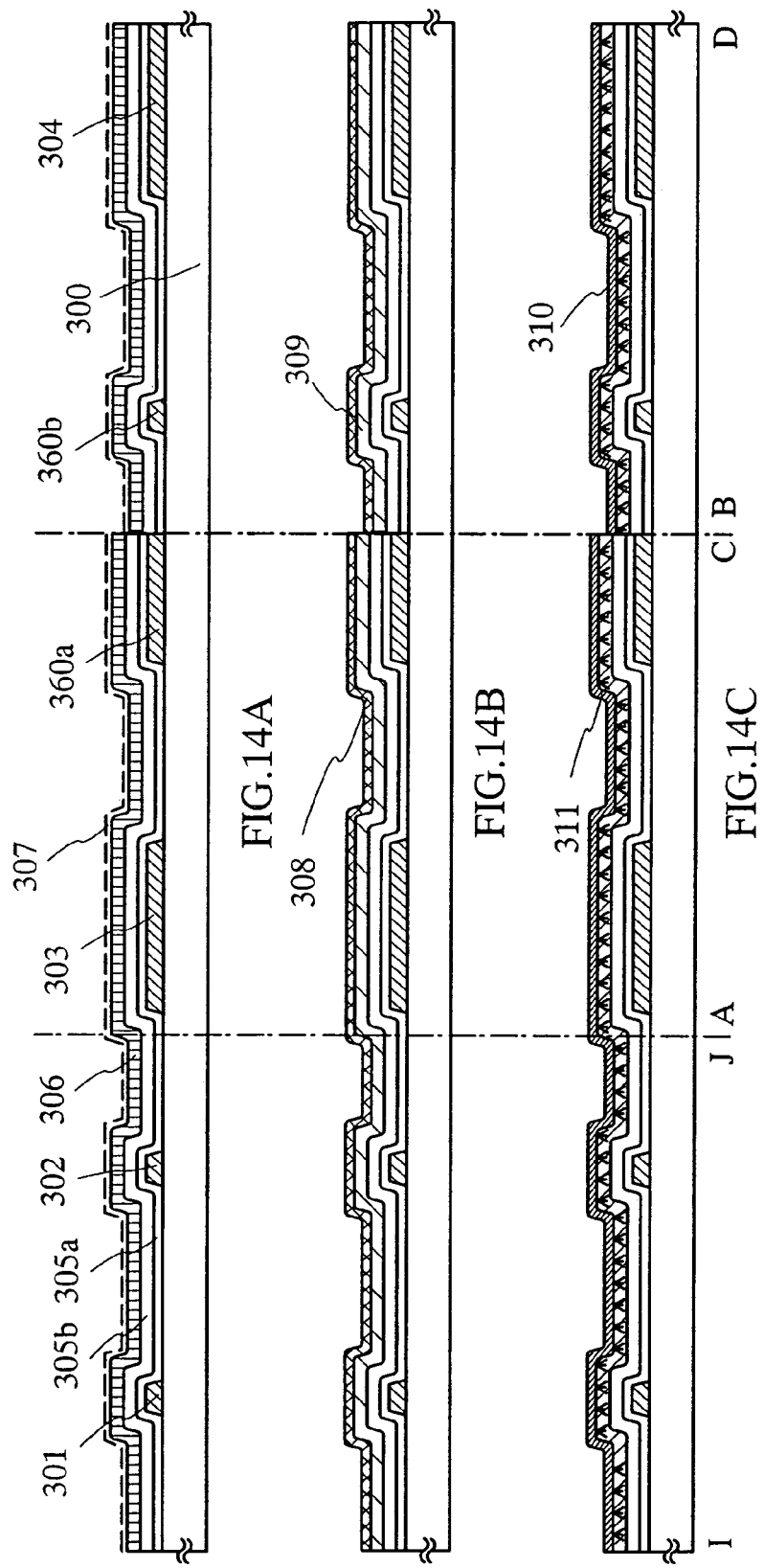

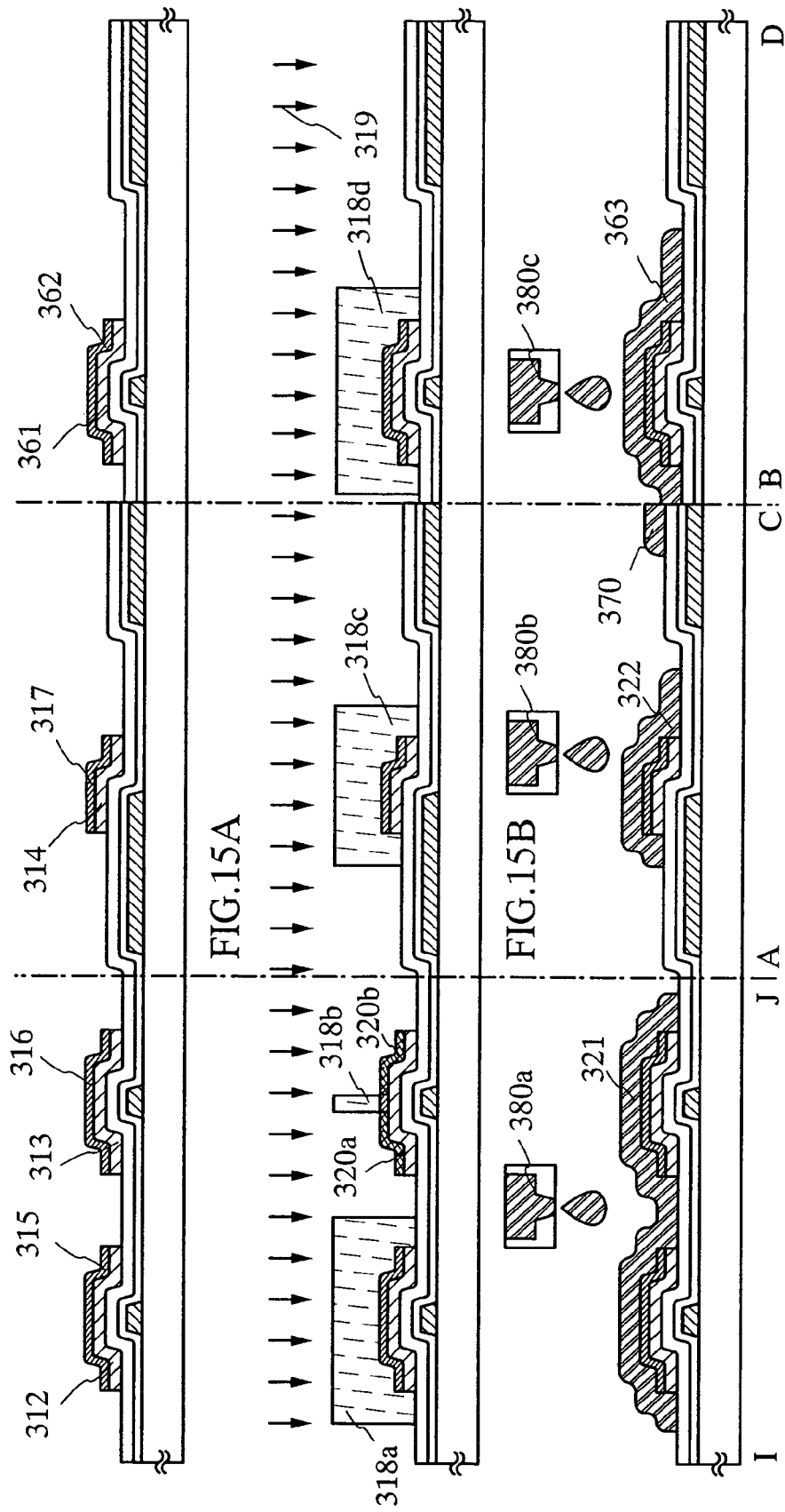

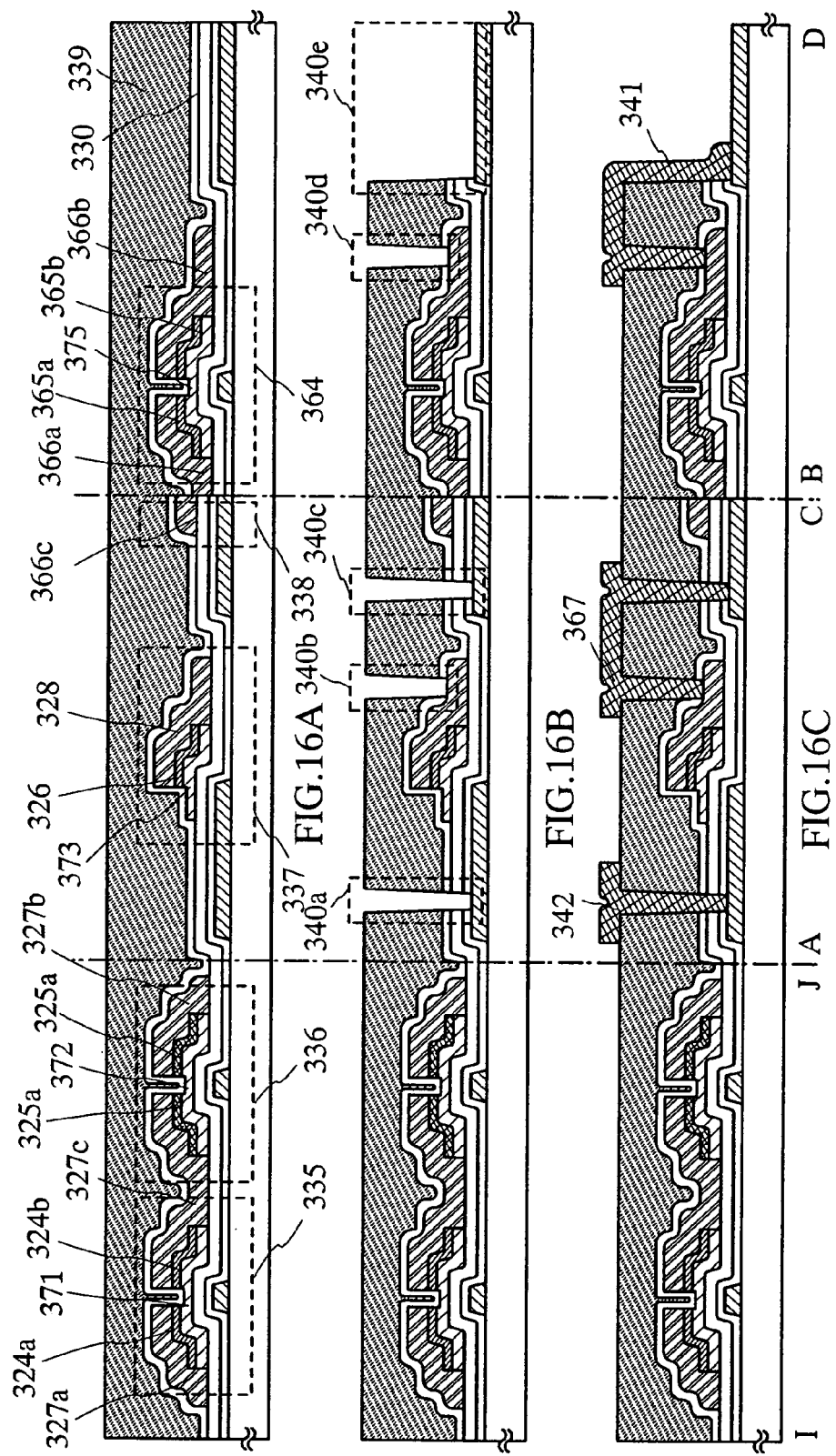

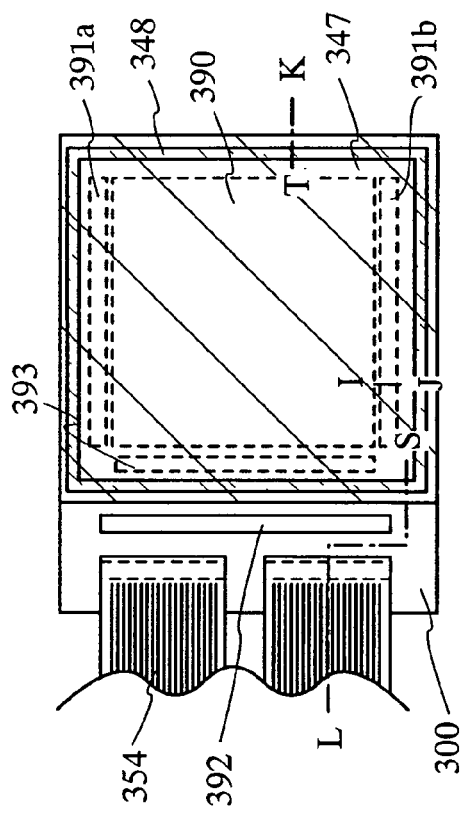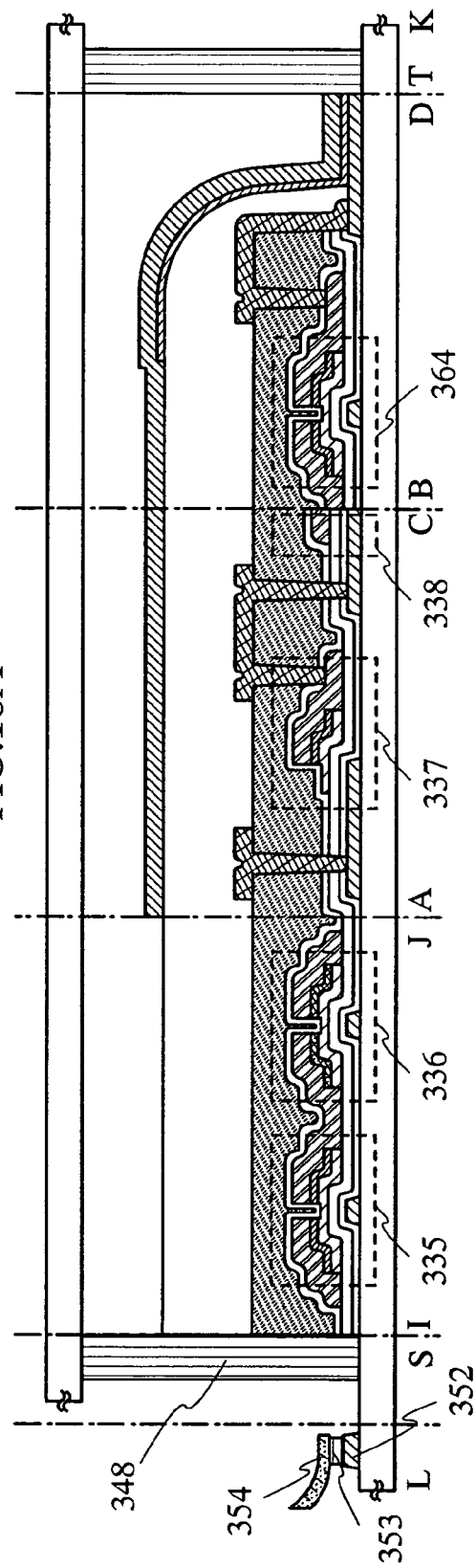
FIG.18A
FIG.18B

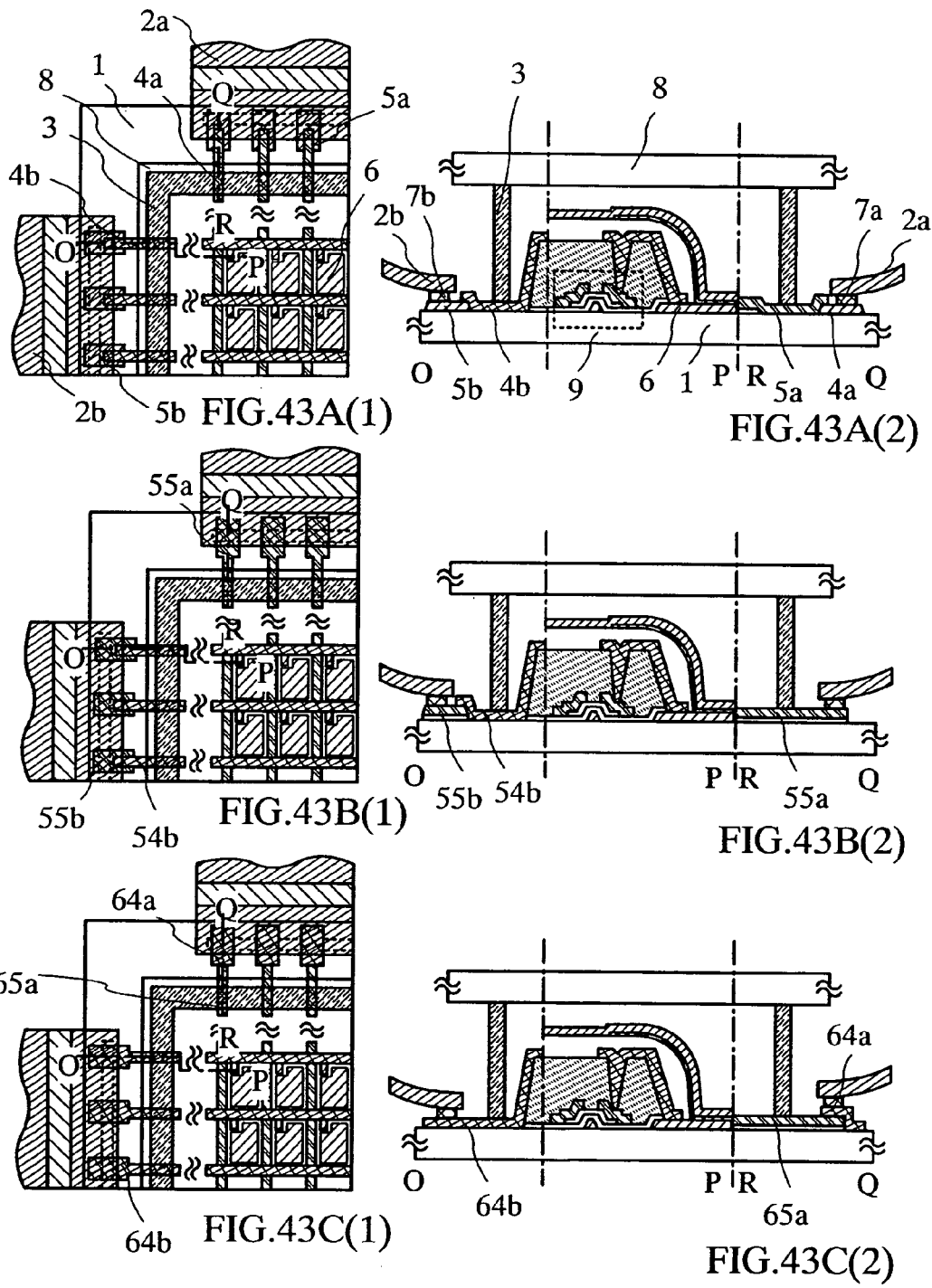

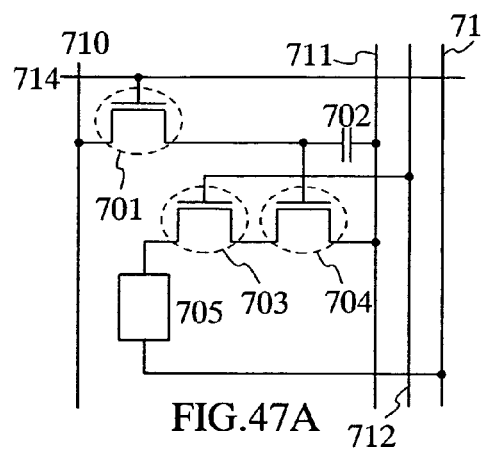
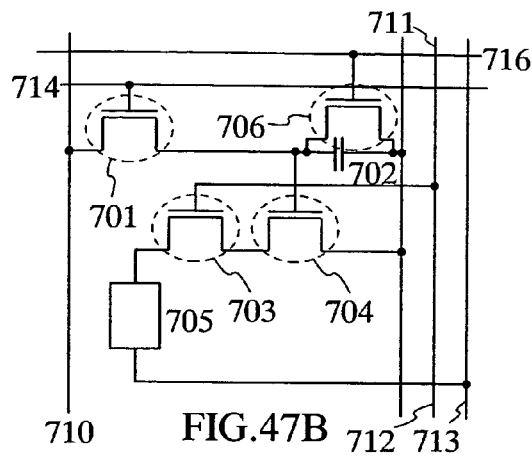
FIG.47A  FIG.47B
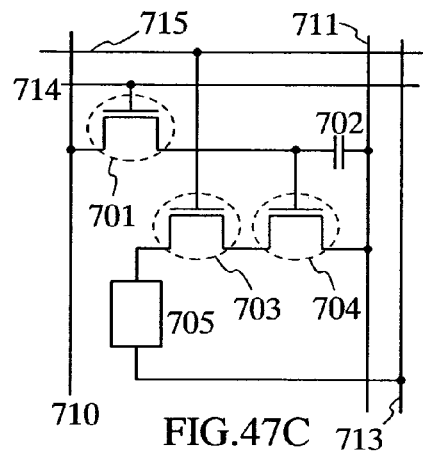
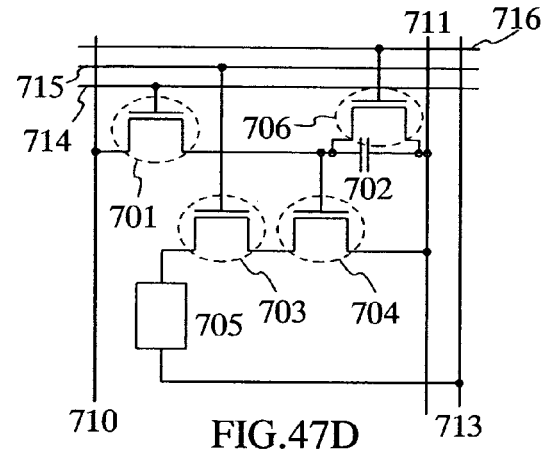
FIG.47C  FIG.47D
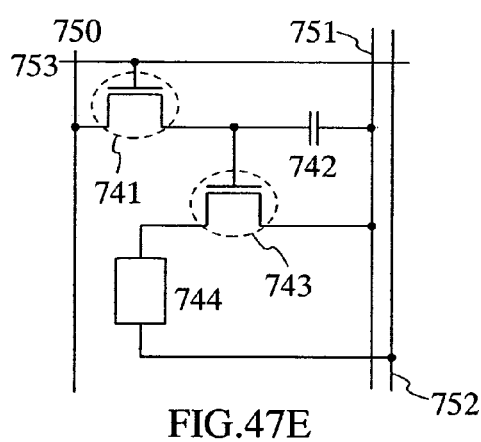
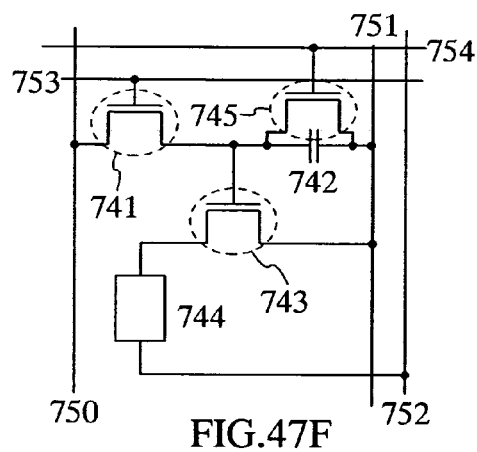
FIG.47E  FIG.47F

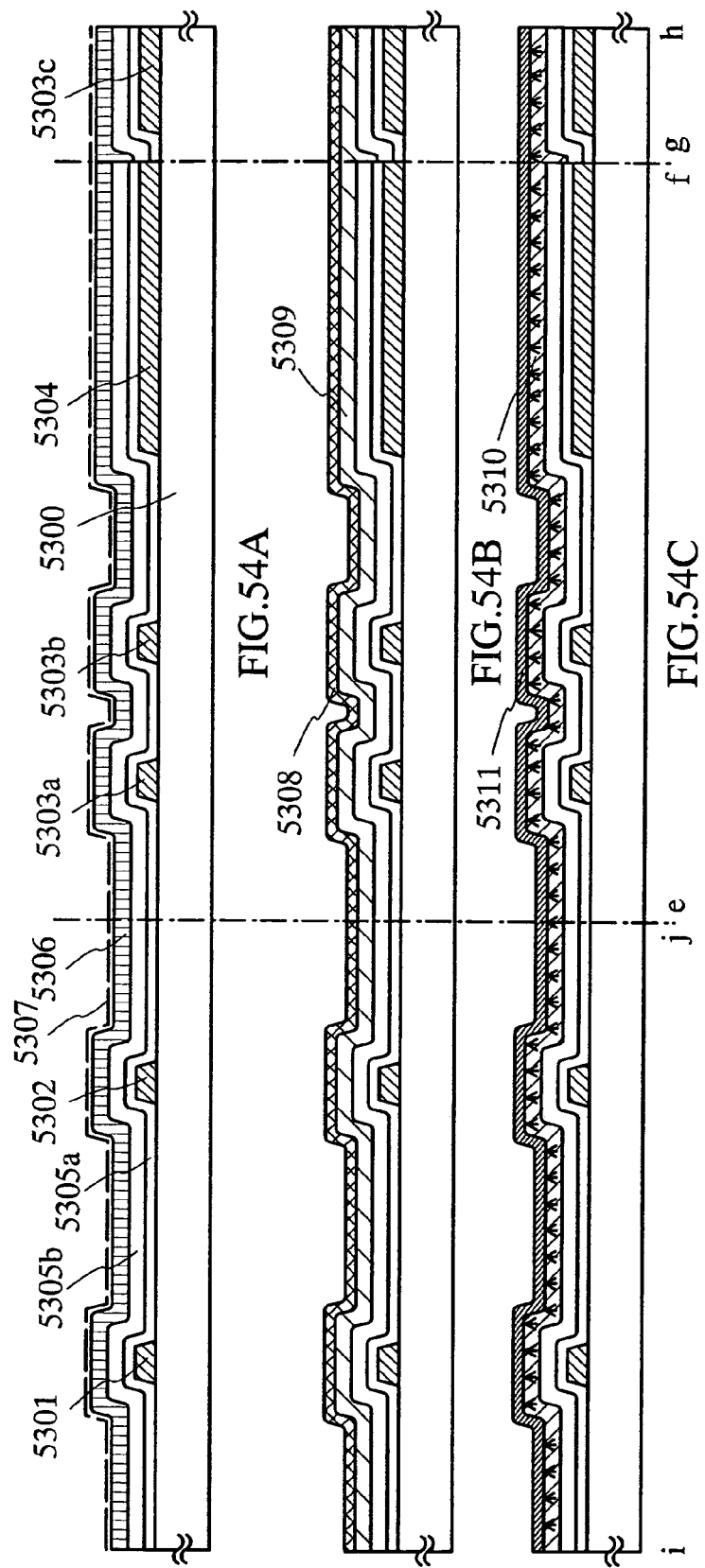

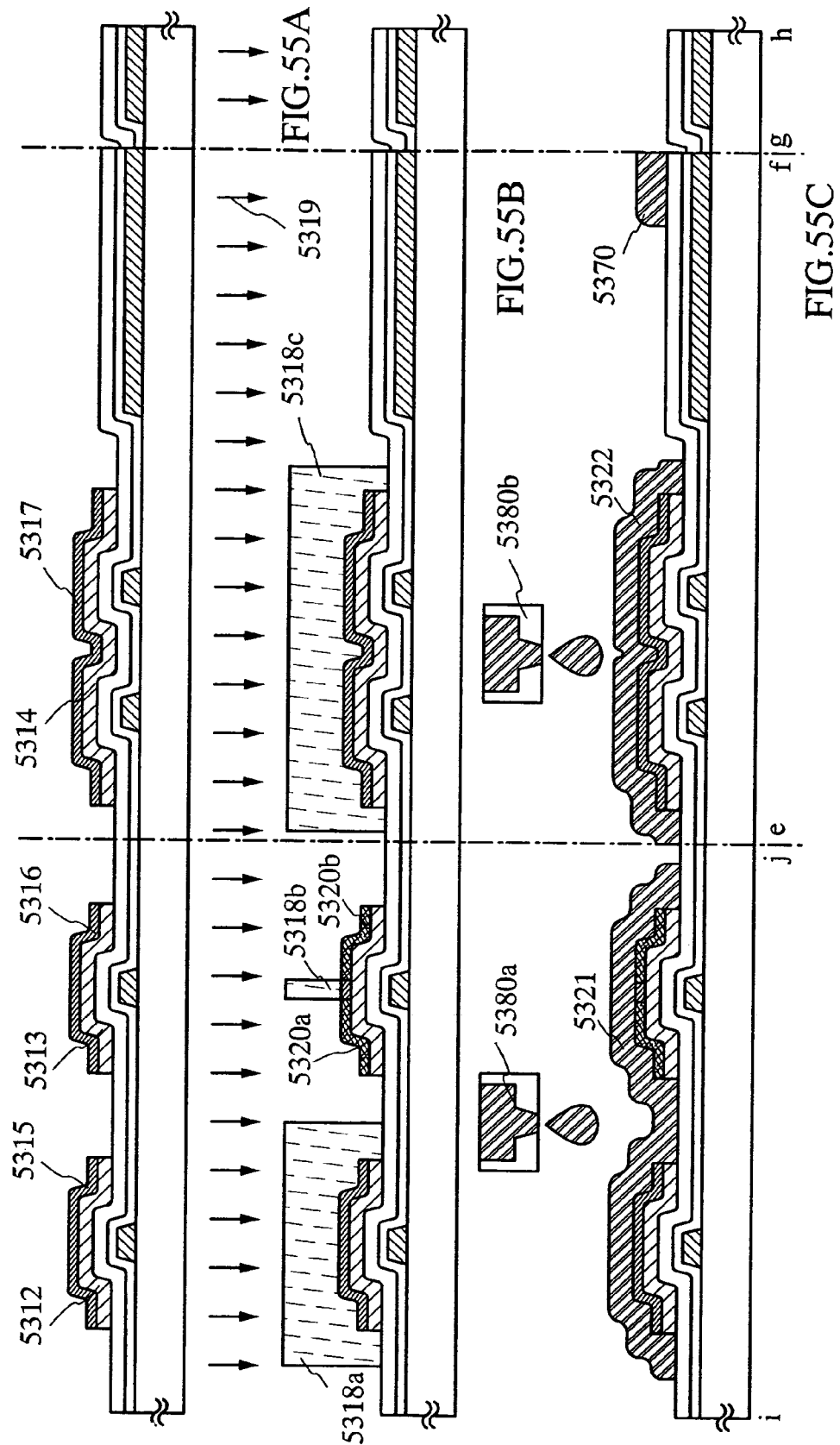

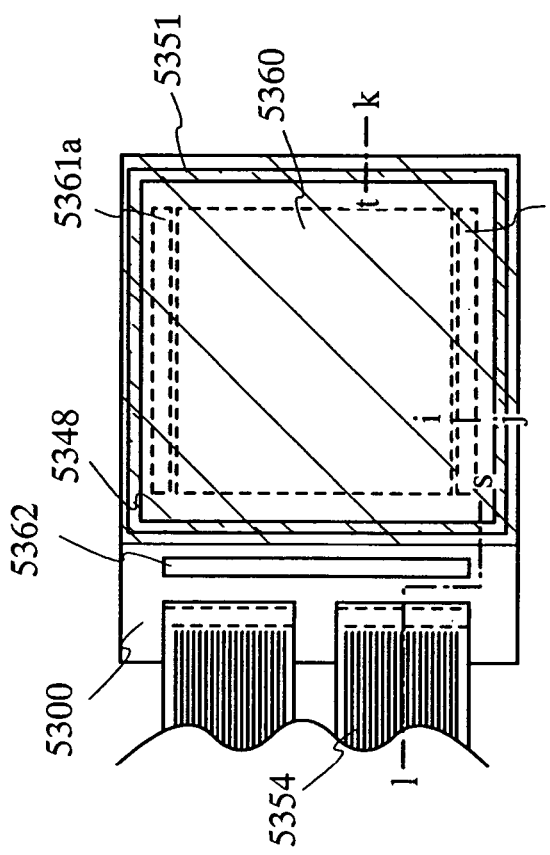
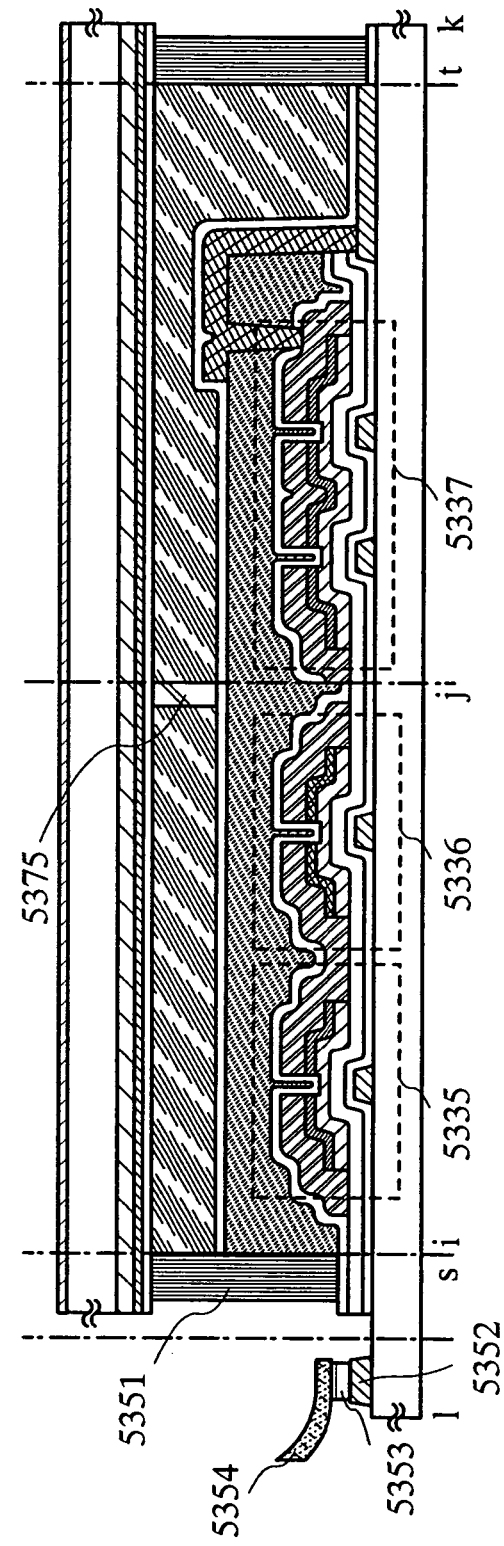
FIG.58A
FIG.58B

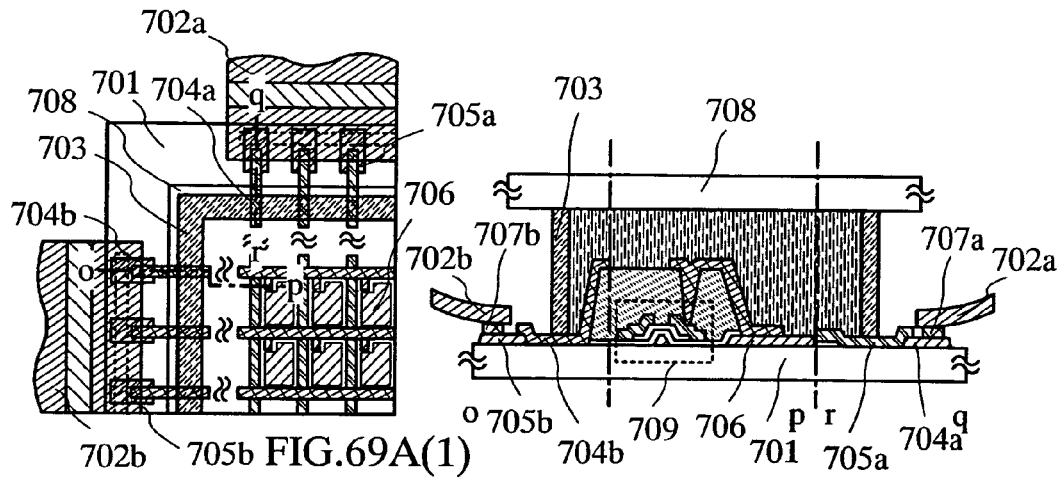
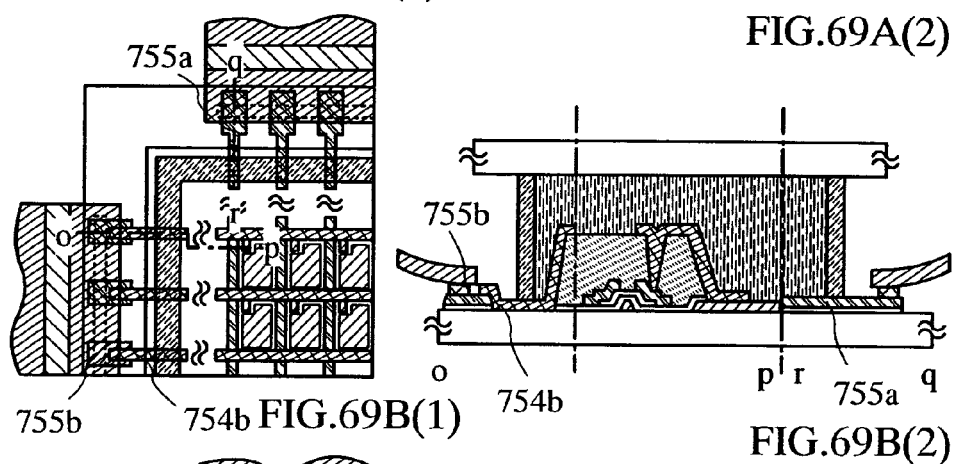
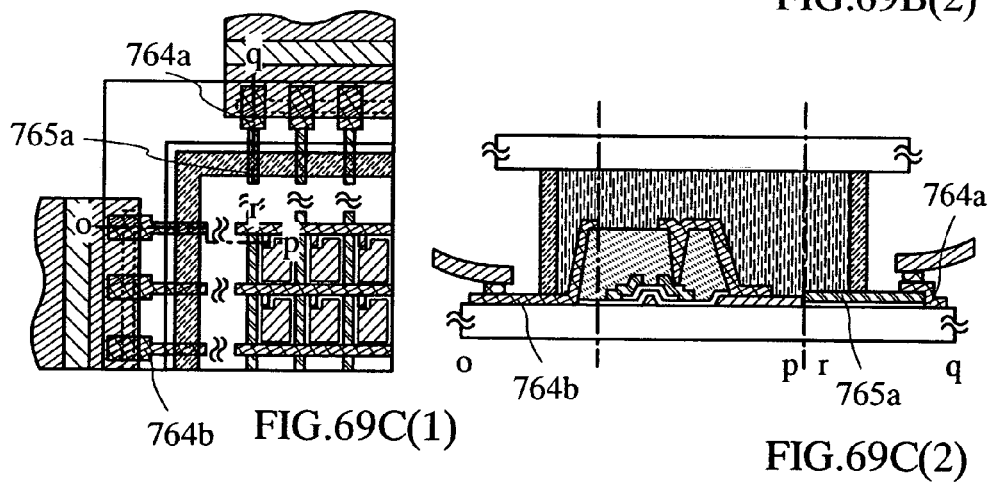

DISPLAY DEVICE, MANUFACTURING METHOD THEREOF, AND TELEVISION SET

BACKGROUND OF THE INVENTION

1. Field of the Invention

The present invention relates to a display device and a manufacturing method thereof. In addition, the invention relates to a television set using the display device.

2. Description of the Related Art

In recent years, a flat panel display (FPD) is attracting attention as an alternative display device for a conventional CRT display device. In particular, development of a large-screen television set mounted with a large display panel which is driven with an active matrix method is the primary task for panel manufacturers.

In the conventional display device, a semiconductor element for driving each pixel is formed of a thin film transistor (hereinafter also referred to as a TFT) which uses amorphous silicon as its active layer (see Patent Document 1).

Meanwhile, in the conventional liquid crystal television set, there has been a defect in that images are blurred due to the limitation of the viewing angle characteristics, limitation of the high speed operation with liquid crystal materials, and the like. However, in recent years, there is proposed a new display mode for solving such a problem, which is an OCB (Optically Compensated Bend) mode (see Non-patent Document 1).

[Patent Document 1] Japanese Patent Laid-Open No. Hei 5-35207

[Non-patent Document 1] Nikkei Microdevices' Flat Panel Display 2002 Yearbook, edited by Yasuhiro Nagahiro and others, Nikkei Business Publications, Inc., published in October, 2001 (pp. 102-109)

However, when a TFT formed of an amorphous silicon (amorphous semiconductor) film is driven with direct current, threshold voltage thereof easily varies, resulting in variations of the TFT characteristics. Therefore, in the display device using such a TFT formed of an amorphous semiconductor film for switching of the pixel, luminance unevenness occurs. Such a phenomenon is recognized more often in a large-screen television set having an opposite angle of 30 inches or more (typically, 40 inches or more), which thus poses a serious problem regarding the degradation in image quality.

Meanwhile, in order to enhance the image quality, a switching element capable of high-speed operation is required. However, the TFT using an amorphous semiconductor film has a limitation in operation speed. For example, it is difficult to realize a liquid crystal display device in the OCB mode.

SUMMARY OF THE INVENTION

The invention is made in view of the aforementioned circumstances, and it is a primary object of the invention to provide a manufacturing method of a display device having TFTs capable of high-speed operation, which has few variations of threshold voltage and requires a small number of photomasks. It is another object of the invention to provide a manufacturing method of a display device having an excellent switching property and high image contrast.

In order to solve the aforementioned problem of the conventional techniques, the invention takes the following measures.

According to the invention, an inversely staggered thin film transistor is manufactured by forming a crystalline semiconductor film by doping a catalytic element into an amorphous semiconductor film and heating it, and then removing the catalytic element from the crystalline semiconductor film. In addition, according to the invention, a gate electrode layer of a thin film transistor and a pixel electrode layer are formed using the same steps and material, thereby simpler manufacturing steps are achieved as well as the reduction of waste of materials. In addition, the display device of the invention has a liquid crystal display element using a liquid crystal material or a light-emitting element (EL element) as a display element, which may thus be called a liquid crystal display device, a light-emitting display device, or an EL display device.

By doping an element for promoting crystallization (mainly a metal element, and therefore also referred to as a metal element or a catalytic element) into an amorphous semiconductor film and heating it, a crystalline semiconductor film is formed. Then, by forming a semiconductor film having a group 15 element in the periodic table or a semiconductor film having a rare gas element to be in contact with the crystalline semiconductor film, heating it, and removing the metal element from the crystalline semiconductor film, an inversely staggered thin film transistor is formed. Note that in the case of forming such a semiconductor film having a group 15 element in the periodic table to be in contact with the crystalline semiconductor film, the semiconductor film having the group 15 element in the periodic table is used as a source region and a drain region to form an n-channel thin film transistor. In addition, by doping a group 13 element in the periodic table as a p-type impurity element into the semiconductor film having the group 15 element in the periodic table as an n-type impurity element, a p-channel thin film transistor is formed. Further, in the case of forming a semiconductor film having a rare gas element, the semiconductor film having the rare gas element is removed after thermal treatment, and a source region and a drain region are formed to obtain an n-channel thin film transistor or a p-channel thin film transistor.

One aspect of the display device of the invention comprises a gate electrode layer and a first electrode layer formed over an insulating surface, a gate insulating layer formed over the gate electrode layer, a crystalline semiconductor layer formed over the gate insulating layer, a semiconductor layer having one conductivity type formed in contact with the crystalline semiconductor layer, a source electrode layer and a drain electrode layer formed in contact with the semiconductor layer having one conductivity type, a first insulating layer formed over the source electrode layer, the drain electrode layer, and the first electrode layer, a first opening formed in the first insulating layer to reach the source electrode layer or the drain electrode layer, a second opening formed in the gate insulating layer and the first insulating layer to reach the first electrode layer, a wiring layer formed in the first opening and the second opening to electrically connect the source electrode layer or the drain electrode layer to the first electrode layer, a second insulating layer formed covering a part of the first electrode layer and the wiring layer, an electroluminescent layer formed over the first electrode layer, and a second electrode layer formed over the electroluminescent layer.

One aspect of the display device of the invention comprises a gate electrode layer and a first electrode layer formed over an insulating surface, a gate insulating layer formed over the gate electrode layer, a crystalline semiconductor layer provided with a source region and a drain region formed over the gate insulating layer, a source electrode layer and a drain electrode layer formed in contact with the source region and the drain region respectively, a first insulating layer formed over the source electrode layer, the drain electrode layer, and the first electrode layer, a first opening formed in the first insulating layer to reach the source electrode layer or the drain electrode layer, a second opening formed in the gate insulating layer and the first insulating layer to reach the first electrode layer, a wiring layer formed in the first opening and the second opening to electrically connect the source electrode layer or the drain electrode layer to the first electrode layer, a second insulating layer formed covering a part of the first electrode layer and the wiring layer, an electroluminescent layer formed over the first electrode layer, and a second electrode layer formed over the electroluminescent layer.

One aspect of the display device of the invention comprises a pixel region and a driver circuit region formed over the same substrate. In the driver circuit region, a first gate electrode layer and a second gate electrode layer are formed over the substrate, a gate insulating layer is formed over the first gate electrode layer and the second gate electrode layer, a first crystalline semiconductor layer and a second crystalline semiconductor layer are formed over the gate insulating layer, an n-type semiconductor layer is formed in contact with the first crystalline semiconductor layer, a p-type semiconductor layer is formed in contact with the first crystalline semiconductor layer, a first source electrode layer and a first drain electrode layer are formed in contact with the n-type semiconductor layer, a second source electrode layer and a second drain electrode layer are formed in contact with the p-type semiconductor layer. In the pixel region, a first electrode layer is formed over the substrate, an electroluminescent layer is formed over the first electrode layer, and a second electrode layer is formed over the electroluminescent layer. In addition, a part of the first electrode layer is covered with the gate insulating layer.

One aspect of the manufacturing method of a display device of the invention comprises the steps of forming a conductive layer over an insulating surface, forming a resist over the conductive layer, patterning the resist by laser beam exposure to form a mask, patterning the conductive layer using the mask to form a gate electrode layer and a first electrode layer, forming a gate insulating layer over the gate electrode layer and the first electrode layer, forming an amorphous semiconductor layer over the gate insulating layer, doping a metal element into the amorphous semiconductor layer, crystallizing the amorphous semiconductor layer by heating to obtain a crystalline semiconductor layer, forming a semiconductor layer having one conductivity type to be in contact with the crystalline semiconductor layer, heating the crystalline semiconductor layer and the semiconductor layer having one conductivity type, patterning the semiconductor layer having one conductivity type to form a source region and a drain region, forming a source electrode layer and a drain electrode layer to be in contact with the source region and the drain region respectively, forming a first insulating layer over the source electrode layer, the drain electrode layer, and the gate insulating layer, forming a first opening in the first insulating layer to reach the source electrode layer or the drain electrode layer, forming a second opening in the first insulating layer and the gate insulating layer to reach the first electrode layer, forming a wiring layer in the first opening and the second opening to electrically connect the source electrode layer or the drain electrode layer to the first electrode layer, forming a second insulating layer for covering a part of the first electrode layer and the wiring layer, forming an electroluminescent layer over the first electrode layer, and forming a second electrode layer over the electroluminescent layer.

One aspect of the manufacturing method of a display device of the invention comprises the steps of forming a conductive layer over an insulating surface, forming a resist over the conductive layer, patterning the resist by laser beam exposure to form a mask, patterning the conductive layer using the mask to form a gate electrode layer and a first electrode layer, forming a gate insulating layer over the gate electrode layer and the first electrode layer, forming a first semiconductor layer over the gate insulating layer, doping a metal element into the first semiconductor layer, heating the first semiconductor layer, forming a second semiconductor layer having a first impurity element to be in contact with the first semiconductor layer, heating the first semiconductor layer and the second semiconductor layer having the first impurity element, removing the second semiconductor layer having the first impurity element, doping a second impurity element into the first semiconductor layer to form a source region and a drain region, forming a source electrode layer and a drain electrode layer to be in contact with the source region and the drain region respectively, forming a first insulating layer over the source electrode layer, the drain electrode layer, and the gate insulating layer, forming a first opening in the first insulating layer to reach the source electrode layer or the drain electrode layer, forming a second opening in the first insulating layer and the gate insulating layer to reach the first electrode layer, forming a wiring layer in the first opening and the second opening to electrically connect the source electrode layer or the drain electrode layer to the first electrode layer, forming a second insulating layer for covering a part of the first electrode layer and the wiring layer, forming an electroluminescent layer over the first electrode layer, and forming a second electrode layer over the electroluminescent layer.

One aspect of the manufacturing method of a display device of the invention, which has a pixel region and a driver circuit region, comprises the steps of forming a conductive layer over a substrate, patterning the conductive layer by laser beam exposure to form a first gate electrode layer and a second gate electrode layer in the driver circuit region and to form a third gate electrode layer and a first electrode layer in the pixel region, forming a gate insulating layer over the first gate electrode layer, the second gate electrode layer, the third gate electrode layer, and the first electrode layer, forming a semiconductor film over the gate insulating layer, doping a metal element into the semiconductor film, heating the semiconductor film, forming an n-type semiconductor film over the semiconductor film, heating the semiconductor film and the n-type semiconductor film, patterning the semiconductor film and the n-type semiconductor film to form a first semiconductor layer, a second semiconductor layer, a first n-type semiconductor layer, and a second n-type semiconductor layer in the driver circuit region and to form a third semiconductor layer and a third n-type semiconductor layer in the pixel region, forming a first mask for covering the first n-type semiconductor layer and the third n-type semiconductor layer, doping a p-type impurity element into the second n-type semiconductor layer to invert the second n-type semiconductor layer into a p-type semiconductor layer, forming a first source electrode layer and a first drain electrode layer to be in contact with the first n-type semiconductor layer, forming a second source electrode layer and a second drain electrode layer to be in contact with the p-type semiconductor layer, forming a third source electrode layer and a third drain electrode layer to be in contact with the third n-type semiconductor layer, forming a first insulating layer over the first source electrode layer, the first drain electrode layer, the second source electrode layer, the second drain electrode layer, the third source electrode layer, the third drain electrode layer, and the gate insulating layer, forming a first opening in the first insulating layer to reach the third source electrode layer or the third drain electrode layer, forming a second opening in the first insulating layer and the gate insulating layer to reach the first electrode layer, forming a wiring layer in the first opening and the second opening to electrically connect the third source electrode layer or the third drain electrode layer to the first electrode layer, forming a second insulating layer for covering a part of the first electrode layer and the wiring layer, forming an electroluminescent layer over the first electrode layer, and forming a second electrode layer over the electroluminescent layer.

One aspect of the display device of the invention comprises a gate electrode layer and a pixel electrode layer formed over an insulating surface, a gate insulating layer formed over the gate electrode layer, a crystalline semiconductor layer formed over the gate insulating layer, a semiconductor layer having one conductivity type formed in contact with the crystalline semiconductor layer, a source electrode layer and a drain electrode layer formed in contact with the semiconductor layer having one conductivity type, an insulating layer formed over the source electrode layer, the drain electrode layer, and the pixel electrode layer, a first opening formed in the insulating layer to reach the source electrode layer or the drain electrode layer, a second opening formed in the gate insulating layer and the insulating layer to reach the pixel electrode layer, and a wiring layer formed in the first opening and the second opening to electrically connect the source electrode layer or the drain electrode layer to the pixel electrode layer.

One aspect of the display device of the invention comprises a gate electrode layer and a pixel electrode layer formed over an insulating surface, a gate insulating layer formed over the gate electrode layer, a crystalline semiconductor layer provided with a source region and a drain region formed over the gate insulating layer, a source electrode layer and a drain electrode layer formed in contact with the source region and the drain region respectively, an insulating layer formed over the source electrode layer, the drain electrode layer, and the pixel electrode layer, a first opening formed in the insulating layer to reach the source electrode layer or the drain electrode layer, a second opening formed in the gate insulating layer and the insulating layer to reach the pixel electrode layer, and a wiring layer formed in the first opening and the second opening to electrically connect the source electrode layer or the drain electrode layer to the pixel electrode layer.

One aspect of the display device of the invention comprises a pixel region and a driver circuit region formed over the same substrate. In the driver circuit region, a first gate electrode layer and a second gate electrode layer are formed over the substrate, a gate insulating layer is formed over the first gate electrode layer and the second gate electrode layer, a first crystalline semiconductor layer and a second crystalline semiconductor layer are formed over the gate insulating layer, an n-type semiconductor layer is formed in contact with the first crystalline semiconductor layer, a p-type semiconductor layer is formed in contact with the first crystalline semiconductor layer, a first source electrode layer and a first drain electrode layer are formed in contact with the n-type semiconductor layer, and a second source electrode layer and a second drain electrode layer are formed in contact with the p-type semiconductor layer. In the pixel region, a pixel electrode layer is formed over the substrate, and a part of the pixel electrode layer is covered with the gate insulating layer.

One aspect of the manufacturing method of a display device of the invention comprises the steps of forming a conductive layer over an insulating surface, forming a resist over the conductive layer, patterning the resist by laser beam exposure to form a mask, patterning the conductive layer using the mask to form a gate electrode layer and a pixel electrode layer, forming a gate insulating layer over the gate electrode layer and the pixel electrode layer, forming an amorphous semiconductor layer over the gate insulating layer, doping a metal element into the amorphous semiconductor layer, crystallizing the amorphous semiconductor layer by heating to obtain a crystalline semiconductor layer, forming a semiconductor layer having one conductivity type to be in contact with the crystalline semiconductor layer, heating the crystalline semiconductor layer and the semiconductor layer having one conductivity type, patterning the semiconductor layer having one conductivity type to form a source region and a drain region, forming a source electrode layer and a drain electrode layer to be in contact with the source region and the drain region respectively, forming an insulating layer over the source electrode layer, the drain electrode layer, and the gate insulating layer, forming a first opening in the insulating layer to reach the source electrode layer or the drain electrode layer, forming a second opening in the insulating layer and the gate insulating layer to reach the pixel electrode layer, and forming a wiring layer in the first opening and the second opening to electrically connect the source electrode layer or the drain electrode layer to the pixel electrode layer.

One aspect of the manufacturing method of a display device of the invention comprises the steps of forming a conductive layer over an insulating surface, forming a resist over the conductive layer, patterning the resist by laser beam exposure to form a mask, patterning the conductive layer using the mask to form a gate electrode layer and a pixel electrode layer, forming a gate insulating layer over the gate electrode layer and the pixel electrode layer, forming a first semiconductor layer over the gate insulating layer, doping a metal element into the first semiconductor layer, heating the first semiconductor layer, forming a second semiconductor layer having a first impurity element to be in contact with the first semiconductor layer, heating the first semiconductor layer and the second semiconductor layer having the first impurity element, removing the second semiconductor layer having the first impurity element, doping a second impurity element into the first semiconductor layer to form a source region and a drain region, forming a source electrode layer and a drain electrode layer to be in contact with the source region and the drain region respectively, forming an insulating layer over the source electrode layer, the drain electrode layer, and the gate insulating layer, forming a first opening in the insulating layer to reach the source electrode layer or the drain electrode layer, forming a second opening in the insulating layer and the gate insulating layer to reach the pixel electrode layer, and forming a wiring layer in the first opening and the second opening to electrically connect the source electrode layer or the drain electrode layer to the pixel electrode layer.

One aspect of the manufacturing method of a display device of the invention, which has a pixel region and a driver circuit region, comprises the steps of forming a conductive layer over a substrate, patterning the conductive layer by laser beam exposure to form a first gate electrode layer and a second gate electrode layer in the driver circuit region and to form a third gate electrode layer and a pixel electrode layer in the pixel region, forming a gate insulating layer over the first gate electrode layer, the second gate electrode layer, the third gate electrode layer, and the pixel electrode layer, forming a semiconductor film over the gate insulating layer, doping a metal element into the semiconductor film, heating the semiconductor film, forming an n-type semiconductor film over the semiconductor film, heating the semiconductor film and the n-type semiconductor film, patterning the semiconductor film and the n-type semiconductor film to form a first semiconductor layer, a second semiconductor layer, a first n-type semiconductor layer, and a second n-type semiconductor layer in the driver circuit region and to form a third semiconductor layer and a third n-type semiconductor layer in the pixel region, forming a first mask for covering the first n-type semiconductor layer and the third n-type semiconductor layer, doping a p-type impurity element into the second n-type semiconductor layer to invert the second n-type semiconductor layer into a p-type semiconductor layer, forming a first source electrode layer and a first drain electrode layer to be in contact with the first n-type semiconductor layer, forming a second source electrode layer and a second drain electrode layer to be in contact with the p-type semiconductor layer, forming a third source electrode layer and a third drain electrode layer to be in contact with the third n-type semiconductor layer, forming an insulating layer over the first source electrode layer, the first drain electrode layer, the second source electrode layer, the second drain electrode layer, the third source electrode layer, the third drain electrode layer, and the gate insulating layer, forming a first opening in the insulating layer to reach the third source electrode layer or the third drain electrode layer, forming a second opening in the insulating layer and the gate insulating layer to reach the pixel electrode layer, and forming a wiring layer in the first opening and the second opening to electrically connect the third source electrode layer or the third drain electrode layer to the pixel electrode layer.

According to the invention, an inversely staggered thin film transistor having a crystalline semiconductor film can be formed. Therefore, a TFT can be formed with a small number of photomasks. In addition, since the TFT of the invention is formed using a crystalline semiconductor film, it exhibits higher mobility as compared to an inversely staggered TFT formed using an amorphous semiconductor film. A source region and a drain region of the TFT are doped with metal elements which promote crystallization in addition to p-type impurity elements (acceptor elements) or n-type impurity elements (donor elements). Therefore, the source region and the drain region can be formed to have low resistivity. As a result, a display device capable of high-speed operation can be manufactured. Typically, a display device such as an OCB-mode display device can be manufactured, which exhibits high response while being capable of displaying images with a wide viewing angle.

In addition, in comparison with a thin film transistor formed using an amorphous semiconductor film, variations of threshold voltage hardly occur, resulting in the decrease in variations of the TFT characteristics. Therefore, display unevenness can be decreased, and a highly reliable display device can thus be manufactured.

Further, metal elements which are mixed into the semiconductor film during the film deposition are removed by a gettering step; therefore, off current can be decreased. By using such a TFT as a switching element of the display device, image contrast can be enhanced.

Further, according to the invention, waste of materials can be reduced, resulting in cost saving. Thus, a high-performance and highly reliable display device can be manufactured with high yield.

BRIEF DESCRIPTION OF THE DRAWINGS

FIGS. 14A to 14C illustrate a manufacturing method of a display device of the invention.

FIGS. 15A to 15C illustrate a manufacturing method of a display device of the invention.

FIGS. 16A to 16C illustrate a manufacturing method of a display device of the invention.

FIGS. 18A and 18B illustrate a manufacturing method of a display device of the invention.

FIGS. 43A(1) to 43C(2) each illustrate an EL display panel of the invention.

FIGS. 47A to 47F each illustrate a configuration of a pixel which can be applied to an EL display panel of the invention.

FIGS. 54A to 54C illustrate a manufacturing method of a display device of the invention.

FIGS. 55A to 55C illustrate a manufacturing method of a display device of the invention.

FIGS. 58A and 58B illustrate a manufacturing method of a display device of the invention.

FIGS. 69A(1) to 69C(2) each illustrate a display panel of the invention.

DETAILED DESCRIPTION OF THE PREFERRED EMBODIMENTS

Embodiment Mode 1

Figure 1A:
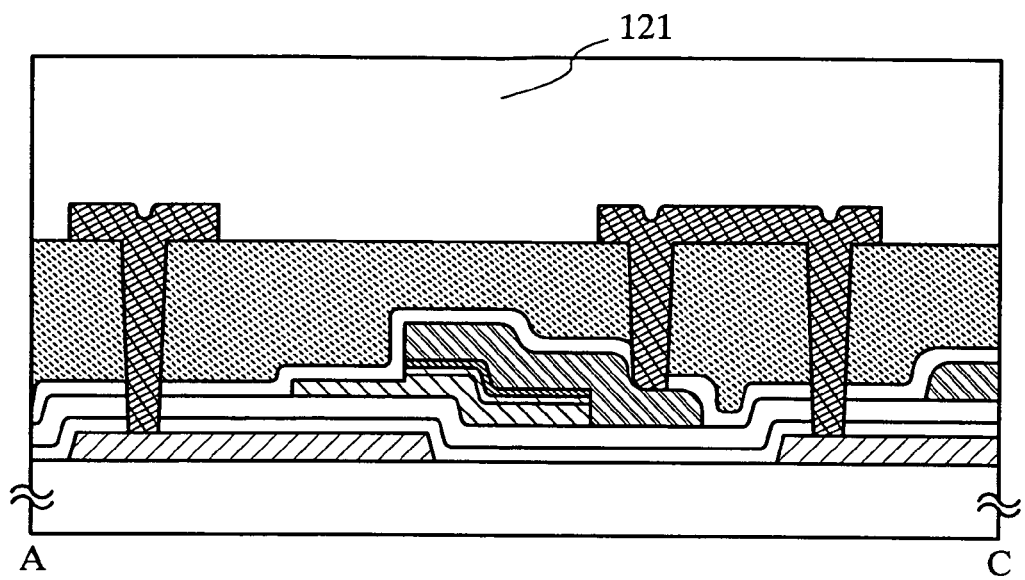
FIGS. 1A and 1B illustrate a display device of the invention.

In this embodiment mode, description is made in detail. Although the invention will be fully described by way of examples with reference to the accompanying drawings, it is to be understood that various changes and modifications will be apparent to those skilled in the art. Therefore, unless otherwise such changes and modifications depart from the scope of the invention, they should be constructed as being included therein. Note that common portions or portions having a common function in the structure of the invention are denoted by common reference numerals in all the drawings, and therefore, the description thereof is made only once.

Figure 29A:
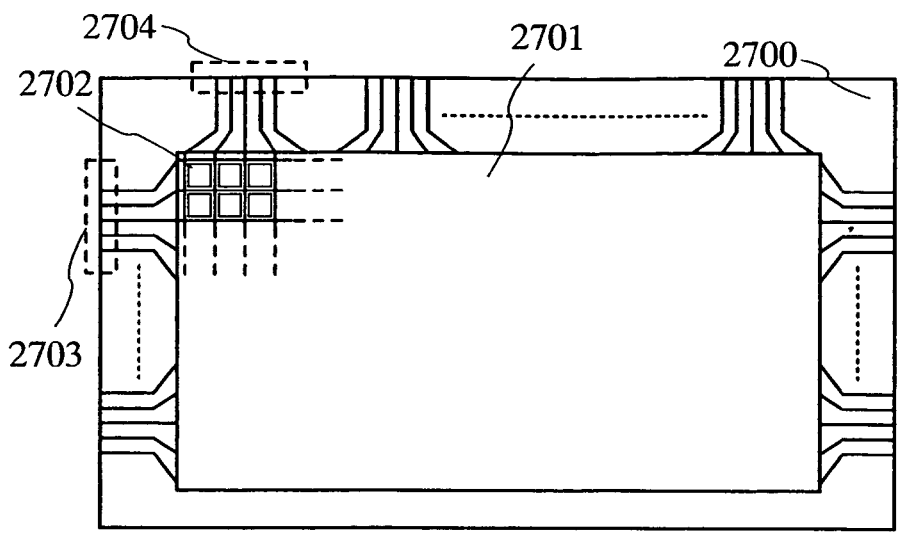
FIGS. 29A to 29C are top views each illustrating an EL display panel of the invention.

FIG. 29A is a top view illustrating the structure of a display panel in accordance with the invention. Over a substrate 2700 having an insulating surface, a pixel portion 2701 having a matrix arrangement of pixels 2702, a scan line side input terminal 2703, and a signal line side input terminal 2704 are formed. The number of the pixels may be determined in accordance with various panel specifications. In the case of XGA, for example, 1024×768×3 (RGB) pixels are required while in the case of UXGA, 1600×1200×3 (RGB) pixels are required. Further, in the case of a full-spec high vision panel, 1920×1080×3 (RGB) pixels are required.

Each pixel 2702 is disposed in matrix by scan lines extending from the scan line side input terminal 2703 and signal lines extending from the signal line side input terminal 2704 being crossed with each other. Each pixel 2702 has a switching element and a pixel electrode connected thereto. As a typical example of the switching element, there is a TFT. By connecting a gate electrode of the TFT to a scan line while connecting a source or drain thereof to a signal line, each pixel can be controlled independently with a signal inputted externally.

Figure 30A:
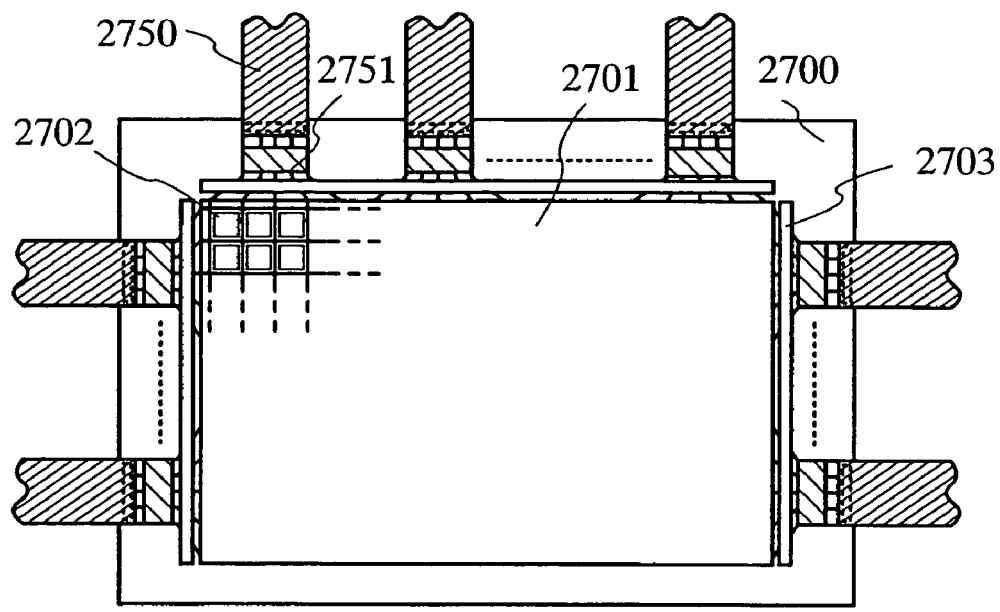
FIGS. 30A and 30B are top views each illustrating an EL display panel of the invention.
Figure 30B:
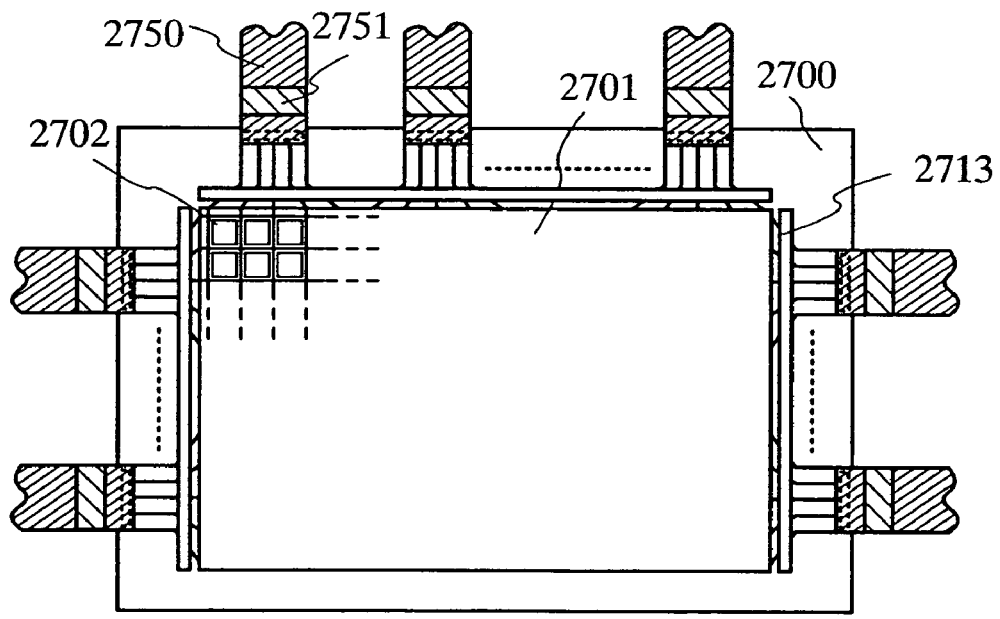

FIG. 29A illustrates a configuration of a display panel in which signals inputted to the scan lines and the signal lines are controlled by an external driver circuit; however, as shown in FIG. 30A, a driver IC 2751 may be mounted on the substrate 2700 by COG (Chip on Glass) bonding. As an alternative mode for mounting, TAB (Tape Automated Bonding) may be used as shown in FIG. 30B. The driver IC may be either a circuit formed over a single crystalline semiconductor substrate or a circuit constructed of TFTs formed over a glass substrate. In FIGS. 30A and 30B, the driver IC 2751 is connected to an FPC 2750.

Figure 29B:
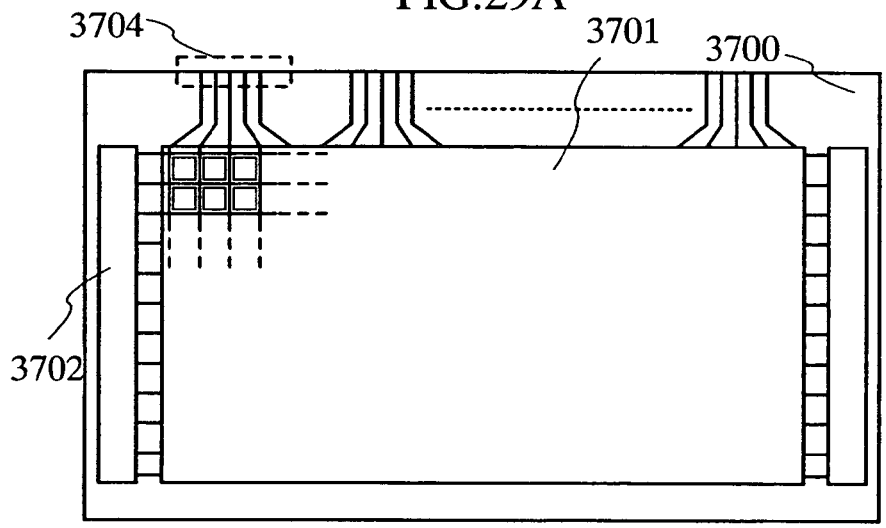
Figure 29C:
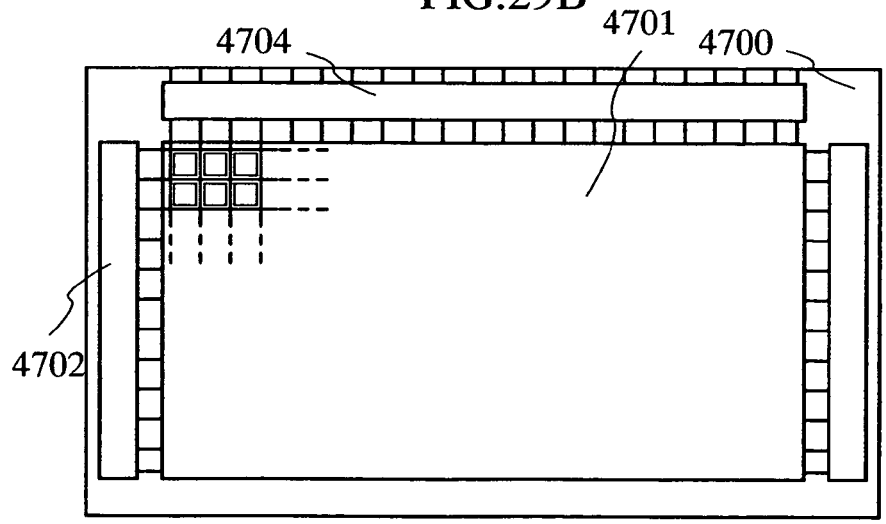

In addition, in the case of forming the TFT provided in each pixel by using an SAS (semi-amorphous semiconductor), a scan line driver circuit 3702 may also be formed over a substrate 3700 as shown in FIG. 29B. In FIG. 29B, reference numeral 3701 denotes a pixel portion, and a signal line driver circuit is controlled by an external driver circuit as in FIG. 29A. In the case of forming the TFT provided in each pixel by using a polycrystalline (microcrystalline) semiconductor, a single crystalline semiconductor, or the like which has high mobility as shown in FIG. 29C, a scan line driver circuit 4702 and a signal line driver circuit 4704 may be formed over a glass substrate 4700.

According to the display device manufactured in accordance with the invention, a method capable of selectively forming a desired shape is used for forming at least one of the objects necessary for the manufacture of a display panel such as a conductive layer for forming a wiring layer or an electrode or a mask layer used for forming a predetermined pattern (e.g., such objects exist in various modes like a film or a layer according to the intended purpose or the function thereof). The invention can be applied to all the components which are formed with predetermined shapes such as a conductive layer including a gate electrode layer, a source electrode layer, and a drain electrode layer, a semiconductor layer, a mask layer, and an insulating layer, each of which constitutes a thin film transistor or a display device. As the method capable of selectively forming a desired pattern, there is a droplet discharge (ejection) method (referred to as ink-jet method in some case of method) capable of forming a predetermined pattern of a conductive layer, an insulating layer, and the like by selectively discharging (ejecting) compositions which are mixed for a specific purpose. Alternatively, a method capable of forming an object to have a desired pattern by transfer or by writing may be used, which includes screen (stencil process) printing, offset (planography) printing, gravure (copperplate) printing, and the like.

This embodiment mode employs a method for forming a desired pattern by discharging (ejecting) compositions containing a fluid material in the form of droplets. After discharging the droplets containing the material to be formed in the target area, baking and drying steps are performed to solidify the material, thereby the object can be formed with the desired pattern.

Figure 27:
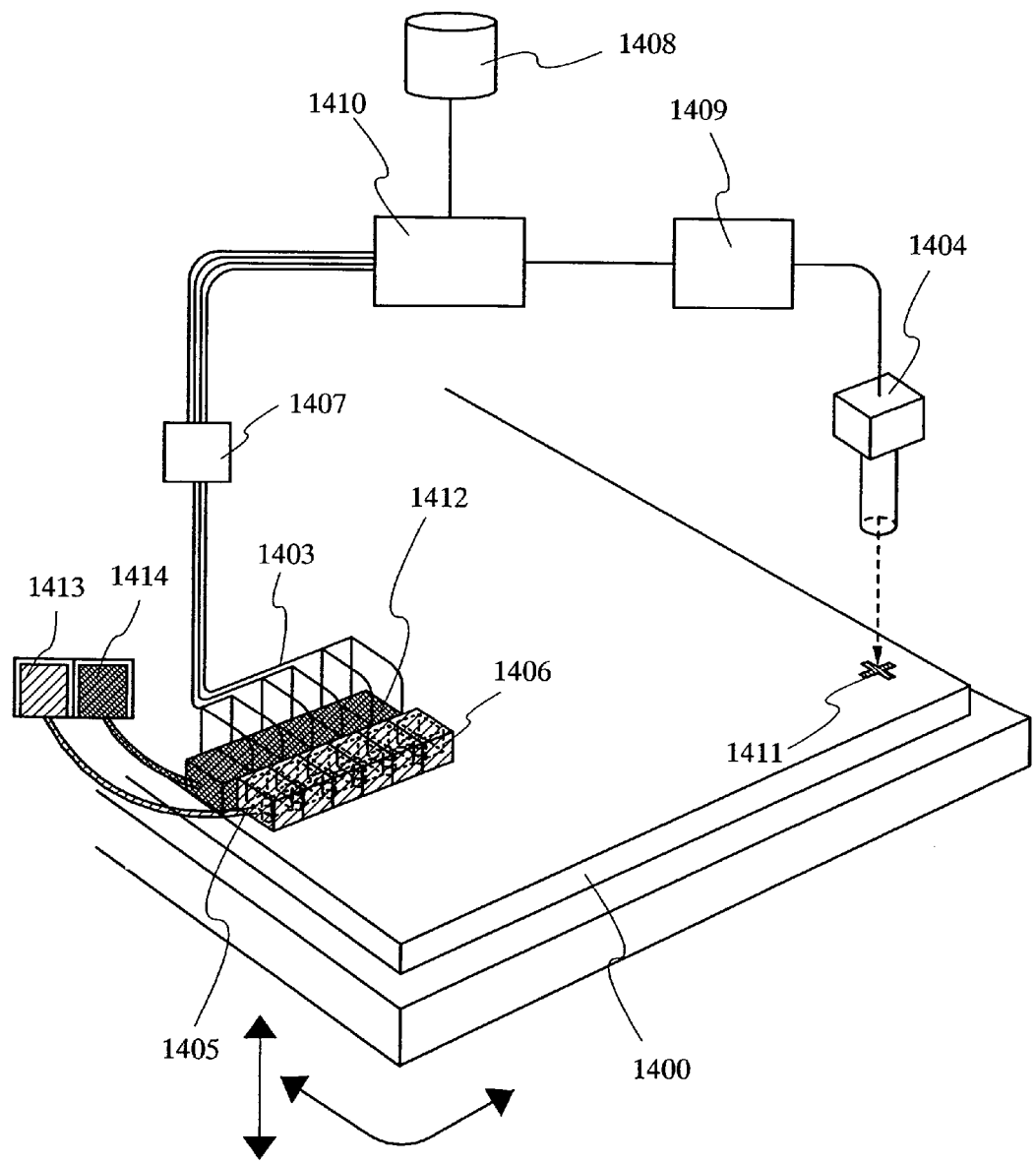
FIG. 27 illustrates a configuration of a droplet discharge system to which the invention can be applied.

FIG. 27 illustrates one mode of a droplet discharge systems used for the droplet discharge method. Each of heads 1405 and 1412 of a droplet discharge means 1403 is connected to a control means 1407, which is controlled by a computer 1410 to write a preprogrammed pattern. The write timing may be determined with, for example, a marker 1411 formed on a substrate 1400 as a basing point. Alternatively, the basing point may be determined using the edge of the substrate 1400. The marker or the basing point is detected by an image pick-up means 1404, and converted into a digital signal in an image processing means 1409. Then, the signal is recognized by the computer 1410 to generate a control signal to be transmitted to the control means 1407. The image pick-up means 1404 may be an image sensor using a charge-coupled device (CCD), a complementary metal-oxide semiconductor (CMOS), and the like. Needless to say, the data on the pattern to be formed on the substrate 1400 is stored in a recording medium 1408, based on which a control signal is transmitted to the control means 1407, thereby each of the heads 1405 and 1412 of the droplet discharge means 1403 can be controlled individually. Materials to be discharged are supplied to the heads 1405 and 1412 from a material supply source 1413 and a material supply source 1414 respectively through pipes.

The interior of the head 1405 has a space filled with a liquid material and a nozzle as a discharge head as shown by dotted lines 1406. Though not shown, the head 1412 has the similar internal structure as the head 1405. The size of the nozzle of the head 1405 and the head 1412 is different, thereby different materials can be written with different line widths at the same time. Using one head, a conductive material, an organic or inorganic material and the like can be discharged respectively, and in the case where a pattern is written in a large area such as an interlayer film, the same material is discharged from a plurality of nozzles at the same time to write a pattern in order to improve the throughput. In the case of using a large substrate, the heads 1405 and 1412 can be scanned over the substrate slidably in the direction of arrows, and the writing area can be set freely. Thus, a plurality of the same patterns can be written on one substrate.

In the invention, a photosensitive resist or a material containing a photosensitive substance is irradiated with and exposed to light in the patterning step of a processing object. The light used for the exposure is not specifically limited, and any one of infrared light, visible light, and ultraviolet light, or a combination of them may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In such a case, irradiation may be carried out by lighting the lamp light source for a required period, or carried out a plurality of times.

Figure 26:
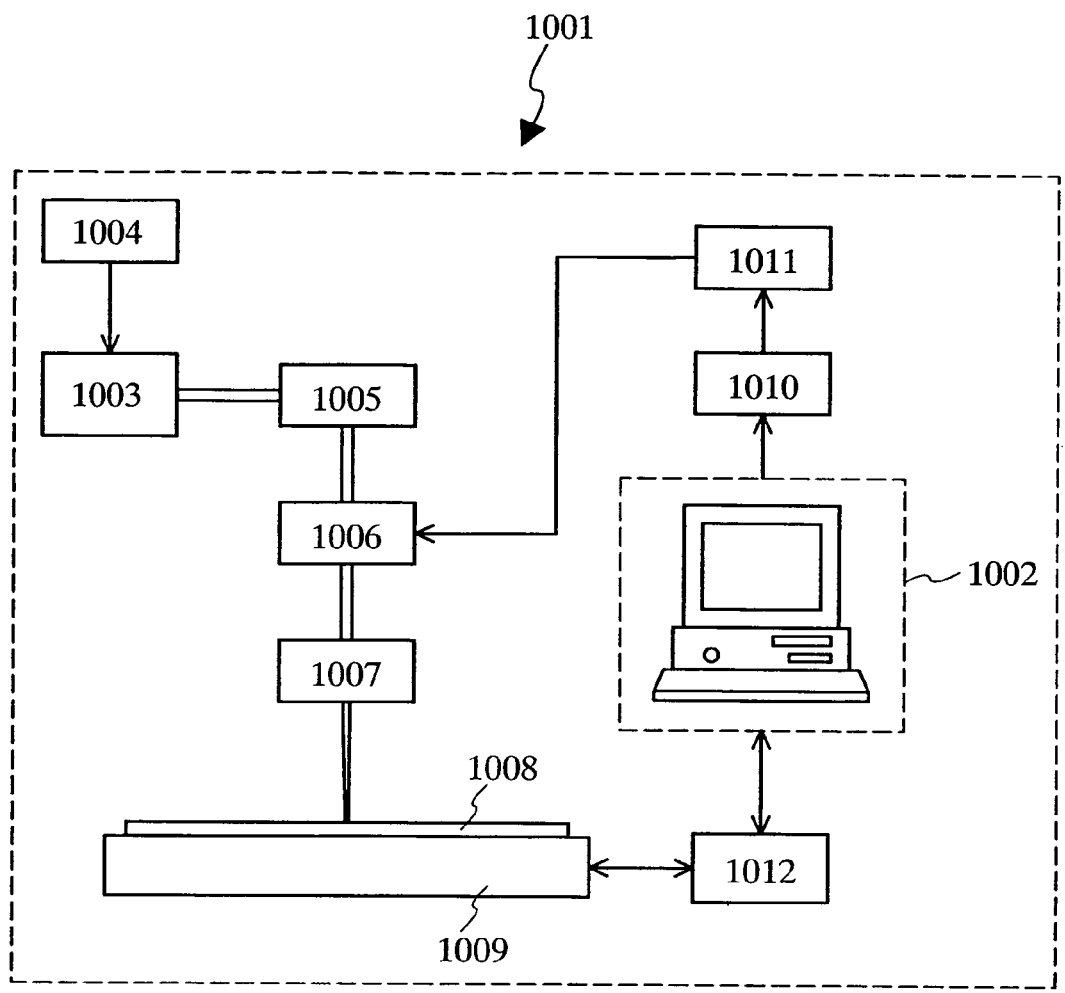
FIG. 26 illustrates a configuration of a laser beam direct writing system to which the invention can be applied.

Alternatively, laser light (also referred to as a laser beam) may be employed, with which the processing area can be exposed to light with even higher accuracy. Thus, the object formed on the area can be processed finely. Description is made with reference to FIG. 26 on a laser beam direct writing system applicable to the invention, which irradiates the processing area with a laser beam to write a pattern. In this embodiment mode, the area to be irradiated with a laser beam is not selected through a mask and the like, but processed by direct irradiation while selecting the processing area; thus, a laser beam direct writing system is used. As shown in FIG. 26, a laser beam direct writing system 1001 includes a personal computer (hereinafter referred to as a PC) 1002 for carrying out various controls in irradiation of laser beams, a laser oscillator 1003 for outputting laser beams, a power source 1004 of the laser oscillator 1003, an optical system (ND filter) 1005 for attenuating laser beams, an acoustooptic modulator (AOM) 1006 for modulating the intensity of laser beams, an optical system 1007 constituted by a lens for magnifying or reducing a cross-sectional surface of laser beams and a mirror for changing the optical path, a substrate moving mechanism 1009 having an X stage and an Y stage, a D/A converter unit 1010 for digital-analog converting the control data outputted from the PC 1002, a driver 1011 for controlling the acoustooptic modulator 1006 according to an analog voltage outputted from the D/A converter unit 1010, and a driver 1012 for outputting a driving signal for driving the substrate moving mechanism 1009.

The laser oscillator 1003 may be a laser oscillator capable of oscillating ultraviolet light, visible light, or infrared light. As a specific laser oscillator, an excimer laser oscillator using KrF, ArF, KrF, XeCl, Xe, and the like, a gas laser oscillator using He, He—Cd, Ar, He—Ne, HF, and the like, a solid-state laser oscillator using such crystals as YAG, GdVO$_4$, YVO$_4$, YLF, or YVO$_4$ which are doped with Cr, Nd, Er, Ho, Ce, Co, Ti or Tm, a semiconductor laser oscillator using GaN, GaAs, GaAlAs, InGaAsP, and the like may be used. Note that when using the solid-state laser oscillator, the second to fifth harmonics of the fundamental wave are desirably used.

Next, an exposure process of a substance (surface) using a laser beam direct writing system is described. When the substrate 1008 is placed above the substrate moving mechanism 1009, the PC 1002 detects the alignment of the marker formed on the substrate 1008 using a camera (not shown). Then, the PC 1002 produces movement data for moving the substrate moving mechanism 1009 based on the detected alignment data of the marker and the writing pattern data which is inputted in advance. After that, the PC 1002 controls the amount of light outputted from the acoustooptic modulator 1006 via the driver 1011, and a laser beam outputted from the laser oscillator 1003 is, after attenuated by the optical system 1005, controlled in quantity by the acoustooptic modulator 1006 to have a predetermined quantity of light. Meanwhile, the laser beam outputted from the acoustooptic modulator 1006 is changed in its optical path and shape (of a beam spot), and condensed with the lens by the optical system 1007. Then, the processing object formed on the substrate is irradiated with the laser beam to obtain improved quality. At this time, the substrate moving mechanism 1009 is controlled to move in the X direction and the Y direction in accordance with the movement data produced by the PC 1002. As a result, a predetermined area is irradiated with the laser beam, thereby the exposure treatment is performed to the processing object.

Thus, the processing object is exposed to light and sensitized in the area irradiated with the laser beam. The photosensitive substance can be roughly classified into a negative type and a positive type. In the case of the negative photosensitive substance, chemical reactions occur in the exposed portion, and only the portion where the chemical reactions have occurred is left by a developer, thereby a pattern is formed. In the case of the positive photosensitive substance, on the other hand, chemical reactions occur in the exposed portion, and the portion where the chemical reactions have occurred is dissolved by a developer, thereby the portion which has not been exposed to light is left to form a pattern. The energy of the laser beam is partially converted to heat by the material of the processing object, which causes a reaction of a part of the processing object; therefore, the processed area of the processing object might be slightly wider than the width of the laser beam used for processing. In addition, the shorter the wavelength of the laser beam is, the shorter the diameter of the laser beam can be condensed into. Therefore, in order to form a processing area with a minute width, the area is preferably irradiated with a laser beam having a short wavelength.

In addition, the laser beam irradiated on the surface of the film is processed with the optical system into a spot having a dotted shape, circular shape, elliptical shape, rectangular shape, or linear shape (strictly, elongated rectangle shape).

In addition, although the system shown in FIG. 26 is an example in which the front surface of the substrate is irradiated with a laser beam for exposure, another laser beam writing system may be employed, with which the rear surface of the substrate is irradiated with a laser beam for exposure while appropriately changing the optical system or the substrate moving mechanism.

Note that the substrate is selectively irradiated with a laser beam while being moved here; however, the invention is not limited to this, and the substrate can be irradiated with a laser beam while scanning the laser beam in the XY-axis direction. In such a case, a polygon mirror or a galvanometer mirror is preferably used for the optical system 1007.

In addition, light emitted from a lamp light source may be used in combination with the laser beam, in which case the area to be patterned in a relatively wide range is irradiated with the light emitted from the lamp using the mask while only the area to be patterned finely can be irradiated with the laser beam. By performing such irradiation of light, throughput can be improved while a finely patterned wiring substrate or the like can be obtained.

Description is made with reference to FIGS. 1A to 9E on embodiment modes of the invention. Specifically, description is made on a manufacturing method of a display device to which the invention is applied. First, description is made on a manufacturing method of a display device having a channel-etch type thin film transistor to which the invention is applied. FIGS. 2A, 3A, 4A, 5A and 6A are top views of a pixel portion of a display device, FIGS. 2B, 3B, 4B, 5B and 6B are cross-sectional views of FIGS. 2A, 3A, 4A, 5A and 6A along a line A-C respectively, and FIGS. 2C, 3C, 4C, 5C and 6C are cross-sectional views of FIGS. 2A, 3A, 4A, 5A and 6A along a line B-D respectively.

A substrate 100 is formed of a glass substrate such as a barium borosilicate glass and an alumino borosilicate glass, a quartz substrate, a silicon substrate, a metal substrate, a stainless substrate, or a plastic substrate which is resistant to the processing temperature of the present manufacturing steps. In addition, the surface of the substrate 100 may be polished by CMP so as to be planarized. Note that an insulating layer may be formed over the substrate 100. The insulating layer is formed in a single layer or stacked layers by a known method such as CVD, plasma CVD, sputtering, and spin coating using an oxide or nitride material containing silicon. This insulating layer is not necessarily required; however, it has a blocking effect of contaminant which would otherwise enter from the substrate 100. The substrate 100 may be a large substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm.

The conductive film 101 is formed over the substrate 100. The conductive film 101 is patterned into a gate electrode layer and a pixel electrode layer. The conductive layer 101 is preferably formed by a known method such as printing, electrolytic plating, PVD (Physical Vapor Deposition), CVD (Chemical Vapor Deposition), and vapor deposition using a high-melting point material. As an alternative deposition method, a droplet discharge method may be used to form a desired pattern. The use of the high-melting point material enables the subsequent thermal step to be performed. As the high-melting point material, there are metals such as tungsten (W), molybdenum (Mo), zirconia (Zr), hafnium (Hf), bismuth (Bi), niobium (Nb), tantalum (Ta), chromium (Cr), cobalt (Co), nickel (Ni), and platinum (Pt). Alternatively, alloys or metal nitride of such metals may be appropriately used. In addition, such materials may be formed in stacked layers. Typically, a tantalum nitride film and a tungsten film are stacked in this order on the surface of the substrate. Note that in the case of carrying out the subsequent thermal step by LRTA (Lamp Rapid Thermal Annealing) which uses heat radiated from one or more of a halogen lamp, a metal halide lamp, a xenon arc lamp, a carbon arc lamp, a high pressure sodium lamp, and a high pressure mercury lamp, or GRTA (Gas Rapid Thermal Annealing) which uses an inert gas such as nitrogen or argon as a heating catalyst, the thermal treatment involves a short time. Therefore, the conductive film may be formed using aluminum (Al), silver (Ag), or gold (Cu) having a relatively low melting point. Such metals having reflexivity are preferable for the manufacture of a top-emission display panel. Alternatively, a silicon material doped with impurity elements having one conductivity type may be used. For example, a silicon film having n-type conductivity may be used, in which an amorphous silicon film is doped with n-type impurity elements such as phosphorus (P).

The conductive film 101 also functions as a pixel electrode layer; therefore, it can be formed using a light-transmissive conductive material as well. Accordingly, the conductive film 101 may be formed using indium tin oxide (ITO), indium tin oxide containing silicon oxide (ITSO), zinc oxide (ZnO), tin oxide ($SnO_2$), and the like. Preferably, the conductive film 101 is formed by sputtering using indium tin oxide (ITO), indium tin oxide containing silicon oxide (ITSO), zinc oxide (ZnO), and the like. More preferably, a film formed of indium tin oxide containing silicon oxide is formed by sputtering using a target such as ITO containing 2 to 10% by weight of silicon oxide. Alternatively, other conductive materials may be used, such as an alloy of indium oxide and zinc oxide which is an alloy of indium oxide containing silicon oxide and further containing 2 to 20% of zinc oxide (ZnO).

In this embodiment mode, the conductive film 101 is formed by discharging a composition containing indium tin oxide as a conductive material, and baking it at 500° C. Note that a droplet discharge means in this specification is a generic term for a system (apparatus) provided with a means for discharging droplets such as a nozzle having a discharge head of compositions or a head having one or more nozzles. The diameter of the nozzle of the droplet discharge means is set to 0.02 to 100 μm (preferably, not longer than 30 μm), and the discharge amount of compositions which are discharged from the nozzle is set to 0.001 to 100 pl (preferably, not smaller than 0.1 pl but not larger than 40 pl, or more preferably not larger than 10 pl). The discharge amount is increased in proportion to the diameter of the nozzle. In addition, the distance between a processing object and the discharge head of the nozzle is preferably set as close as possible in order to discharge droplets to a desired point, and it is preferably set to 0.1 to 3 mm (preferably, not longer than 1 mm).

As a composition discharged from the discharge head, a conductive material which is dissolved or dispersed into a solvent is used. The conductive material corresponds to metals such as Ag, Au, Cu, Ni, Pt, Pd, Ir, Rh, W, and Al, metallic sulfide of Cd or Zn, oxide of Fe, Ti, Ge, Si, Zr, Ba, or the like, fine particles of silver halide, or dispersive nanoparticles. In addition, the conductive material corresponds to indium tin oxide (ITO), Indium tin oxide containing silicon oxide (ITSO), organic indium, organotin, zinc oxide, titanium nitride, or the like, which is used as a light-transmissive conductive film. Such metals may be mixed as well for the material of the conductive layer. However, the composition discharged from the discharge head is preferably one of gold, silver, and copper which is dissolved or dispersed into a solvent in consideration of the resistivity, or more preferably silver or copper which has low resistance Note that when using silver or copper, a barrier film is preferably provided in combination as a measure against impurities. The barrier film can be formed using a silicon nitride film or a nickel boron (NiB) film.

Alternatively, particles having a plurality of layers may be employed such that a conductive material is coated with another conductive material. For example, particles having a three-layer structure may be used such that copper is coated with nickel boron (NiB), which is further coated with silver. As the solvent, an organic solvent such as butyl acetate, ester (e.g., ethyl acetate), alcohol (e.g., isopropyl alcohol or ethyl alcohol), methyl ethyl ketone, and acetone is used. The viscosity of the composition is preferably not higher than 20 cp, which can prevent drying or can enable compositions to be discharged smoothly from the discharge head. The surface tension of the composition is preferably not higher than 40 mN/m. However, the viscosity of the composition may be appropriately controlled in accordance with the solvent or the intended purpose. For an example, it is preferable that the composition (ITO, organic indium or organotin which is dissolved or dispersed into a solvent) have a viscosity of 5 to 20 mPa·S, the composition (silver dissolved or dispersed into a solvent) have a viscosity of 5 to 20 mPa·S, and the composition (gold dissolved or dispersed into a solvent) have a viscosity of 5 to 20 mPa·S.

In addition, the conductive film 101 to function as the electrode layer may be formed by stacking a plurality of conductive materials. Further, the conductive layer may be formed by a droplet discharge method using silver as a conductive material, followed by plating with copper. The plating may be performed by electroplating or chemical (electroless) plating. The plating may be performed in such a manner that the surface of the substrate is dipped in a container filled with a solution containing a plating material, or that the substrate is set obliquely (or upright) so that the surface thereof is coated with a solution containing a plating material while flowing the solution from above. When the plating is performed by setting the substrate upright to be coated with a solution, such advantage is provided that the system (apparatus) for the step can be downsized.

The diameter of the conductive particles is, though depending on the diameter of each nozzle or the desired pattern shape, preferably small to be not longer than 0.1 μm in order to prevent the clogging of the nozzle and to manufacture a fine pattern. The composition is formed by a known method such as an electrolytic method, atomization method, and wet reduction method. The grain size of the composition is generally about 0.01 to 10 μm. When the composition is formed by a gas evaporation method, nanoparticles protected by a dispersing agent has quite a small size of about 7 nm. Further, when the surface of each nanoparticle is covered with coating flux, aggregations do not occur in the solvent, thereby the nanoparticles are stably dispersed at the room temperature, exhibiting substantially the same action as a liquid. Thus, the coating flux is preferably used.

When the step for discharging the composition is carried out under the low pressure, the solvent of the composition evaporates in the period after the composition is discharged until it is landed on the processing object; thus, the subsequent drying and baking steps can be omitted. In addition, the step performed under the low pressure is preferable since the surface of the conductor is not formed with an oxide film and the like. After discharging the composition, one or both of the drying and baking steps are performed. Both the drying and baking steps are thermal treatment. For example, the drying step is performed at 100° C. for 3 minutes while the baking step is performed at 200 to 350° C. for 15 to 60 minutes. Thus, the object, temperature and time thereof are different from each other. The drying and baking steps are performed by laser irradiation, rapid thermal annealing, or using a heating furnace under the normal pressure or the low pressure. Note that the timing for performing the thermal treatment is not specifically limited. In order to perform the drying and baking steps favorably, the substrate may be heated, and the temperature at this time is, though depending on the material of the substrate and the like, generally 100 to 800° C. (preferably, 200 to 350° C.). According to the present step, the solvent of the composition is evaporated or the dispersing agent is chemically removed while the surrounding resin is cured and shrunk, which causes the nanoparticles to be brought into contact with each other to be fused and welded at faster speed.

The irradiation of laser beams may be carried out by a continuous wave (CW) or pulsed gas laser or a solid-state laser. The former gas laser includes an excimer laser, a YAG laser, and the like while the latter solid-state laser includes a laser using such crystals as YAG, $YVO_4$, or $GdVO_4$ doped with Cr, Nd, or the like. Note that the CW laser is preferably employed in view of the absorptivity of laser beams. In addition, a so-called hybrid laser irradiation method which combines the pulsed wave and continuous wave may be employed. Note that depending on the heat resistance of the substrate 100, the thermal treatment by laser irradiation is preferably carried out instantaneously for several micro to several ten seconds so that the substrate 100 is not damaged. The rapid thermal annealing (RTA) is performed by instantaneously applying heat for several minutes to several micro seconds by rapidly increasing the temperature using an infrared lamp for emitting the ultraviolet to infrared light or using a halogen lamp under the inert gas atmosphere. This treatment is performed instantaneously; therefore, only a thin film on the outmost surface can be heated substantially without affecting the film in the lower layer. That is, a low heat-resistant substrate such as a plastic substrate is not even affected.

Alternatively, after forming the conductive film 101 by discharging compositions by a droplet discharge method, the surface thereof may be planarized by applying pressure in order to increase the planarity. As the method for applying pressure, the surface of the film may be scanned with a roller so as to level the irregularity, or the surface thereof may be pressed perpendicularly with a flat plate. While applying the pressure, a thermal step may be performed. Alternatively, the surface of the film may be softened or melted with a solvent and the like, and then the irregularity of the surface may be removed with an air knife. In addition, the surface thereof may be polished by CMP. Such steps may be performed in order to planarize the surface in the case where irregularity occurs due to the droplet discharge method. Alternatively, the planarizing step may also be performed after the conductive film 101 is patterned with masks 102a, 102b, and 102c, and a gate electrode layer 103 and a first electrode layer 120 are formed.

A resist mask is formed on the conductive film 101. The resist mask is finely processed by being exposed to laser beams 170a, 170b, and 170c, thereby the masks 102a, 102b, and 102c are formed (see FIGS. 2A to 2C). The resist mask used in this embodiment mode is a negative resist, the exposed region of which is insoluble in etchant. Thus, a region remaining as a mask is irradiated with a laser beam. The resist mask before being processed with the laser beam may also be formed by the droplet discharge method. By using the droplet discharge method in combination, waste of materials can be reduced as compared to the case of coating the whole surface by spin coating and the like, resulting in cost saving.

The mask may be formed using a commercial resist material including a photosensitizing agent, for example, such as a positive resist (e.g., novolac resin), a photosensitizing agent (e.g., naphthoquinone diazide compound), or a negative resist (e.g., base resin, diphenylsilanediol, or acid generator). In using any of the aforementioned materials, the surface tension and viscosity thereof are appropriately controlled by controlling the concentration of a solvent or adding a surface-active agent and the like. In addition, when the conductive film 101 is formed using a conductive material containing a photosensitive substance, the conductive film 101 can be directly irradiated with and exposed to a laser beam, and then removed using etchant without forming a resist mask, thereby the conductive film 101 can be patterned into a desired shape. In such a case, no mask is required, resulting in the simplified manufacturing steps. The conductive material containing a photosensitive substance may include metals such as Ag, Au, Cu, Ni, Al, and Pt, or alloys thereof as well as a photosensitive resin such as a high molecular weight organic resin, photo polymerization initiator, photopolymerization polymers, or solvent. The organic high molecular weight resin includes a novolac resin, acrylic copolymers, methacrylic copolymers, cellulose derivatives, a cyclized rubber resin, and the like.

Figure 3A:
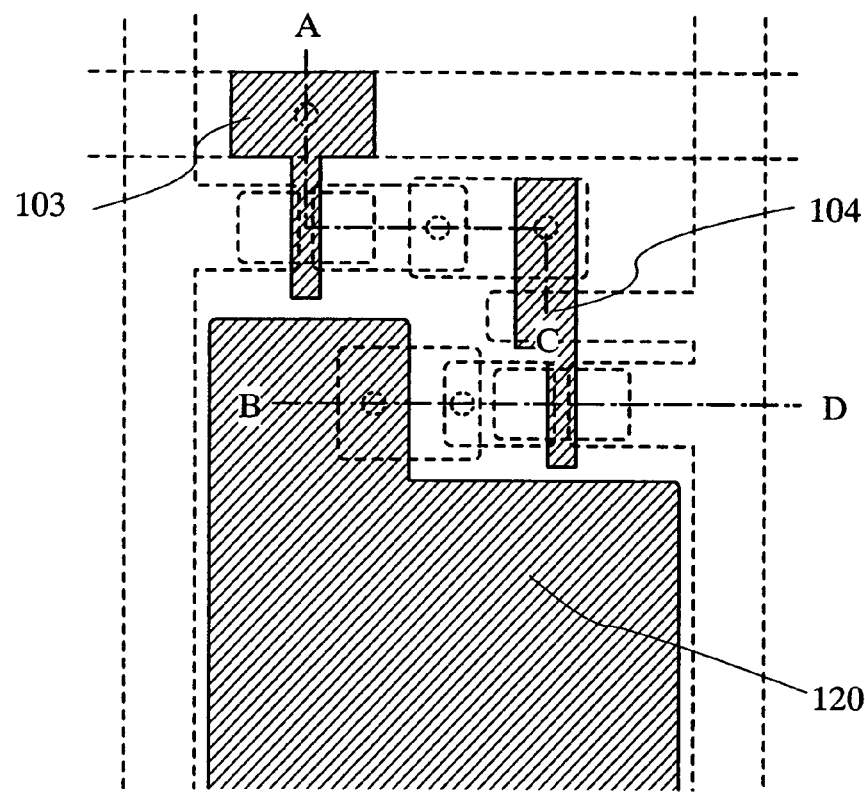
FIGS. 3A to 3C illustrate a manufacturing method of a display device of the invention.
Figure 3B:
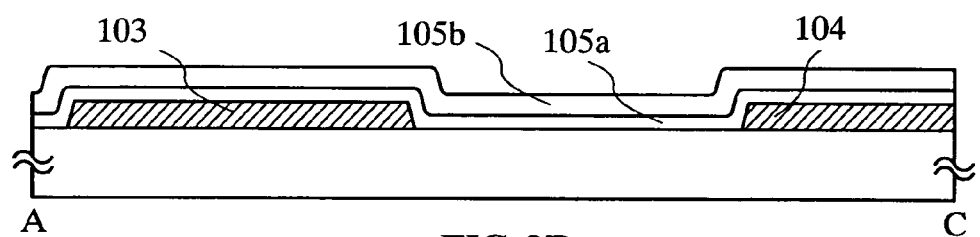
Figure 3C:
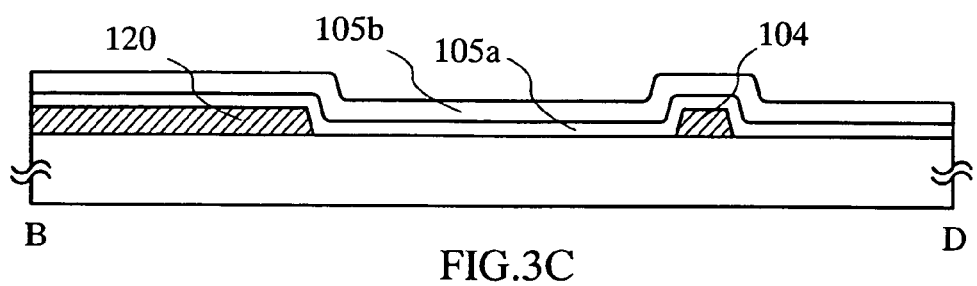
Figure 4A:
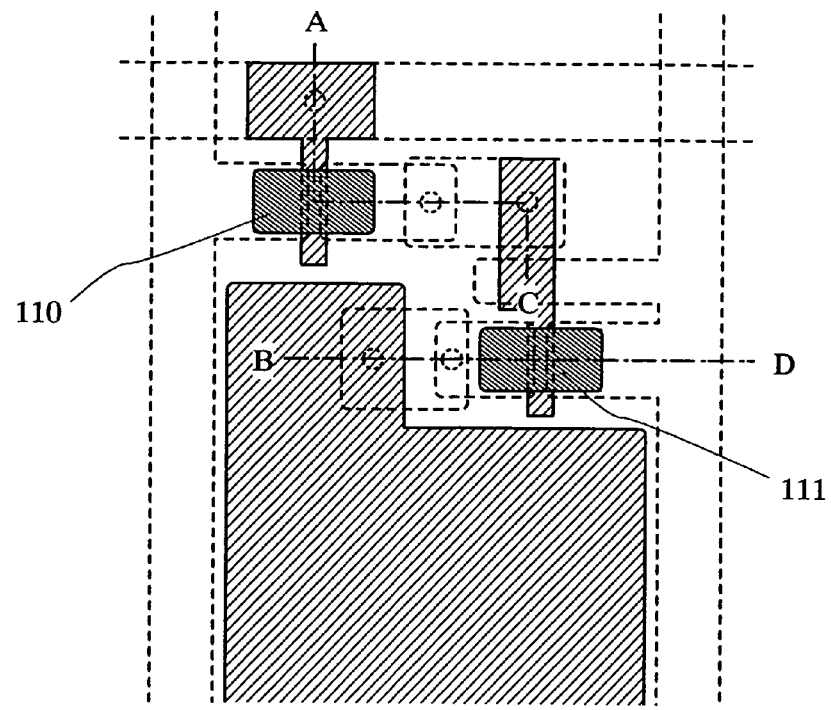
FIGS. 4A to 4C illustrate a manufacturing method of a display device of the invention.
Figure 4B:
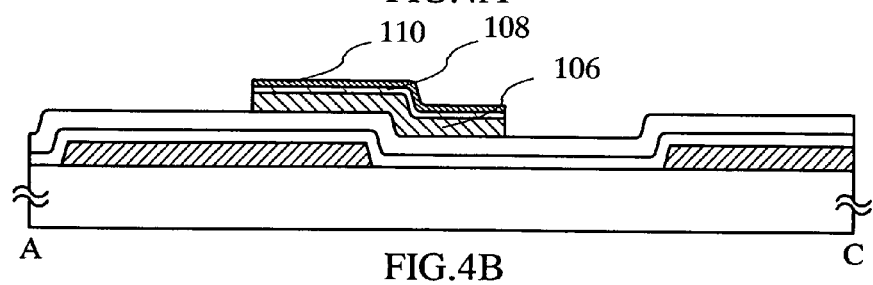
Figure 4C:
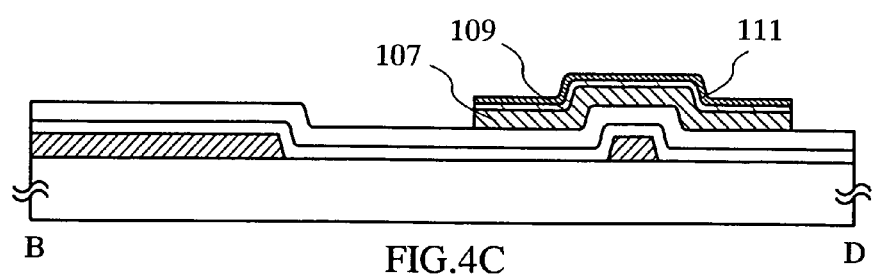
Figure 5A:
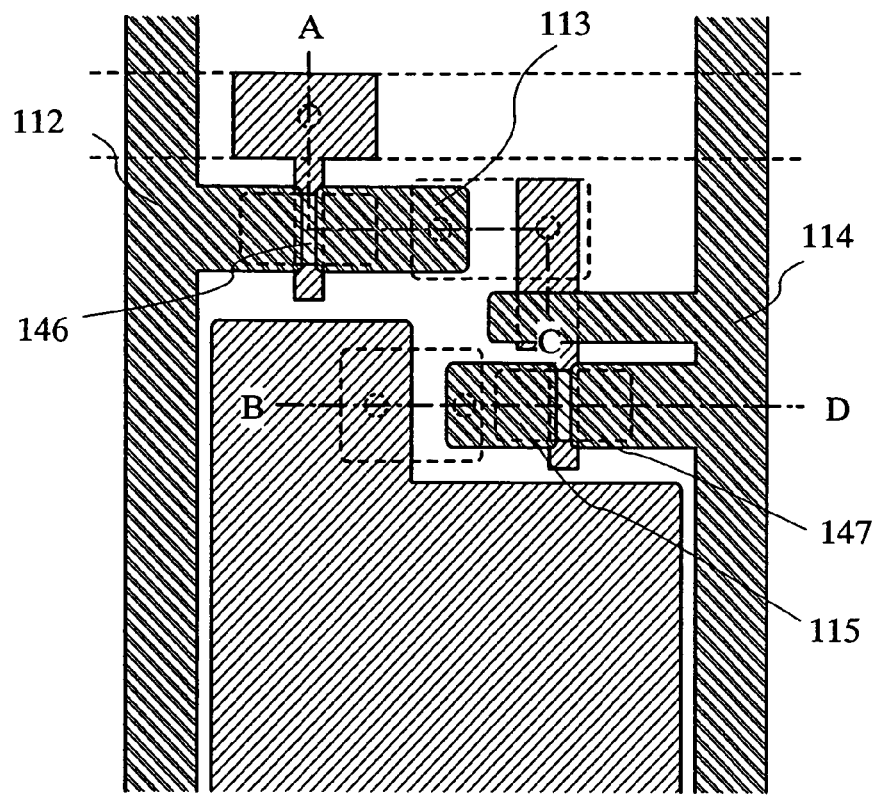
FIGS. 5A to 5C illustrate a manufacturing method of a display device of the invention.
Figure 5B:
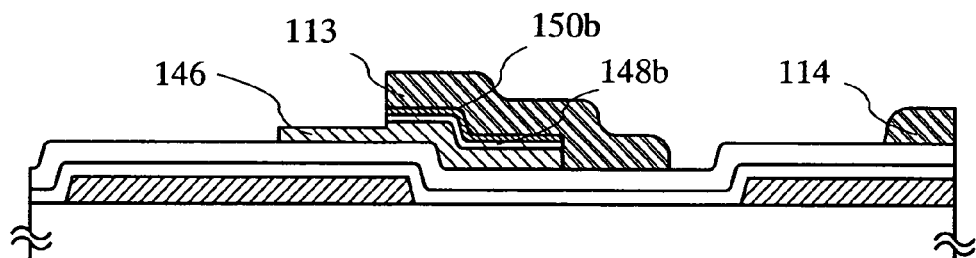
Figure 5C:
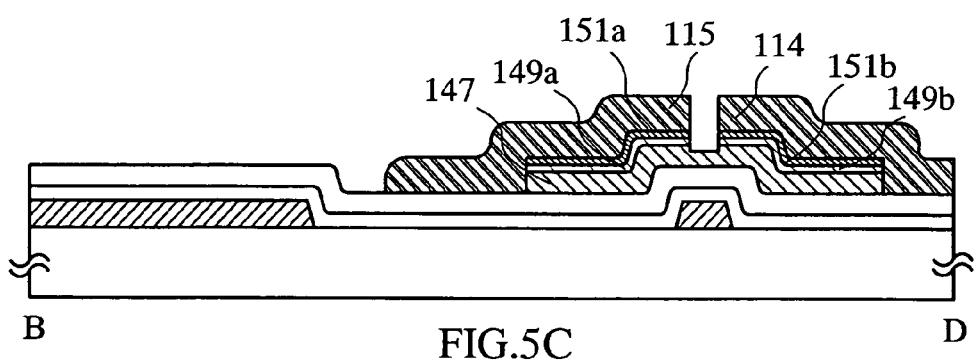

In this manner, the conductive film 101 is patterned using the finely processed masks 102a, 102b, and 102c, thereby the gate electrode layer 103, a gate electrode layer 104, and the first electrode layer 120 to serve as a pixel electrode layer are formed (see FIGS. 3A to 3C).

Then, gate insulating layers 105a and 105b are formed over the gate electrode layer 103, the gate electrode layer 104, and the first electrode layer 120 to serve as the pixel electrode layer. The gate insulating layers 105a and 105b can be formed using silicon oxide ($SiO_x$), silicon nitride ($SiN_x$), silicon oxynitride ($SiO_xN_y$) (x>y), silicon nitride oxide ($SiN_xO_y$) (x>y), and the like. Further, by anodizing the gate electrode layer 103 and the gate electrode layer 104, an anodized film may be formed instead of the gate insulating layer 105a. Note that in order to prevent diffusion of impurities from the substrate side, the gate insulating layer 105a is preferably formed using silicon nitride ($SiN_x$), silicon nitride oxide ($SiN_xO_y$) (x>y), and the like. In addition, the gate insulating layer 105b is desirably formed using silicon oxide ($SiO_x$) or silicon oxynitride ($SiO_xN_y$) (x>y) in view of the property of the interface with a semiconductor layer to be formed later. However, the gate insulating layer is not limited to such steps, and it may be formed in a single layer using any one of silicon oxide ($SiO_x$), silicon nitride ($SiN_x$), silicon oxynitride ($SiO_xN_y$) (x>y), silicon nitride oxide ($SiN_xO_y$) (x>y), and the like. Note that the gate insulating layer 105b contains hydrogen. In the case where the conductive layer formed by the droplet discharge method is formed using silver, copper, or the like, diffusion of impurities can be prevented as well as the surface can be planarized if a barrier film such as a silicon nitride film and an nickel boron (NiB) film is formed over the gate insulating layer. Note that in order to form a dense insulating film with small gate leakage current at a low deposition temperature, rare gas elements such as argon are preferably contained in the reaction gas so as to be mixed into the insulating film to be formed. In this embodiment mode, the gate insulating film 105a is formed using a silicon nitride film with a reaction gas of $SiH_4$ and $NH_3$ to have a thickness of 50 nm, and the gate insulating film 105b is formed using a silicon oxide film with a reaction gas of $SiH_4$ and $N_2O$ to have a thickness of 100 nm. Alternatively, a silicon nitride oxide film may be set to have a thickness of 140 nm, and a silicon oxynitride film stacked thereover may be set to have a thickness of 100 nm. Each of the gate insulating layer 105a and the gate insulating layer 105b is preferably set to have a thickness of 50 to 100 nm.

Then, a semiconductor film is formed. A specific manufacturing method of a semiconductor layer will be described with reference to FIGS. 9A to 9E. FIGS. 9A to 9E illustrate a manufacturing method of a thin film transistor formed on the gate electrode layer 103; however, a thin film transistor formed on the gate electrode layer 104 can be formed in a similar manner. The semiconductor film may be formed to have a thickness of 25 to 200 nm (preferably, 30 to 150 nm) by a known method (e.g., sputtering, LPCVD, or plasma CVD). In this embodiment mode, a crystalline semiconductor film obtained by crystallizing an amorphous semiconductor film is preferably employed.

The semiconductor film may be formed using an amorphous semiconductor (hereinafter also referred to as an "AS") which is formed by vapor phase growth or sputtering with a semiconductor material gas typified by a silane (SiH4) source gas and a german (GeH4) source gas, and the like. Alternatively, the semiconductor film may be formed using a polycrystalline semiconductor obtained by crystallizing the amorphous semiconductor utilizing thermal energy, or a semi-amorphous (also referred to as micro-crystalline) semiconductor (hereinafter also referred to as an "SAS").

The SAS is a semiconductor having an intermediate structure between amorphous and crystalline (including single crystalline and polycrystalline) structures and has the third state which is stable in free energy. The semi-amorphous semiconductor includes a crystalline region having a short-range order and lattice distortion. At least a part of the regions in the film includes crystal grains of 0.5 to 20 nm. In the case of a silicon as a major component, Raman spectrum is shifted to the lower wave number than 520 cm$^{-1}$, and it has the observed diffraction peaks at (111) and (220) under the X-ray diffraction, which are supposedly derived from the Si-crystal lattices. In addition, it contains hydrogen or halogen with a concentration of 1 atomic % or more in order to terminate dangling bonds. The SAS is formed by decomposing a silicon source gas by glow discharge (plasma CVD). The silicon source gas includes SiH$_4$, Si$_2$H$_6$, SiH$_2$Cl$_2$, SiHCl$_3$, SiCl$_4$, SiF$_4$, and the like, which may be mixed with F$_2$ or GeF$_4$. In addition, the silicon source gas may be diluted with H$_2$, or diluted with H$_2$ and one or more rare gas elements selected from He, Ar, Kr, and Ne. It is desirable that the dilution rate be set in the range of 2 to 1000 times; pressure, in the range of about 0.1 to 133 Pa; and power supply frequency, in the range of 1 to 120 MHz, or more preferably in the range of 13 to 60 MHz. In addition, the substrate is preferably heated to not higher than 300° C., and the heating temperature of the substrate may be 100 to 200° C. Among the impurities introduced into the film during the deposition, atmospheric impurities such as oxygen, nitrogen, and carbon are desirably set to be not higher than $1 \times 10^{20}$ cm$^{-3}$. In particular, oxygen concentration is preferably set to be not higher than $5 \times 10^{19}$ cm$^{-3}$, or more preferably not higher than $1 \times 10^{19}$ cm$^{-3}$. Further, by mixing rare gas elements such as He, Ar, Kr, and Ne into the silicon source gas to further promote the lattice distortion, a more stable and excellent SAS can be obtained. Further alternatively, the semiconductor film may be formed by stacking an SAS layer formed using a fluorine-containing gas and an SAS layer formed using a hydrogen-containing gas.

Figure 9A:
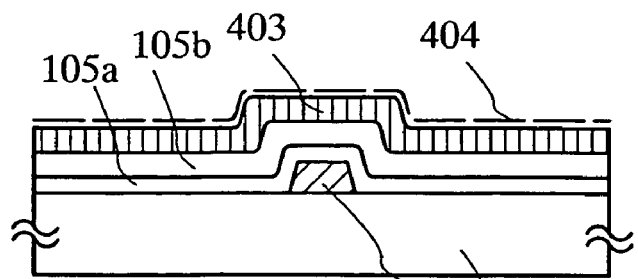
FIGS. 9A to 9E illustrate a manufacturing method of a display device of the invention.
Figure 9B:
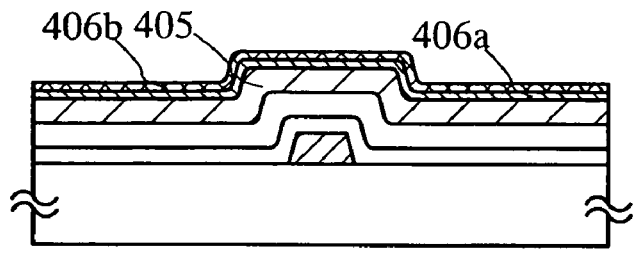

Note that in order to obtain a semiconductor film having an excellent crystalline structure in the subsequent crystallization, concentration of impurities such as oxygen and nitrogen contained in an amorphous semiconductor film 403 shown in FIG. 9A is desirably reduced to be $5 \times 10^{18}$/cm$^3$ (hereinafter, concentrations are all indicated by the atomic concentration measured by secondary ion mass spectrometry (SIMS). Such impurities easily react with catalytic elements, which would disturb the crystallization later, and would increase the density of the trapping center or the recombination center even after the crystallization.

In this embodiment mode, an amorphous semiconductor film or an SAS film is thermally crystallized using elements for promoting crystallization. As the thermal method, there is RTA (Rapid Thermal Annealing) such as GRTA (Gas Rapid Thermal Annealing) and LRTA (Lamp Rapid Thermal Annealing).

A method for introducing metal elements into the amorphous semiconductor film is not specifically limited as long as the metal element is made present in the surface or the inside of the amorphous semiconductor film. For example, sputtering, CVD, plasma treatment (including plasma CVD), adsorption process, a coating method with a solution of metal salt, ion implantation, ion doping, and the like can be employed. Among them, the method using a solution is advantageous in that it can be easily performed and the concentration of metal elements can be controlled easily. In addition, in order to improve the wettability of the surface of the amorphous semiconductor film and to spread an aqueous solution over the whole surface of the amorphous semiconductor film, it is desirable to deposit an oxide film by UV irradiation in an oxygen atmosphere, thermal oxidation, or treatment with ozone water containing hydroxyl radical or hydrogen peroxide.

In this embodiment mode, the amorphous semiconductor film 403 is formed over the gate insulating layer 105b, and the amorphous semiconductor film 403 is crystallized to form a crystalline semiconductor film 405. The amorphous semiconductor film 403 is formed using amorphous silicon with a reaction gas of SiH$_4$ and H$_2$. In this embodiment mode, the gate insulating layers 105a and 105b, and the amorphous semiconductor film 403 are formed continuously in the same chamber maintained in vacuum, yet at a constant temperature (330° C. in this embodiment mode) while switching the reaction gas. In this embodiment mode, after forming the gate insulating layers 105a and 105b, the reaction gas of SiH$_4$ is supplied to the chamber without generating plasma, thereby removing oxygen from the chamber. Then, the amorphous semiconductor film 403 is formed continuously. By removing the oxygen from the chamber, the oxygen concentration in the amorphous semiconductor film 403 can be set not higher than $5 \times 10^{19}$ atom/cm$^3$, or more preferably not higher than $2 \times 10^{19}$ atom/cm$^3$, thereby nickel which is added later as a metal element can be easily removed by gettering. The thickness of the amorphous semiconductor film 403 is preferably 100 to 300 nm. In this embodiment mode, the amorphous semiconductor film 403 is formed to have a thickness of 150 nm.

After removing the oxide film formed over the amorphous semiconductor film, an oxide film is formed to have a thickness of 10 to 50 Å by UV irradiation in an oxygen atmosphere, thermal oxidation, or treatment with ozone water containing hydroxyl radical or hydrogen peroxide. In this embodiment mode, Ni is used as the element for promoting crystallization. A solution containing 10 to 110 ppm (preferably, 10 to 50 ppm) by weight of the Ni elements is applied by spin coating method to form a metal film 404 (see FIG. 9A). As the element for promoting crystallization, metal elements for promoting crystallization of silicon can be employed, such as one or more of iron (Fe), nickel (Ni), cobalt (Co), ruthenium (Ru), Rhodium (Rh), palladium (Pd), osmium (Os), iridium (Ir), platinum (Pt), copper (Cu), and gold (Au) to form the metal film 404. The metal film 404 is, depending on the formation conditions thereof, extremely thin, and may not necessarily be kept in the form of a film. In order to obtain the effect of promoting crystallization, the metal film 404 is only required to be formed in contact with the amorphous semiconductor film 403.

Then, the amorphous semiconductor film 403 is heated to form a crystalline semiconductor film 405. In this case, silicide is formed in the semiconductor film of the portion in contact with the metal elements for promoting crystallization of the semiconductor film, and crystallization progresses with the silicide as a crystal nucleus. Here, after the thermal treatment for dehydrogenation, thermal treatment for crystallization (550 to 650° C. for 5 minutes to 24 hours) is performed. Alternatively, crystallization may be performed by RTA or GRTA. Here, by performing crystallization by thermal treatment without using laser irradiation, variations of crystallinity can be decreased, while variations of TFTs formed later can be suppressed.

In this embodiment mode, thermal treatment is performed at 550° C. for 4 hours; however, it may be performed at 650° C. for 6 minutes by RTA.

The crystalline semiconductor film 405 obtained in this manner may be doped with a slight amount of impurity elements (boron or phosphorus) in order to control the threshold voltage of the thin film transistor. The doping of impurity elements may be performed either to the amorphous semiconductor film either before undergoing the crystallization step or after being reduced or removed of the internal metal elements in the crystalline semiconductor film 405 by the gettering step. In this embodiment mode, boron is doped by ion doping by exciting diborane ($B_2H_6$) with plasma without being separated in mass. Note that the ion implantation for mass separation may be performed. When the impurity elements are doped in the state of the amorphous semiconductor film, the impurity elements can be activated by thermal treatment for crystallization later. In addition, defects and the like which occur in doping can be improved.

When the crystallization is performed using metal elements, a gettering step for reducing or removing the metal elements is performed. In contact with the crystalline semiconductor film 405, a semiconductor film is formed as a layer for absorbing the metal elements of the crystalline semiconductor film 405. In this embodiment mode, an amorphous semiconductor film containing impurity elements is formed as a gettering sink for trapping metal elements. First, the oxide film formed over the crystalline semiconductor film 405 is removed by washing. Then, semiconductor films 406a and 406b are formed by plasma CVD. The semiconductor film 406a is formed to have a thickness of 30 to 100 nm (typically, 40 to 60 nm) while the semiconductor film 406b is formed to have a thickness of 20 to 200 nm (typically, 50 to 150 nm). The semiconductor films 406a and 406b contain impurity elements. The impurity elements may be n-type impurity elements, p-type impurity elements, or rare gas elements such as one or more of phosphorus (P), nitrogen (N), arsenic (As), antimony (Sb), bismuth (Bi), boron (B), helium (He), neon (Ne), argon (Ar), Kr (Krypton), and Xe (Xenon). The n-type semiconductor layer containing n-type impurity elements may also be formed to contain rare gas elements such as argon. In this embodiment mode, the semiconductor films 406a and 406b contain n-type impurity elements (phosphorus in this embodiment mode), and the concentration of the impurity elements in the semiconductor film 406a is set lower than that of the semiconductor film 406b. The semiconductor films may be formed to contain the impurity elements by CVD or the like. Alternatively, after forming the semiconductor films, the impurity elements may be doped thereto by ion doping and the like.

Figure 38A:
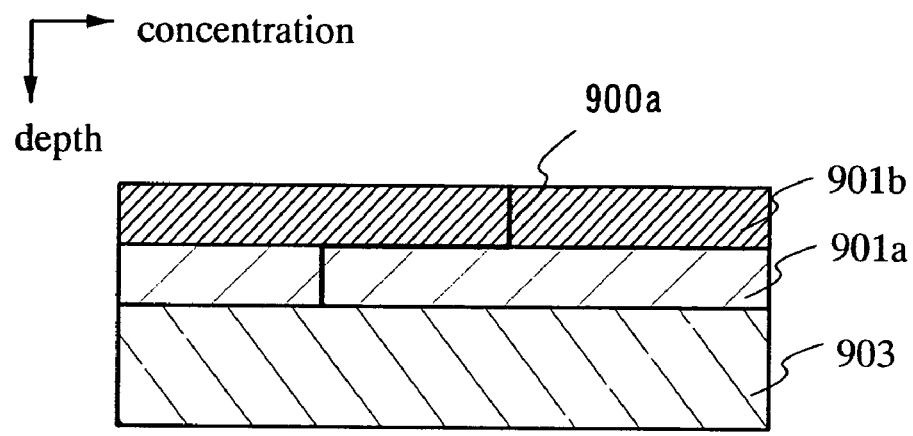
FIGS. 38A and 38B each illustrate a display device of the invention.
Figure 38B:
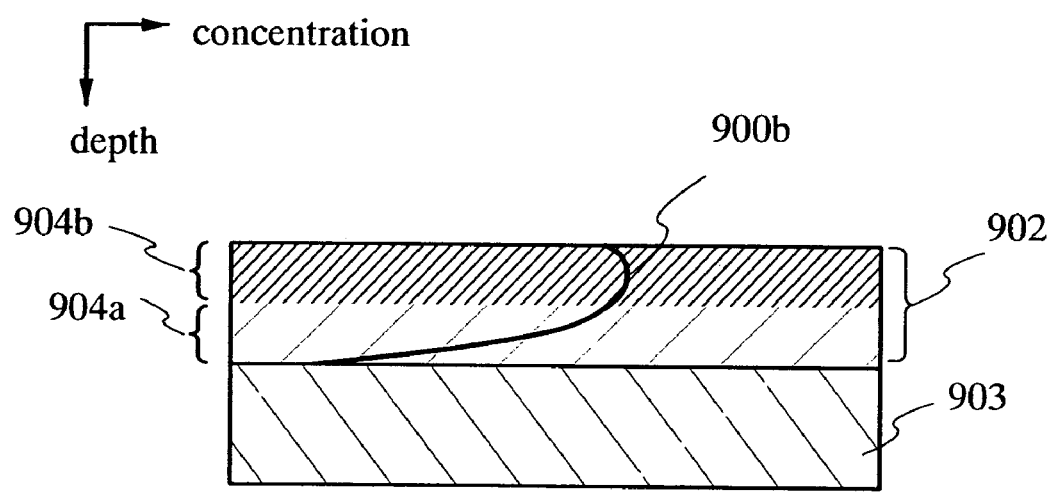

FIGS. 38A and 38B illustrate profiles of impurities in the aforementioned semiconductor films containing n-type impurity elements. FIG. 38A illustrates a profile 900a of n-type impurity elements when the semiconductor films 901a and 901b containing n-type impurity elements are formed by plasma CVD over a crystalline semiconductor film 903. The semiconductor films 901a and 901b correspond to the semiconductor films 406a and 406b respectively. The semiconductor film 901a is formed as an n-type low-concentration impurity region (also referred to as an n− region) while the semiconductor film 901b is formed as an n-type high-concentration impurity region (also referred to as an n+ region). Accordingly, the semiconductor films 901a and 901b are each dispersed with n-type impurity elements with a fixed concentration in the depth direction. The semiconductor film 901a is dispersed with n-type impurity elements at a lower concentration than the semiconductor film 901b. The semiconductor film 901b which is the n+ region functions as a source region and a drain region later while the semiconductor film 901a which is the n− region functions as an LDD (Lightly Doped Drain) region. Note that the n+ region and the n− region are formed separately; therefore, there is an interface between the regions. The thickness of the n+ region and the n− region can be controlled by controlling the thickness of the semiconductor films having the respective concentrations.

Figure 39A:
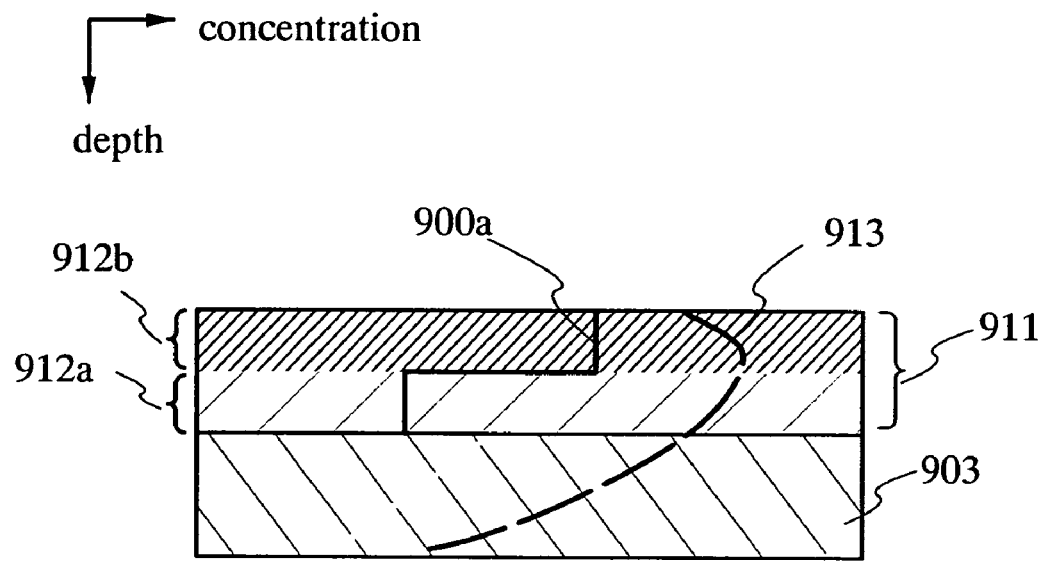
FIGS. 39A and 39B each illustrate a display device of the invention.

FIG. 39A illustrates a profile 913 of p-type impurity elements when a semiconductor film 911 is formed by doping boron as p-type impurity elements by ion doping or ion implantation into the semiconductor films 901a and 901b which are formed in FIG. 38A. The p-type impurity elements have a higher concentration than the n-type impurity elements, and the semiconductor film 911 functions as a p-type semiconductor film. In addition, since the p-type impurity elements are doped through a channel, the crystalline semiconductor film 903 is also doped. As shown in FIG. 39A, the vicinity of the surface of the semiconductor film 911 functions as a p-type impurity region (also referred to as a p+ region) 912b having a relatively high concentration of p-type impurity elements while the semiconductor film 911 of the region in the vicinity of the crystalline semiconductor film 903 has a relatively lower concentration of p-type impurity elements; thus, it functions as a p-type low-concentration impurity region (also referred to as a p− region) 912a.

On the other hand, FIG. 38B illustrates a profile 900b of n-type impurity elements when a semiconductor film 902 is formed by forming a semiconductor film in the state of any one of an amorphous semiconductor, an SAS, a micro-crystalline semiconductor, and a crystalline semiconductor, followed by doping of n-type impurity elements into the semiconductor film by ion doping or ion implantation. As shown in FIG. 38B, the semiconductor film 902 of the region in the vicinity of the surface has relatively a high concentration of n-type impurity elements. A region having a concentration of n-type impurity elements of $1\times10^{19}/cm^3$ or more is denoted by an n-type high-concentration impurity region (also referred to as an n+ region) 904b. On the other hand, the concentration of n-type impurity elements is relatively lower in the vicinity of the crystalline semiconductor film 903. A region having a concentration of n-type impurity elements of $5\times10^{17}$ to $1\times10^{19}/cm^3$ is denoted by an n-type low-concentration impurity region (also referred to as an n− region) 904a. The n+ region 904b functions as a source region and a drain region later while the n− region 904a functions as an LDD region. Note that there is no interface between the n+ region and the n− region, and the area occupied by each of the n+ region and the n− region changes depending on the relative concentration of n-type impurity elements. In this manner, the semiconductor film 902 containing n-type impurity elements formed by ion doping or ion implantation can be controlled in concentration profile according to the doping conditions; thus, each thickness of the n+ region and the n− region can be controlled appropriately. By providing the n+ region and the n− region, an effect of alleviating an electric field is increased, thereby a thin film transistor having the improved resistance to the hot-carrier degradation can be formed.

Figure 39B:
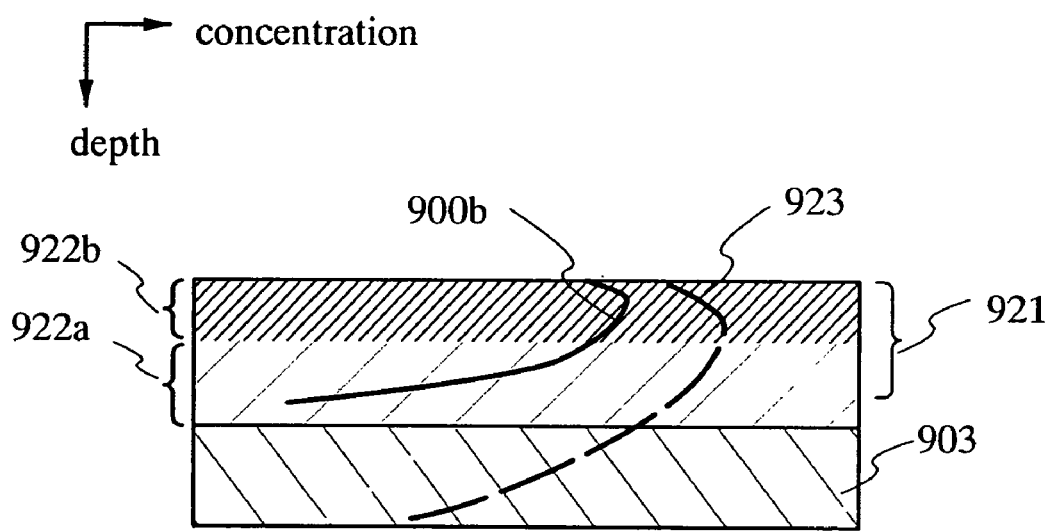

FIG. 39B illustrates a profile 923 of p-type impurity elements when a semiconductor film 921 is formed by doping boron as p-type impurity elements by ion doping or ion implantation into the semiconductor film 902 which is formed in FIG. 38B. The p-type impurity elements have a higher concentration than the n-type impurity elements, and the semiconductor film 921 functions as a p-type semiconductor film (may also be referred to as a semiconductor film having a p-type impurity region). In addition, since the p-type impurity elements are doped through a channel, the crystalline semiconductor film 903 is also doped. As shown in FIG. 39B, the semiconductor film 921 of the region in the vicinity of the surface functions as a p-type impurity region (also referred to as a p+ region) 922b having a relatively high concentration of p-type impurity elements while the semiconductor film 921 of the region in the vicinity of the crystalline semiconductor film 903 has a relatively lower concentration of p-type impurity elements; thus, it functions as a p-type low-concentration impurity region (also referred to as a p− region) 922a. According to the doping conditions for the doping step of n-type impurity elements, the concentration of impurity elements in the surface of the film might be higher in some cases. In such a case, the surface of the film may be etched thinly to remove the film having a high concentration region of impurity elements, and then a step for doping p-type impurity elements may be performed.

In this embodiment mode, n-type semiconductor films, which contain phosphorus as n-type impurity elements (donor elements), are formed by plasma CVD as the semiconductor films 406a and 406b. In addition, since the concentration of n-type impurity elements contained in the semiconductor films 406a and 406b are set different from each other, the semiconductor film 406a functions an n-type low-concentration impurity region while the semiconductor film 406b functions as an n-type high-concentration impurity region. The concentration of impurities in the n-type low-concentration impurity region can be set in the range of $1 \times 10^{17}$ to $3 \times 10^{19}/cm^3$, or more preferably $1 \times 10^{18}$ to $1 \times 10^{19}/cm^3$ while the concentration of impurities in the n-type high-concentration impurity region is preferably set 10 to 100 times as high as the n-type low-concentration impurity region, and can be set in the range of $1 \times 10^{19}$ to $3 \times 10^{21}/cm^3$. The thickness of the semiconductor film 406a which is the n-type low-concentration impurity region is set to 20 to 200 nm, and typically, 50 to 150 nm. In this embodiment mode, it is set to 50 nm. Meanwhile, the thickness of the semiconductor film 406b which is the n-type high-concentration impurity region is set to 30 to 100 nm, and typically 40 to 60 nm. In this embodiment mode, it is set to 50 nm.

Figure 9C:
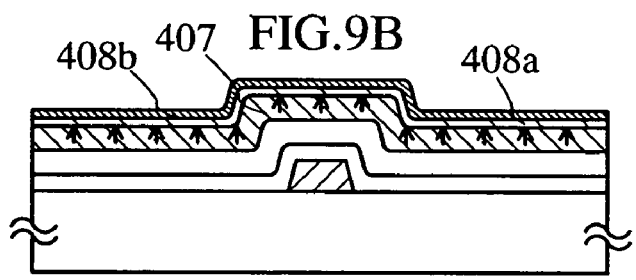

Subsequently, thermal treatment is performed to reduce or remove metal elements. The metal elements in the crystalline semiconductor film 405 moves by the thermal treatment in the direction of arrows as shown in FIG. 9C, and then trapped into the semiconductor films 406a and 406b. The crystalline semiconductor film 405 is removed of its metal elements to be a crystalline semiconductor film 407, thereby the semiconductor films 406a and 406b become semiconductor films 408a and 408b containing metal elements for promoting crystallization respectively. In this embodiment mode, the semiconductor films 408a and 408b contain n-type impurity elements and metal elements for promoting crystallization. By this step, the elements for promoting crystallization (nickel elements in this embodiment mode) contained in the crystalline semiconductor film can be set to have a concentration which does not affect the property of the device, namely the nickel concentration can be set to be not higher than $1 \times 10^{18}/cm^3$, or desirably not higher than $1 \times 10^{17}/cm^3$. In addition, the semiconductor films 408a and 408b, to which the metal elements after gettering have moved, might also be crystallized by the thermal treatment in some cases. Note that in this embodiment, the n-type impurity elements (donor elements) in the semiconductor films 408a and 408b are activated along with the gettering step. The thermal treatment may be performed under the nitrogen atmosphere. In this embodiment mode, the thermal treatment is performed at 550° C. for 4 hours; however, the thermal treatment may be performed at 650° C. for 6 minutes by RTA.

Next, the crystalline semiconductor film 407 and the semiconductor films 408a and 408b are patterned with a mask. In this embodiment mode, a photomask is manufactured, with which patterning is performed by photolithography to form a semiconductor layer 107, and n-type semiconductor layers 109 and 111 (see FIGS. 4A to 4C). Similarly, a semiconductor layer 106, and n-type semiconductor layers 108 and 110 are formed. The photomask may be formed similarly to the case of forming the mask 102a, in which the whole surface is coated with a resist by spin coating or the like, or selectively formed by a droplet discharge method, followed by laser beam exposure to obtain a mask with a fine pattern. Using the mask having a fine pattern, the semiconductor films can be patterned finely and precisely into a desired shape.

In the case of forming the semiconductor lasers by selectively discharging compositions without exposing a mask to light, a resin material can be used, such as an epoxy resin, an acrylic resin, a phenol resin, a novolac resin, an acrylic resin, a melamine resin, and an urethane resin. Alternatively, the pattern is formed by a droplet discharging method using an organic material (e.g., benzocyclobutene, parylene, flare, or permeable polyimide), a compound material formed by polymerization of siloxane polymers or the like, a composition material containing water-soluble homopolymers and water-soluble copolymers, or the like. In either case, the surface tension and viscosity are appropriately controlled by controlling the concentration of a solvent or adding a surface-active agent and the like.

The etching process for patterning may be performed either by plasma etching (dry etching) or wet etching; however, plasma etching is preferable for processing a large substrate. As the etching gas, a fluorine source gas such as $CF_4$, $NF_3$, $SF_6$, and $CHF_3$, a chlorine source gas such as $Cl_2$, $BCl_3$, $SiCl_4$, and $CCl_4$, or an $O_2$ gas is employed, which may be appropriately added with an inert gas such as He and Ar. Alternatively, electric discharge machining may be performed locally if the etching process is performed using atmospheric pressure discharge, in which case a mask layer is not required to be formed over the whole surface.

By discharging compositions containing a conductive material, source or drain (referred to as source/drain) electrode layers 112, 113, 114, and 115 are formed. Using as masks the source/drain electrode layers 112, 113, 114, and 115, the semiconductor layer 106, the n-type semiconductor layers 108 and 110, the semiconductor layer 107, the n-type semiconductor layers 109 and 111 are patterned, thereby a semiconductor layer 146, n-type semiconductor layers 148a, 148b, 150a, and 150b, a semiconductor layer 147, and n-type semiconductor layers 149a, 149b, 151a, and 151b are formed (see FIGS. 5A to 5C). The source/drain electrode layers 112, 113, 114, and 115 can be formed similarly to the aforementioned gate electrode layers 103 and 104. The source/drain electrode layers 112, and 114 also function as wiring layers.

As the conductive material for forming the source/drain electrode layers, a composition containing metal particles such as Ag (silver), Au (gold), Cu (copper), W (tungsten), and Al (aluminum) as its main component may be employed. Further, light-transmissive indium tin oxide (ITO), indium tin oxide containing silicon oxide (ITSO), organic indium, organotin, zinc oxide, titanium nitride, and the like may be combined.

Figure 7A:
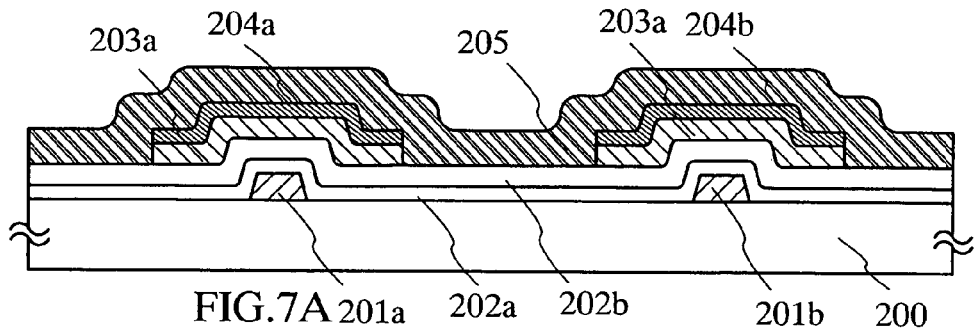
FIGS. 7A to 7D illustrate a manufacturing method of a display device of the invention.

A method for forming the source/drain electrode layers will be described with reference to FIGS. 7A to 7D and 8A to 8D. The source/drain electrode layers 112, 113, 114, and 115 are formed with fine patterns, and are thus required to be formed with high controllability, which may otherwise cause manufacturing defects such as a short circuit. Accordingly, the fine patterning on the semiconductor layer is performed by fine processing with a laser beam. As shown in FIG. 7A, over a substrate 200, gate electrode layers 201a and 201b, gate insulating layers 202a and 202b, semiconductor layers 203a and 203b, and n-type semiconductor layers 204a and 204b are formed, the whole surface of which is covered with a conductive film 205. The conductive film 205 can be formed by vapor deposition, CVD, sputtering, and the like. After that, a resist mask 230 is formed.

Figure 7B:
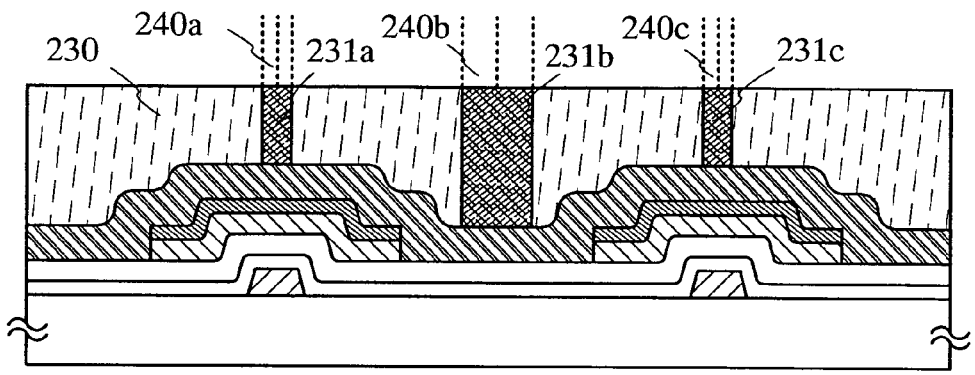
Figure 7C:
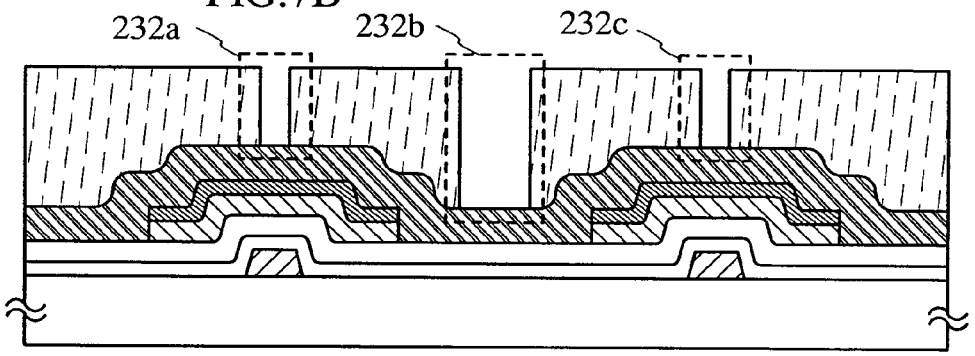
Figure 7D:
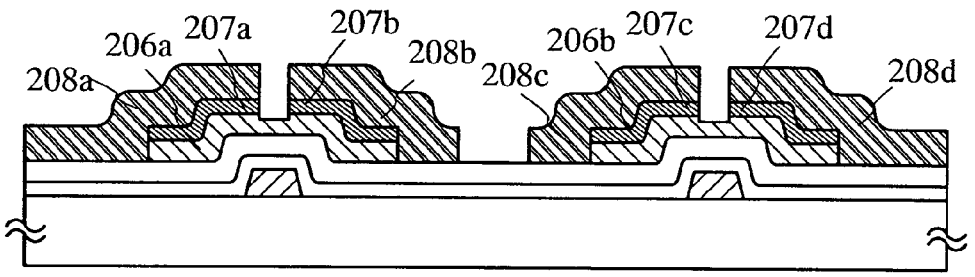
Figure 8A:
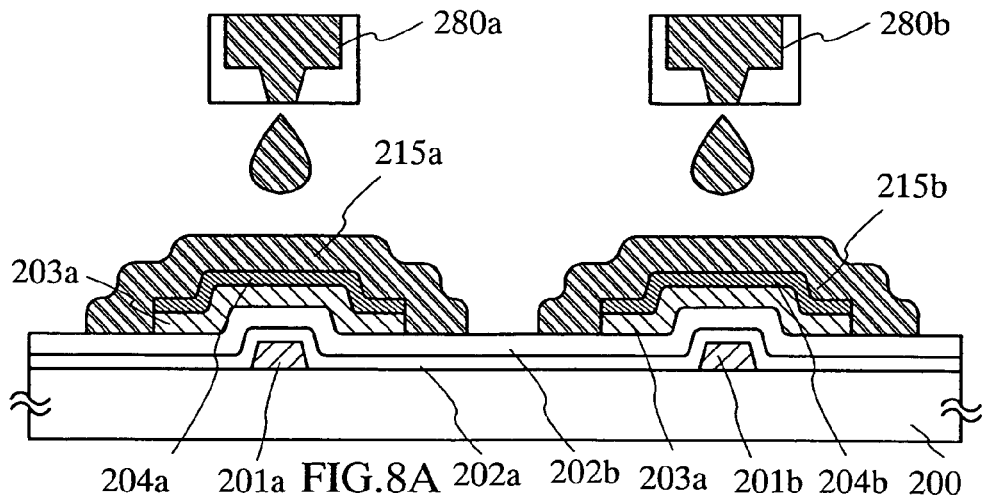
FIGS. 8A to 8D illustrate a manufacturing method of a display device of the invention.
Figure 8B:
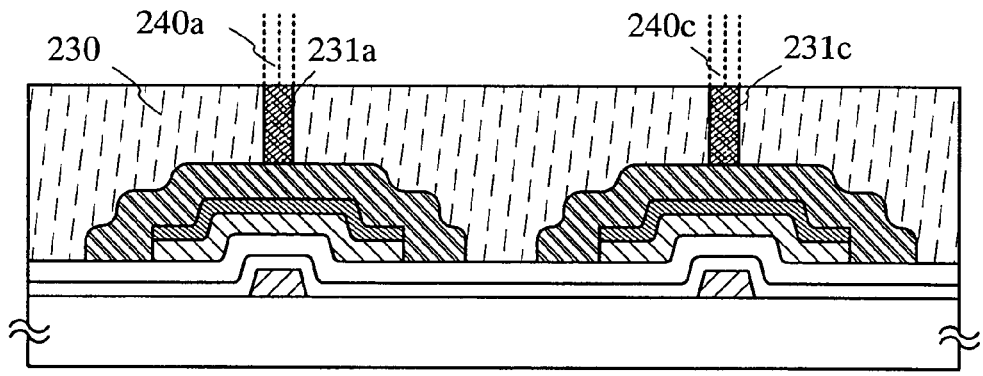
Figure 8C:
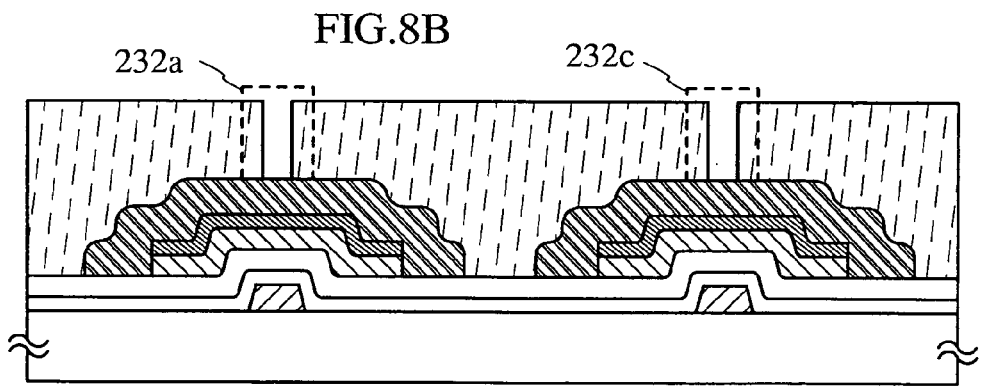
Figure 8D:
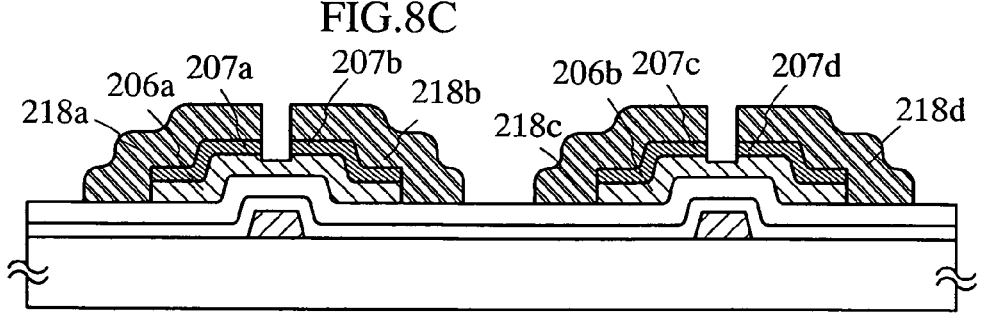

The resist mask 230 is irradiated with and exposed to laser beams 240a, 240b, and 240c, thereby regions 231a, 231b, and 231c are sensitized (see FIG. 7B). In this embodiment mode, a positive photosensitive resin is used; therefore, the regions 231a, 231b, and 231c which are exposed to light are removed by etchant, thereby openings 232a, 232b, and 232c are formed (see FIG. 7C). By patterning the conductive film 205 by etching with the mask having the openings 232a, 232b, and 232c, source/drain electrode layers 208a, 208b, 208c, and 208d are formed. By using as masks the source/drain electrode layers 208a, 208b, 208c, and 208d, the semiconductor layers 203a and 203b, the n-type semiconductor layers 204a and 204b are etched, thereby semiconductor layers 206a and 206b, and n-type semiconductor layers 207a, 207b, 207c, and 207d can be formed (see FIG. 7D). In this manner, by forming a mask by fine processing with a laser beam, and patterning a conductive film with the mask, the conductive film can be patterned precisely with high controllability, thereby a source electrode layer or a drain electrode layer can be formed into a desired shape. Accordingly, no manufacturing defects occur, and the reliability of the thin film transistor can thus be improved.

Similarly to FIGS. 7A to 7D, FIGS. 8A to 8D illustrate a patterning method of a conductive film through exposure steps using a laser beam, in which the conductive film 205 is not formed over the whole surface unlike FIGS. 7A to 7D, but selectively formed by a droplet discharge method. After forming a semiconductor layer as in FIG. 7A, conductive films 215a and 215b are selectively formed using droplet discharge systems 280a and 280b respectively (see FIG. 8A). After that, the resist is exposed to a laser beam similarly to FIG. 7B to 7D, thereby a fine mask is formed. By using the mask, the conductive films 215a and 215b over a semiconductor channel formation region are finely patterned. In FIGS. 8A to 8D, the conductive films 215a and 215b are formed selectively by the droplet discharge method so as not to be in contact with each other; therefore, the opening 232b is not required to be formed unlike FIGS. 7A to 7D. In addition, since patterning by etching is not performed, obtained source/drain electrode layers 218a, 218b, 218c, and 218d have roundish end portions with curvature radii. Accordingly, the use of the droplet discharge method can reduce waste of materials, and simplify the manufacturing steps; thus, such advantage is provided that the cost is reduced while the productivity is increased.

Even after the source/drain electrode layers 112, 113, 114, and 115 are formed, a planarizing step may be performed by pressing and the like in the same as the gate electrode layer 103. Alternatively, if a pressing step is performed after discharging a source/drain electrode layer by a droplet discharge method, and prebaking it before baking completely, an advantageous effect can be obtained such that the electric resistance is decreased along with the decrease of oxygen concentration since the oxygen contained in the electrode layer is released, as well as the electrode layer is planarized.

Figure 6A:
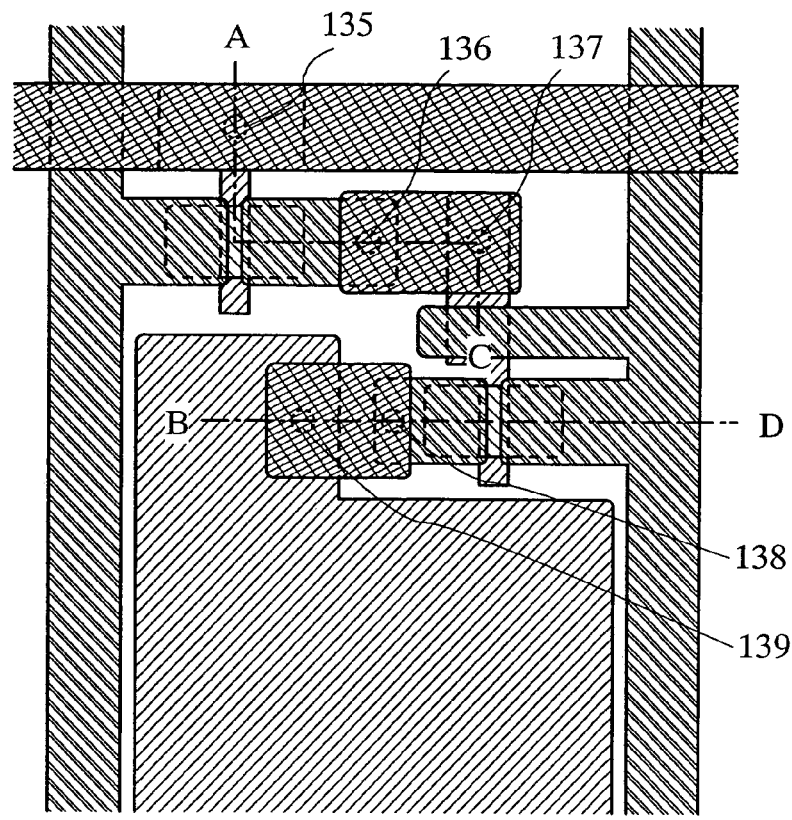
FIGS. 6A to 6C illustrate a manufacturing method of a display device of the invention.
Figure 6B:
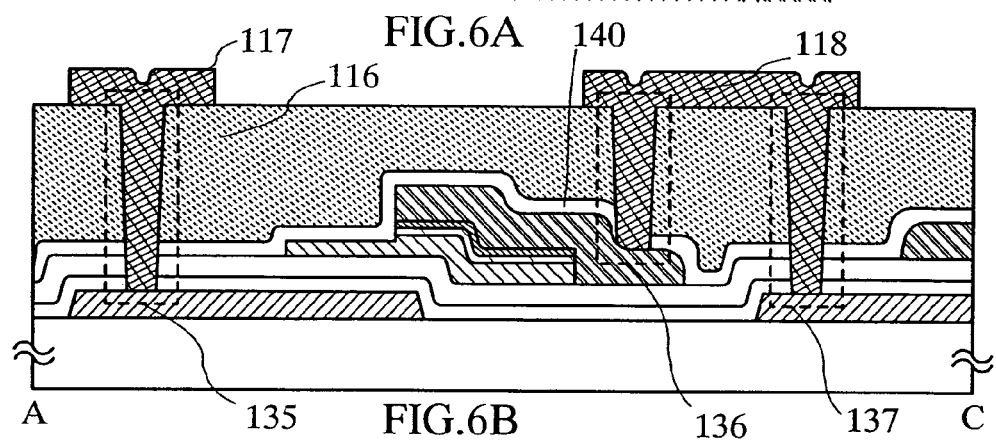
Figure 6C:
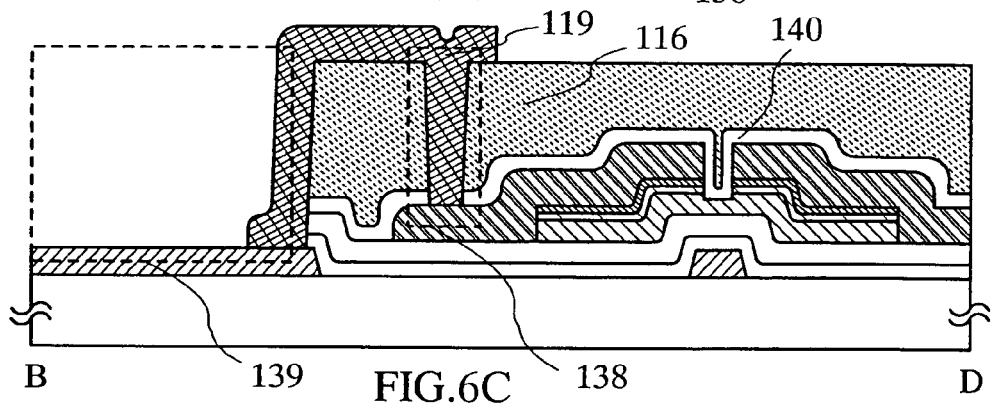

As shown in FIGS. 6A to 6C, an insulating film 140 to serve as a passivation film is preferably formed so as to cover a source/drain electrode layer, a semiconductor layer, a gate electrode layer, and a gate insulating layer. The insulating film 140 is formed by a thin film formation method such as plasma CVD and sputtering, and can be formed using silicon nitride, silicon oxide, silicon nitride oxide, silicon oxynitride, aluminum oxynitride, aluminum oxide, diamond-like carbon (DLC), carbon containing nitrogen (CN), or other insulating materials. Note that the passivation film may have either a single-layer structure or a stacked-layer structure. Here, in view of the interfacial property of the semiconductor layers 146 and 147, the stacked-layer structure is preferably employed, in which a silicon oxide film or a silicon oxynitride film is formed first, and a silicon nitride film or a silicon nitride oxide film is formed thereon so as to prevent diffusion of external impurities into the semiconductor elements. In this embodiment mode, the insulating film 140 is formed in stacked layers in such a manner that a silicon oxide film is formed first with a thickness of 150 nm so as to be in contact with the semiconductor layers 146 and 147, and then a silicon nitride film is formed continuously with a thickness of 200 nm by switching the gas in the same chamber.

After that, the semiconductor layers 146 and 147 are preferably heated in a hydrogen atmosphere or a nitrogen atmosphere to be hydrogenated. Note that in the case of heating the semiconductor layers 146 and 147 in a nitrogen atmosphere, an insulating film containing hydrogen is preferably formed as the insulating film 140.

Then, an insulating layer 116 is formed. In this embodiment mode, the insulating layer 116 is formed over the whole surface, and patterned then by etching using a resist mask and the like. In the case where the insulating layer 116 can be formed by a droplet discharge method or a printing method capable of directly selective deposition, the patterning by etching is not necessarily required. In this embodiment mode, after providing the insulating layer 116 as an interlayer insulating layer, a second insulating layer functioning as a bank is provided thereover. In this case, the insulating layer 116 may be called a first insulating layer.

The insulating layer 116 can be formed using an inorganic insulating material such as silicon oxide, silicon nitride, silicon oxynitride, aluminum oxide, aluminum nitride, aluminum oxynitride, diamond-like carbon (DLC), and a carbon film containing nitrogen (CN), an organic insulating material such as acrylic acid, methacrylic acid, derivatives thereof, polyimide, aromatic polyamide, polybenzimidazole, benzocyclobutene, and polysilazane, an insulating material such as inorganic siloxane as a compound of silicon, oxygen, and hydrogen, which is formed of a siloxane material as a starting material and has a Si—O—Si bond, or organic siloxane, the hydrogen on silicon of which is substituted with an organic group such as methyl and phenyl. Alternatively, a photosensitive or non-photosensitive material such as acrylic and polyimide may be used.

In this embodiment mode, the insulating layer 116 may be formed using a siloxane resin. Note that the siloxane resin corresponds to a resin having a Si—O—Si bond. Siloxane is composed of a skeleton formed by the bond of silicon (Si) and oxygen (O), which includes an organic group containing at least hydrogen (e.g., alkyl group or aromatic hydrocarbon) as a substituent. Alternatively, a fluoro group may be used as the substituent. Further alternatively, both the fluoro group and the organic group containing at least hydrogen may be used as the substituent.

In the insulating film 140 and the insulating layer 116, an opening 136 is formed to reach the source/drain electrode layer 113, and also an opening 138 is formed to reach the source/drain electrode layer 115. Meanwhile, in the gate insulating layers 105a and 105b, the insulating film 140, and the insulating layer 116, an opening 139 is formed to reach the first electrode layer 120, an opening 135 is formed to reach the gate electrode layer 103, and also an opening 137 is formed to reach the gate electrode layer 104. The openings are also formed by etching with a resist mask. The mask used for patterning can have a fine shape by being exposed to a laser beam. A wiring layer 119 is then formed in the openings 138 and 139 formed in the aforementioned manner so as to electrically connect the source/drain electrode layer 115 to the first electrode layer 120. A wiring layer 118 is formed in the openings 136 and 137 so as to electrically connect the source/drain electrode layer 113 to the gate electrode layer 104. In addition, a gate wiring layer 117 is formed in the opening 135 so as to be electrically connected to the gate electrode layer 103. By forming the gate wiring layer 117 using a low-resistant material, high-speed operation is enabled even when the gate electrode layer 103 is formed of a relatively high-resistant material, thereby a large current can be flown.

According to the aforementioned steps, a TFT substrate for a display panel is completed, in which a bottom-gate (also called an inversely staggered) thin film transistor and a pixel electrode are connected to each other over the substrate 100. The thin film transistor in this embodiment mode is a channel-etch type thin film transistor.

Subsequently, an insulating layer 121 (also called a bank or a partition wall) is selectively formed (see FIGS. 1A and 1B). The insulating layer 121 is formed covering the wiring layer 119 so as to have an opening on the first electrode layer 120. In this embodiment mode, the insulating layer 121 is formed over the whole surface, and patterned then by etching with a resist mask and the like. In the case of forming the insulating layer 121 by a droplet discharge method or a printing method capable of directly selective deposition, the patterning by etching is not necessarily required. The insulating layer 121 can also be formed into a desired shape by the pre-treatment of the invention.

The insulating layer 121 can be formed using an inorganic insulating material such as silicon oxide, silicon nitride, silicon oxynitride, aluminum oxide, aluminum nitride, and aluminum oxynitride, heat-resistant polymers such as acrylic acid, methacrylic acid, derivatives thereof, polyimide, aromatic polyamide, and polybenzimidazole, an insulating material such as inorganic siloxane as a compound of silicon, oxygen, and hydrogen, which is formed of a siloxane material as a starting material and has a Si—O—Si bond, or organic siloxane, the hydrogen on silicon of which is substituted with an organic group such as methyl and phenyl. Alternatively, a photosensitive or non-photosensitive material such as acrylic and polyimide may be used. The insulating layer 121 is preferably formed to have a shape with a continuously variable curvature radius, which can improve the coverage of an electroluminescent layer 122 and a second electrode layer 123 formed later.

In addition, after forming the insulating layer 121 by discharging compositions by the droplet discharge method, the surface thereof may be planarized by applying pressure in order to increase the planarity. As the method for applying pressure, the surface of the film may be scanned with a roller so as to level the irregularity, or the surface thereof may be pressed perpendicularly with a flat plate. Alternatively, the surface of the film may be softened or melted with a solvent and the like, and then the irregularity of the surface may be removed with an air knife. In addition, the surface thereof may be polished by CMP. Such steps may be performed in order to planarize the surface in the case where irregularity occurs due to the droplet discharge method. When the planarity is improved by such steps, display unevenness of a display panel can be prevented and high-resolution images can be displayed.

Figure 1B:
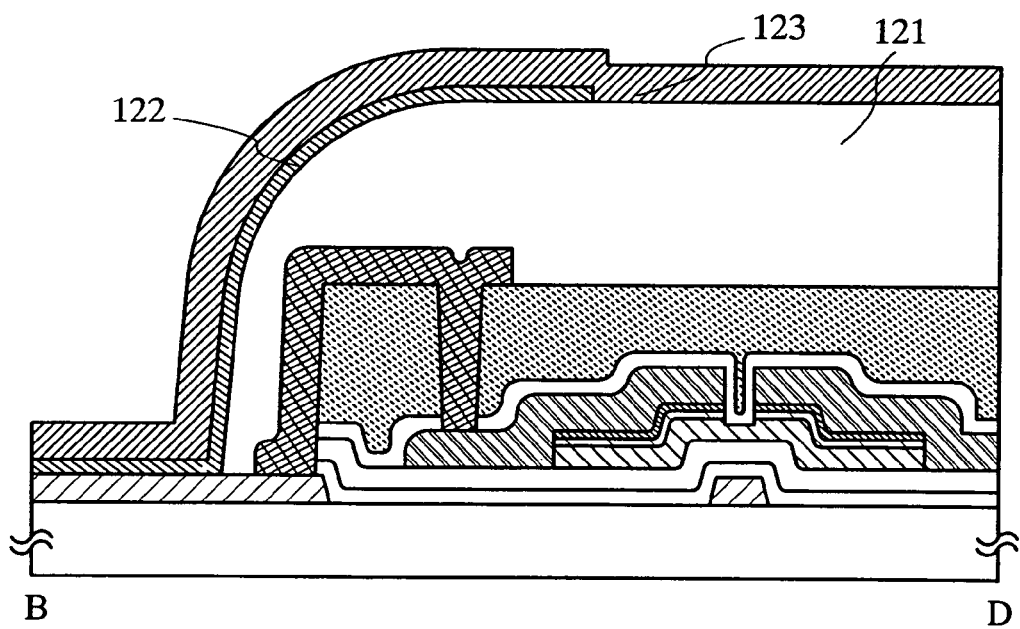
Figure 2A:
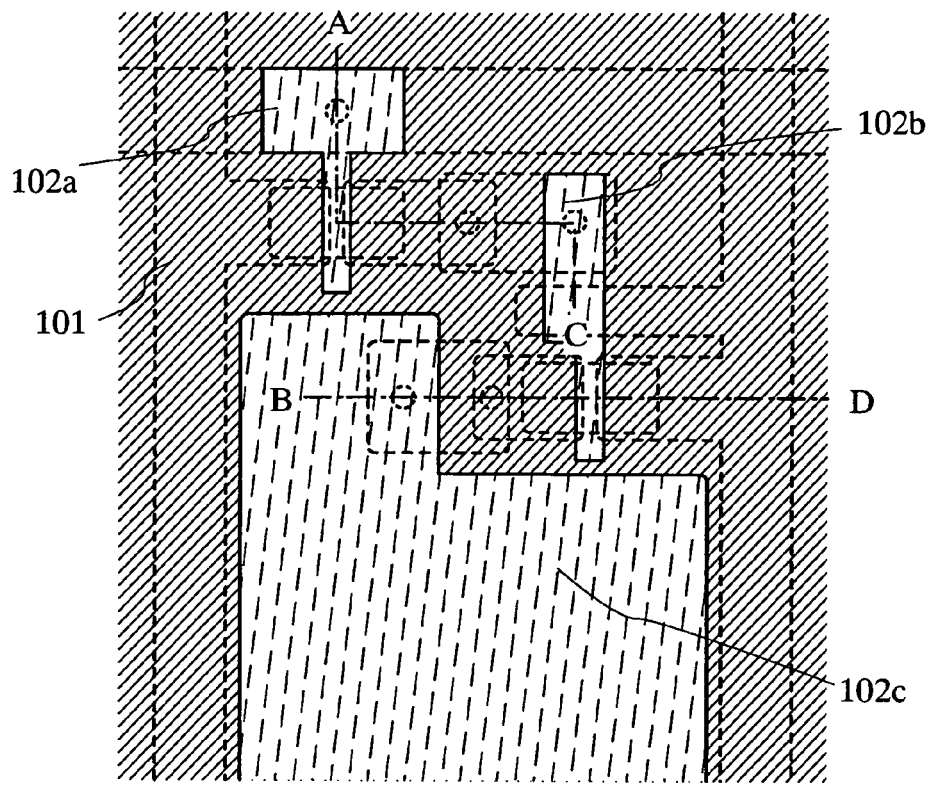
FIGS. 2A to 2C illustrate a manufacturing method of a display device of the invention.
Figure 2B:
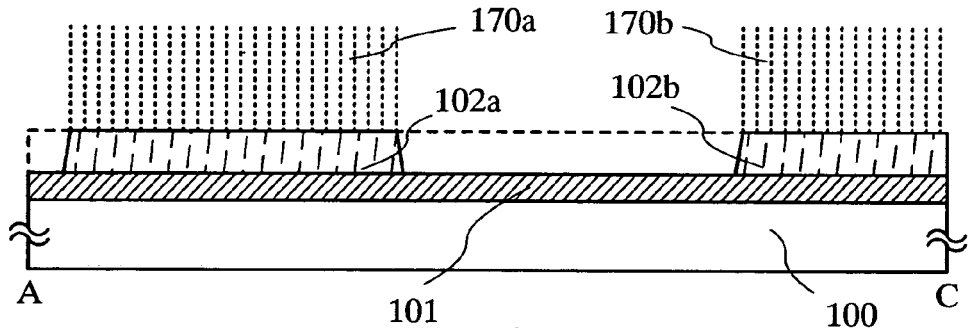
Figure 2C:
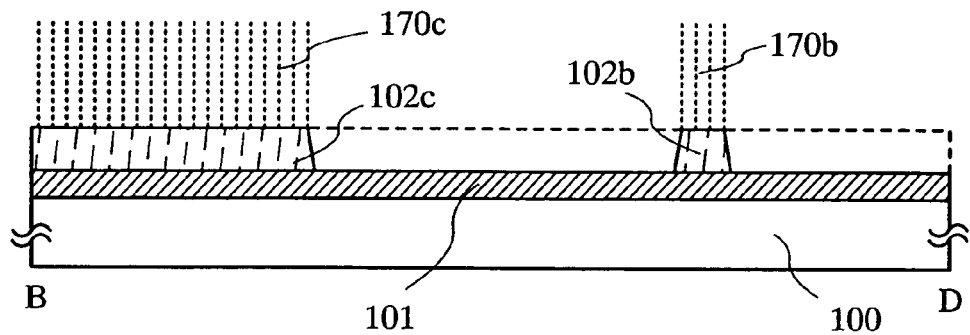

A light-emitting element is formed so as to be electrically connected to the thin film transistor (see FIGS. 1A and 1B).

Before forming the electroluminescent layer 122, thermal treatment is performed at 200° C. in the atmospheric pressure so as to remove the moisture absorbed inside or in the surface of the first electrode layer 120 and the insulating layer 121. In addition, thermal treatment is preferably performed under the low pressure at 200 to 400° C., or more preferably 250 to 350° C., followed by the formation of the electroluminescent layer 122 by vacuum deposition or a droplet discharge method under the reduced pressure without being exposed to the atmosphere.

As the electroluminescent layer 122, materials for red (R), green (G), and blue (B) light emission are selectively formed by vapor deposition using an evaporation mask and the like. The materials for red (R), green (G), and blue (B) light emission can also be formed by the droplet discharge method (using a low molecular weight or high molecular weight organic material (referred to as polymer) and the like) similarly to a color filter, which is preferable as the RGB materials can be selectively deposited without the use of a mask. By stacking the second electrode layer 123 over the electroluminescent layer 122, a display device having a display function using light-emitting elements can be completed.

Though not shown, it is effective to provide a passivation film so as to cover the second electrode layer 123. The passivation film provided for constructing the display device may have either a single-layer structure or a multi-layer structure. The passivation film may be formed of an insulating film such as a silicon nitride (SiN) film, a silicon oxide ($SiO_2$) film, a silicon oxynitride (SiON) film, a silicon nitride oxide (SiNO) film, an aluminum nitride (AlN) film, an aluminum oxynitride (AlON) film, an aluminum nitride oxide (AlNO) film which contains nitrogen in larger quantities than oxygen, an aluminum oxide film, a diamond-like carbon (DLC) film, and a carbon film containing nitrogen ($CN_X$), which may be formed either in a single layer or stacked layers. For example, the passivation film may be formed by stacking a carbon film containing nitrogen ($CN_X$) film and a silicon nitride (SiN) film. Alternatively, a high molecular weight organic material such as a styrene polymer, or a siloxane resin may be used.

In this case, a film having an excellent coverage is preferably used. In particular, a carbon film such as a DLC film can be effectively utilized. The DLC film can be formed at a temperature ranging from the room temperature up to 100° C.; therefore, it can be formed easily even over a low heat-resistant electroluminescent layer. The DLC film can be formed by plasma CVD (typically, RF plasma CVD, microwave CVD, electron cyclotron resonance (ECR) CVD, hot-filament CVD, and the like), combustion, sputtering, ion beam deposition, laser deposition, and the like. As the reaction gas used for the film deposition, a hydrogen source gas, a hydrocarbon source gas (e.g., $CH_4$, $C_2H_2$, or $C_6H_6$) is used, which is ionized by glow discharge, thereby the ions collide against a negative-biased cathode to form a film. In addition, the CN film may be formed using a reaction gas such as a $C_2H_4$ gas and an $N_2$ gas. The DLC film has a high blocking property against oxygen, and can control the oxidation of the electroluminescent layer. Accordingly, such problem can be prevented that the electroluminescent layer is oxidized during a subsequent sealing step.

Subsequently, a sealant is formed, with which the substrate and a sealing substrate are sealed. Then, a gate wiring layer which is formed to be electrically connected to the gate electrode layer 103 may be connected to a flexible wiring substrate to be connected to the outside. The same can be applied to a source wiring which is formed to be electrically connected to the source/drain electrode layer 112 or 114.

Subsequently, a wiring board for connection is provided so as to be electrically connected to a wiring layer in the display device via an anisotropic conductive layer. The wiring board functions to transmit external signals or potentials, and it may be an FPC (Flexible Printed Circuit) and the like. Through the aforementioned steps, a display panel including a channel-etch type switching TFT, a channel-etch type driving TFT, and a capacitor is completed. The capacitor is formed to have the source/drain electrode layer 114, the gate insulating layers 105a and 105b, and the gate electrode layer 104.

The wiring layer in the display device and the FPC are connected by using a terminal electrode layer. The terminal electrode layer can be formed using any of the same material and steps as the gate electrode layer, the source wiring layer which combines the source electrode layer and the drain electrode layer, and the gate wiring layer. A connection example of an FPC and a wiring layer in a display device will be described with reference to FIGS. 43A(1) to 43C(2).

In FIGS. 43A(1) to 43C(2), a thin film transistor 9 and a first electrode layer 6 provided with a light-emitting element are formed over a substrate 1, which is stuck to a counter substrate 8 with a sealant 3. Wiring layers formed outside of the sealant extending from inside of the display device are stuck to FPCs 2b and 2a via anisotropic conductive films 7a and 7b respectively.

FIGS. 43A(1), 43B(1), and 43C(1) are top views of a display device while FIGS. 43A(2), 43B(2), and 43C(2) are cross-sectional views of FIGS. 43A(1), 43B(1), and 43C(1) respectively along lines O-P and R-Q. In FIGS. 43A(1) and 43A(2), terminal electrode layers 5a and 5b are formed using the same material and steps as the gate electrode layer. The terminal electrode layer 5a is connected to a source wiring layer 4a which is formed extending to the outside of the sealant, and the terminal electrode layer 5a and the FPC 2a are connected via the anisotropic conductive film 7a. On the other hand, the terminal electrode layer 5b is connected to a gate wiring layer 4b which is formed extending to the outside of the sealant, and the terminal electrode layer 5b and the FPC 2b are connected via the anisotropic conductive film 7b.

In FIGS. 43B(1) and 43B(2), terminal electrode layers 55a and 55b are formed using the same material and steps as the source wiring layer. The terminal electrode layer 55a is formed of a source wiring layer which is formed extending to the outside of the sealant, and the terminal electrode layer 55a and the FPC 2a are connected via the anisotropic conductive film 7a. On the other hand, the terminal electrode layer 55b is connected to a gate wiring layer 54b which is formed extending to the outside of the sealant, and the terminal electrode layer 55b and the FPC 2b are connected via the anisotropic conductive film 7b.

In FIGS. 43C(1) and C(2), terminal electrode layers 64a and 64b are formed using the same material and steps as the gate wiring layer. A source wiring layer 65a formed extending to the outside of the sealant is connected to the terminal electrode layer 64a, and the terminal electrode layer 64a and the FPC 2a are connected via the anisotropic conductive film 7a. On the other hand, the terminal electrode layer 64b is formed of a gate wiring layer which is formed extending to the outside of the sealant, and the terminal electrode layer 64b and the FPC 2b are connected via the anisotropic conductive film 7b.

In this embodiment mode, the switching TFT has a single-gate structure; however, it may have a multi-gate structure such as a double-gate structure.

Through the aforementioned steps, an inversely staggered thin film transistor having a crystalline semiconductor film can be formed. The thin film transistor in this embodiment mode is formed using a crystalline semiconductor film; therefore, it exhibits higher mobility (about 2 to 50 cm$^2$/Vsec) as compared to a thin film transistor formed using an amorphous semiconductor film. The source region and the drain region contain metal elements having a function to promote crystallization in addition to the impurity elements having one conductivity type. Therefore, the source region and the drain region having low resistivity can be formed. As a result, a display device capable of high-speed operation can be manufactured.

In addition, in comparison with a thin film transistor formed using an amorphous semiconductor film, variations of threshold voltage are unlikely to occur, resulting in the decrease in variations of the thin film transistor characteristics.

Further, since metal elements which are mixed into the semiconductor film during the film deposition are removed by the gettering step, off current can be decreased. Therefore, by providing such a TFT as the switching element of a display device, image contrast can be enhanced.

In addition, by the fine processing with laser irradiation, thinner wirings and the like can be designed freely. According to the invention, desired patterns can be formed with high controllability, and waste of materials can be reduced, resulting in cost saving. Thus, a high-performance and highly reliable display device can be manufactured with high yield.

Embodiment Mode 2

One embodiment mode of the invention will be described with reference to FIGS. 10A to 10F. This embodiment mode is different from Embodiment 1 in the gettering steps of a crystalline semiconductor film. Therefore, common portions or portions having a common function will be described in no more detail.

Over a substrate 400, a gate electrode layer 401 is formed, which is covered with gate insulating layers 402a and 402b. Over the gate insulating layer 402b, an amorphous semiconductor film 403 and a metal film 404 are formed (see FIG. 10A). Then, the amorphous semiconductor film 403 is crystallized by thermal treatment to obtain a crystalline semiconductor film 405 (see FIG. 10B).

In this embodiment mode, a semiconductor layer 421 containing rare gas elements as impurity elements is formed as a gettering layer for gettering metal elements for promoting crystallization, which are contained in the crystalline semiconductor film 405. The rare gas elements may be helium, argon, xenon, krypton, and the like. In this embodiment mode, a semiconductor film containing argon as impurity elements is formed. Then, the metal elements contained in the crystalline semiconductor film 405 travel in the direction of arrows in FIG. 10C by thermal treatment, and trapped into a semiconductor film 422. Thus, a crystalline semiconductor film 423 containing a reduced amount of metal elements is formed. Then, the semiconductor film 422 as a gettering sink, and an oxide film formed over the semiconductor film 422 are removed using hydrofluoric acid and the like, thereby the crystalline semiconductor film 423 containing a reduced amount of or removed metal elements can be obtained. In this embodiment mode, the semiconductor film 422 as a gettering sink is removed using TMAH (Tetramethyl ammonium hydroxide). Over the crystalline semiconductor film 423, a semiconductor film 424 having one conductivity type is formed as shown in FIG. 10D, which is patterned to form source/drain electrode layers 425a and 425b (see FIG. 10E). In this embodiment mode, an n-type semiconductor film containing P as n-type impurity elements is formed as the semiconductor film 424 having one conductivity type.

Figure 10A:
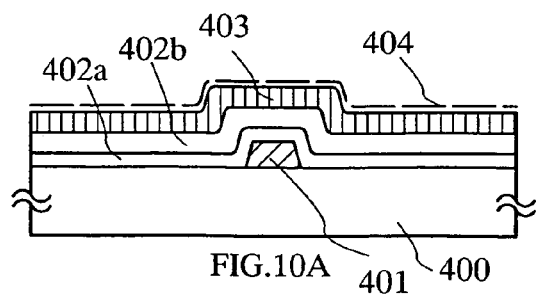
FIGS. 10A to 10F illustrate a manufacturing method of a display device of the invention.
Figure 10B:
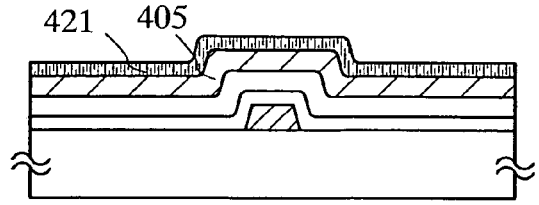
Figure 10C:
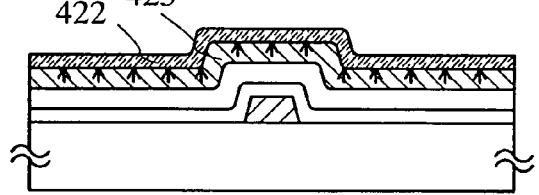
Figure 10D:
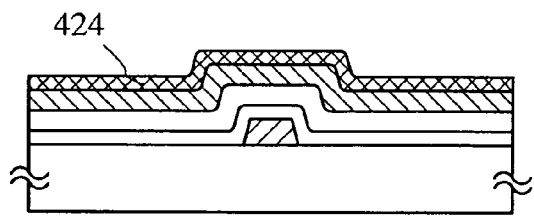
Figure 10E:
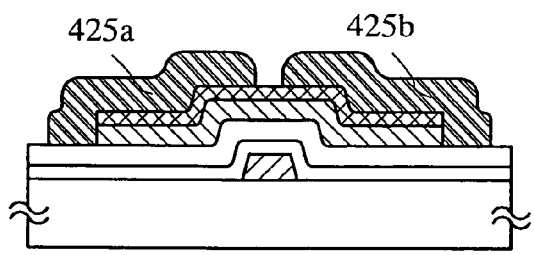
Figure 10F:
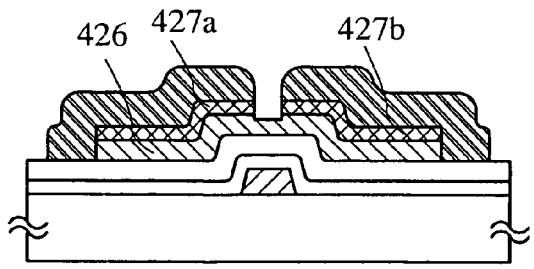

By using the source/drain electrode layers 425a and 425b as masks, the n-type semiconductor film and the crystalline semiconductor film are etched, thereby a semiconductor layer 426, and n-type semiconductor layers 427a and 427b functioning as a source region or a drain region are formed (see FIG. 10F).

Through the aforementioned steps, the crystalline semiconductor film crystallized with metal elements is gettered; thus, a thin film transistor can be formed, which has a semiconductor layer containing a reduced amount of metal elements, yet does not contain metal elements in the semiconductor layer having one conductivity type which function as a source region or a drain region.

The thin film transistor described in Embodiment Mode 1 with reference to FIGS. 9A to 9E or in this embodiment mode with reference to FIGS. 10A to 10F is one thin film transistor having one conductivity type; however, two or more thin film transistors can be manufactured through the same steps. For example, when forming a plurality of n-channel thin film transistors and electrically connecting them, an NMOS circuit can be constructed. Similarly, when forming a plurality of p-channel thin film transistors and electrically connecting them, a PMOS circuit can be constructed. In addition, a CMOS structure can be constructed, in which an n-channel thin film transistor and a p-channel thin film transistor are electrically connected to each other. By incorporating such NMOS, PMOS, or CMOS circuit into a pixel region or a driver region, a display device can be manufactured.

This embodiment mode can be implemented in combination with Embodiment Mode 1.

Embodiment Mode 3

One embodiment mode of the invention will be described with reference to FIGS. 11A to 11D. This embodiment mode is an example in which two kinds of thin film transistors: an n-channel thin film transistor and a p-channel thin film transistor are manufactured. Therefore, common portions or portions having a common function will be described in no more detail.

Over a substrate 430, gate electrode layers 431a and 431b, and gate insulating layers 433a and 433b are formed. Over the gate insulating layer 433b, an amorphous semiconductor film is formed, to which metal elements are doped. Then, the amorphous semiconductor is crystallized by thermal treatment to obtain a crystalline semiconductor film. Over the crystalline semiconductor film, an n-type semiconductor film 435 is formed and heated (see FIG. 11A).

By the thermal treatment, metal elements contained in the crystalline semiconductor film are gettered, which travel in the direction of arrows to be trapped into the n-type semiconductor film 435. Thus, a crystalline semiconductor film 434 is formed. The crystalline semiconductor film 434 and the n-type semiconductor film 435 are patterned, thereby semiconductor layers 436a and 436b, and an n-type semiconductor layer 437 are formed. Then, a mask 438a for covering the semiconductor layer 436a and the n-type semiconductor layer 437, and a mask 438b for covering an n-type semiconductor layer 444 over a channel formation region of the semiconductor layer 436b are formed. Then, p-type impurity elements 439 are doped into the n-type semiconductor layer. The n-type semiconductor layer can be, when p-type impurity elements are doped thereto at a concentration of 2 to 10 times as high as the n-type impurity elements, inverted into a p-type semiconductor layer in terms of the conductivity type, thereby p-type impurity regions 445a and 445b can be formed (see FIG. 11B).

Figure 11A:
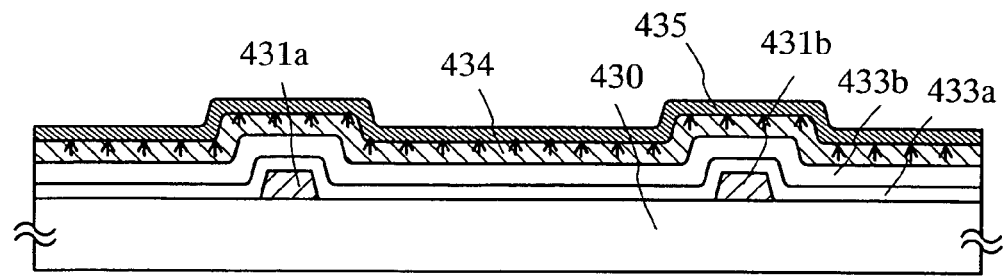
FIGS. 11A to 11D illustrate a manufacturing method of a display device of the invention.
Figure 11B:
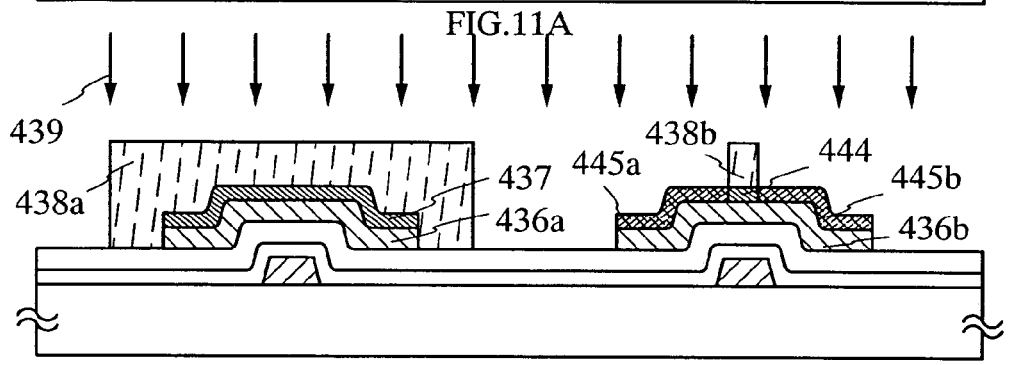
Figure 11C:
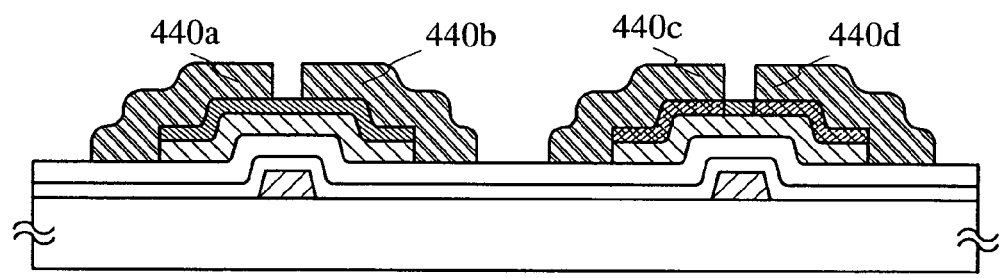
Figure 11D:
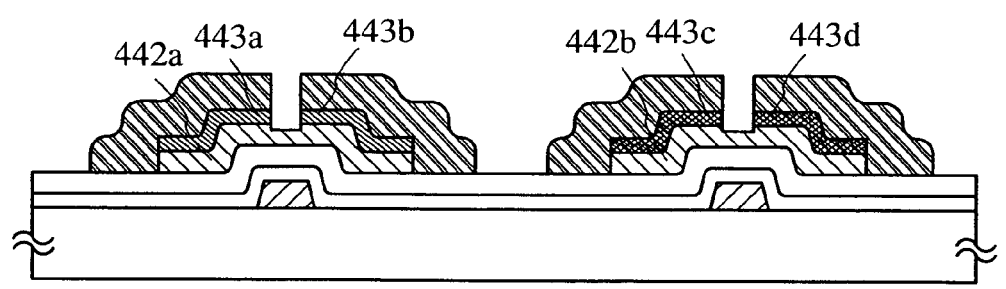
Figure 12A:
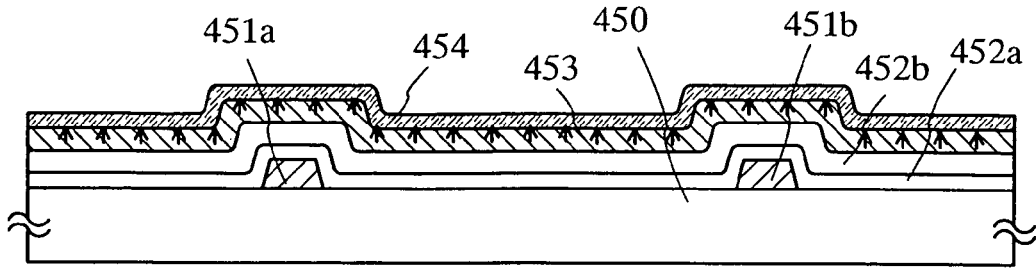
FIGS. 12A to 12D illustrate a manufacturing method of a display device of the invention.
Figure 12B:
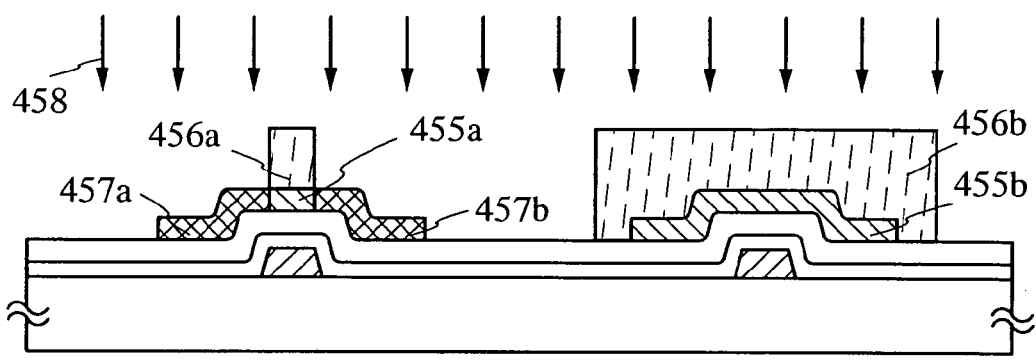
Figure 12C:
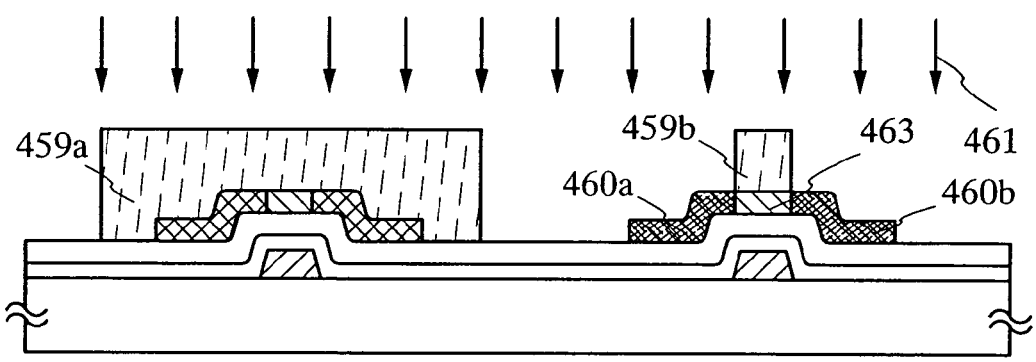
Figure 12D:
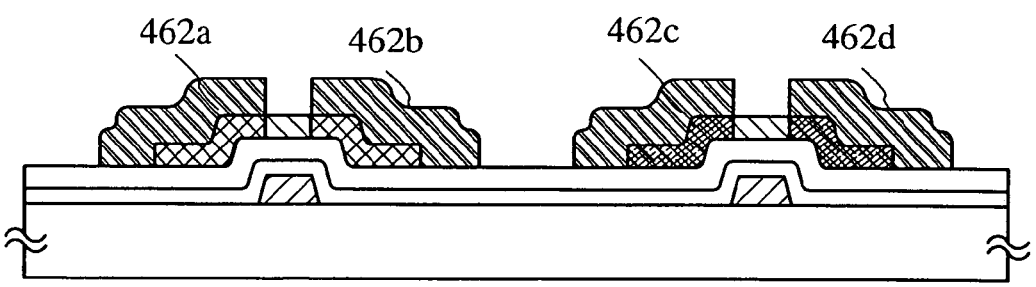

Source/drain electrode layers 440a, 440b, 440c, and 440d are formed by a droplet discharge method and fine exposure with a laser beam (see FIG. 11C). By using as masks the source/drain electrode layers 440a, 440b, 440c, and 440d, the semiconductor layers 436a and 436b, and the n-type semiconductor layers 437 and 444 are etched, thereby semiconductor layers 442a and 442b, n-type semiconductor layers 443a and 443b, and p-type semiconductor layers 443c and 443d can be formed (see FIG. 11D). The etching of the semiconductor layers and the n-type semiconductor layers may be performed under the condition that a resist mask, which is formed in the patterning step of the source/drain electrode layer, is provided. In addition, the etching may be performed either by dry etching or wet etching. For example, the etching of the source/drain electrode layers may be performed by wet etching using etchant while the etching of the semiconductor layers may be performed by dry etching.

Through the aforementioned steps, an n-channel thin film transistor and a p-channel thin film transistor can be formed over the same substrate. In addition, by electrically connecting the n-channel thin film transistor and the p-channel thin film transistor, a CMOS structure can be constructed. By incorporating such CMOS structure into a pixel region or a driver region, a display device can be manufactured.

This embodiment mode can be implemented in combination with Embodiment Mode 1 or Embodiment Mode 2.

Embodiment Mode 4

One embodiment mode of the invention will be described with reference to FIGS. 12A to 12D. This embodiment mode is an example in which two kinds of thin film transistors: an n-channel thin film transistor and a p-channel thin film transistor are manufactured. Therefore, common portions or portions having a common function will be described in no more detail.

Over a substrate 450, gate electrode layers 451a and 451b are formed, over which gate insulating layers 452a and 452b are formed. Over the gate insulating layer 452b, an amorphous semiconductor film is formed, to which metal elements are doped. Then, the amorphous semiconductor film is crystallized by thermal treatment to obtain a crystalline semiconductor film. Over the crystalline semiconductor film, a semiconductor film 454 containing rare gas elements as impurity elements is formed, and heated (see FIG. 12A).

By the thermal treatment, metal elements contained in the crystalline semiconductor film are gettered, which travel in the direction of arrows to be trapped into the semiconductor film 454. Thus, a crystalline semiconductor film 453 is formed. The semiconductor film 454 used as a gettering sink is removed by etching. The crystalline semiconductor film 453 is patterned, and a mask 456a for covering a channel formation region 455a, and a mask 456b for covering a semiconductor layer 455b are formed. Then, n-type impurity elements 458 are doped to form n-type impurity regions 457a and 457b (see FIG. 12B).

After removing the masks 456a and 456b, a mask 459a for covering the n-type impurity region 457a, the channel formation region 455a, and the n-type impurity region 457b is formed, and also another mask 459b for covering a channel formation region 463 is formed. Then, p-type impurity elements 461 are doped, with which p-type impurity regions 460a and 460b are formed (see FIG. 12C). Each of the n-type impurity regions 457a and 457b, and the p-type impurity regions 460a and 460b functions as a source region or a drain region. In contact with the source region or the drain region, source/drain electrode layers 462a, 462b, 462c, and 462d are formed (see FIG. 12D).

Through the aforementioned steps, an n-channel thin film transistor and a p-channel thin film transistor can be formed over the same substrate. In addition, by electrically connecting the n-channel transistor and the p-channel transistor, a CMOS structure can be constructed. By incorporating such CMOS structure into a pixel region or a driver region, a display device can be manufactured. In this embodiment mode, the film deposition steps can be reduced as compared to Embodiment Mode 3; therefore, throughput can be improved.

Embodiment Mode 5

One embodiment mode of the invention will be described with reference to FIGS. 13A to 13E. This embodiment mode is an example in which two kinds of thin film transistors: an n-channel thin film transistor and a p-channel thin film transistor are manufactured, which is different from the aforementioned embodiment modes in the gettering step. Therefore, common portions or portions having a common function will be described in no more detail.

Over a substrate 470, gate electrode layers 471a and 471b are formed, over which gate insulating layers 472a and 472b are formed. Over the gate insulating layer 472b, an amorphous semiconductor film is formed, to which metal elements are doped. Then, the amorphous semiconductor film is crystallized by thermal treatment to obtain a crystalline semiconductor film. The crystalline semiconductor film is patterned to form semiconductor layers 473a and 473b (see FIG. 13A)

Figure 13A:
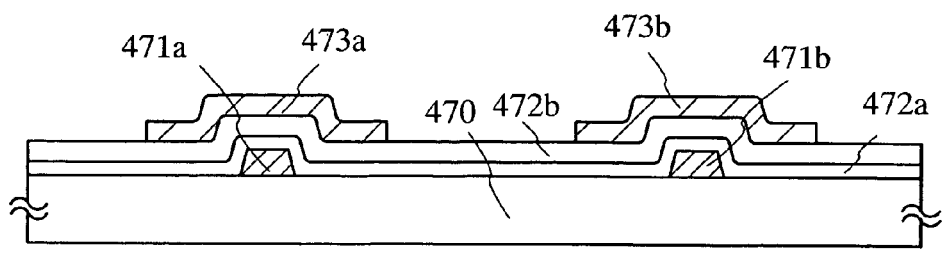
FIGS. 13A to 13E illustrate a manufacturing method of a display device of the invention.
Figure 13B:
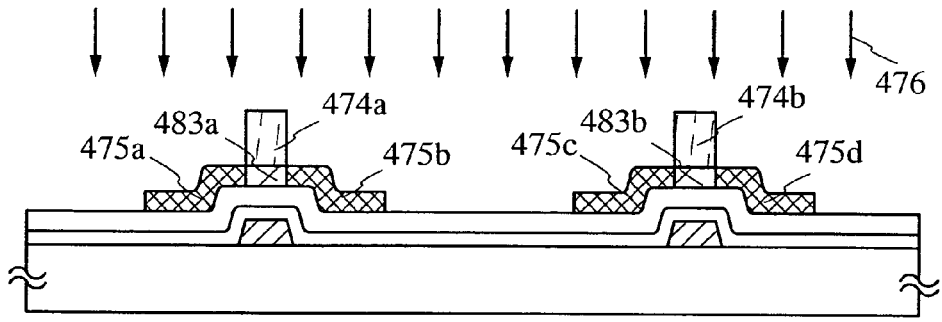
Figure 13C:
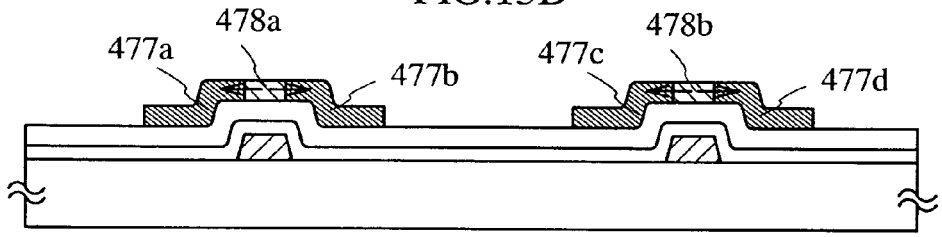
Figure 13D:
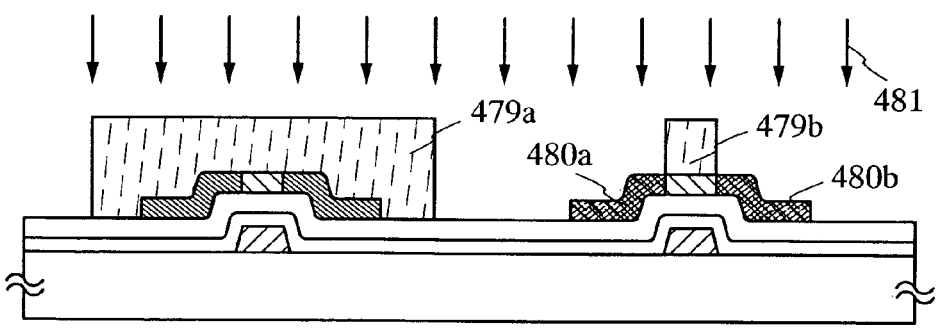
Figure 13E:
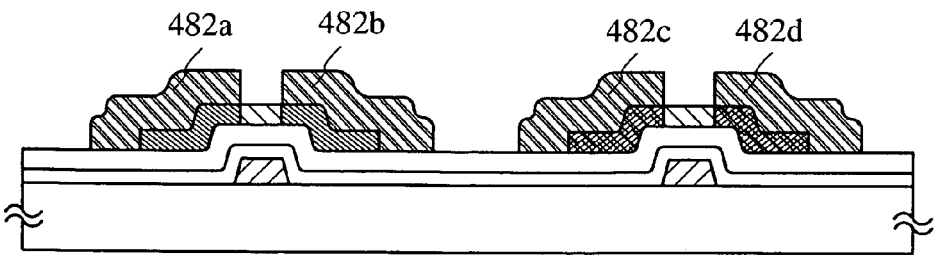

A mask 474a for covering a channel formation region 483a, and a mask 474b for covering a channel formation region 483b are formed, and then n-type impurity elements 476 are doped to form n-type impurity regions 475a, 475b, 475c, and 475d (see FIG. 13B). Then, thermal treatment is performed.

By the thermal treatment, metal elements contained in the channel formation regions 483a and 483b are gettered, which travel in the direction of arrows to be trapped in the n-type impurity regions 477a, 477b, 477c, and 477d. Thus, channel formation regions 478a and 478b each having the removed or reduced amount of metal elements are formed (see FIG. 13C). In addition, this thermal treatment can activate the n-type impurity elements which are doped.

A mask 479a for covering the n-type impurity region 477a, the channel formation region 478a, and the n-type impurity region 477b, and a mask 479b for covering the channel formation region 478b are formed, and then p-type impurity elements 481 are doped. With the p-type impurity elements, p-type impurity regions 480a and 480b are formed (see FIG. 13D). Each of the n-type impurity regions 477a and 477b, and the p-type impurity regions 480a and 480b functions as a source region or a drain region. In contact with the source region or the drain region, source/drain electrode layers 482a, 482b, 482c, and 482d are formed (see FIG. 13D).

Through the aforementioned steps, an n-channel thin film transistor and a p-channel thin film transistor can be formed over the same substrate. In addition, by electrically connecting the n-channel thin film transistor and the p-channel thin film transistor, a CMOS structure can be constructed. By incorporating such CMOS structure into a pixel region or a driver region, a display device can be manufactured. According to this embodiment mode, the film deposition steps can be reduced as compared to Embodiment Mode 3; therefore, throughput can be improved.

Embodiment Mode 6

This embodiment mode will be described with reference to FIGS. 14A to 18B. In this embodiment mode, the pixel region manufactured in Embodiment Mode 1 is used, and a thin film transistor using the invention is used in a peripheral driver circuit region. Further, a CMOS having the n-channel thin film transistor and the p-channel thin film transistor manufactured in Embodiment Mode 2 is employed. Therefore, common portions or portions having a common function will be described in no more detail.

Figure 19A:
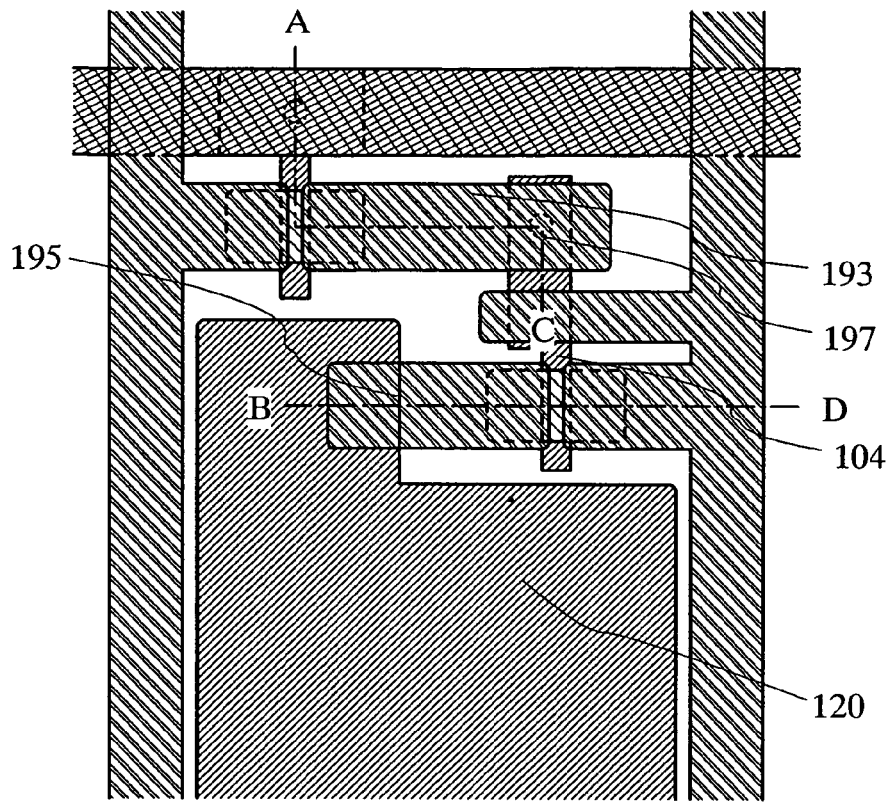
FIGS. 19A to 19C illustrate a manufacturing method of a display device of the invention.

FIG. 19A is a top view of a pixel region of a display device manufactured in this embodiment mode, and FIGS. 14A to 17 and 18B each correspond to a cross-sectional view of FIG. 19A along lines A-C and B-D. Regions denoted by L-S, T-K, and I-J in FIGS. 14A to 17 correspond to the line I-J as a peripheral driver circuit region of the display device in FIG. 18A.

A conductive film is formed over a substrate 300, which is patterned then with a resist mask to form gate electrode layers 301, 302, 303, 360a, and 360b, and a first electrode layer 304 (pixel electrode layer). In this embodiment mode, each gate electrode layer is formed in a single layer of a light-transmissive conductive film; however, it may have a stacked-layer structure. As the stacked-layer structure, stacked layers of Ta, Ti, W, Mo, and Cr, or a nitride film of such elements can be used. Specifically, stacked layers of TaN and W, stacked layers of TaN and Mo, stacked layers of TaN and Cr, stacked layers of TiN and W, stacked layers of TiN and Mo, stacked layers of TiN and Cr, and the like can be used. In this embodiment mode, compositions containing indium tin oxide which contains silicon oxide (ITSO) are discharged by a droplet discharge method, and then baked to form a conductive film in the vicinity containing the region for forming the gate electrode layers. The conductive film is patterned precisely using a mask which is finely processed by laser beam exposure, thereby the gate electrode layers 301, 302, 303, 360a, and 360b, and the first electrode layer 304 are formed.

Over the gate electrode layers 301, 302, 303, 360a, 360b, and the first electrode layer 304, a gate insulating layer is formed, over which an amorphous semiconductor film 306 is formed. In this embodiment mode, a gate insulating layer 305a formed of silicon nitride and a gate insulating layer 305b formed of silicon oxide are stacked as the gate insulating layer. The amorphous semiconductor film 306 is formed of an amorphous silicon film. The gate insulating layers 305a and 305b and the amorphous semiconductor film 306 are continuously formed by plasma CVD only by switching the gas. By forming such films continuously, manufacturing steps thereof can be simplified, and it can be prevented that the contaminant in the atmosphere adheres to the surface or the interface of the films.

Over the amorphous semiconductor film 306, a metal film 307 is formed in order to introduce elements for promoting crystallization (see FIG. 14A). The metal film 307 is quite thin, thus it might not be kept in the form of a film. In this embodiment mode, the amorphous semiconductor film 306 is coated with a solution containing 30 ppm of Ni by spin coating to form the metal film 307. The amorphous semiconductor film 306 coated with the metal film 307 is heated and crystallized. In this embodiment mode, the thermal treatment is performed at 550° C. for 8 hours to obtain a crystalline semiconductor film 309.

Over the crystalline semiconductor film 309, an n-type semiconductor film 308 is formed (see FIG. 14B). In this embodiment mode, the n-type semiconductor film 308 is formed by depositing an amorphous silicon film containing phosphorus (P) as n-type impurity elements by plasma CVD to have a thickness of 100 nm. Then, thermal treatment is performed using the n-type semiconductor film 308 as a gettering sink to getter the metal elements in the crystalline semiconductor film 309 (see FIG. 14C). In this embodiment mode, the thermal treatment is performed at 550° C. for 4 hours. By the thermal treatment, the metal elements in the crystalline semiconductor film 309 travel in the direction of arrows to be trapped into the n-type semiconductor film 308. Accordingly, the crystalline semiconductor film 309 becomes a crystalline semiconductor film 310 containing a reduced amount of metal elements while the n-type semiconductor film 308 becomes an n-type semiconductor film 311 containing n-type impurity elements (P in this embodiment mode) and metal elements (Ni in this embodiment mode).

The crystalline semiconductor film 310 and the n-type semiconductor film 311 are patterned to form semiconductor layers 312, 313, 314, and 361, and n-type semiconductor layers 315, 316, 317, and 362 (see FIG. 15A). The patterning of such semiconductor layers may also be performed precisely by using a mask of the invention which is finely processed by laser beam exposure.

Then, a mask 318a for covering the semiconductor layer 312 and the n-type semiconductor layer 315, a mask 318b for covering a channel formation region of the semiconductor layer 313 and a channel formation region of the n-type semiconductor layer 316, a mask 318c for covering the semiconductor layer 314 and the n-type semiconductor layer 317, and a mask 318d for covering the semiconductor layer 361 and the n-type semiconductor layer 362 are formed. Then, p-type impurity elements 319 are doped to form p-channel impurity regions 320a and 320b in the n-type semiconductor layer 316 (see FIG. 15B). In this embodiment mode, the p-type impurity elements (boron: B in this embodiment mode) are doped by ion doping. Then, thermal treatment is performed at 550° C. for 4 hours to activate the region doped with the impurity elements.

Figure 40:
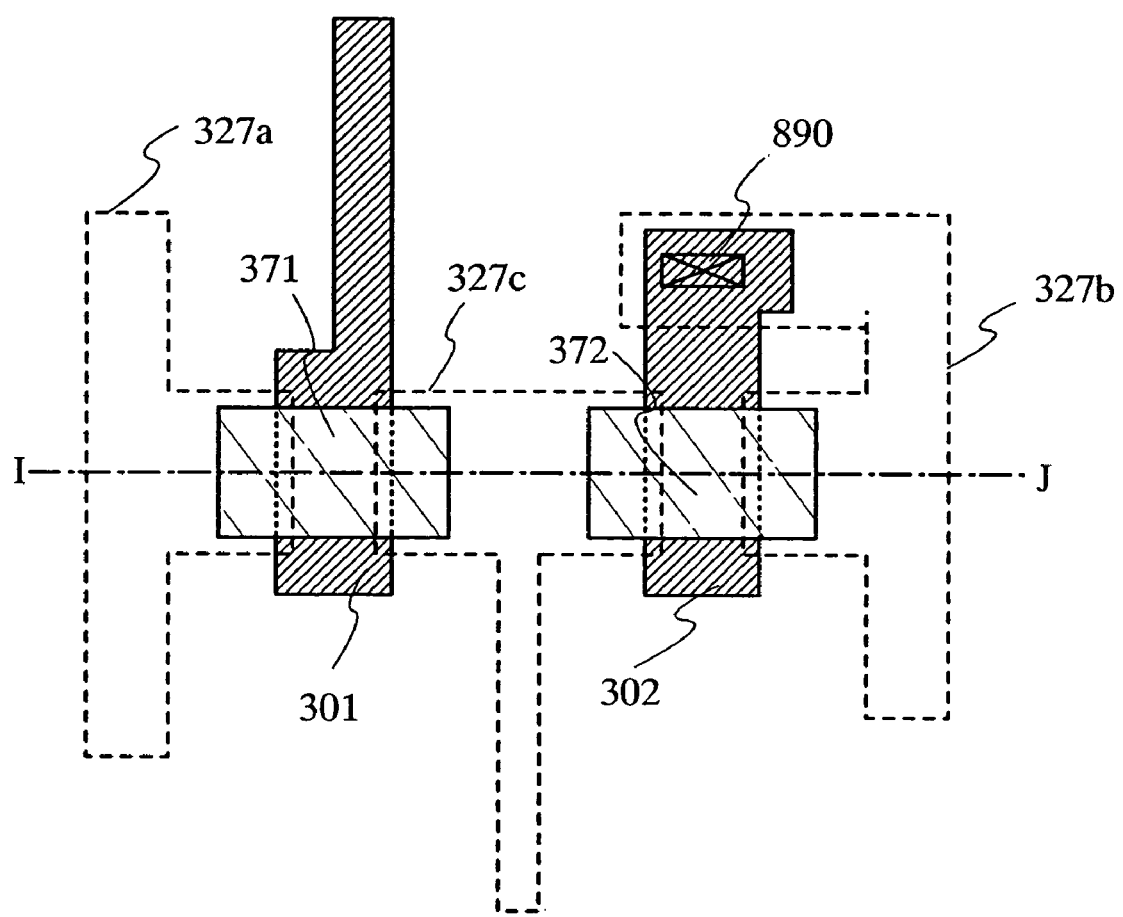
FIG. 40 illustrates a display device of the invention.

In this embodiment mode, a CMOS structure is used for a driver circuit region so as to function as an inverter. In the case of using only a PMOS or NMOS structure, gate electrode layers of several TFTs are connected to source or drain electrode layers thereof. FIG. 40 illustrates an example of this case. By using a photomask, the gate insulating layers 305a and 305b are partially etched to form a contact hole 890 as shown in FIG. 40. In this embodiment mode, a first electrode layer to be a pixel electrode layer and a source/drain electrode layer are connected via a contact hole formed in the insulating layer; however, they may be connected without the intermediary of the inter layer insulating layer. In such a case, an opening reaching the first electrode layer can be formed simultaneously with the contact hole 890. After that, the source/drain electrode layer is formed in the contact holes to be electrically connected to the gate electrode layer or the first electrode layer respectively. By connecting a source/drain electrode layer 327b to the gate electrode layer 302, thin film transistors 335 and 336 which are formed later can jointly function as an inverter even when both of them are NMOS transistors or PMOS transistors. As set forth above, in this embodiment mode, the thin film transistors 335 and 336 constitute a CMOS structure; therefore, they can jointly function as an inverter without having the structure shown in FIG. 40.

After removing the masks 318a, 318b, and 318c, conductive layers 321, 322, and 363 are formed over the semiconductor layers 312, 313, 314, and 362. In this embodiment mode, the conductive layers 321, 322, and 363 are selectively formed by a droplet discharge method, thereby waste of materials is reduced. As the conductive material, silver (Ag) is used, and compositions containing Ag are discharged from droplet discharge systems 380a, 380b, and 380c, which are then baked at 300° C. to form the conductive layers 321, 322, and 363 (see FIG. 15C). In addition, in the same step, a conductive layer 370 to be a source/drain electrode layer, which also forms a capacitor, is formed over the gate insulating layer 305b over the gate electrode layer 360a.

As described in Embodiment Mode 1 with reference to FIGS. 8A to 8D, the conductive layers 321, 322, 363, and 370 are precisely patterned to form source/drain electrode layers 327a, 327b, 327c, 328, 366a, 366b, and 366c. By using as masks the source/drain electrode layers 327a, 327b, 327c, 328, 366a, and 366b, the semiconductor layers 312, 313, 314, and 361, and n-type semiconductor layers 315, 316, 317, and 362 are etched to form semiconductor layers 371, 372, 373, and 375, and n-type semiconductor layers 324a, 324b, 325a, 325b, 326a, 326b, 365a, and 365b. The etching may be performed by dry etching or wet etching. In this embodiment mode, dry etching is used.

Through the aforementioned steps, the n-channel thin film transistor 355 and the p-channel thin film transistor 336 which constitute the CMOS, n-channel thin film transistors 337 and 364, and a capacitor 338 can be formed (see FIG. 16A). This embodiment employs a CMOS structure; however, the invention is not limited to this, and a PMOS or NMOS structure may be employed as well.

An insulating film 330 to serve as a passivation film is formed. In this embodiment mode, the insulating film 330 is formed in stacked layers of a silicon oxide film (150 nm) and a silicon nitride film (200 nm), which are formed in this order from the side in contact with the semiconductor layer. The insulating film 330 may be formed of other films containing silicon. For example, instead of using the silicon oxide film, a silicon oxynitride film may be used, and stacked with the silicon nitride film.

The insulating film 330 is formed to contain hydrogen, and applied with thermal treatment at 300 to 500° C. under a nitrogen atmosphere in order to hydrogenate the semiconductor layer.

Over the insulating film 330, an insulating layer 339 is formed. In this embodiment mode, a silicon oxide film containing an alkyl group is formed using a slit coater. In the insulating layer 339 and the insulating film 330, an opening 340b is formed to reach the source/drain electrode layer 328, and also an opening 340d is formed to reach the source/drain electrode layer 366b. Meanwhile, in the insulating layer 339, the insulating film 330, and the gate insulating layers 305a and 305b, an opening 340a is formed to reach the gate electrode layer 303, an opening 340c is formed to reach the gate electrode layer 360a, and also an opening 340e is formed to reach the first electrode layer 340 (see FIG. 16B). The patterning for forming the openings can be performed by using the fine processing of the invention with a laser beam. In this embodiment mode, the openings are formed by dry etching.

Then, a wiring layer 341, and gate wiring layers 342 and 367 are formed. In this embodiment mode, the gate wiring layers or the wiring layer are formed by a droplet discharge method using Ag. As the conductive material, compositions containing Ag are discharged into the openings 340a, 340b, 340c, 340d, and 340e, and then baked at 300° C. According to the aforementioned steps, the gate wiring layer 367 for electrically connecting the source/drain electrode layer 328 to the gate electrode layer 360a, a wiring layer 341 for electrically connecting the source/drain electrode layer 366b to the first electrode layer 304, and a gate wiring layer 342 electrically connected to the gate electrode layer 303 are formed (see FIG. 16C).

Figure 17:
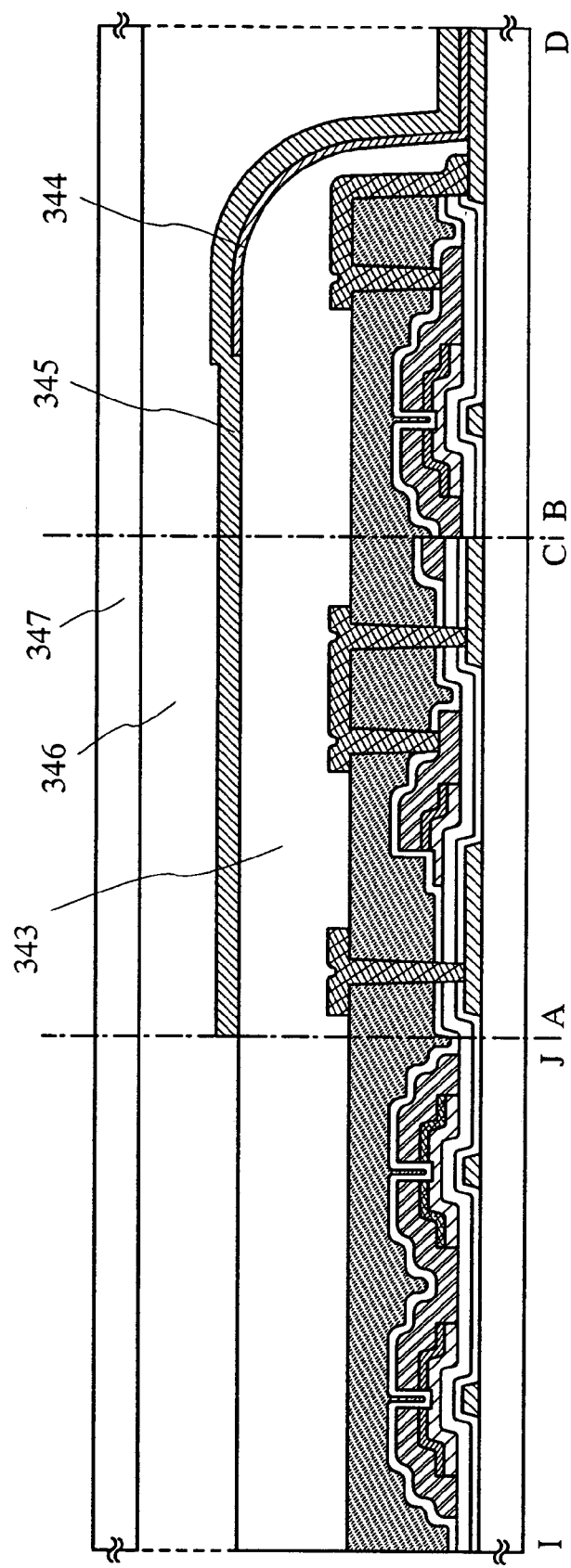
FIG. 17 illustrates a manufacturing method of a display device of the invention.

Then, an insulating layer 343 to serve as a bank (also called a partition wall) is formed. The whole surface of the insulating layer 343 is formed with an insulating layer by spin coating or dipping, and then formed to have an opening by etching process as shown in FIG. 17. If the insulating layer 343 is formed by a droplet discharge method, etching process is not necessarily performed.

The insulating layer 343 is formed to have an opening as a through-hole in accordance with the position where a pixel is formed correspondingly to the first electrode layer 304.

Over the first electrode layer 304, an electroluminescent layer 344 and a second electrode layer 345 are stacked in this order. Then, a filling agent 346 is encapsulated using a sealing substrate 347. Instead of the filling agent 346, the space may be filled with an inert gas such as nitrogen. In addition, by providing a drying agent in the display device, degradation of a light-emitting element due to moisture can be prevented. The position of the drying agent may be on either side of the sealing substrate 347 or the substrate 300 over which elements are formed. Alternatively, the drying agent may be provided in a depressed portion formed in the substrate, which is also the region provided with a sealant 348. When the drying agent is provided in the non-display area such as s driver circuit area of the sealing substrate 347 and a wiring area, the aperture ratio is not decreased even when the drying agent is opaque. Alternatively the filler 346 may be formed to contain a hydroscopic material to have a function of a drying agent. Accordingly, a display device having a display function using light-emitting elements is completed (see FIG. 17).

An FPC 354 is stuck to a terminal electrode layer 352 for electrically connecting the inside of the display device to the outside thereof with an anisotropic conductive film 353 so as to be electrically connected to the terminal electrode layer 352.

FIG. 18A is a top view of a display device. As shown in FIG. 18A, a pixel region 390, a scan line driver region 391a, a scan line driver region 391b, and a connecting region 393 are sealed between the substrate 300 and the sealing substrate 347 with the sealant 348, and a signal line driver circuit 392 constructed of a driver IC is formed over the substrate 300.

Figure 44:
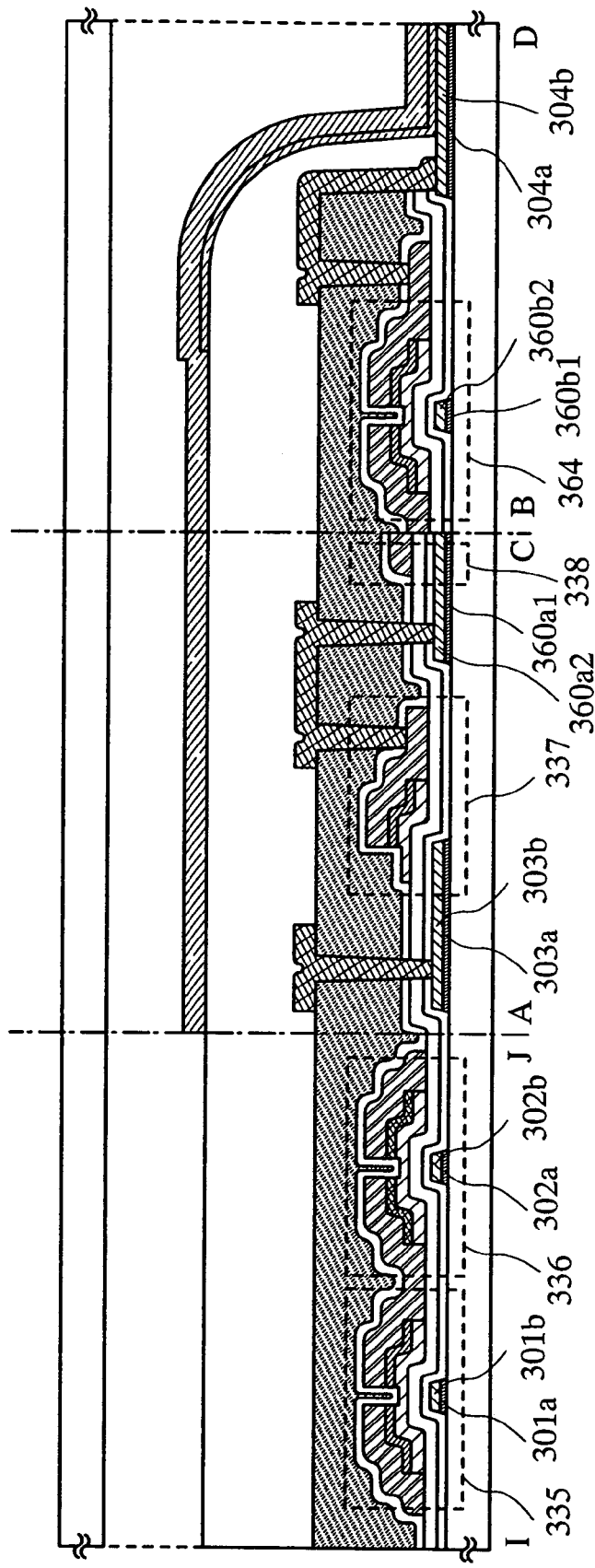
FIG. 44 illustrates a display device of the invention.

The display device of this embodiment mode shown in FIGS. 18A and 18B includes the gate electrode layers 301, 302, 303, 360a, and 360b, and the first electrode layer 304, each of which has a single-layer structure; however, the gate electrode layer 304 may have two or more stacked layers as set forth above. FIG. 44 illustrates an example in which gate electrode layers and a first electrode layer each have a stacked-layer structure.

As the stacked-layer structure, stacked layers of Ta, Ti, W, Mo, and Cr, or a nitride film of such elements can be used. Specifically, stacked layers of TaN and W, stacked layers of TaN and Mo, stacked layers of TaN and Cr, stacked layers of TiN and W, stacked layers of TiN and Mo, stacked layers of TiN and Cr, and the like can be used. In this embodiment mode, first gate electrode layers 301a, 302a, 303a, 360a1, and 360b1 are formed of TaN while second gate electrode layers 301b, 302b, 303b, 360a2, and 360b2 are formed of W. As for a pixel electrode layer which is formed in the same step, a first electrode layer 304a is formed of a TaN film while a first electrode layer 304b is formed of a W film. In this manner, each of the gate electrode layer and the pixel electrode layer can be formed to have a stacked-layer structure. Alternatively, the pixel electrode layer may be formed to have a single-layer structure while the gate electrode layer may be formed to have a stacked-layer structure. On the other hand, the pixel electrode layer may be formed to have a stacked-layer structure while the gate electrode layer may be formed to have a single-layer structure. Such structure may be appropriately determined in accordance with the required function of the display device.

Through the aforementioned steps, an inversely staggered thin film transistor having a crystalline semiconductor film can be formed. The thin film transistor in this embodiment mode is formed using a crystalline semiconductor film; therefore, it exhibits higher mobility as compared to a thin film transistor formed using an amorphous semiconductor film. In addition, the source region and the drain region contain metal elements in addition to the impurity elements having one conductivity type. Therefore, the source region and the drain region having low resistivity can be formed. As a result, a display device capable of high-speed operation can be manufactured.

In addition, in comparison with a thin film transistor formed using an amorphous semiconductor film, variations of threshold voltage are unlikely to occur, resulting in the decrease in variations of the thin film transistor characteristics.

Further, since the metal elements which are mixed into the semiconductor film during the film deposition are removed by the gettering step, off current can be decreased. Therefore, by providing such a thin film transistor as the switching element of a display device, image contrast can be enhanced.

Embodiment Mode 7

In this embodiment mode, an example of a display device is described with reference to FIGS. 19A to 19C, which is different from the display device in Embodiment Mode 6 in the connection structure of wirings. Therefore, common portions or portions having a common function will be described in no more detail.

In Embodiment Mode 6, when the source/drain electrode layer is electrically connected to the gate electrode layer or the first electrode layer, the gate electrode layer, the insulating film 140 as an interlayer insulating layer, and the insulating layer 116 are patterned to form openings. According to such a method, the openings can be formed all in one step; thus, it is advantageous for simplifying the manufacturing steps. FIGS. 19A to 19C illustrate an example in which openings and the connection structure of wirings are different.

Figure 19B:
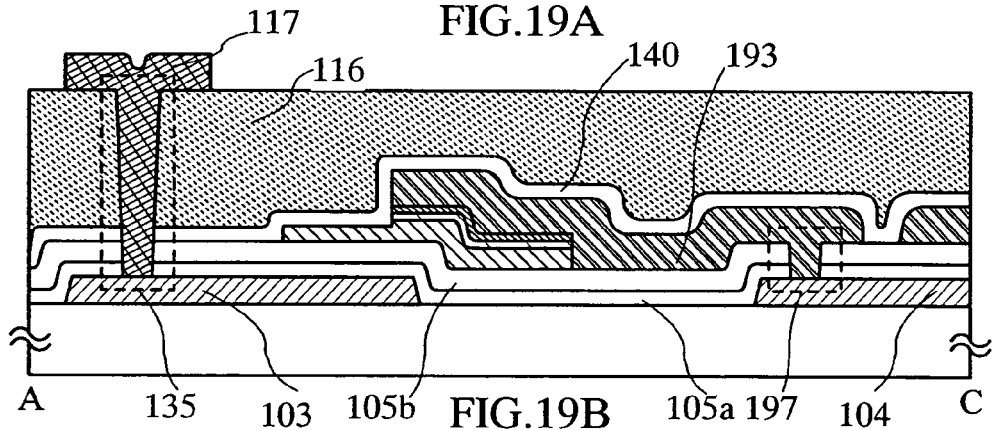
Figure 19C:
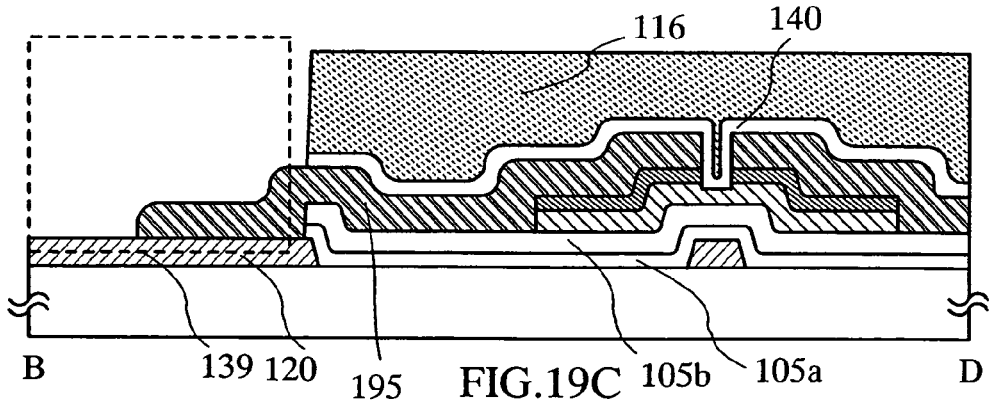

FIGS. 19B and 19C illustrate a pixel region of a display device which is manufactured in this embodiment mode. Specifically, FIG. 19A is a top view of a display device of this embodiment mode, FIG. 19B is a cross-sectional view of FIG. 19A along a line A-C, and FIG. 19C is a cross-sectional view of FIG. 19A along a line B-D.

A source electrode layer 193 is directly connected to the gate electrode layer 104 in an opening 197 which is formed in a gate insulating layer, without the intermediary of a wiring layer. In addition, a source/drain electrode layer 195 is directly connected to the first electrode layer 120 without the intermediary of a wiring layer. In this manner, when an opening is formed in the gate insulating layer to reach the gate electrode layer or the first electrode layer after the gate insulating layer is formed but before the source electrode layer or the drain electrode layer is formed, followed by the formation of the source electrode layer or the drain electrode layer in the opening, a wiring layer is not required to be formed between them. After that, the insulating film 140 and the insulating layer 116 are formed, and the openings 135 and 139 are formed. The gate wiring layer 117 is formed in the opening 135 to be electrically connected to the gate electrode layer 103. In this manner, when the steps for forming the openings are separately performed, a wiring layer for connecting wirings is not required. In the case of a top-emission display device, a reflective material may be used for the source/drain electrode layer 195 to be stacked over the first electrode layer 120.

This embodiment mode can be implemented in combination with any of Embodiment Modes 1 to 6.

Embodiment Mode 8

Figure 31A:
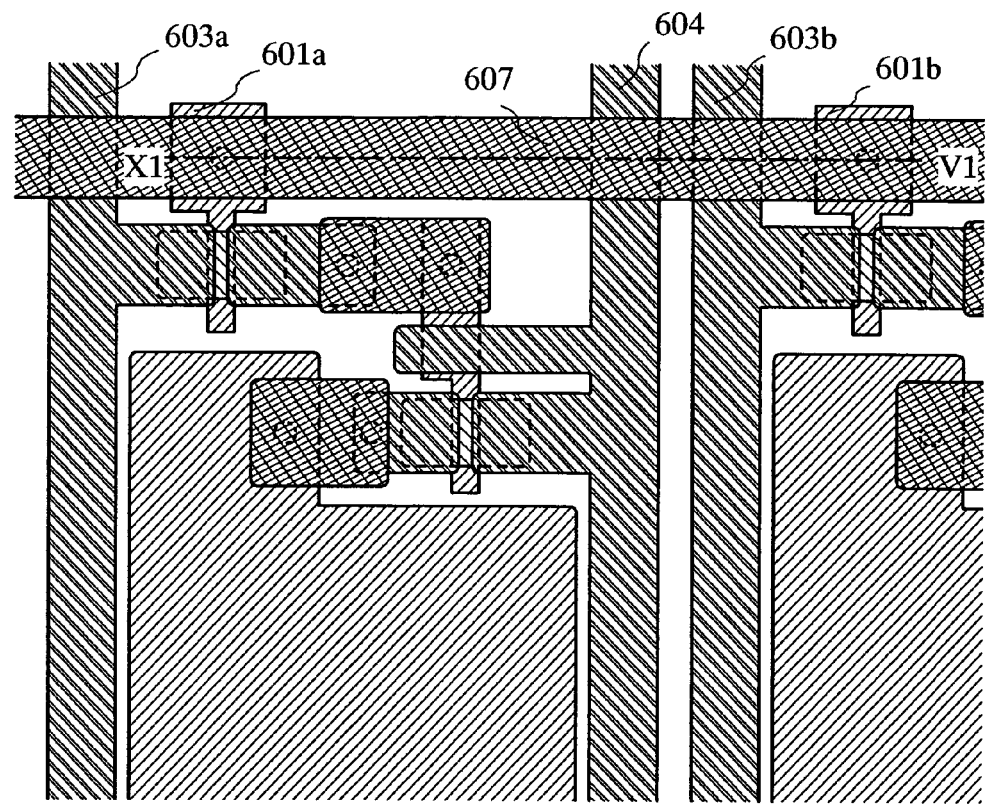
FIGS. 31A and 31B each illustrate a display device of the invention.
Figure 31B:
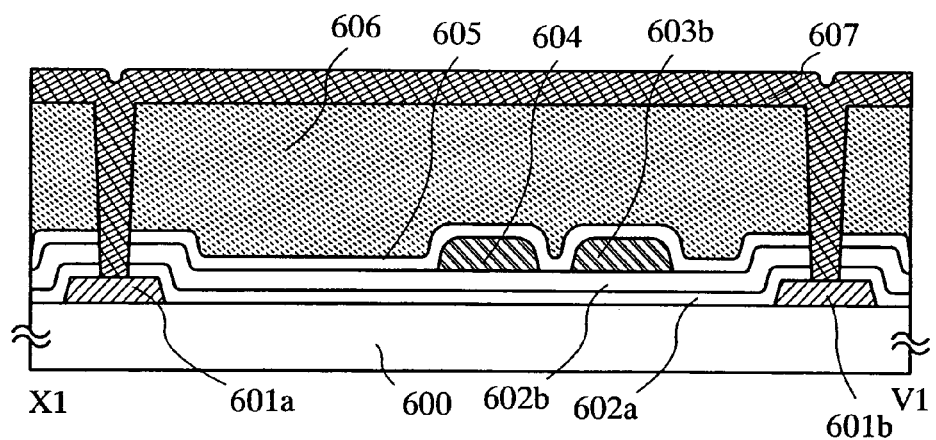
Figure 32A:
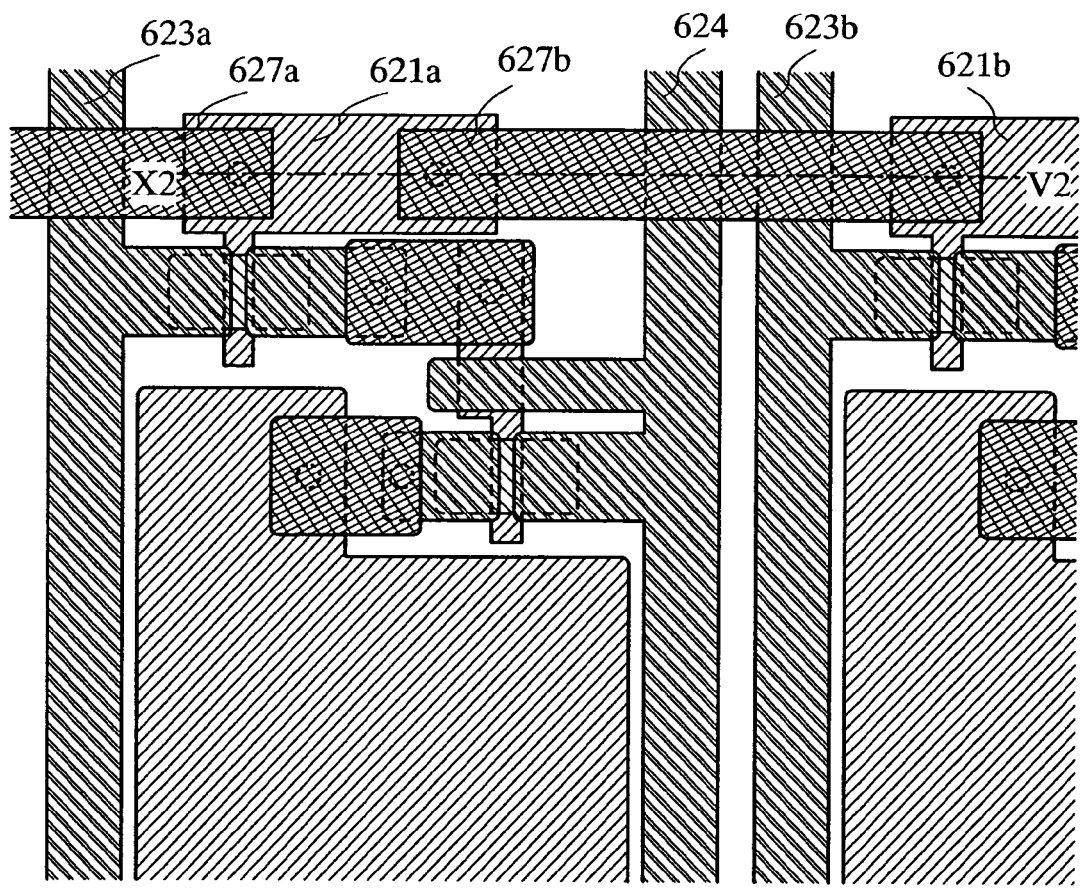
FIGS. 32A and 32B each illustrate a display device of the invention.
Figure 32B:
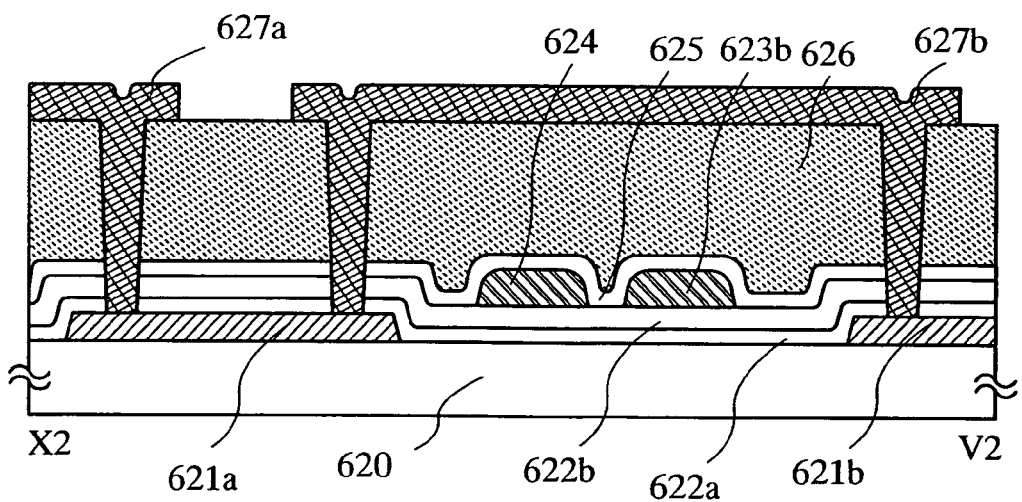
Figure 33A:
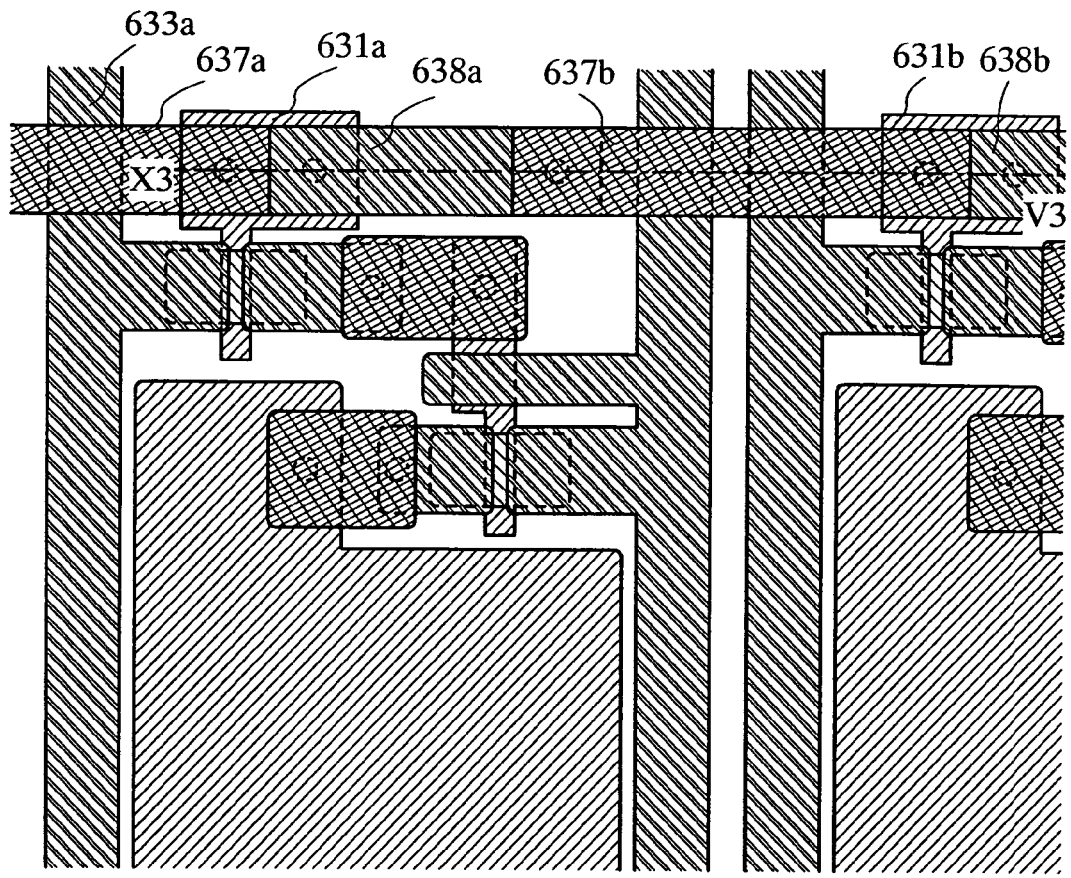
FIGS. 33A and 33B each illustrate a display device of the invention.
Figure 33B:
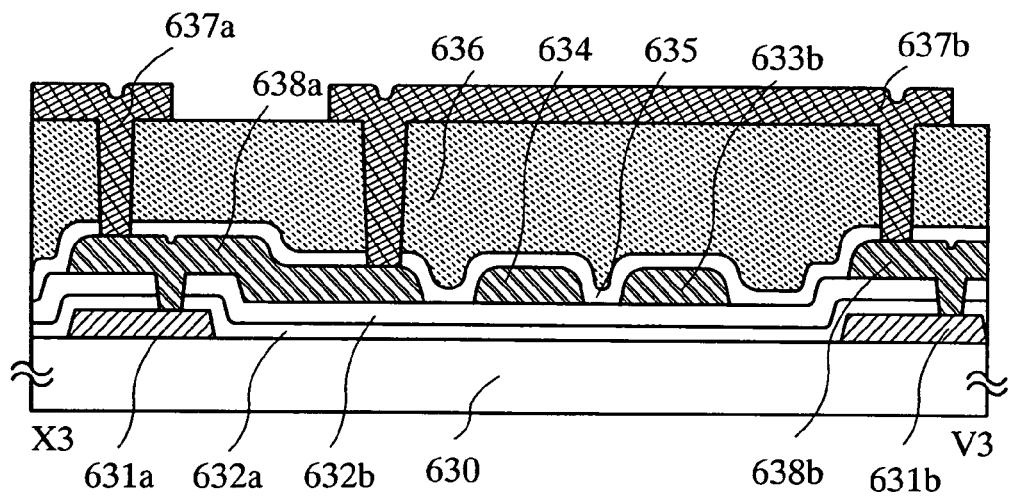
Figure 34A:
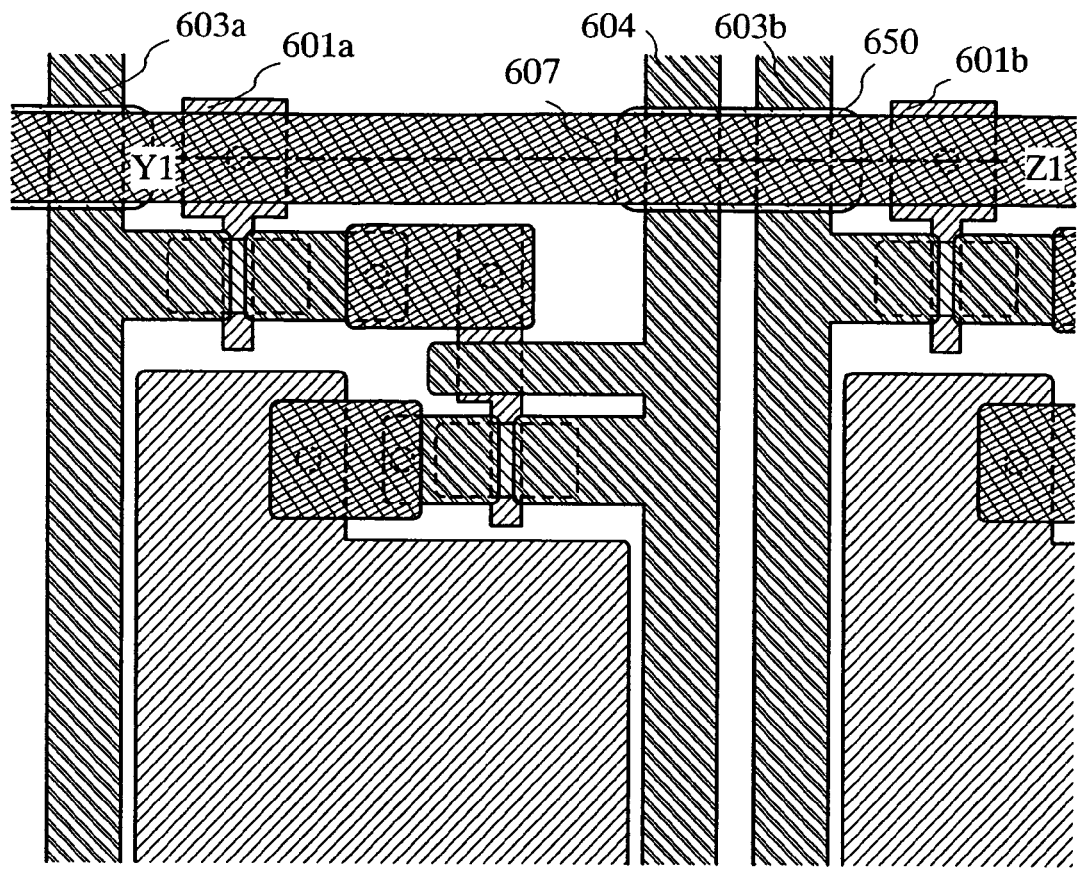
FIGS. 34A and 34B each illustrate a display device of the invention.
Figure 34B:
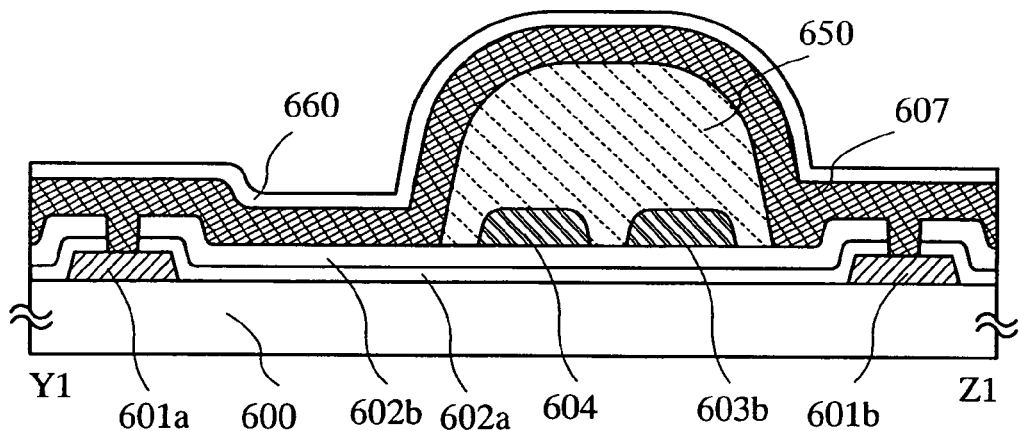
Figure 35A:
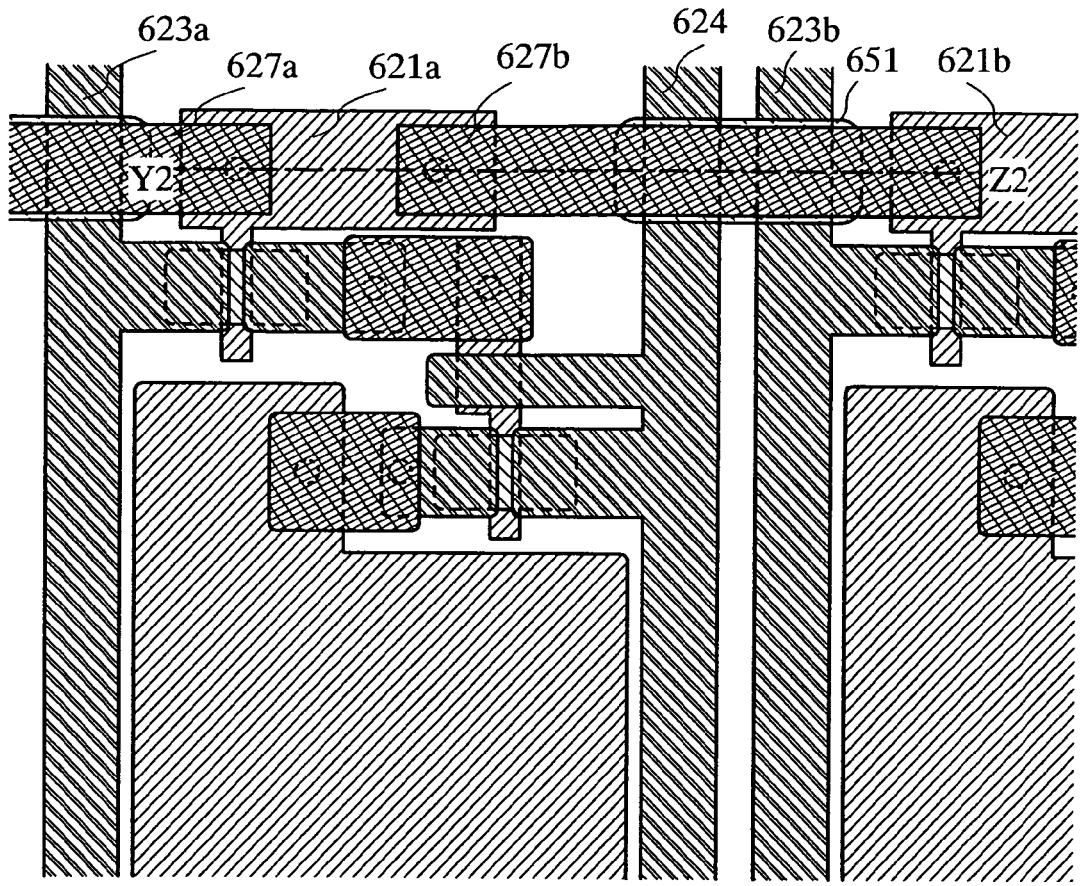
FIGS. 35A and 35B each illustrate a display device of the invention.
Figure 35B:
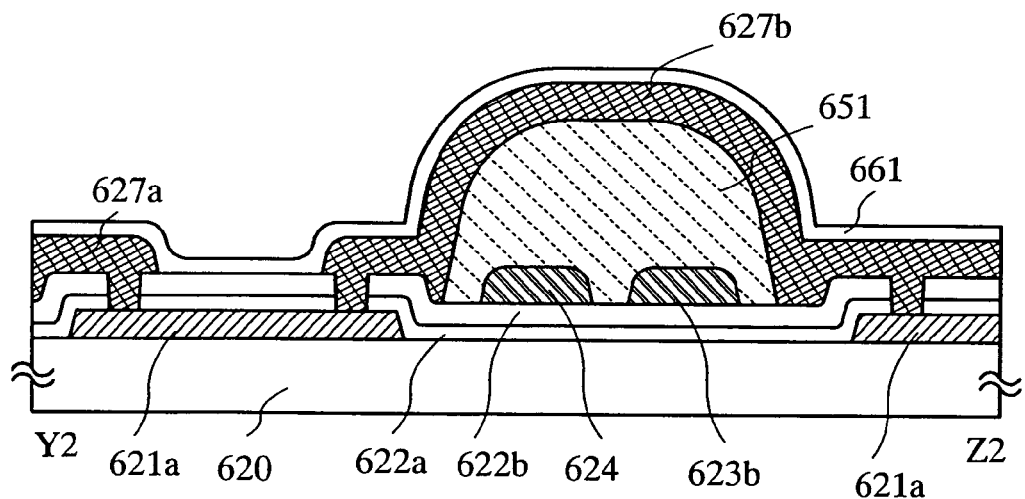
Figure 36A:
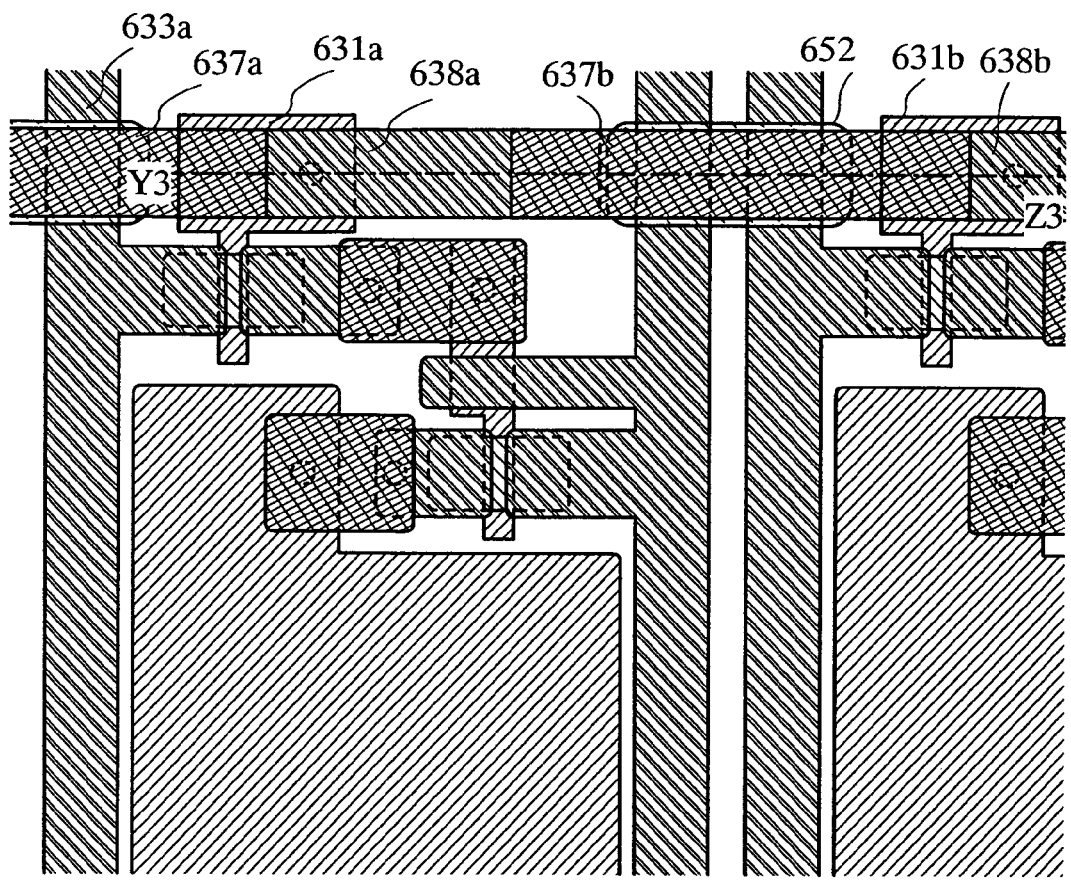
FIGS. 36A and 36B each illustrate a display device of the invention.
Figure 36B:
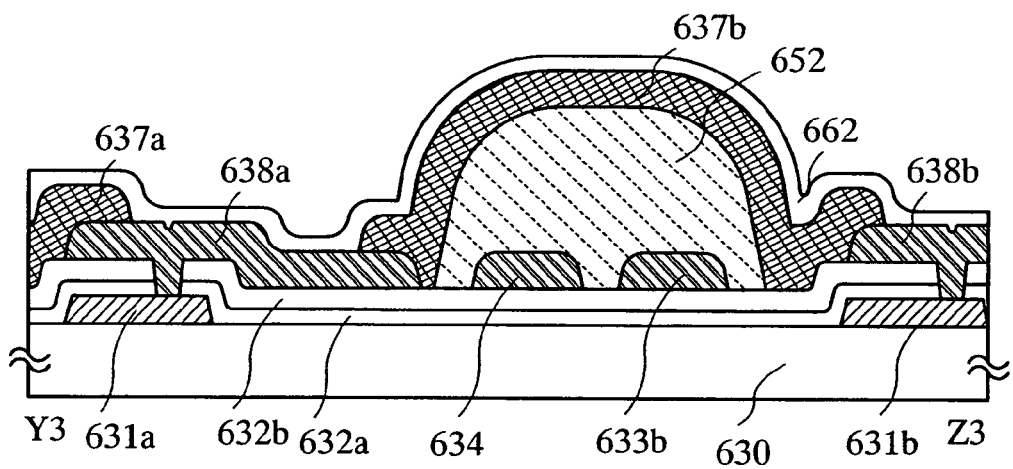

In Embodiment Mode 1, a multi-layer structure is adopted, in which a gate electrode layer is stacked with a source/drain electrode layer (including a source wiring layer) and a capacitor wiring layer, with a gate insulating layer interposed therebetween, and the source/drain electrode layer (including the source wiring layer) and a gate wiring layer are stacked with an interlayer insulating layer interposed therebetween. In this embodiment mode, a different stacked-layer structure of such layers is described with reference to FIGS. 31A to 36B, 41A and 41B. FIGS. 31A, 32A and 33A are top views of a display device while FIGS. 31B, 32B and 33B are cross-sectional views thereof along lines X1-V1, X2-V2, and X3-V3 respectively. FIGS. 34A, 35A and 36A are top views of a display device while FIGS. 34B, 35B and 36B are cross-sectional views thereof along lines Y1-Z1, Y2-Z2, and Y3-Z3 respectively.

FIG. 31A is a top view of a display device while FIG. 31B is a cross-sectional view thereof along a line X1-V1.

In FIGS. 31A and 31B, in a pixel region of the display device, gate electrode layers 601a and 601b, gate insulating layers 602a and 602b, a capacitor wiring layer 604, source/drain electrode layers 603a and 603b, a gate wiring layer 607, a semiconductor layer 608, n-type semiconductor layers 609a and 609b, an insulating film 605 as a passivation film, and an insulating layer 606 are formed over a substrate 600.

The insulating film 605 is not necessarily required; however, the provision of the insulating film 605 can further improve the reliability of the display device as it functions as a passivation film. In addition, if the insulating film 605 is formed and applied with thermal treatment, hydrogen contained in the insulating film 605 can hydrogenate the semiconductor layer.

As shown in FIG. 31B, the source/drain electrode layer 603b and the gate wiring layer 607 are stacked with the insulating layer 606 as an interlayer insulating layer interposed therebetween. The gate wiring layer 607 is connected to the gate electrode layers 601a and 601b via contact holes formed in the insulating layer 606, the insulating film 605, and the gate insulating layers 602a and 602b. Accordingly, the gate wiring layer 607 is not short-circuited to the source/drain electrode layer 603b nor the capacitor wiring layer 604.

FIG. 32A is a top view of a display device while FIG. 32B is a cross-sectional view thereof along a line X2-V2. In FIGS. 32A and 32B, in a pixel region of the display device, gate electrode layers 621a and 621b, gate insulating layers 622a and 622b, a capacitor wiring layer 624, source/drain electrode layers 623a and 623b, gate wiring layers 627a and 627b, an insulating film 625 as a passivation film, and an insulating layer 626 are formed over a substrate 620.

As shown in FIG. 32B, the source/drain electrode layer 623b and the gate wiring layer 627b are stacked with the insulating layer 626 as an interlayer insulating layer interposed therebetween. The gate wiring layer 627b is connected to the gate electrode layers 621a and 621b via contact holes formed in the insulating layer 626, the insulating film 625, and the gate insulating layers 622a and 622b. Accordingly, the gate wiring layer 627b is not short-circuited to the source/drain electrode layer 623b nor the capacitor wiring layer 624. In addition, the display device shown in FIGS. 32A and 32B has a structure that the gate wiring layer and the gate electrode layer are not formed continuously but formed intermittently, and they are formed while being electrically connected via contact holes. Accordingly, in the region where the source/drain electrode layer 623b and the capacitor wiring layer 624 are formed, the gate electrode layers 621a and 621b are electrically connected by being connected to the gate wiring layer 627b formed on the insulating layer 626 in the contact holes.

FIG. 33A is a top view of a display device while FIG. 33B is a cross-sectional view thereof along a line X3-V3. In FIGS. 33A and 33B, in a pixel region of the display device, gate electrode layers 631a and 631b, gate insulating layers 632a and 632b, a capacitor wiring layer 634, source/drain electrode layers 633a and 633b, gate wiring layers 637a and 637b, wiring layers 638a and 638b, an insulating film 635 as a passivation film, and an insulating layer 636 are formed over a substrate 630.

As shown in FIG. 33B, the source/drain electrode layer 633b and the gate wiring layer 637b are stacked with the insulating layer 636 as an interlayer insulating layer interposed therebetween. In the display device shown in FIGS. 32A and 32B, the gate electrode layer 621a is directly connected to the gate wiring layers 627a and 627b. However, in the display device shown in FIGS. 33A and 33B, the gate electrode layer 631a is electrically connected to the gate wiring layers 637a and 637b via the wiring layer 638a which is formed with the same material and steps as the source electrode layer. Accordingly, the gate electrode layer 631a is connected to the wiring layer 638a formed over the gate insulating layers 632a and 632b via a contact hole, and the wiring layer 638a is connected to the gate wiring layers 637a and 637b via contact holes. Thus, the gate electrode layer 631a is electrically connected to the gate wiring layers 637a and 637b. The source/drain electrode layer 633b and the capacitor wiring layer 634 are stacked with the gate wiring layer 637b with the insulating layer 636 as an interlayer insulating layer interposed therebetween; therefore, the source/drain electrode layer 633b and the capacitor wiring layer 634 are not short-circuited to the gate wiring layer 637b.

FIGS. 31A to 33B illustrate the case where an insulating layer is formed as an interlayer insulating layer covering a wide range. FIGS. 34A to 36B illustrate an example in which an interlayer insulating layer which separates wiring layers is selectively formed only in a needed place using a droplet discharge method.

FIGS. 34A and 34B correspond to FIGS. 31A and 31B respectively, FIGS. 35A and 35B correspond to FIGS. 32A and 32B respectively, and FIGS. 36A and 36B correspond to FIGS. 33A and 33B respectively, each of which illustrates a display device having a different structure of an interlayer insulating layer. FIG. 34A is a top view of a display device while FIG. 34B is a cross-sectional view thereof along a line Y1-Z1. In FIGS. 34A and 34B, the insulating layer 650 is formed by a droplet discharge method, covering the source/drain electrode layer 603b and the capacitor wiring layer 604. Covering the insulating layer 650, the gate wiring layer 607 is formed. Over the gate wiring layer 607, the insulating film 660 is formed as a passivation film. The insulating film 660 is not necessarily required; however, the provision thereof can improve the reliability. In addition, although the insulating layer 650 is formed in a single layer in this embodiment mode, the insulating layer 650 may be formed in stacked layers by forming an insulating film thereover or thereunder.

FIG. 35A is a top view of a display device while FIG. 35B is a cross-sectional view thereof along a line Y2-Z2. In FIGS. 35A and 35B, similarly to FIGS. 34A and 34B, the insulating layer 651 is selectively formed by a droplet discharge method, covering the source/drain electrode layer 623b and the capacitor wiring layer 624. Covering the insulating layer 651, the gate wiring layer 627b is formed and connected to the gate electrode layer 621a via a contact hole. Over the gate wiring layer 627a, an insulating film 661 is formed as a passivation film.

FIG. 36A is a top view of a display device while FIG. 36B is a cross-sectional view thereof along a line Y3-Z3. In FIGS. 36A and 36B, similarly to FIGS. 34A and 34B, an insulating layer 652 is selectively formed by a droplet discharge method, covering the source/drain electrode layer 633b and the capacitor wiring layer 634. Covering the insulating layer 652, the gate wiring layer 637b is formed, and electrically connected to the gate wiring layer 637a and the gate electrode layer 631a via the wiring layer 638a.

If an insulating layer such as the insulating layers 650, 651, and 652 for preventing short circuit of wirings is selectively formed by a droplet discharge method, waste of materials can be reduced. In addition, since the wirings can be formed in direct contact with each other, a step for forming a contact hole in the insulating layer can be omitted. Accordingly, the manufacturing steps can be simplified, resulting in cost saving and higher productivity.

Figure 41A:
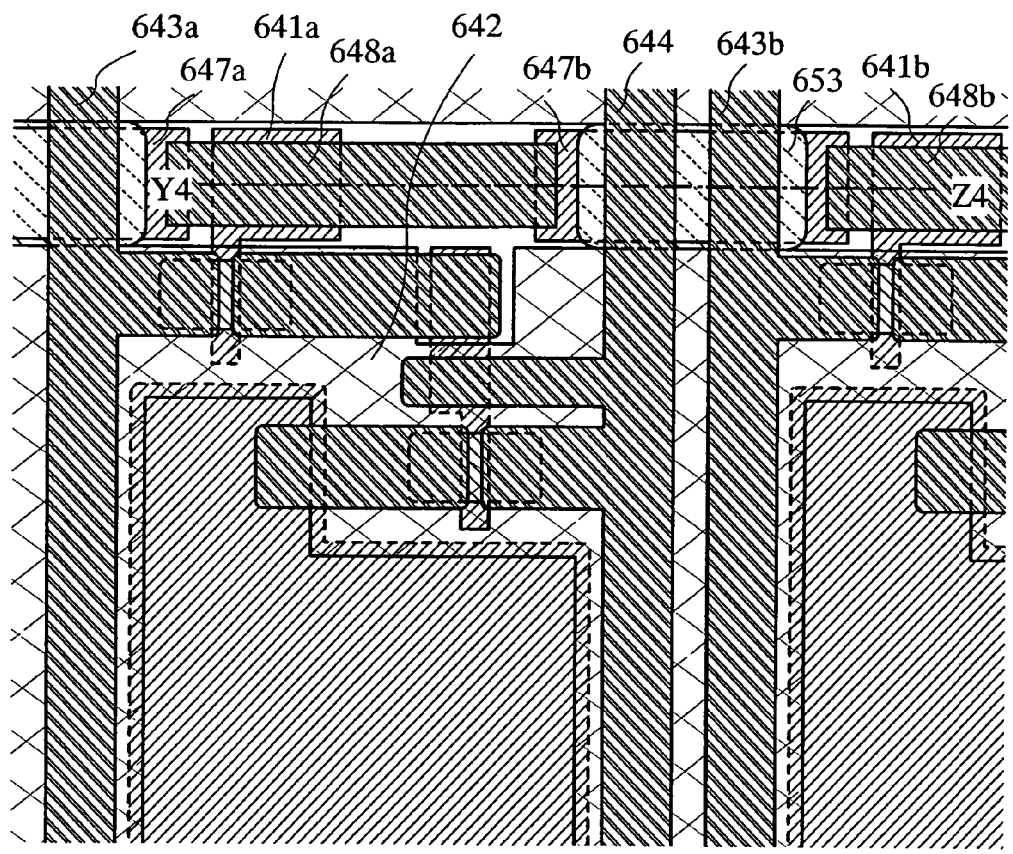
FIGS. 41A and 41B each illustrate a display device of the invention.
Figure 41B:
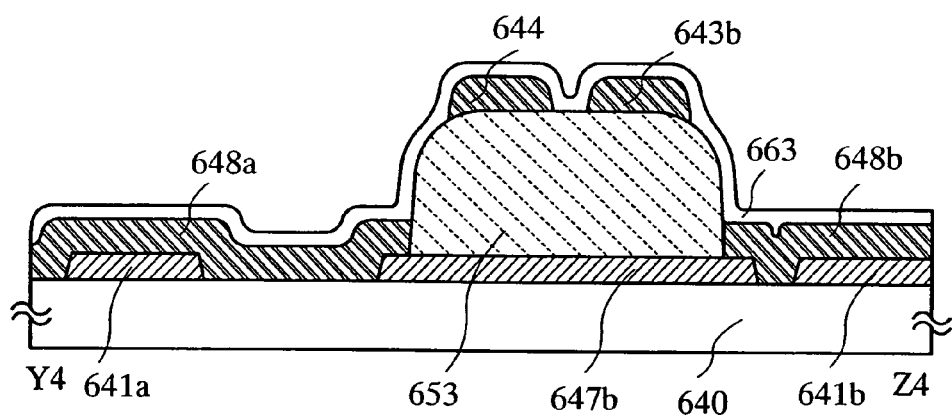

The display device in FIGS. 41A and 41B also illustrate an example in which an insulating layer 653 for physically separating a source/drain electrode layer 643b and a capacitor wiring layer 644 from a wiring layer 647b is selectively formed by a droplet discharge method. In the display devices shown in FIGS. 34A to 36B, short circuit between the source/drain electrode layer and the gate wiring layer is prevented by forming the gate wiring layer so as to cover an insulating layer. In the display device of FIGS. 41A and 41B, the wiring layers 647a and 647b are formed in the steps for forming the gate electrode layers 641a and 641b. Then, a gate insulating layer 642, which covers the wiring layers 647a and 647b, is partially etched to be removed before a source/drain electrode layer 643a and the capacitor wiring layer 644 are formed. As shown in the top view of the display device in FIG. 41A, the gate insulating layer 642 is formed in the region over the semiconductor layer where the gate electrode layer and the source/drain electrode layer are stacked, and where the capacitor is formed; however, the gate insulating layer 642 is not formed in the region where the wiring layers 647a, 647b, 648a, and 648b are formed. Accordingly, the wiring layers can be directly connected without forming a contact hole. On a part of the wiring layer 647b, the insulating layer 653 is selectively formed by a droplet discharge method, on which the source/drain electrode layer 643a and the capacitor wiring layer 644 are formed. Using the same steps for forming the source/drain electrode layer 643b and the capacitor wiring layer 644, the wiring layers 648a and 648b are formed in contact with the gate electrode layers 641a and 641b respectively. The wiring layers 648a and 648b are electrically connected by the wiring layer 647b under the insulating layer 653. In this manner, the gate wiring layer and the gate electrode layer can be electrically connected by the layer under the insulating layer 653.

As described in the aforementioned steps, a highly reliable display device can be manufactured at low cost with high productivity.

This embodiment mode can be implemented in combination with any of Embodiment Modes 1 to 7.

Embodiment Mode 9

Next, description is made on a mode for mounting a driver circuit on a display panel manufactured in accordance with Embodiment Modes 1 to 7.

First, a display device adopting COG (Chip On Glass) bonding is descried with reference to FIG. 30A. Over a substrate 2700, a pixel portion 2701 for displaying text data, image data, and the like is provided. A substrate provided with a plurality of driver circuits is segmented into rectangular shapes, and each segmented driver circuit (hereinafter referred to as a driver IC) 2751 is mounted on the substrate 2700. FIG. 30A illustrates a mode for mounting an FPC 2750 on each end of the plurality of driver ICs 2751. In addition, the size of the substrates segmented may be set substantially equal to a side of a pixel portion on the signal line side, and an end of a single driver IC may be mounted with a tape.

Alternatively, TAB (Tape Automated Bonding) may be adopted, in which case a plurality of tapes are attached as shown in FIG. 30B, and the tapes may be mounted with driver ICs. Similarly to the case of COG bonding, a single tape may be mounted with a single driver IC, in which case it is desirable to attach a metal piece together for securing the driver IC in terms of the strength.

The driver ICs mounted on such display panels are desirably formed in the plural number over a rectangular substrate with one side of 300 to 1000 mm or longer in order to improve the productivity.

That is, a plurality of circuit patterns each of which has a driver circuit portion and a pair of input or output (referred to as input/output) terminals as one unit may be formed over a substrate, and they may be segmented at the end. The length of one side of the driver IC may be set to have a rectangular shape, a long side of which is 15 to 80 mm while a short side of which is 1 to 6 mm, in consideration of the length of one side of the pixel portion or the pixel pitch. Alternatively, the length of one side of the driver IC may be set to have a total length of one side of the pixel region or one side of the pixel portion and one side of each driver circuit.

The outline dimension of a driver IC relatively to an IC chip has the advantage in the length of its long side. When a driver IC having a long side of 15 to 80 mm is used, a smaller number of driver ICs is required to be mounted correspondingly to the pixel portion as compared to the case of using IC chips, which results in the improvement in manufacturing yield. In addition, if the driver ICs are formed over a glass substrate, the shape of the mother substrate is not specifically limited; therefore, productivity is not decreased. This is a great advantage in comparison with the case where IC chips are taken from a circular silicon wafer.

In addition, when a driver circuit 3704 on the scan line side is formed integrally over a substrate as in FIG. 29B, driver ICs formed with driver circuits on the signal line side are mounted on the region outside a pixel region 3701. Such driver ICs are the driver circuits on the signal line side. In order to form a pixel region corresponding to an RGB full color display, 3072 signal lines are required for an XGA panel, and 4800 signal lines are required for an UXGA panel. The signal lines of such number are divided per several blocks at terminal portions of the pixel region 3701, thereby forming leading lines, which are gathered in accordance with the pitch of the output terminals of the driver ICs.

The driver ICs are preferably formed using a crystalline semiconductor formed over a substrate, to which a thin film transistor using the invention can be used. In addition, since excellent mobility and response speed are provided, high-speed operation is enabled while improving the operating frequency of elements as compared to the conventional techniques; thus, characteristic variations are decreased, resulting in higher reliability.

In the pixel region, signal lines and scan lines are disposed crosswise to form a matrix, and a transistor is disposed correspondingly to each intersection. For the transistor disposed in the pixel region, the thin film transistor using the invention can also be used. The thin film transistor manufactured by adopting the invention can exhibit relatively higher mobility with the simplified steps; therefore, it can be effectively utilized for the manufacture of a large-screen display device. Thus, such a thin film transistor can be used as a switching element of a pixel or an element for constituting a driver circuit on the scan line side. Accordingly, a display panel which realizes system-on-panel can be manufactured.

As shown in FIGS. 30A and 30B, driver ICs may be mounted as both of a scan line driver circuit and a signal line driver circuit. In such a case, the specification of the respective driver ICs used for the scan line side and the signal line side are preferably different.

For example, a transistor which constitutes the driver IC on the scan line side requires a withstand voltage of about 30 V, and yet requires an operating frequency of not higher than 100 kHZ, thus it does not relatively require a high-speed operation. Accordingly, the channel length (L) of a transistor which constitutes the driver on the scan line side is preferably designed long. On the other hand, a transistor of the driver IC on the signal line side requires a withstand voltage of about at most 12V; however, it requires a drive frequency of 65 MHz at 3 V, which requires a high-speed operation. Therefore, the channel length and the like of the transistor which constitutes the driver are desirably designed in accordance with a micron rule. Note that the channel length direction corresponds to the direction of a current flow in the channel formation region, namely the direction in which charges move.

The method for mounting the driver ICs is not specifically limited, and a known method such as COG bonding, wire bonding, and TAB may be used.

The driver ICs can have, when formed to have the same thickness as a counter substrate, substantially the same height as the counter substrate, which contributes to the slimming of the whole display device. In addition, when each of the substrates is formed using the same material, thermal stress is not generated even when the temperature change occurs in the display device; therefore, the property of a circuit manufactured using TFTs is not degraded. Further, by mounting a driver circuit using a driver IC which is longer than an IC chip as shown in this embodiment mode, the number of driver ICs mounted in one pixel region can be reduced.

In the aforementioned manner, the driver circuit can be incorporated in the display panel.

This embodiment mode can be implemented in combination with any of Embodiment Modes 1 to 7.

Embodiment Mode 10

Figure 25A:
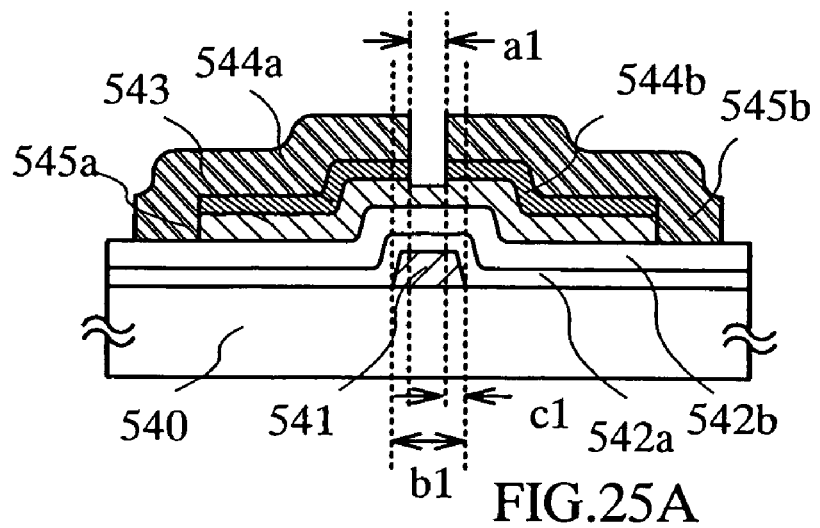
FIGS. 25A to 25C each illustrate a display device of the invention.
Figure 25B:
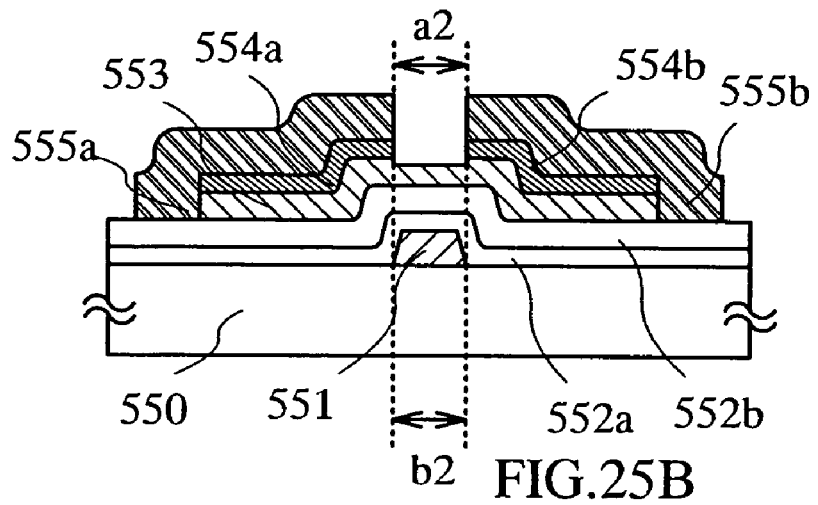
Figure 25C:
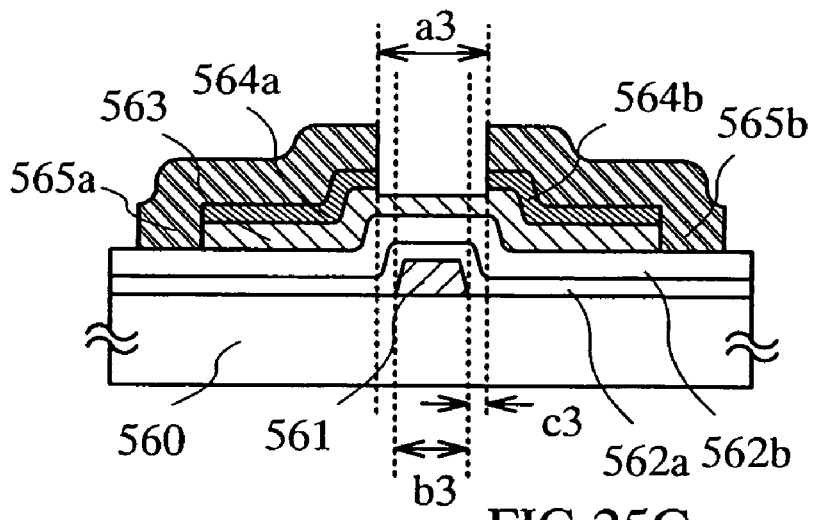

In this embodiment mode, description is made with reference to FIGS. 25A to 25C based on the aforementioned embodiment mode, on the positional relationship between the gate electrode layer and an end portion of the source and drain electrode layer, namely the relationship between the width of the gate electrode layer and the channel length.

FIG. 25A illustrates a thin film transistor formed over a substrate 540, which includes a gate electrode layer 541, gate insulating layers 542a and 542b, a semiconductor layer 543, semiconductor layers having one conductivity type 544a and 544b, and source/drain electrode layers 545a and 545b.

In FIG. 25A, end portions of the source/drain electrode layers 545a and 545b partially overlap the gate electrode layer 541 by the length of c1. Here, the region where the source/drain electrode layers 545a and 545b each overlap the gate electrode layer 541 is called an overlapped region. That is, the width b1 of the gate electrode layer is longer than the channel length a1. The width c1 of the overlapped region can be represented by (b1−a1)/2. An n-channel TFT having such an overlapped region preferably has an n+ region and an n− region between a source electrode layer and a drain electrode layer, and a semiconductor region. With such a structure, an effect of alleviating an electric field is increased, thereby resistance to the hot-carrier degradation can be increased.

FIG. 25B illustrates a thin film transistor formed over a substrate 550, which includes a gate electrode layer 551, gate insulating layers 552a and 552b, a semiconductor layer 553, semiconductor layers having one conductivity type 554a and 554b, and source/drain electrode layers 555a and 555b.

In FIG. 25B, end portions of the gate electrode layer 551 are aligned with end portions of the source/drain electrode layers 555a and 555b respectively. That is, the width b2 of the gate electrode layer is equal to the channel length a2.

FIG. 25C illustrates a thin film transistor formed over a substrate 560, which includes a gate electrode layer 561, gate insulating layers 562a and 562b, a semiconductor layer 563, semiconductor layers 564a and 564b having one conductivity type, and source/drain electrode layers 565a and 565b.

In FIG. 25C, the gate electrode layer 561 is away from each end portion of the source/drain electrode layers 565a and 565b by the length of c3. Here, the region where the gate electrode layer 561 is away from each of the source/drain electrode layers 565a and 565b is called an off-set region. That is, the width b3 of the gate electrode layer is shorter than the channel length a3. The width c3 of the off-set region can be represented by (a3−b3)/2. A TFT having such a structure can have smaller off current; therefore, the provision of such a TFT as a switching element of a display deice can enhance the image contrast.

Further, a TFT having a so-called multi-gate structure may be formed, in which a plurality of gate electrodes are covered with a semiconductor region. The TFT having such a structure can also have a smaller off current.

This embodiment mode can be implemented in combination with any of Embodiment Modes 1 to 9.

Embodiment Mode 11

In the aforementioned embodiment mode, a source and drain electrode layer having a terminal portion, which is perpendicular to the surface of a channel formation region is shown; however, the invention is not limited to such a structure. In this embodiment mode, description is made with reference to FIG. 24 on an example in which a semiconductor layer having one conductivity type has a different shape.

Figure 24:
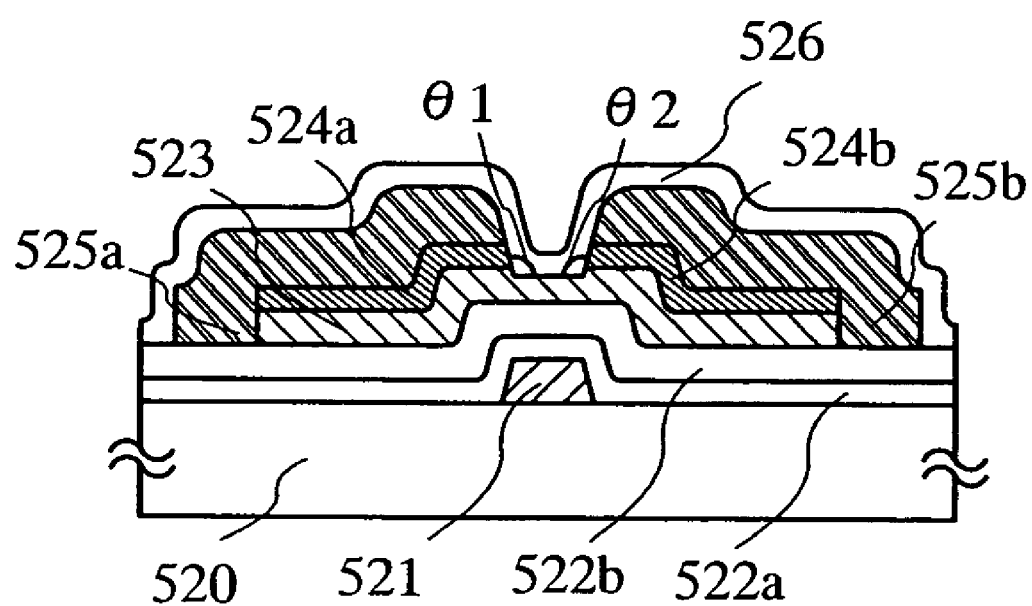
FIG. 24 illustrates a display device of the invention.

FIG. 24 illustrates a thin film transistor formed over a substrate 520, which includes a gate electrode layer 521, gate insulating layers 522a and 522b, a semiconductor layer 523, semiconductor layers 524a and 524b having one conductivity type, and source/drain electrode layers 525a and 525b.

As shown in FIG. 24, each of the semiconductor layers having one conductivity type 524a and 524b may have an end portion which makes an angle of larger than 90 but smaller than 180 degrees with respect to the surface of the channel formation region, and preferably 95 to 140 degrees, or more preferably 135 to 140 degrees. In addition, provided that the angle between the source electrode layer and the surface of the channel formation region is θ1 while the angle between the drain electrode layer and the surface of the channel formation region is θ2, θ1 and θ2 may be equal to or different from each other. The source electrode and the drain electrode having such shapes can be formed by dry etching.

This embodiment mode can be implemented in combination with any of Embodiment Modes 1 to 10.

Embodiment Mode 12

In this embodiment mode, description is made with reference to FIGS. 22A and 22B and FIGS. 23A to 23D on crystallization step which is adaptable to the aforementioned mode.

Figure 22A:
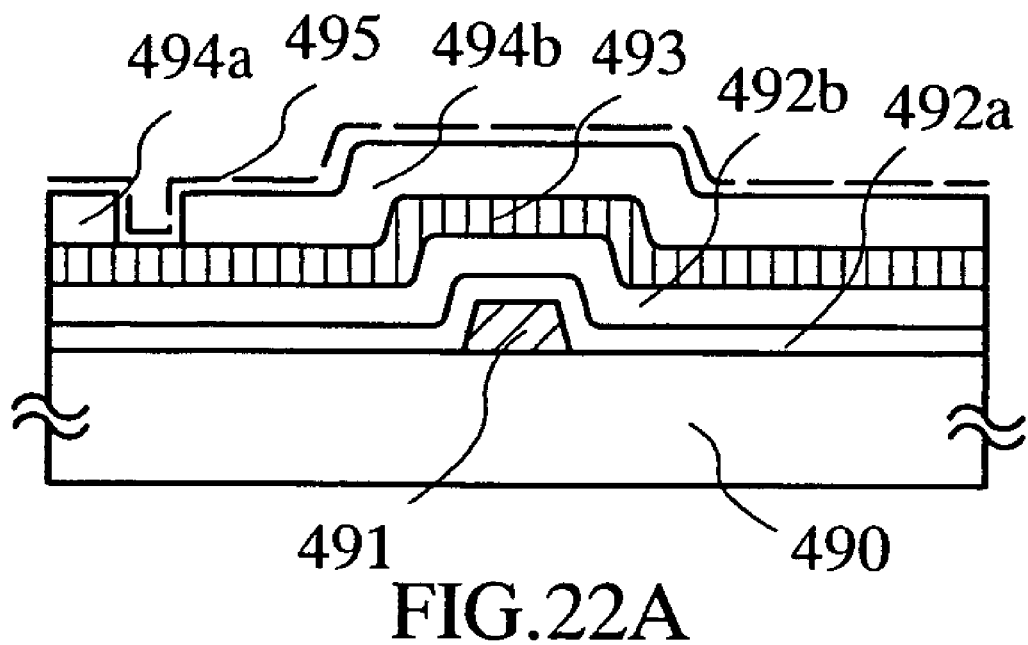
FIGS. 22A and 22B each illustrate a display device of the invention.
Figure 22B:
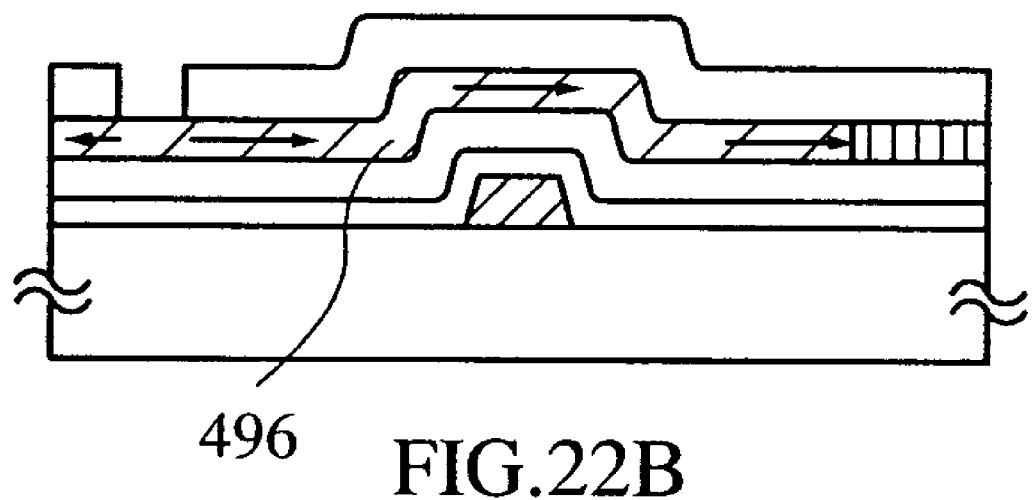

In FIGS. 22A and 22B, a gate electrode layer 491, and gate insulating layers 492a and 492b are formed over a substrate 490, over which a semiconductor film 493 is formed. Masks 494a and 494b each formed of an insulating film are formed over the semiconductor film 493, and a metal layer 495 is selectively formed, thereby the semiconductor film can be crystallized. When the semiconductor film is heated, crystals thereof grow in the direction parallel to the surface of the substrate as shown by arrows in FIG. 22B from the portion where the semiconductor film is in contact with the metal layer 495, thereby a crystalline semiconductor film 496 is formed. Note that a portion far away from the metal layer 495 is not crystallized, thereby an amorphous portion remains.

Figure 23A:
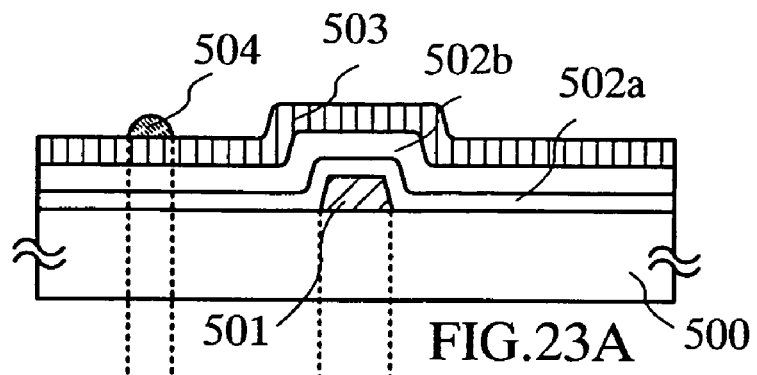
FIGS. 23A to 23D each illustrate a display device of the invention.
Figure 23B:
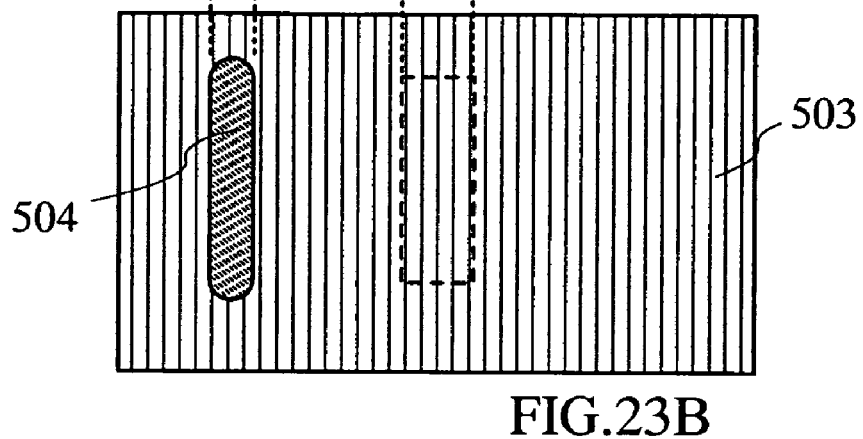
Figure 23C:
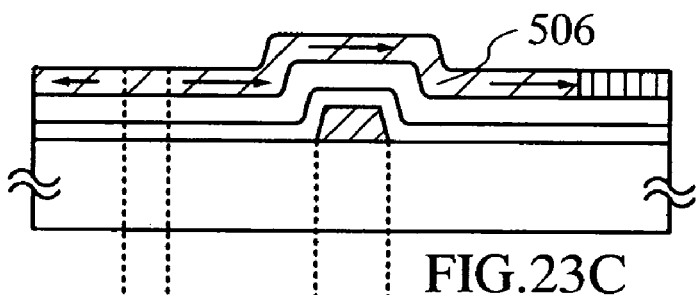
Figure 23D:
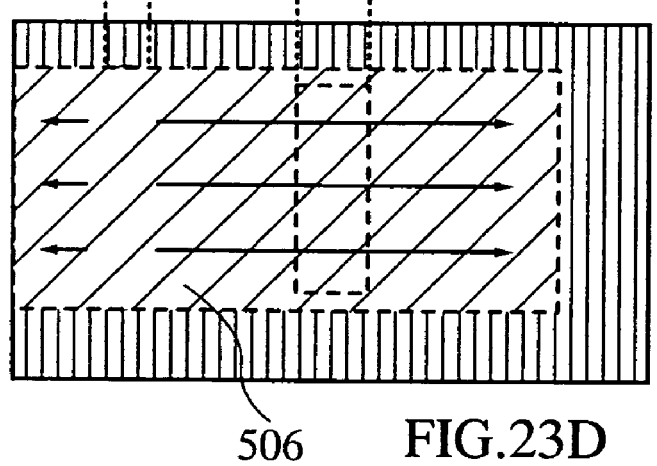

Alternatively, as shown in FIG. 23A, the aforementioned crystallization may be performed after selectively forming a metal layer 504 by a droplet discharge method without using a mask. FIG. 23B is a top view of FIG. 23A. In addition, FIG. 23D is a top view of FIG. 23C.

In FIGS. 23A to 23D, a gate electrode layer 501, and gate insulating layers 502a and 502b are formed over a substrate 500, over which a semiconductor film 503 is formed. On the semiconductor film 503, the metal layer 504 is selectively formed by a droplet discharge method. When the semiconductor film is crystallized by thermal treatment, crystals thereof grow in the direction parallel to the surface of the substrate as shown by arrows in FIGS. 23C and 23D from the portion where the semiconductor film is in contact with the metal film. Note that a portion far away from the metal layer 504 is not crystallized, thereby an amorphous portion remains.

In this manner, crystalline growth in the direction parallel to the substrate is called lateral growth. Since crystalline grains of a large grain size can be formed by the lateral growth, a thin film transistor having higher mobility can be formed.

This embodiment mode can be implemented in combination with any of Embodiment Modes 1 to 11.

Embodiment Mode 13

Description is made on an example of a protective circuit included in the semiconductor device of the invention.

Figure 42A:
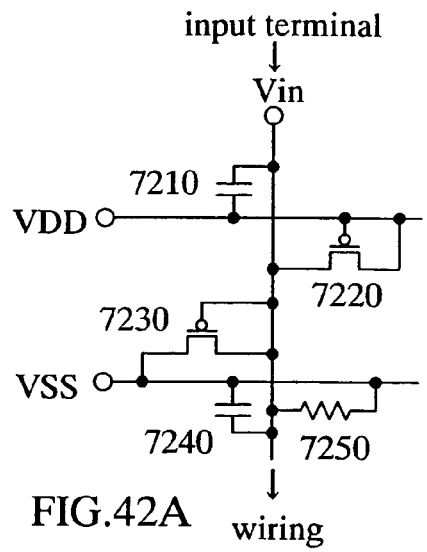
FIGS. 42A to 42E each illustrate a protective circuit to which the invention can be applied.

As shown in FIGS. 30A and 30B, a protective circuit 2703 or 2713 is formed between an external circuit and an internal circuit. The protective circuit is constructed with one or more elements selected from a TFT, a diode, a resistor, and a capacitor. Described below are several configurations of the protective circuit and the operation thereof. First, description is made below with reference to FIGS. 42A to 42E on the configuration of an equivalent circuit of a protective circuit which is disposed between an external circuit and an internal circuit and which corresponds to one input terminal. The protective circuit shown in FIG. 42A includes p-channel thin film transistors 7220 and 7230, capacitors 7210 and 7240, and a resistor 7250. The resistor 7250 has two terminals, one of which is supplied with an input voltage Vin (hereinafter referred to as Vin) and the other of which is supplied with a low-potential voltage VSS (hereinafter referred to as VSS).

Figure 42D:
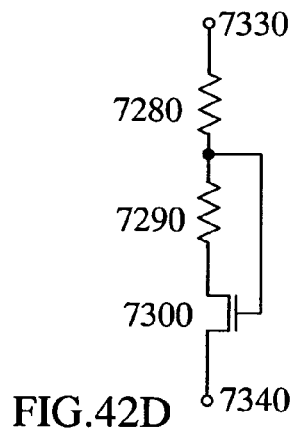
Figure 42B:
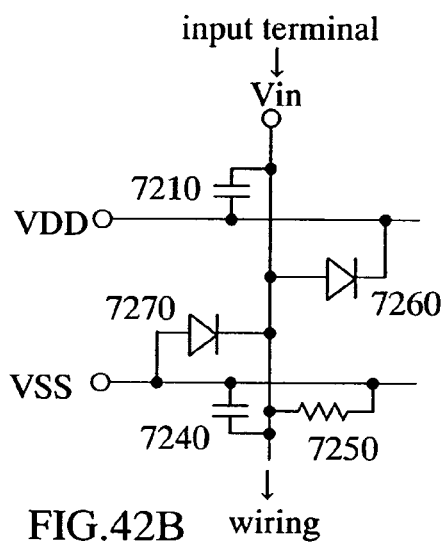
Figure 42E:
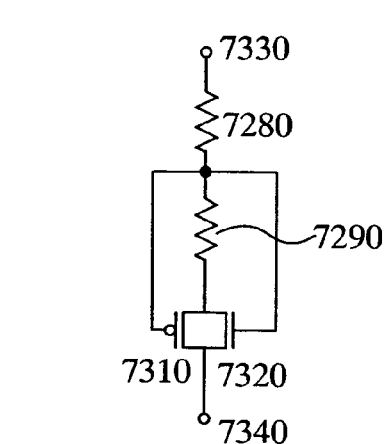
Figure 42C:
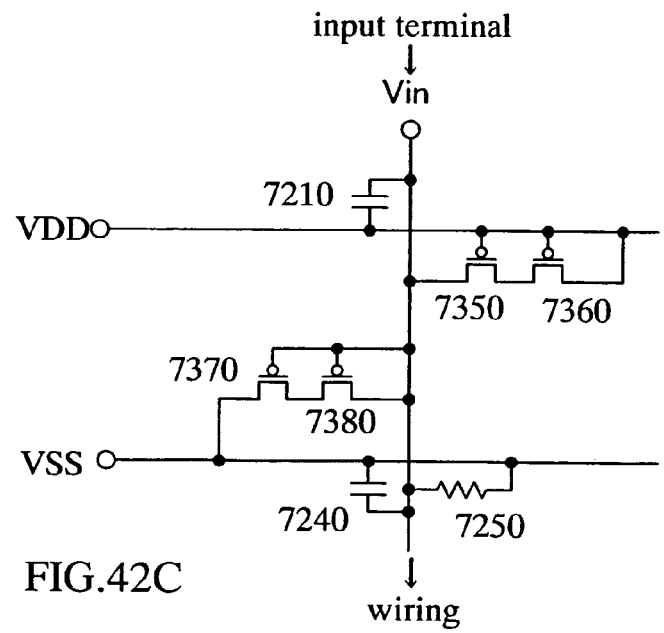

The protective circuit shown in FIG. 42B is an equivalent circuit diagram in which the p-channel thin film transistors 7220 and 7230 are substituted with rectifying diodes 7260 and 7270. A protective circuit shown in FIG. 42C is an equivalent circuit diagram in which the p-channel thin film transistors 7220 and 7230 are substituted with TFTs 7350, 7360, 7370, and 7380. In addition, a protective circuit having a still another configuration is shown in FIG. 42D, which includes resistors 7280 and 7290, and an n-channel thin film transistor 7300. A protective circuit shown in FIG. 42E includes resistors 7280 and 7290, an p-channel thin film transistor 7310, and an n-channel thin film transistor 7320. By providing a protective circuit, a sudden surge of potentials can be prevented, thereby element breakdown or damage can be prevented, which results in higher reliability. Note that an element having the aforementioned protective circuit is preferably formed using an amorphous semiconductor having high withstand voltage.

This embodiment mode can be implemented in combination with any of Embodiment Modes 1 to 12.

Embodiment Mode 14

A display device can be formed by using a thin film transistor which is formed by adopting the invention. In the case where a light-emitting element is used, and an n-channel transistor is used as a transistor for driving the light-emitting element, light emitted from the light-emitting element is emitted to any one of the top, bottom, and dual sides. Here, description is made with reference to FIGS. 46A to 46C on a stacked-layer structure of a light-emitting element in accordance with the respective cases.

In this embodiment mode, channel-etch type thin film transistors 671, 681, and 691 to which the invention is applied are used. Further, in this embodiment mode, a silicon film having a crystalline structure is used as a semiconductor layer, and an n-type semiconductor layer is used as a semiconductor layer having one conductivity type. Instead of forming the n-type semiconductor layer, a semiconductor layer may be imparted with a conductivity type by being applied with plasma treatment with a $PH_3$ gas. The semiconductor layer is not limited to this embodiment mode. For example, instead of forming a semiconductor layer having one conductivity type, an impurity region having one conductivity type may be formed by introducing (doping) impurities into a crystalline semiconductor layer.

In addition, the thin film transistor may be a channel-protective type thin film transistor having a channel-protective layer, in which case the channel protective layer may be formed by dropping polyimide, polyvinyl alcohol, or the like by a droplet discharge method. As a result, an exposure step can be omitted. The channel-protective layer may be a film formed using one or more of an inorganic material (e.g., silicon oxide, silicon nitride, silicon oxynitride, or silicon nitride oxide), a photosensitive or non-photosensitive organic material (organic resin material) (e.g., polyimide, acrylic, polyamide, polyimide amide, or benzocyclobutene), a resist, a low-k (low dielectric constant) material, and the like, or stacked layers of such films. Alternatively, a siloxane resin may be formed. As the manufacturing method of the channel-protective layer, vapor phase growth such as plasma CVD and thermal CVD or sputtering may be used. Alternatively, a droplet discharge method or a printing method (method for forming patterns such as screen printing and offset printing) may be used. A TOF film or an SOG film obtained by a coating method may be used as well.

Figure 46A:
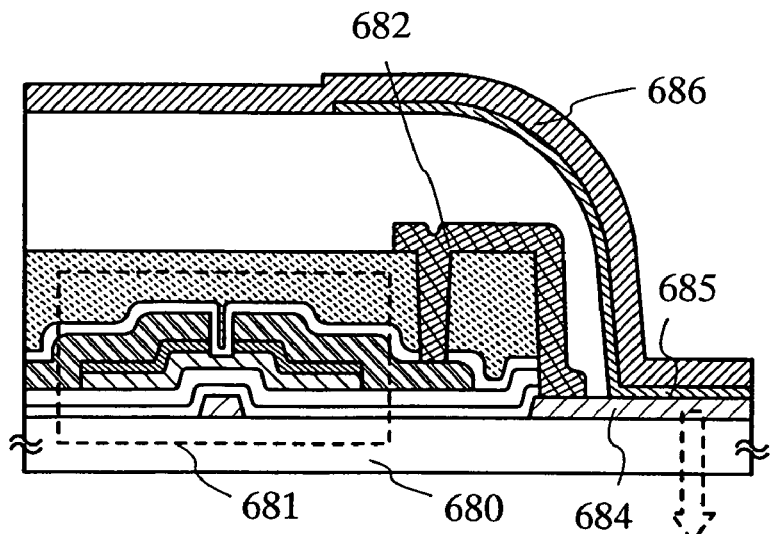
FIGS. 46A to 46C each illustrate a display device of the invention.

First, description is made with reference to FIG. 46A on the case where light is emitted to the side of a substrate 680, namely the case where bottom emission is carried out. In this case, a first electrode layer 684, an electroluminescent layer 685, and a second electrode layer 686 are stacked in this order to be in contact with a wiring layer 682 connected to a source/drain electrode layer so as to be electrically connected to the thin film transistor 681. The substrate 680 is required to transmit light. Next, description is made with reference to FIG. 46B on the case where light is emitted to the opposite side of a substrate 690, namely the case where top emission is carried out. The thin film transistor 691 may be formed similarly to the aforementioned thin film transistor.

A wiring layer 692 connected to a source/drain electrode layer which is electrically connected to the thin film transistor 691 is in contact with and electrically connected to the first electrode layer 684. A gate electrode layer of the thin film transistor 691 has a stacked-layer structure, and the first electrode layer formed using the same steps and material as the gate electrode layer also has a stacked-layer structure of first electrode layers 693a and 693b. The first electrode layer 693a is a reflective metal layer, and light emitted from the light-emitting element is reflected to the top side in the direction of an arrow. Accordingly, even when the light travels through the first electrode layer 693b, it is reflected on the first electrode layer 693a, and emitted to the opposite side of the substrate 690. Needless to say, the first electrode layer may have a single-layer structure of a reflective metal layer. The first electrode layers 693a and 693b, an electroluminescent layer 694, and a second electrode layer 695 are stacked in this order. Finally, description is made with reference to FIG. 46C on the case where the light is emitted to the side of a substrate 670 and the opposite side thereof, namely the case where dual emission is carried out. The thin film transistor 671 is a channel-etch type thin film transistor as well as the thin film transistor 681, and can be formed similarly to the thin film transistor 681. A wiring layer 675 connected to a source/drain electrode layer which is electrically connected to the thin film transistor 671 is electrically connected to a first electrode layer 672. The first electrode layer 672, an electroluminescent layer 673, and a second electrode layer 674 are stacked in this order. At this time, if both of the first electrode layer 672 and the second electrode layer 672 are formed of a light-transmissive material or with a thickness to transmit light, dual emission is realized. In such a case, an insulating layer to transmit light and the substrate 670 are also required to transmit light.

FIGS. 45A to 45D illustrate modes of a light-emitting element which can be applied to this embodiment mode. The light-emitting element has a structure that an electroluminescent layer 860 is interposed between a first electrode layer 870 and a second electrode layer 850. Each material for the first electrode layer and the second electrode layer is required to be selected in consideration of a work function, and each of the first electrode layer and the second electrode layer can be an anode or a cathode according to a pixel structure. In this embodiment mode, the conductivity of a driving TFT is n type; therefore, it is desirable that the first electrode layer be a cathode while the second electrode layer be an anode. If the driving TFT has p-type conductivity, it is desirable that the first electrode layer be an anode while the second electrode layer be a cathode.

Figure 45A:
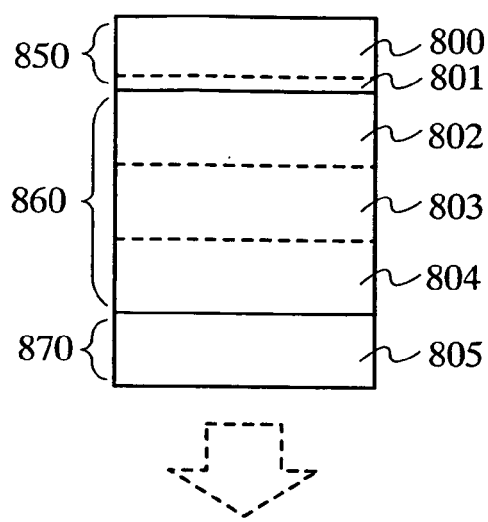
FIGS. 45A to 45D each illustrate a structure of a light-emitting element which can be applied to the invention.
Figure 45B:
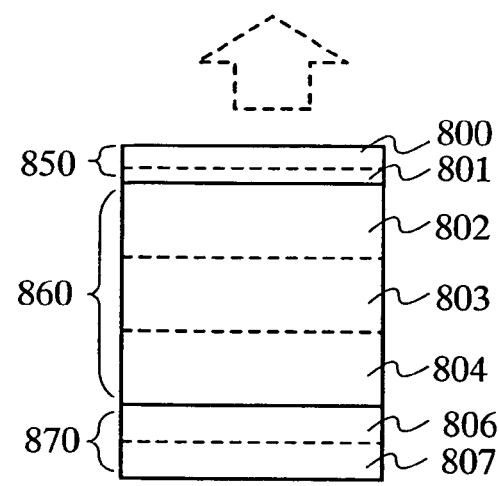

FIGS. 45A and 45B illustrate the case where the first electrode layer 870 is an anode while the second electrode layer 850 is a cathode, in which case the electroluminescent layer 860 preferably has a stacked-layer structure of an HIL (Hole-Injection Layer) and HTL (Hole-Transporting Layer) 804, an EML (light-EMitting Layer) 803, an ETL (Electron-Transporting Layer) and EIL (Electron-Injection Layer) 802, and the second electrode layer 850, which are formed in this order from the side of the first electrode layer 870. FIG. 45A illustrates a structure in which light is emitted from the first electrode layer 870. The first electrode layer 870 has an electrode layer 805 formed of a light-transmissive conductive oxide material, and the second electrode layer has stacked layers of an electrode layer 801 containing alkaline metals such as LiF and MgAg or alkaline earth metals, and an electrode layer 800 formed of a metal material such as aluminum, which are formed in this order from the side of the electroluminescent layer 860. FIG. 45B illustrates a structure in which light is emitted from the second electrode layer 850. The first electrode layer has stacked layers of an electrode layer 807 formed of metals such as aluminum and titanium, or a metal material containing such metals and nitrogen at a concentration not higher than the stoichiometric composition ratio, and a second electrode layer 806 formed of a conductive oxide material containing silicon oxide at a concentration of 1 to 15 atomic %. The second electrode layer has stacked layers of an electrode layer 801 containing alkaline metals such as LiF and MgAg or alkaline earth metals, and an electrode layer 800 formed of a metal material such as aluminum, which are formed in this order from the side of the electroluminescent layer 860. By forming each layer to be not thicker than 100 nm so as to transmit light, light can be emitted from the second electrode layer 850.

Figure 45C:
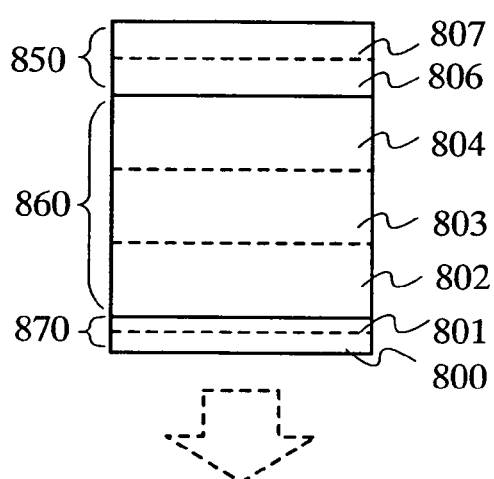
Figure 45D:
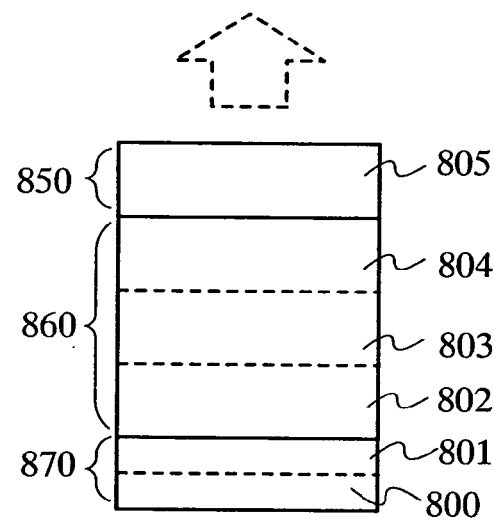

FIGS. 45C and 45D illustrate the case where the first electrode layer 870 is a cathode while the second electrode layer 850 is an anode, in which case the electroluminescent layer 860 preferably has a stacked-layer structure of the EIL (Electron-Injection Layer) and ETL (Electron-Transporting Layer) 802, the EML (light-EMitting Layer) 803, the HTL (Hole-Transporting Layer) and HIL (Hole-Injection Layer) 804, and the second electrode layer 850 as an anode, which are formed in this order from the cathode side. FIG. 45C illustrates a structure in which light is emitted from the first electrode layer 870. The first electrode layer 870 has stacked layers of the electrode layer 801 containing alkaline metals such as LiF and MgAg or alkaline earth metals, and the electrode layer 800 formed of a metal material such as aluminum, which are formed in this order from the side of the electroluminescent layer 860. By forming each layer to be not thicker than 100 nm so as to transmit light, light can be transmitted from the first electrode layer 870. The second electrode layer has stacked layers of the second electrode layer 806 formed of a conductive oxide material containing silicon oxide at a concentration of 1 to 15 atomic %, and the electrode layer 807 formed of metals such as aluminum and titanium, or a metal material containing such metals and nitrogen at a concentration not higher than the stoichiometric composition ratio, which are formed in this order from the side of the electroluminescent layer 860. FIG. 45D illustrates a structure in which light is emitted from the second electrode layer 850. The first electrode layer 870 has stacked layers of the electrode layer 801 containing alkaline metals such as LiF and MgAg or alkaline earth metals, and the electrode layer 800 formed of a metal material such as aluminum, which are formed in this order from the side of the electroluminescent layer 860. Each layer is formed thin thick enough to reflect light which is emitted from the electroluminescent layer 860.

The second electrode layer 850 has the electrode layer 805 formed of a light-transmissive conductive oxide material. Note that the electroluminescent layer may have a single-layer structure or a mixed structure as well as the stacked-layer structure.

As the electroluminescent layer, materials for red (R), green (G), and blue (B) emission are selectively formed by vapor deposition using an evaporation mask. Red (R), green (G), and blue (B) emission can also be formed by a droplet discharge method (with a low or high molecular weight material) as well as by using a color filter, which is preferable since RGB can be deposited selectively without using a mask.

In the case of a top-emission structure in which the second electrode layer is formed using light-transmissive ITO or ITSO, benzoxazoles derivatives (BzOs) added with Li (i.e., BzOs—Li) and the like can be used. Alternatively, the EML can be formed using, for example, $Alq_3$ which is doped with a dopant corresponding to each emission color of RGB (e.g., DCM for R, and DMQD for G).

Note that the electroluminescent layer is not limited to the aforementioned materials. For example, when oxide such as molybdenum oxide ($MoO_x$: x=2 to 3) and a-NPD or rubrene are co-evaporated to form the electroluminescent material instead of using CuPc or PEDOT, a hole injection property can be improved. Alternatively, the material for electroluminescent layer can be formed using an organic material (including low and high molecular weight materials) or a composite material of the organic material and an inorganic material. The material for forming the light-emitting element is described in detail.

As the substance having a specifically superior electron-transporting property among the charge-injection or transporting substances, there is a metal complex having quinoline or benzoquinoline skeleton such as tris(8-quinolinolato) aluminum (abbreviated to $Alq_3$), tris(4-methyl-8-quinolinolato) aluminum (abbreviated to $Almq_3$), bis(10-hydroxybenzo[h]-quinolinato)beryllium (abbreviated to $BeBq_2$), and bis(2-methyl-8-quinolinolato)-4-phenylphenolato-aluminum (abbreviated to BAlq). As the substance having a superior hole-transporting property, for example, there is an aromatic amine compound (compound having benzene ring-nitrogen bonds) such as 4,4'-bis[N-(1-naphthyl)-N-phenyl-amino]-biphenyl (abbreviated to a-NPD), N,N'-bis(3-methylphenyl)-N,N'-diphenyl-1,1'-biphenyl-4,4'-diamine (abbreviated to TPD), 4,4',4"-tris(N,N-diphenyl-amino)-triphenylamine (abbreviated to TDATA), and 4,4',4"-tris[N-(3-methylphenyl)-N-phenyl-amino]-triphenylamine (abbreviated to MTDATA).

In addition, as the substance having a specifically superior electron-injection property among the charge-injection or transporting substances, there is a compound of alkaline metals or alkaline earth metals such as lithium fluoride (LiF), cesium fluoride (CsF), and calcium fluoride ($CaF_2$). Alternatively, a mixture of a substance having a superior electron-transporting property such as $Alq_3$ and an alkaline earth metal such as magnesium (Mg) may be used.

As the substance having a superior hole-injection property among the charge-injection or transporting substances, there is a metal oxide such as molybdenum oxide ($MoO_x$), vanadium oxide ($VO_x$), ruthenium oxide ($RuO_x$), tungsten oxide ($WO_x$), and manganese oxide ($MnO_x$). In addition, there is a phthalocyanine-based compound such as phthalocyanine (abbreviated to $H_2Pc$) and copper phthalocyanine (CuPC).

As the light-emitting layer, a structure for performing color display may be employed by forming a light-emitting layer having a different emission spectrum in each pixel. Typically, a light-emitting layer corresponding to each color of R (red), G (green) and B (blue) is formed. In this case also, color purity can be improved as well as the mirror-like surface (glare) of the pixel portion can be prevented by adopting a structure where a filter for transmitting light with the emission spectrum is provided on the emission side of the pixel. By providing the filter, a circular polarizing plate and the like which have been conventionally required can be omitted, which can recover the loss of light emitted from the light-emitting layer. Further, changes in color tone, which are recognized when the pixel portion (display screen) is seen obliquely, can be reduced.

As the light-emitting material, various materials can be used. As a low molecular weight organic light-emitting material, there are 4-dicyanomethylene-2-methyl-6-[2-(1,1,7,7-tetramethyljulolidine-9-yl)ethenyl]-4H-pyran (abbreviated to DCJT), 4-dicyanomethylene-2-t-butyl-6-[2-(1,1,7,7-tetramethyljulolidine-9-yl)ethenyl]-4H-pyran (abbreviated to DCJTB), periflanthene, 2,5-dicyano-1,4-bis[2-(10-methoxy-1,1,7,7-tetramethyljulolidine-9-yl)ethenyl]benzene, N,N'-dimethyl quinacridone (abbreviated to DMQd), Coumalin 6, Coumarin 545T, tris(8-quinolinolato) aluminum (abbreviated to $Alq_3$), 9,9'-biantolyl, 9,10-diphenylanthracene (abbreviated to DPA), 9,10-di(2-naphthyl)anthracene (abbreviated to DNA), and the like. Alternatively, other substances may be employed.

On the other hand, a high molecular weight organic light-emitting material has higher physical strength as compared to the low molecular weight organic light-emitting material, and thus is highly durable. In addition, since the material can be deposited by coating, manufacture of the element can be relatively facilitated. The light-emitting element using the high molecular weight organic light-emitting material has basically the same structure as the light-emitting element using the low molecular weight organic light-emitting material, in which a cathode, an organic light-emitting layer, and an anode are stacked in this order. However, in manufacture of the light-emitting layer using the high molecular weight organic light-emitting material, it is difficult to form a stacked-layer structure similarly to the light-emitting layer using the low molecular weight organic light-emitting material; therefore, a bi-layer structure is often adopted. Specifically, such a structure is adopted that a cathode, a light-emitting layer, a hole-transporting layer and an anode are stacked in this order over the semiconductor layer is adopted.

The emission color is determined by the material for forming the light-emitting layer; therefore, by selecting the material, a light-emitting element which exhibits desired luminescence can be formed. As the high molecular weight organic light-emitting material which can be used for forming the light-emitting layer, there is a polyparaphenylene vinylene, polyparaphenylene, polythiophene or polyfluorene-based compound.

As the polyparaphenylene vinylene-based compound, there are derivatives of poly(paraphenylene vinylene) [PPV] such as poly(2,5-dialkoxy-1,4-phenylene vinylene [RO-PPV], poly[2-(2'-ethylhexoxy)-5-methoxy-1,4-phenylene vinylene [MEH-PPV], and poly(2-(dialkoxyphenyl)-1,4-phenylene vinylene [ROPh-PPV]. As the polyparaphenylene-based compound, there are derivatives of polyparaphenylene [PPP] such as poly(2,5-dialkoxy-1,4-phenylene) [RO-PPP] and poly(2,5-dihexoxy-1,4-phenylene). As the polythiophene-based compound, there are derivatives of polythiophene [PT] such as poly(3-alkylthiophene) [PAT], poly (3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene][POPT], and poly[3-(4-octylphenyl)-2,2-bithiophene][PTOPT]. As the polyfluorene-based compound, there are derivatives of polyfluorene [PF] such as poly(9,9-dialkylfluorene) [PDAF] and poly(9,9-diochtylfluorene) [PDOF].

Note that the hole-injection property from the anode can be improved if a high molecular weight organic light-emitting material having a hole-transporting property is formed to be interposed between the anode and the high molecular weight organic light-emitting material. In general, the material dissolved in water with an acceptor material is applied by spin coating or the like. In addition, since the material is insoluble in organic solvent, it can be stacked with the aforementioned organic light-emitting material. As the high molecular weight organic light-emitting material having a hole-transporting property, there are a mixture of PEDOT and camphorsulfonic acid (CSA) as an acceptor material, a mixture of polyaniline [PANI] and polystyrenesulphonic [PSS] as an acceptor material, and the like.

The light-emitting layer can be formed to have a structure to emit monochromatic light or white light. In the case of using a white-light-emitting material, color display can be achieved by adopting the structure where a filter (colored layer) for transmitting light with a specific wavelength is provided on the emission side of the pixel.

In order to form a light-emitting layer to emit white light, for example, white emission can be obtained by sequentially stacking $Alq_3$ which is partially doped with Nile Red as a red emission pigment, $Alq_3$, p-EtTAZ, and TPD (aromatic diamine) by vapor deposition. In addition, in the case of forming an EL layer by coating with a spin coater, the EL layer is desirably baked by vacuum heating after the coating. For example, the whole surface is coated with an aqueous solution of poly(3,4-ethylenedioxythiophene)/poly(styrenesulfonate) (PEDOT/PSS) which functions as a hole-injection layer, and then baked. Subsequently, the whole surface is coated with a polyvinylcarbazole (PVK) solution doped with a luminescence center pigment (e.g., 1,1,4,4-tetraphenyl-1,3-butadiene (TPB), 4-(dicyano-methylene)-2-methyl-6-(p-dimethylaminostyryl)-4H-pyran (DCM1), Nile Red, or Coumarin 6) which functions as a light-emitting layer.

The light-emitting layer may be formed in a single layer, and it may be formed using polyvinylcarbazole (PVK) having a hole-transporting property dispersed with 1,3,4-oxadiazole derivatives (PBD) having an electron transporting property. In addition, by dispersing 30 wt % of PBD as an electron-transporting agent, and further dispersing four kinds of pigments (TPB, Coumarin 6, DCM1, and Nile Red) in appropriate quantities, white emission can be obtained. Not only the light-emitting element which provides white emission shown herein, but also a light-emitting element which provides red, green or blue emission can be manufactured by appropriately selecting the material for the light-emitting layer.

Further, the light-emitting layer may be formed using a material for emission that is obtained from a singlet excitation (hereinafter referred to as a singlet excitation light-emitting material), or a material for emission that is obtained from a triplet excitation (hereinafter referred to as a triplet excitation light-emitting material) including a metal complex. For example, among light-emitting pixels for red emission, green emission and blue emission, the light-emitting pixel for red emission, which has a relatively short luminance half decay period (time until which the luminance decays to the half level of its original value), is formed using a triplet excitation light-emitting material while the other light-emitting pixels are formed using a singlet excitation light-emitting material. The triplet excitation light-emitting material has high luminous efficiency, which is advantageous in that lower power consumption is required for obtaining the same luminance. That is, when the triplet excitation light-emitting material is applied to the red pixel, the amount of current supplied to the light-emitting element can be suppressed, resulting in the improvement of reliability. For lowering the power consumption, the light-emitting pixels for red emission and green emission may be formed using a triplet excitation light-emitting material while the light-emitting element for blue emission may be formed using a singlet excitation light-emitting material. When forming the light-emitting element for green emission that is highly visible to human eyes using the triplet excitation light-emitting material, even lower power consumption can be achieved.

As an example of the triplet excitation light-emitting material, there is the one using a metal complex as a dopant, which includes a metal complex having, as a central metal, platinum that is a third transition element or iridium, and the like. The triplet excitation light-emitting material is not limited to the aforementioned compounds, and it may be a compound having an element of groups 8 to 10 in the periodic table as a central metal.

The aforementioned substances for forming the light-emitting layer are only examples, and a light-emitting element can be formed by appropriately stacking each functional layer such as a hole-injection layer, a hole-transporting layer, an electron-injection layer, an electron-transporting layer, a light-emitting layer, an electron-blocking layer, and a hole-blocking layer. In addition, a mixed-layer or mixed-junction structure combining such layers may be employed. The layer structure of the light-emitting layer may be changed, and the modification is possible without departing the broader spirit of the invention such that no specific electron-injection region or light-emitting region is provided but an alternative electrode layer for this purpose is provided or a light-emitting material is dispersed.

The light-emitting element formed using the aforementioned materials emits light when it is applied with a forward bias. Pixels of a display device formed with light-emitting elements may be driven by a passive matrix method or an active matrix method as described in Embodiment 2. In either case, the individual pixel is controlled to emit light by being applied with a forward bias at specific timing, and it is controlled to emit no light in a certain period. By applying a reverse bias in the non-emission period, the reliability of the light-emitting elements can be improved. As a degradation mode of the light-emitting elements, there is a degradation that the luminance intensity is decreased under the constant drive conditions, or a degradation that the apparent luminance is decreased due to the non-emission region increased in the pixels. For this, by performing AC drive in which forward and reverse biases are applied, degradation speed can be retarded, resulting in the improvement of the reliability of the light-emitting device. In addition, either a digital drive or an analog drive may be applied.

Figure 46B:
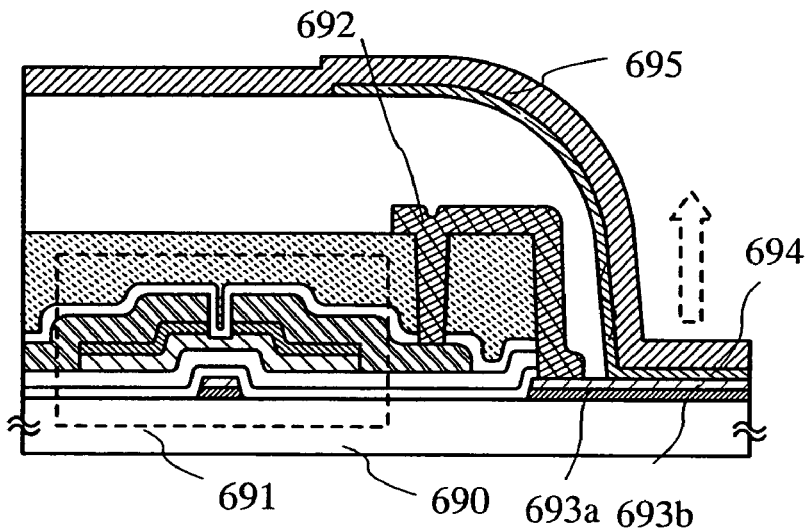
Figure 46C:
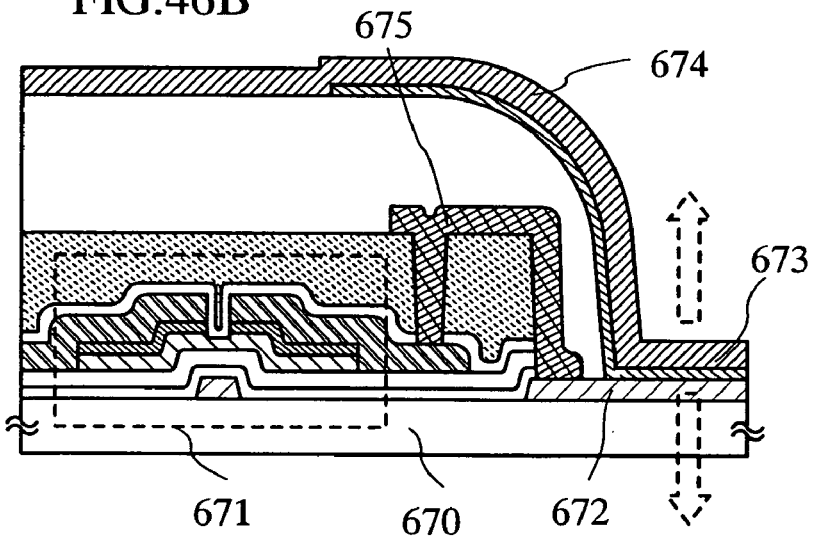

Accordingly, though not shown in FIGS. 46A to 46C, a color filter (colored layer) may be formed on a sealing substrate for the substrate 680. The color filter (colored layer) may be formed by a droplet discharge method, in which case light irradiation treatment can be adopted as the base pretreatment. When the invention is used, a color filter (colored layer) can be formed with high controllability to have a desired pattern. In addition, when the color filter (colored layer) is used, high resolution display can be performed. This is because the provision of the color filter (colored layer) can correct the broad peaks of the emission spectrum of each RGB to be sharp.

Described above is the case where a material for each emission of RGB is formed; however, a full color display can also be performed by forming a material for monochrome emission, and combining a color filter or a color conversion layer. The color filter (colored layer) or the color conversion layer may be formed, for example, on the sealing substrate to be attached to the substrate. In addition, as set forth above, each of the material for monochrome emission, the color filter (colored layer), and the color conversion layer can be formed by a droplet discharge method.

Needless to say, monochrome-emission display may be performed. For example, an area-color type display device can be formed using monochrome emission. The area-color type is suitable for a passive matrix display portion, with which text and symbols can be displayed.

In the aforementioned structures, the cathode can be formed using a material having a low work function, for example such as Ca, Al, CaF2, MgAg, and AlLi. The light-emitting layer may have any of a single-layer structure, a stacked-layer structure, and a mixed structure having no interface between layers. The light-emitting layer is formed of a light-emitting material and a substance having a charge-injection or -transporting property including an organic compound or an inorganic compound. The organic compound can be classified into, according to the number of molecules thereof, a low molecular weight organic compound, a medium molecular weight organic compound (corresponding to an organic compound having no sublimation property, in which the number of molecules is less than 20, or the length of the molecules connected in chain alignment is not longer than 10 μm), and a high molecular weight organic compound. The light-emitting layer includes one or more layers formed of such organic compounds, which may also be combined with an inorganic compound having an electron-injection or -transporting property or hole-injection or -transporting property. Each of the first electrode layer 684, the first electrode layer 693a, and the first electrode layer 672 is formed using a light-transmissive conductive film, for example such as ITO, ITSO, or indium oxide mixed with 2 to 20% of zinc oxide (ZnO). Note that before forming the first electrode layer 684, the first electrode layer 693a, the first electrode layer 693b, and the first electrode layer 672, plasma treatment in an oxygen atmosphere or thermal treatment in vacuum is preferably performed. A partition wall (also called a bank) is formed using a material containing silicon, an organic material, or a compound material. Alternatively, a porous film may be used. If a photosensitive or non-photosensitive material such as acrylic and polyimide is used, the side face of the partition wall can have a continuously variable curvature radius, which is preferable since a thin film of the upper layer can be formed continuously. This embodiment mode can be implemented in combination with any of Embodiment Modes 1 to 13.

Embodiment Mode 15

Description is made below with reference to FIGS. 47A to 47F on the configuration of a pixel included in the display panel shown in this embodiment mode.

The pixel shown in FIG. 47A includes a signal line 710 and power supply lines 711, 712, and 713 in columns, and a scan line 714 in rows. The pixel also includes a switching TFT 701, a driving TFT 703, a current-controlling TFT 704, a capacitor 702 and a light-emitting element 705.

The pixel shown in FIG. 47C is different from FIG. 47A in that the gate electrode of the TFT 703 is connected to the power supply line 715 disposed in rows, and configuration other than this is the same as FIG. 10A. That is, the pixels shown in FIGS. 47A and 47C are equivalent circuit diagrams of each other. However, each power supply line is formed of a conductive film of different layers between the case where the power supply line 712 is disposed in rows (FIG. 47A) and the case where the power supply line 715 is disposed in columns (FIG. 47C). Here, a wiring to which the gate electrode of the TFT 703 is connected is considered, and the description is made with reference to FIGS. 47A and 47C in order to show the difference of layers for forming the respective wirings.

In the pixels shown in FIGS. 47A and 47C, the TFT 703 and the TFT 704 are connected in series. It is desirable that the channel length $L_3$ and the channel width $W_3$ of the TFT 703, and the channel length $L_4$ and the channel width $W_4$ of the TFT 704 be set to satisfy $L_3/W_3 : L_4/W_4 = 5000$ to $6000:1$. In order to satisfy $L_3/W_3 : L_4/W_4 = 6000:1$, for example, $L_3$ is 500 μm, $W_3$ is 3 μm, $L_4$ is 3 μm, and $W_4$ is 100 μm. In addition, when the invention is used, fine patterning can be carried out; thus, fine wirings having such short channel width can be formed stably without causing defects such as a short circuit. Accordingly, a TFT having the electrical property, which is necessary for the pixels as shown in FIGS. 47A and 47C to function fully, can be formed, thereby a highly reliable display panel having an excellent display function can be manufactured.

Note that the TFT 703 operates in the saturation region, and functions to control the current value flowing to the light-emitting element 705 while the TFT 704 operates in the linear region, and functions to control the current supply to the light-emitting element 705. Both of the TFTs preferably have the same conductivity in view of the manufacturing steps. In addition, the TFT 703 may be either an enhancement mode TFT or a depletion mode TFT. According to the invention having the aforementioned configuration, the TFT 704 operates in the linear region; therefore, slight fluctuation of $V_{GS}$ of the TFT 704 does not affect the current value of the light-emitting element 705. That is, the current value of the light-emitting element 705 can be determined by the TFT 703 which operates in the saturation region. According to the invention having such a configuration, luminance unevenness of light-emitting elements resulting from the characteristic variations of the TFTs can be improved, thereby a display device with improved image quality can be provided.

In the pixels shown in FIGS. 47A to 47D, the TFT 701 controls a video signal input to each pixel. When the TFT 701 is turned ON, a video signal is inputted to the pixel. Then, the video signal is held in the capacitor 702. Note that FIGS. 47A and 47C show the configurations provided with the capacitor 702; however, the invention is not limited to them, and the capacitor 702 may be omitted if the gate capacitance and the like can substitute for the capacitor for holding video signals.

The light-emitting element 705 has a structure that an electroluminescent layer is interposed between a pair of electrodes, and a potential difference is provided between a pixel electrode and a counter electrode (between the anode and the cathode) so that a forward voltage is applied thereto. The electroluminescent layer may be formed using various kinds of materials such as an organic material and an inorganic material. The luminescence generated in the electroluminescent layer includes luminescence that is generated when an excited singlet state returns to a ground state (fluorescence) and luminescence that is generated when an excited triplet state returns to a ground state (phosphorescence).

The pixel shown in FIG. 47B has the same configuration as the pixel shown in FIG. 47A except that a TFT 706 and a scan line 716 are additionally provided. Similarly, the pixel shown in FIG. 47D has the same configuration as the pixel shown in FIG. 47C except that the TFT 706 and the scan line 716 are additionally provided.

ON or OFF of the TFT 706 is controlled by the scan line 716 additionally provided. When the TFT 706 is turned ON, charges held in the capacitor 702 are released, thereby the TFT 706 is turned OFF. That is, the provision of the TFT 706 can forcibly provide the state where no current flows to the light-emitting element 705. Thus, in the configurations in FIGS. 47B and 47D, emission period can start simultaneously with or immediately after the writing period without awaiting the signal input to the whole pixels, thereby the duty ratio can be improved.

In the pixel shown in FIG. 47E, a signal line 750 and power supply lines 751 and 752 are disposed in columns, and a scan line 753 is disposed in rows. In addition, the pixel includes a switching TFT 741, a driving TFT 743, a capacitor 742, and a light-emitting element 744. The pixel shown in FIG. 47F has the same configuration as the pixel shown in FIG. 47E except that a TFT 745 and a scan line 754 are additionally provided. Note that in the configuration shown in FIG. 47F also, the provision of the TFT 745 can improve the duty ratio.

As set forth above, according to the invention, patterns of a wiring and the like can be stably formed with precision without causing manufacturing defects; therefore, TFTs can be formed with an excellent electric property and reliability, which can fully be applied to a technique for improving the display function of a pixel in accordance with the intended use.

This embodiment mode can be implemented in combination with any of Embodiment Modes 1 to 14.

Embodiment Mode 16

Figure 20:
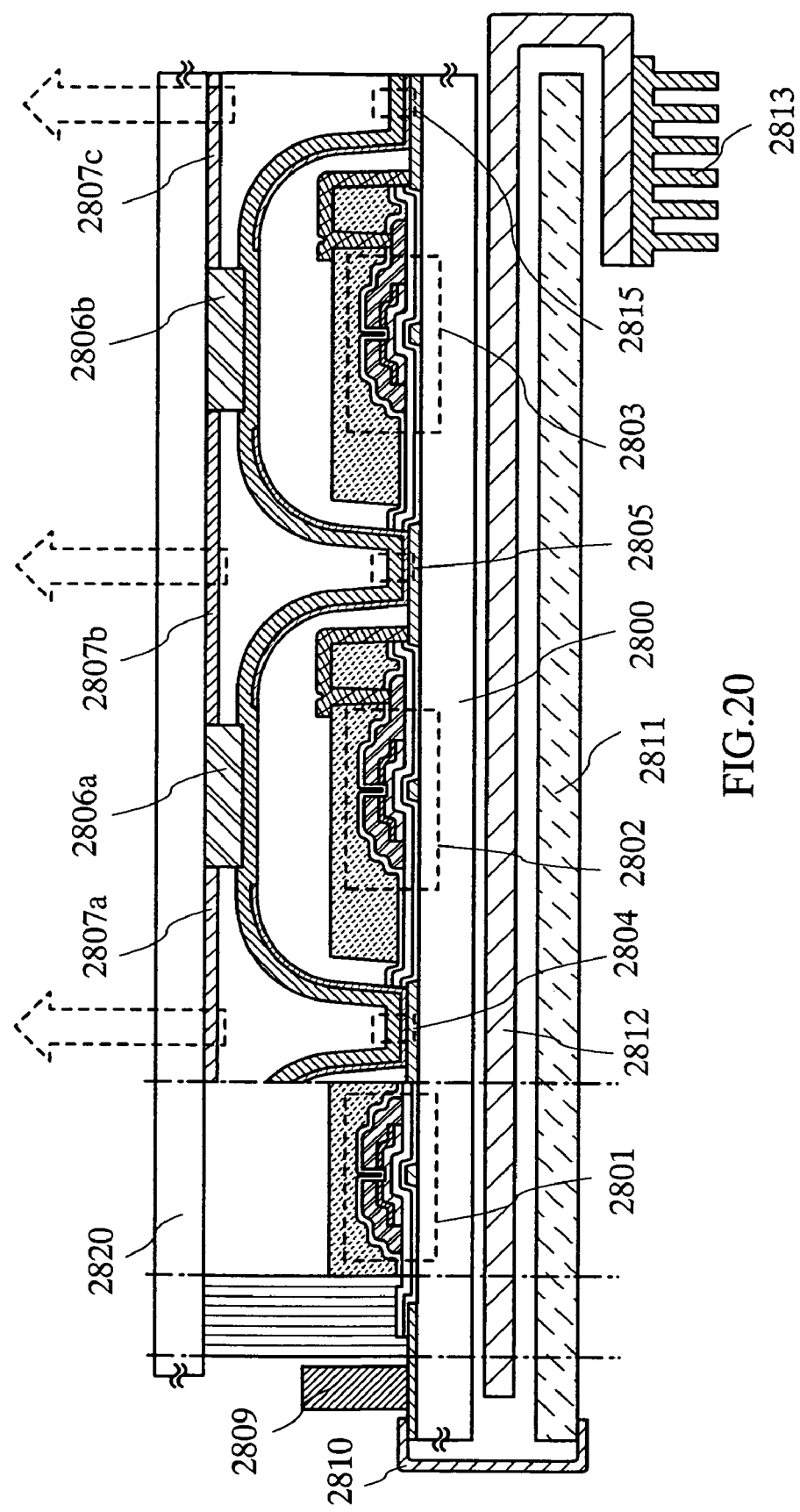
FIG. 20 illustrates a structure of an EL display module of the invention.

FIG. 20 illustrates an example in which an EL display module is constructed by using a TFT substrate 2800 manufactured by adopting the invention. In FIG. 20, a pixel portion having pixels is formed over the TFT substrate 2800.

In FIG. 20, a protective circuit portion 2801 is provided outside the pixel portion and between a driver circuit and the pixels, which is operated similarly to a TFT formed in the pixel or a diode which is obtained by connecting a gate of the TFT to one of a source and a drain of the TFT. A driver circuit 2809 may be a driver IC formed using a single crystalline semiconductor, a stick driver IC formed over a glass substrate using a polycrystalline semiconductor film, or a driver circuit formed using an SAS.

The TFT substrate 2800 is stuck to a sealing substrate 2820 via spacers 2806a and 2806b formed by a droplet discharge method. The spacers are preferably provided in order to maintain the constant gap between the two substrates even when the substrates are thin or the area of the pixel portion is enlarged. The space above light-emitting elements 2804 and 2805 connected to TFTs 2802 and 2803 respectively, which is between the TFT substrate 2800 and the sealing substrate 2820, may be filled with a light-transmissive resin material to be solidified or be filled with dehydrated nitrogen or an inert gas.

FIG. 20 illustrate the case where the light-emitting elements 2804, 2805, and 2815 each have a top-emission structure, in which light can be emitted in the direction of arrows. When each pixel is formed to emit a different emission color from each other such as red, green, and blue emission, multicolor display can be performed. In addition, when colored layers 2807a, 2807b, and 2807c corresponding to the respective colors are formed on the side of the sealing substrate 2820, color purity of the light emitted outside can be increased. Alternatively, the pixels can be formed to have white light-emitting elements and combined with the colored layers 2807a, 2807b, and 2807c.

The driver circuit 2809 as an external circuit is connected to a connection terminal of a scan line or a signal line provided at one end of an external circuit substrate 2811 via a wiring substrate 2810. In addition, the driver circuit 2809 may be provided in contact with or close to the TFT substrate 2800, and a heat pipe 2813 and a heat sink 2812 may be provided to increase the heat dissipation effect.

Note that FIG. 20 illustrates a top-emission EL module; however, a bottom-emission structure or a dual-emission structure in which light is emitted from both the top and bottom sides may be constructed by changing the structure of the light-emitting element or the position of the external circuit substrate. In the case of the top-emission structure, a black matrix may be formed by coloring an insulating layer to serve as a partition wall. The partition wall can be formed by a droplet discharge method using a resin material such as polyimide mixed with a pigment-based black resin, carbon black or the like, or stacked layers thereof may be used.

In addition, a sealing structure may be formed by attaching a resin film to the TFT substrate 2800 of the side where the pixel portion is formed, using a sealant or an adhesive resin. Although glass sealing with a glass substrate is shown in this embodiment mode, other sealing methods can be used such as resin sealing with a resin, plastic sealing with plastic, and film sealing with a film. Over the surface of the resin film, a gas-barrier film for preventing penetration of moisture vapor is preferably provided. By adopting the film-sealing structure, further slimming and weight saving can be achieved.

This embodiment mode can be implemented in combination with any of Embodiment Modes 1 to 15.

Embodiment Mode 17

By using a display panel (liquid crystal display panel and EL display panel) manufactured in accordance with the aforementioned embodiment modes, a television set (liquid crystal television set and EL television set) can be completed. The display panel may be in various modes such as the structure shown in FIG. 29A in which only the pixel portion is formed while the scan line side driver circuit and the signal line side driver circuit are mounted by TAB as in FIG. 30B or by COG bonding as in FIG. 30A, the structure shown in FIG. 29B in which an TFT is formed using an SAS, and the pixel portion and the scan line side driver circuit are integrally formed over the substrate while the signal line side driver circuit is mounted separately as a driver IC, and the structure shown in FIG. 29C in which the pixel portion, the signal line side driver circuit, and the scan line side driver circuit are integrally formed over the substrate.

As other structures of an external circuit, the input side of video signals is provided with a video signal amplifier circuit for amplifying video signals among the signals received at a tuner, and a video signal processing circuit for converting signals outputted from the video signal amplifier circuit to color signals corresponding to the respective colors of red, green, and blue, and a control circuit for converting the video signals to meet the input specification of the driver IC. The control circuit outputs signals to both the scan line side and the signal line side. When the display panel is driven digitally, a signal dividing circuit may be provided on the signal line side, with which input digital signals are divided into m signals to be supplied.

Audio signals among the signals received at the tuner are transmitted to an audio signal amplifier circuit, and the output thereof is supplied to a speaker through an audio signal processing circuit. The control circuit receives control data on the receiving station (received frequency) or the sound volume from the input portion, and transmits signals to the tuner and the audio signal processing circuit.

Figure 37A:
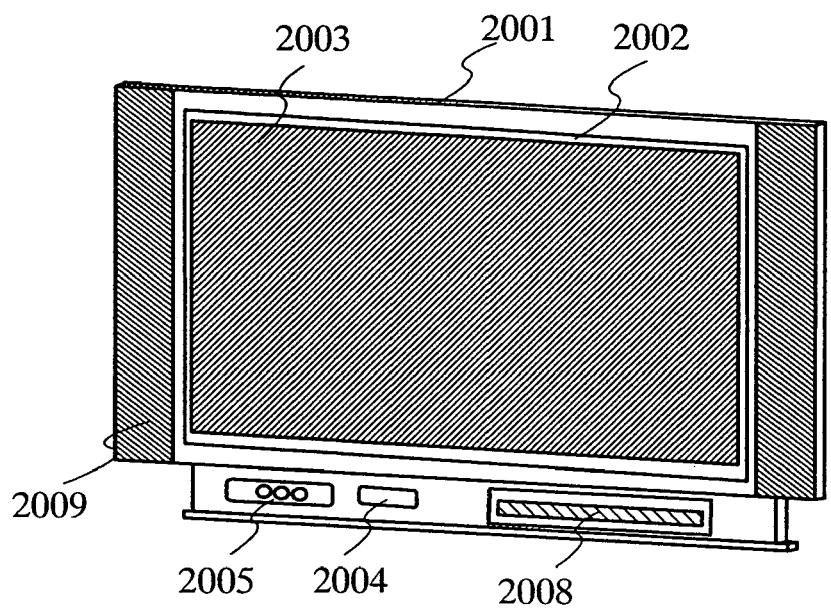
FIGS. 37A and 37B each illustrate an electronic appliance to which the invention can be applied.
Figure 37B:
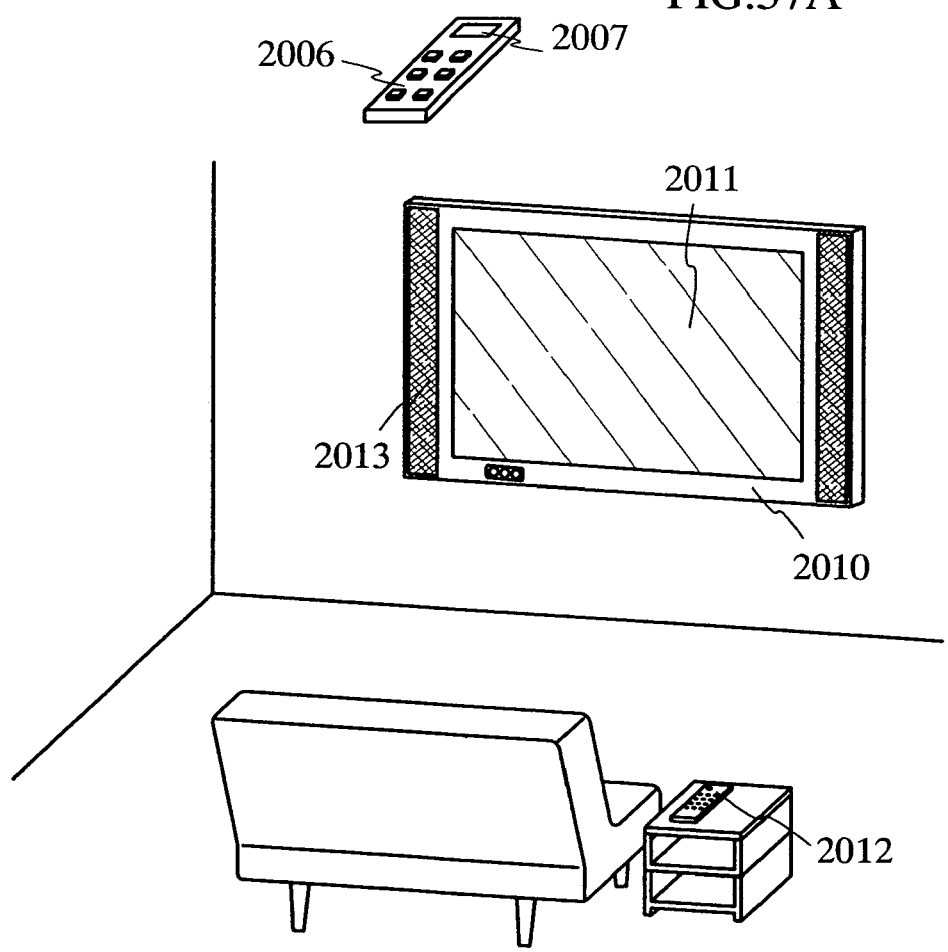

By incorporating a display module into a housing as shown in FIGS. 37A and 37B, a television set can be completed. When the EL display module as shown in FIG. 20 is used, an EL television set can be completed. The display module constitutes a main display screen 2003, and other accessories such as a speaker portion 2009 and operating switches are provided. In this manner, a television set can be completed according to the invention.

Figure 21:
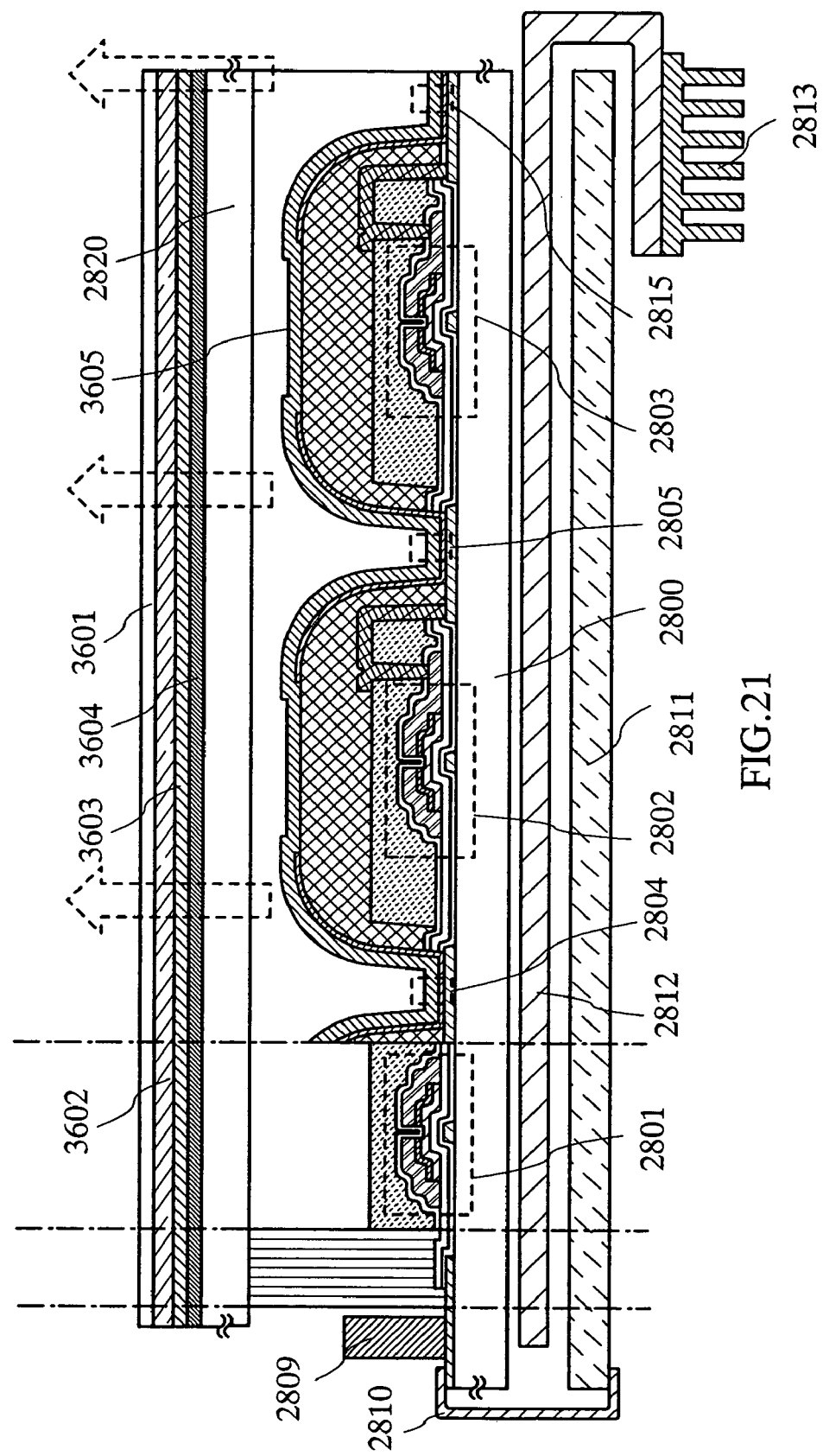
FIG. 21 illustrates a structure of an EL display module of the invention.

In addition, an EL display module can be constructed as shown in FIG. 21 in which a retardation plate or a polarizing plate is used to shield the reflected light which enters from the outside. FIG. 21 illustrates a top-emission structure, in which an insulating layer 3605 to serve as a partition wall is colored to be used as a black matrix. This partition wall can be formed by a droplet discharge method using a resin material such as polyimide mixed with carbon black or the like, or stacked layers thereof may be used. By the droplet discharge method, different materials can be discharged to the same region over a plurality of times to form a partition wall. In this embodiment mode, a pigment-based black resin is used. As a retardation plate 3603 and a retardation plate 3604, a λ/4 plate and a λ/2 plate may be used to control light. The EL display module has a structure that the TFT substrate 2800, the light-emitting element 2804, the sealing substrate (sealant) 2820, the retardation plates 3603 and 3604 (λ/4 plate and λ/2 plate), and a polarizing plate 3602 are provided in this order, and light emitted from the light-emitting element travels through these layers to be emitted outside from the polarizing plate. The retardation plates and the polarizing plate may be disposed on the side from which light is emitted, and in the case of a dual-emission display device which emits light to both sides, they may be disposed on both sides. In addition, a antireflection film 3601 may be provided outside the polarizing plate. Accordingly, higher-resolution and more precise images can be displayed.

Figure 61:
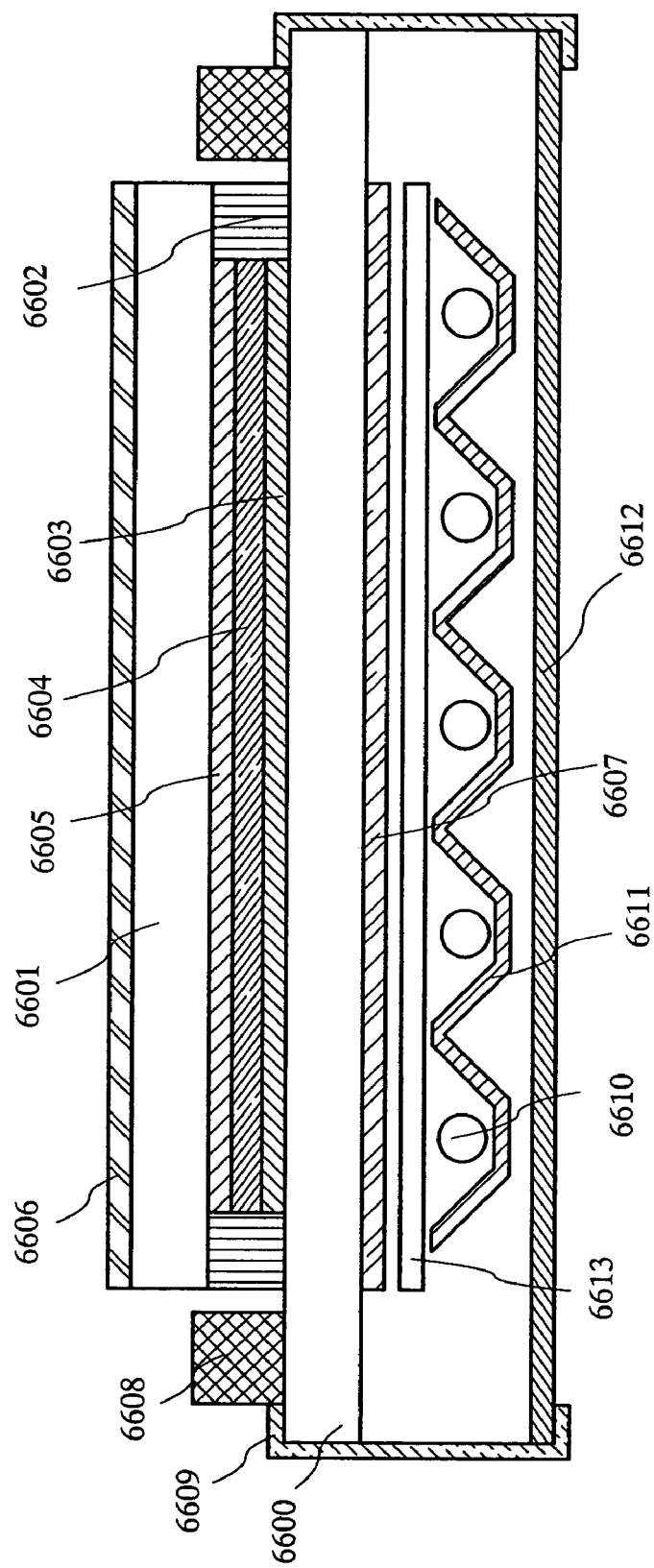
FIG. 61 illustrates a structure of a display module of the invention.

FIG. 61 is an example of a liquid crystal display module, in which a TFT substrate 6600 is stuck to a counter substrate 6601 with a sealant 6602, and between these substrates, a pixel region 6603 and a liquid crystal layer 6604 are provided to form a display region. A colored layer 6605 is required in the case of performing color display, and in the case of RGB, colored layers corresponding to the respective colors of red (R), green (G), and blue (B) are provided in the respective pixels. Outside of the TFT substrate 6600 and the counter substrate 6601, polarizing plates 6606 and 6607, and a lens film 6613 are provided. The light source includes a cold-cathode tube 6610 and a reflecting plate 6611, and a circuit board 6612 is connected to the TFT substrate 6600 with a flexible wiring board 6609, and incorporated with external circuits such as a control circuit and a power supply circuit.

Figure 71:
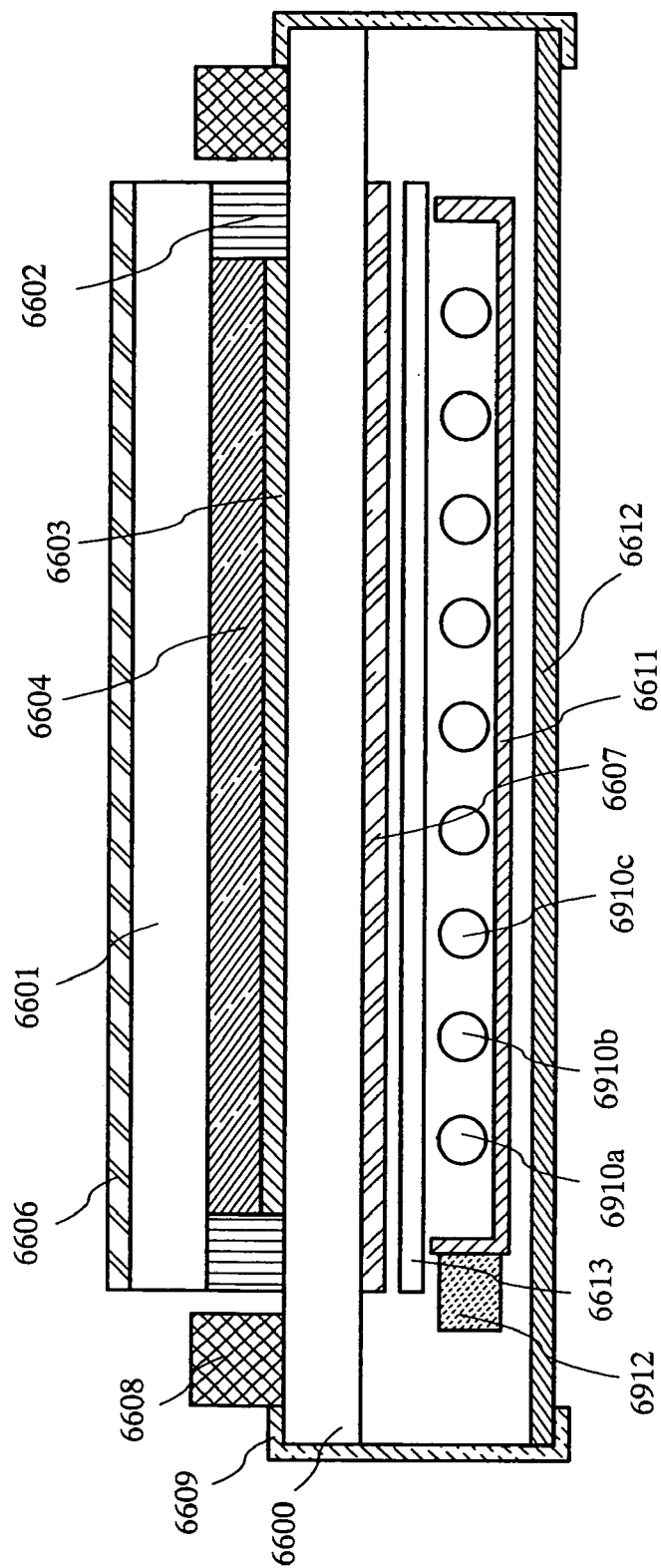
FIG. 71 illustrates a structure of a display module of the invention.

In addition, when the liquid crystal display device in accordance with the invention is manufactured using an OCB (optically compensated bend) mode, higher performance can be realized. FIG. 71 is an example in which the liquid crystal display module of FIG. 61 adopts the OCB mode, which is an FS-LCD (Field Sequential-LCD). In the FS-LCD, red emission, green emission, and blue emission are carried out in one frame period using a light-emitting diode and the like; therefore, no color filter is required. Accordingly, as there is no need to arrange color filters of RGB, pixels 9 times as many can be displayed with the same area as compared to a general liquid crystal display device using color filters. On the other hand, since RGB emission is carried out in one frame period, rapid response of liquid crystals is required. Since the thin film transistor included in the liquid crystal display of the invention can operate at fast speed, the OCB mode can be adopted. Thus, the liquid crystal display device of the invention can adopt the FS method and the OCB mode, thereby an liquid crystal display device or a liquid crystal television having even higher performance and higher image quality can be completed. In addition, as a mode corresponding to the FS method, there is HV-FLC, SS-FLV, or the like which uses ferroelectric liquid crystals (FLCs). For the OCB mode, nematic liquid crystals having relatively low viscosity is used while smectic liquid crystals are used for the HV-FLC and SS-FLC. The liquid crystal display module in FIG. 71 is a light-transmissive liquid crystal display module, which includes as light sources a red light source 6910a, a green light source 6910b, and a blue light source 6910c. Such light sources as the red light source 6910a, the green light source 6910b, and the blue light source 6910c are provided with a control portion 6912 for controlling the ON or OFF thereof. With the control portion 6912, emission of each color is controlled, thereby light enters the liquid crystals to display images.

By incorporating a display panel 2002, which includes display elements such as liquid crystal elements and light-emitting elements (EL elements), into a housing 2001, and connecting it to wire or wireless communications networks via a modem 2004 using a receiver 2005 for reception of general television broadcast, data communication of one way (from a transmitter to a receiver) or two ways (between a transmitter and a receiver or between receivers) can be achieved. The operation of the television set can be carried out by using switches incorporated in the housing or a separate remote controller 2006. The remote controller may be provided with a display portion 2007 as well for displaying the output data.

In addition, the television set may have an additional option such as a sub-display screen 2008 formed of a second display panel in addition to the main display screen 2003, so as to display channels or sound volume. In this structure, the main display screen 2003 may be formed using an EL display panel with an excellent viewing angle while the sub-display screen may be formed using a liquid crystal display panel capable of displaying images with low power consumption. Alternatively, in order to give priority to the low power consumption, the main display screen 2003 may be formed using a liquid crystal display panel while the sub-display screen may be formed using an EL display panel, and the sub-display screen may have a structure capable of blinking. When the invention is used, a highly reliable EL display device can be provided even when such a large substrate and a number of TFTs or electronic components are used.

FIG. 37B is a television set having a large display portion of, for example, 20 to 80 inches, which includes a housing 2010, a display portion 2011, a remote controller 2012 as an operating portion, a speaker portion 2013, and the like. The invention is applied to the manufacture of the display portion 2011. The television set in FIG. 37B is of a wall-hanging type, and thus does not require much space for setting.

Needless to say, the invention is not limited to the television set, and can be applied to various objects such as a monitor of a personal computer, or a large-area display medium such as an information display board at the train station or the airport, and an advertising display board on the street.

Embodiment Mode 18

The invention can be applied to the manufacture of various display devices. That is, the invention can be applied to various electronic appliances which incorporate such display devices as the display portion.

Such electronic appliances include a camera (e.g., video camera or digital camera), projector, heat mounted display (goggle display), a car navigation system, a car stereo, a personal computer, a game machine, a portable information terminal (e.g., mobile computer, portable phone, or electronic book), an image reproducing device provided with a recording medium (specifically, device for reproducing a recording medium such as a Digital Versatile Disc (DVD) and having a display portion for displaying the reproduced image), and the like. Examples of such electronic appliances are shown in FIGS. 28A to 28D.

Figure 28A:
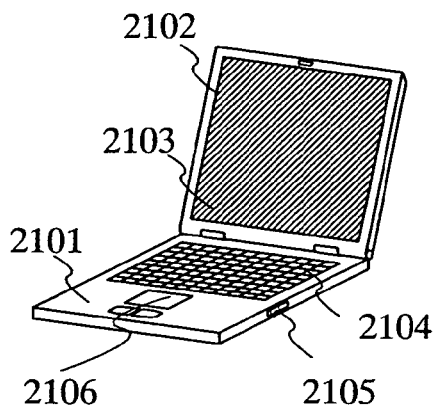
FIGS. 28A to 28D each illustrate an electronic appliance to which the invention can be applied.

FIG. 28A is a personal computer which includes a main body 2101, a housing 2102, a display portion 2103, a keyboard 2104, an external connecting port 2105, a pointing mouse 2106, and the like. By applying the invention to the manufacture of the display portion 2103, highly reliable and high-quality images can be displayed even when the personal computer is downsized, and wirings and the like are formed with higher precision.

Figure 28B:
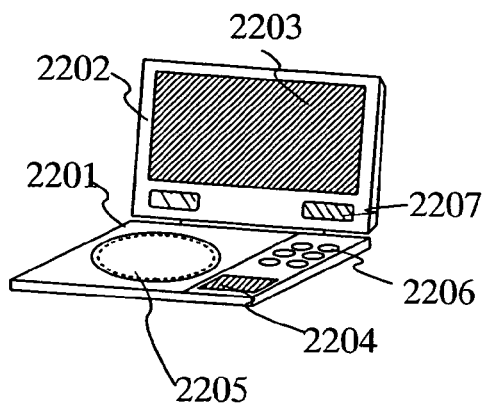

FIG. 28B is an image reproducing device provided with a recording medium (specifically, DVD reproducing device), which includes a main body 2201, a housing 2202, a display portion A 2203 a display portion B 2204, a recording medium (DVD) reading portion 2205, an operating key 2206, a speaker portion 2207, and the like. The display portion A 2203 mainly displays image data while the display portion B 2204 mainly displays text data. The invention can be applied to the manufacture of the display portions A 2203 and B 2204. By applying the invention to the manufacture of the display portions A 2203 and B 2204, highly reliable and high-quality images can be displayed even when the image reproducing device is downsized, and wirings and the like are formed with higher precision.

Figure 28C:
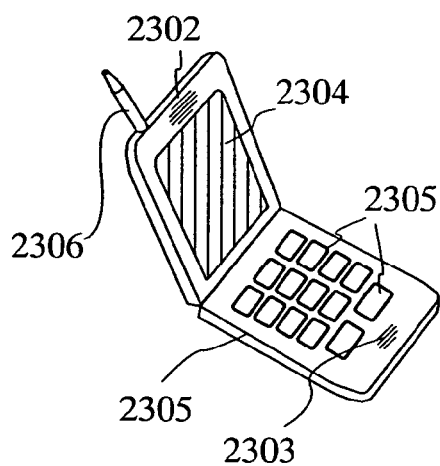

FIG. 28C is a portable phone which includes a main body 2301, an audio output portion 2302, an audio input portion 2303, a display portion 2304, operating switches 2305, an antenna 2306, and the like. By applying the display device manufactured in accordance with the invention to the display portion 2304, highly reliable and high-quality images can be displayed even when the portable phone is downsized, and wirings and the like are formed with higher precision.

Figure 28D:
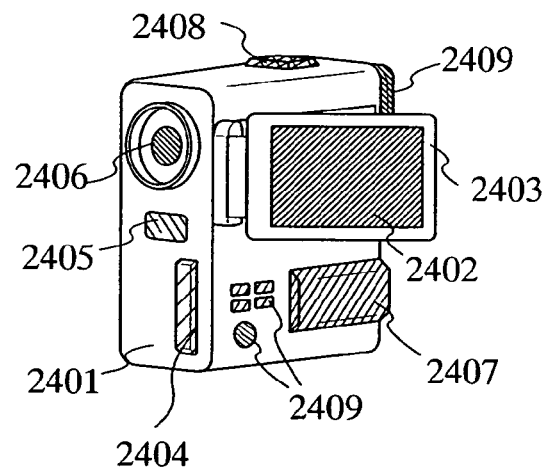

FIG. 28D is a video camera which includes a main body 2401, a display portion 2402, an external connecting port 2404, a remote controller receiving portion 2405, an image receiving portion 2406, a battery 2407, an audio input portion 2408, operating keys 2409, and the like. By applying the display device manufactured in accordance with the invention to the display portion 2402, highly reliable and high-quality images can be displayed even when the video camera is downsized, and wirings and the like are formed with higher precision. This embodiment mode can be freely implemented in combination with the aforementioned embodiment modes.

Embodiment Mode 19

One embodiment mode of the invention will be described with reference to FIGS. 48 to 53C, 7A to 7D, 8A to 8D, and 9A to 9E. More specifically, a manufacturing method of a liquid crystal display device to which the invention is applied is described. First, description is made on a manufacturing method of a liquid crystal display device having a channel-etch type thin film transistor to which the invention is applied. FIGS. 49A, 50A, 51A, 52A and 53A are top views of a pixel portion of a liquid crystal display device, FIGS. 49B, 50B, 51B, 52B and 53B are cross-sectional views of FIGS. 49A, 50A, 51A, 52A and 53A along a line a-b respectively, and FIGS. 49C, 50C, 51C, 52C and 53C are cross-sectional views of FIGS. 49A, 50A, 51A, 52A and 53A along a line c-d respectively.

A substrate 5100 is formed of a glass substrate such as a barium borosilicate glass and an alumino borosilicate glass, a quartz substrate, a silicon substrate, a metal substrate, a stainless substrate, or a plastic substrate which is resistant to the processing temperature of the present manufacturing step. In addition, the surface of the substrate 5100 may be polished by CMP to be planarized. Note that an insulating layer may be formed over the substrate 5100. The insulating layer is formed in a single layer or stacked layers by a known method such as CVD, plasma CVD, sputtering, and spin coating using an oxide or nitride material containing silicon. This insulating layer is necessarily required; however, it has a blocking effect of contaminant which would otherwise enter from the substrate 5100. The substrate 5100 may be a large substrate.

Over the substrate 5100, a conductive film 5101 is formed. The conductive film 5101 is patterned into a gate electrode layer and a pixel electrode layer. The conductive film 5101 is preferably formed by a known method such as printing, electrolytic plating, PVD, CVD, and vapor deposition using a high-melting point material. As an alternative deposition method, a droplet discharge method may be used to form a desired pattern. The use of the high-melting point material enables a subsequent thermal step to be performed. As the high-melting point material, there are metals such as tungsten (W), molybdenum (Mo), zirconia (Zr), hafnium (Hf), bismuth (Bi), niobium (Nb), tantalum (Ta), chromium (Cr), cobalt (Co), nickel (Ni), and platinum (Pt). Alternatively, alloys or metal nitride of such metals may be appropriately used. In addition, such materials may be formed in stacked layers. Typically, a tantalum nitride film and a tungsten film are stacked in this order over the surface of the substrate. Note that in the case of carrying out the subsequent thermal step by LRTA which uses heat radiated from one or more of a halogen lamp, a metal halide lamp, a xenon arc lamp, a carbon arc lamp, a high pressure sodium lamp, and a high pressure mercury lamp, or GRTA which uses an inert gas such as nitrogen or argon as a heating catalyst, the thermal treatment involves a short time. Therefore, the conductive film may be formed using aluminum (Al), silver (Ag), or gold (Cu) having a relatively low melting point. The metals having such reflexivity are preferable for the manufacture of a reflective liquid crystal display panel. Alternatively, a silicon material doped with impurity elements having one conductivity may be used. For example, a silicon film having n-type conductivity may be used, which is obtained by doping n-type impurity elements such as phosphorus (P) into an amorphous silicon film.

The conductive film 5101 also functions as a pixel electrode layer; therefore, it can be formed using a light-transmissive conductive material as well. In the case of manufacturing a light-transmissive liquid crystal display panel, the pixel electrode layer may be formed using indium tin oxide (ITO), indium tin oxide containing silicon oxide (ITSO), zinc oxide (ZnO), tin oxide ($SnO_2$), and the like. Preferably, the pixel electrode layer is formed by sputtering using indium tin oxide (ITO), indium tin oxide containing silicon oxide (ITSO), zinc oxide (ZnO), and the like. More preferably, the pixel electrode layer is formed by sputtering using a target such as ITO containing 2 to 20% by weight of silicon oxide. Alternatively, other conductive materials may be used, such as an alloy of indium oxide and zinc oxide which is an alloy of indium oxide containing silicon oxide and further containing 2 to 20% of zinc oxide (ZnO).

In this embodiment mode, the conductive film 5101 is formed by discharging a composition containing indium tin oxide as a conductive material, and then baking it at 550° C.

Alternatively, after forming the conductive film 5101 by discharging compositions by the droplet discharge method, the surface thereof may be planarized by applying pressure in order to increase the planarity. As the method for applying pressure, the surface of the film may be scanned with a roller so as to level the irregularity, or the surface thereof may be pressed perpendicularly with a flat plate. While applying the pressure, a thermal step may be performed. Alternatively, the surface of the film may be softened or melted with a solvent and the like, and then the irregularity of the surface may be removed with an air knife. In addition, the surface thereof may be polished by CMP. Such steps may be performed in order to planarize the surface in the case where irregularity occurs due to the droplet discharge method. Alternatively, the planarizing step may be performed after the conductive film 5101 is patterned with masks 5102a and 5102b to form a gate electrode layer 5103 and a pixel electrode layer 5111.

A resist mask is formed on the conductive film 5101. The resist mask is finely processed by being exposed to a laser beam 5170, thereby the masks 5102a and 5102b are formed (see FIGS. 49A to 49C). The resist mask before being processed with the laser beam can be formed by the droplet discharge method as well. By using the droplet discharge method in combination, waste of materials can be reduced as compared to the case of coating the whole surface by spin coating and the like, resulting in cost saving.

The mask may be formed using a commercial resist material including a photosensitizing agent, for example, such as a positive resist (e.g., novolac resin), a photosensitizing agent (e.g., naphthoquinone diazide compound), or a negative resist (e.g., base resin, diphenylsilanediol, or acid generator). In using any of the aforementioned materials, the surface tension and viscosity thereof are appropriately controlled by controlling the concentration of a solvent or adding a surface-active agent and the like. In addition, when the conductive film 5101 is formed using a conductive material containing a photosensitive substance, the conductive film 5101 can be directly irradiated with and exposed to a laser beam, and then removed using etchant without forming a resist mask, thereby the conductive film 5101 can be patterned into a desired shape. In such a case, no mask is required, resulting in the simplified manufacturing steps. The conductive material containing a photosensitive substance may include metals such as Ag, Au, Cu, Ni, Al, and Pt, or alloys thereof, and a photosensitive resin containing a high molecular weight organic resin, photo polymerization initiator, photopolymerization polymers, or solvent. The organic high molecular weight resin includes a novolac resin, an acrylic copolymers, methacrylic copolymers, cellulose derivatives, a cyclized rubber resin, and the like.

Figure 50A:
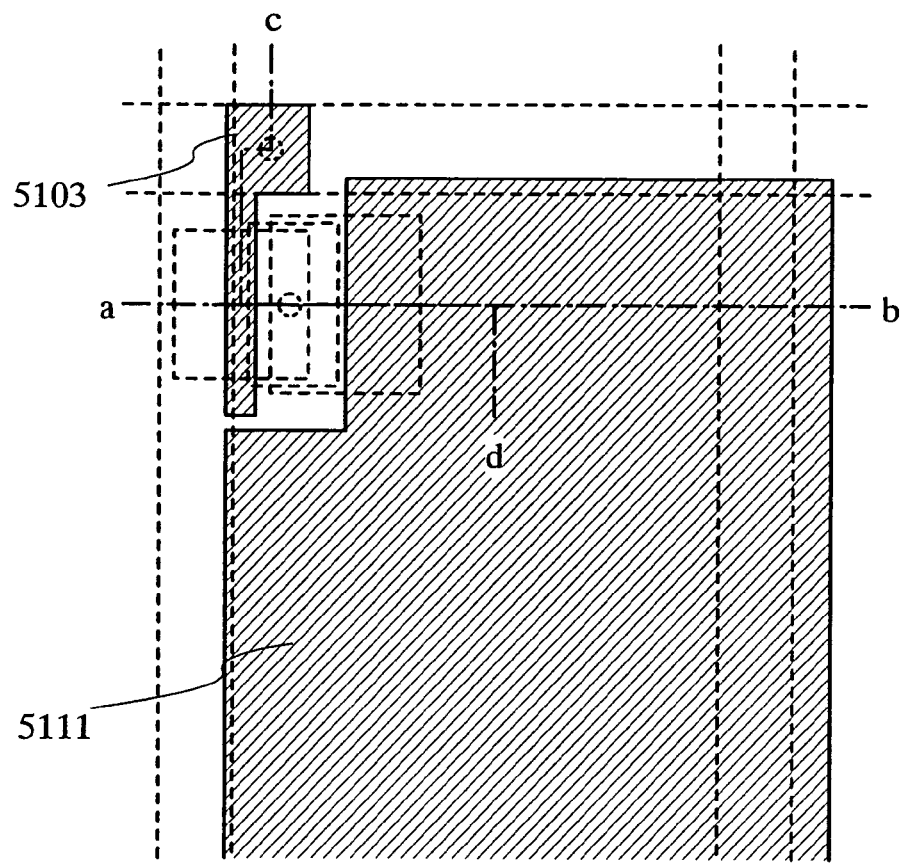
FIGS. 50A to 50C illustrate a manufacturing method of a display device of the invention.
Figure 50B:
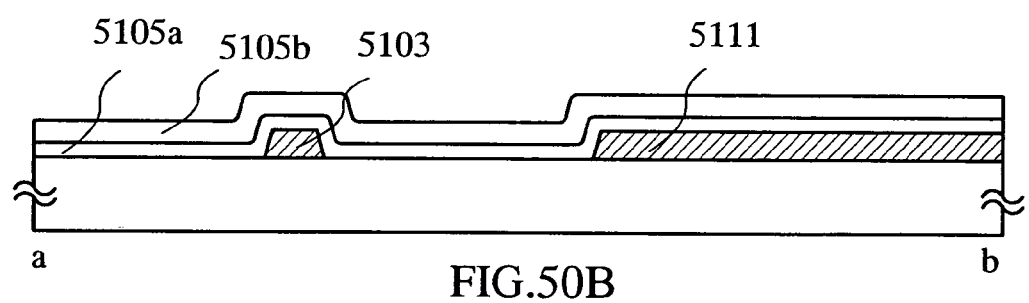
Figure 50C:
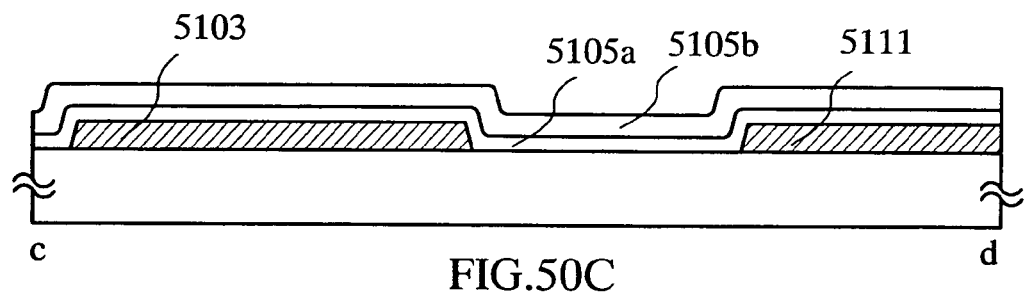

In this manner, the conductive film 5101 is patterned using the finely processed masks 5102a and 5102b, thereby the gate electrode 5103 and the pixel electrode layer 5111 are formed (see FIGS. 50A to 50C).

Then, gate insulating layers 5105a and 5105b are formed over the gate electrode layer 5103 and the pixel electrode layer 5111. The gate insulating layers 5105a and 5105b can be formed using silicon oxide ($SiO_x$), silicon nitride ($SiN_x$), silicon oxynitride ($SiO_xN_y$) (x>y), silicon nitride oxide ($SiN_xO_y$) (x>y), and the like. Further, by anodizing the gate electrode layer 5103, an anodized film may be formed in stead of the gate insulating layer 5105a. Note that in order to prevent diffusion of impurities from the substrate side, the gate insulating layer 5105a is preferably formed using silicon nitride ($SiN_x$), silicon nitride oxide ($SiN_xO_y$) (x>y), and the like. In addition, the gate insulating layer 5105b is desirably formed using silicon oxide ($SiO_x$) or silicon oxynitride ($SiO_xN_y$) (x>y) in view of the property of the interference with a semiconductor layer to be formed layer. However, the gate insulating layer is not limited to such steps, and it may be formed in a single layer using any one of silicon oxide ($SiO_x$), silicon nitride ($SiN_x$), silicon oxynitride ($SiO_xN_y$) (x>y), silicon nitride oxide ($SiN_xO_y$) (x>y), and the like. Note that the gate insulating layer 5105b contains hydrogen. In the case where the conductive layer formed by the droplet discharge method is formed using silver or copper, diffusion of impurities can be prevented as well as the surface can be planarized if a barrier film such as a silicon nitride film and an NiB film is formed over the gate insulating layer. Note that in order to form a dense insulating film with small gate leakage current at a low deposition temperature, rare gas elements such as argon are preferably contained in the reaction gas so as to be mixed into an insulating film formed. In this embodiment mode, the gate insulating film 5105a is formed using a silicon nitride film with a reaction gas of $SiH_4$ and $NH_3$ to have a thickness of 50 nm, and the gate insulating film 5105b is formed using a silicon oxide film with a reaction gas of $SiH_4$ and $N_2O$ to have a thickness of 100 nm. Alternatively, a silicon nitride oxide film may be set to have a thickness of 140 nm, and a silicon oxynitride film stacked thereover may be set to have a thickness of 100 nm. Each of the gate insulating layer 5105a and the gate insulating layer 5105b is preferably set to have a thickness of 50 to 100 nm.

Figure 9D:
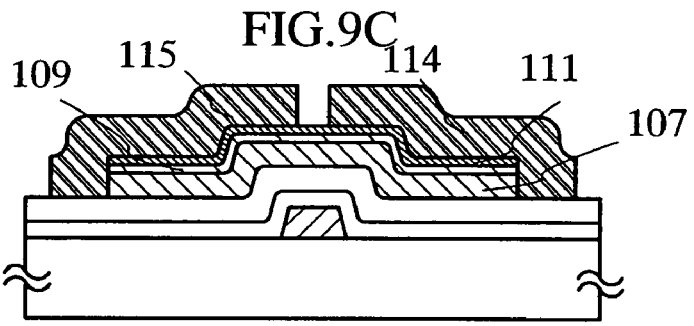
Figure 9E:
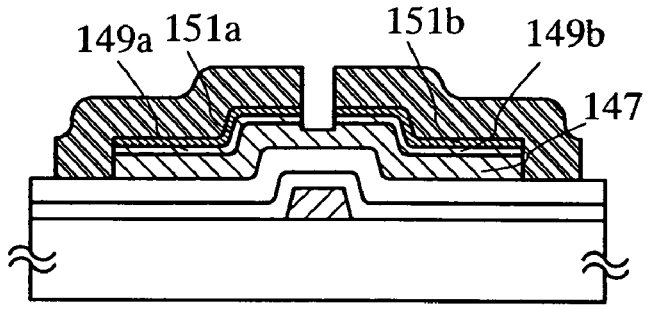

Then, a semiconductor film is formed. As a specific manufacturing method of a semiconductor layer, materials and steps similar to those in Embodiment Mode 1 may be used as shown in FIGS. 9A to 9E. Therefore, the description thereof is omitted here. Referring to FIG. 9D and the thin film transistor manufactured in this embodiment mode, the semiconductor layer 107 corresponds to a semiconductor layer 5106, the n-type semiconductor layers 109 and 111 correspond to n-type semiconductor layers 5107a and 5107b respectively, and the source/drain electrode layers 114 and 115 correspond to source/drain electrode layers 5108 and 5130 respectively. Referring to FIGS. 9D and 9E and this the thin film transistor manufactured in this embodiment mode, the semiconductor layer 147 corresponds to a semiconductor layer 5115, and the n-type semiconductor layers 149a 149b, 151a, and 151b correspond to n-type semiconductor layers 5116a, 5116b, 5117a and 5117b respectively.

Figure 51A:
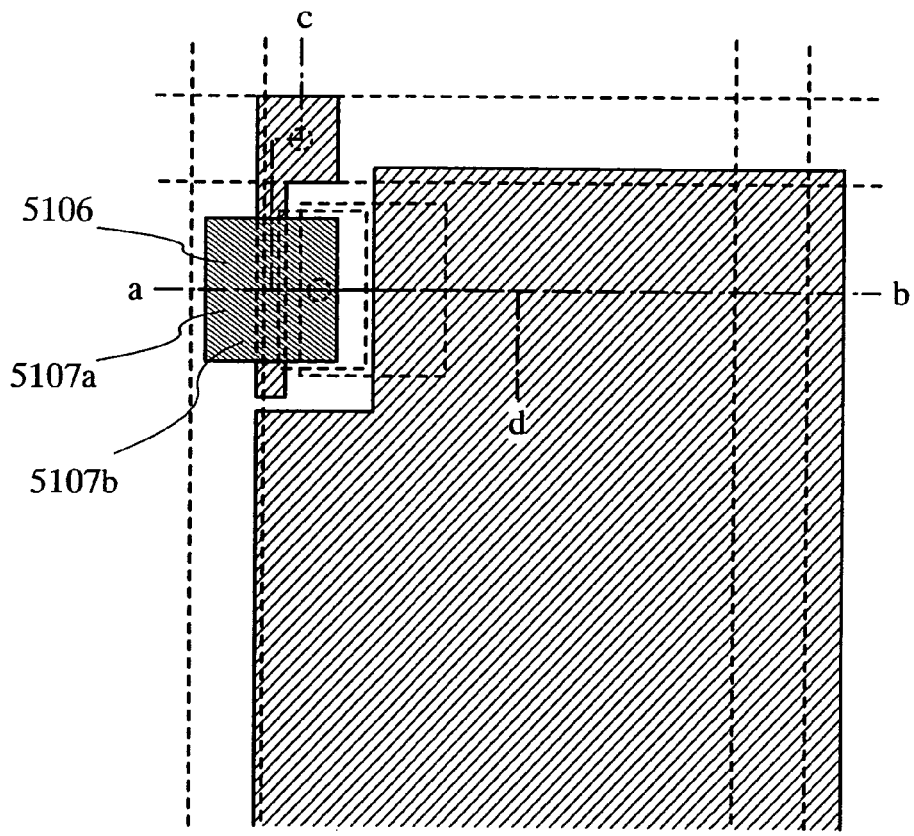
FIGS. 51A to 51C illustrate a manufacturing method of a display device of the invention.
Figure 51B:
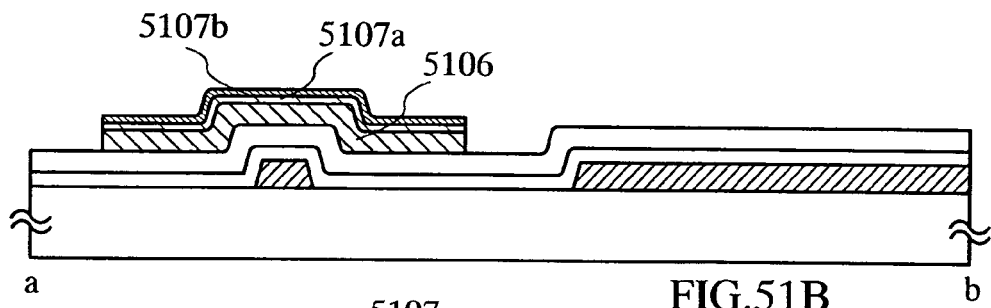
Figure 51C:
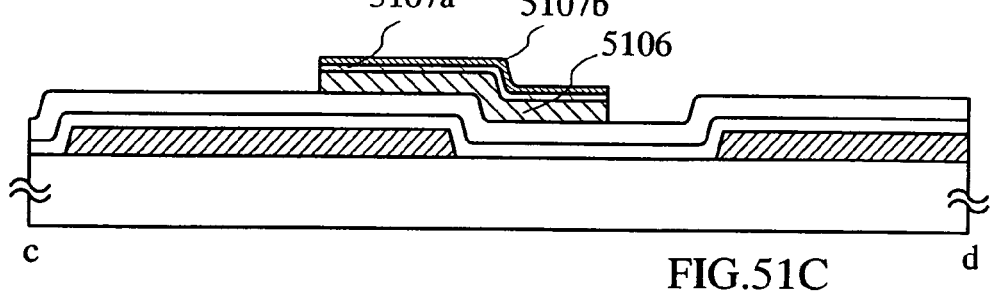
Figure 52A:
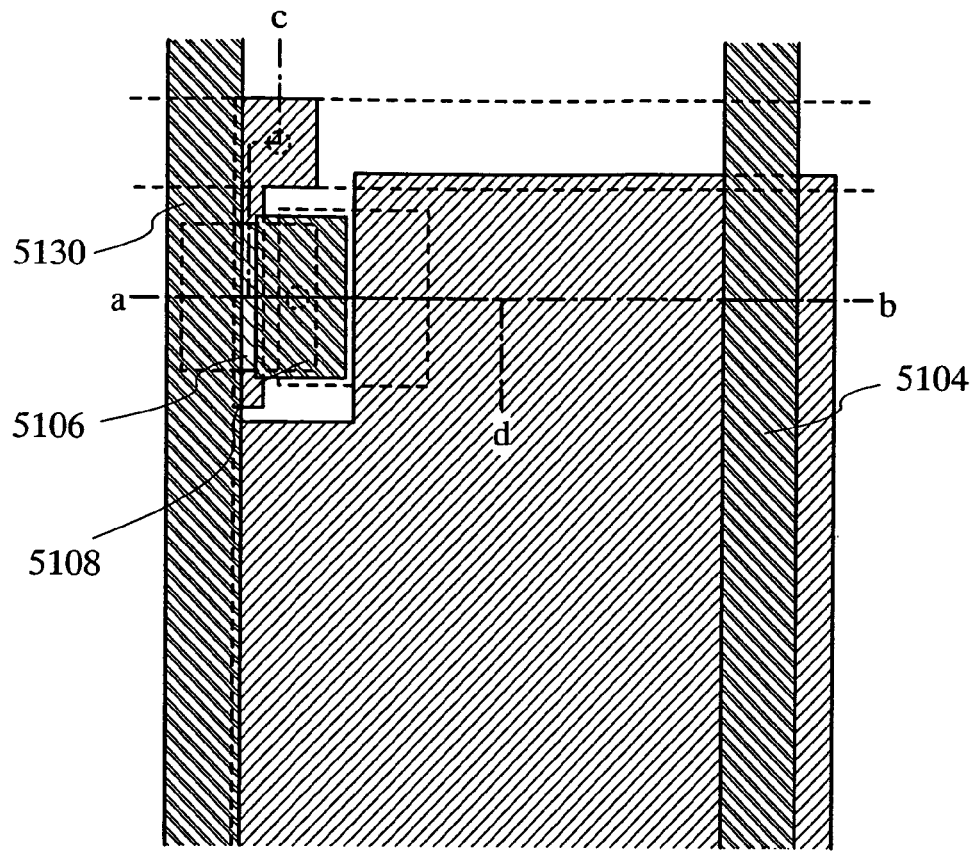
FIGS. 52A to 52C illustrate a manufacturing method of a display device of the invention.
Figure 52B:
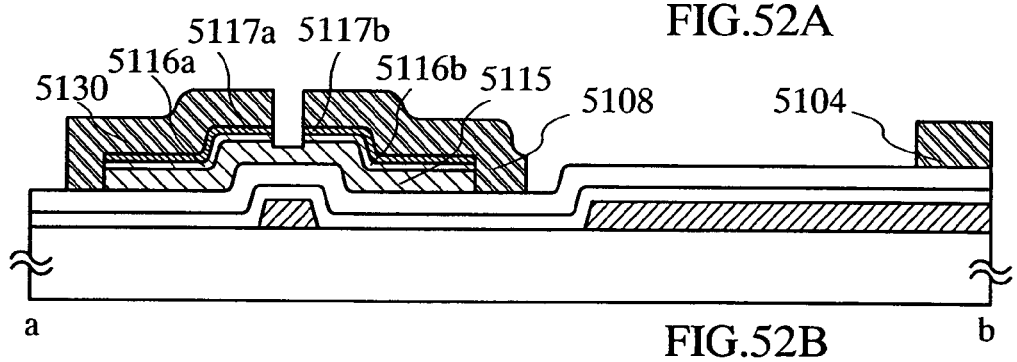
Figure 52C:
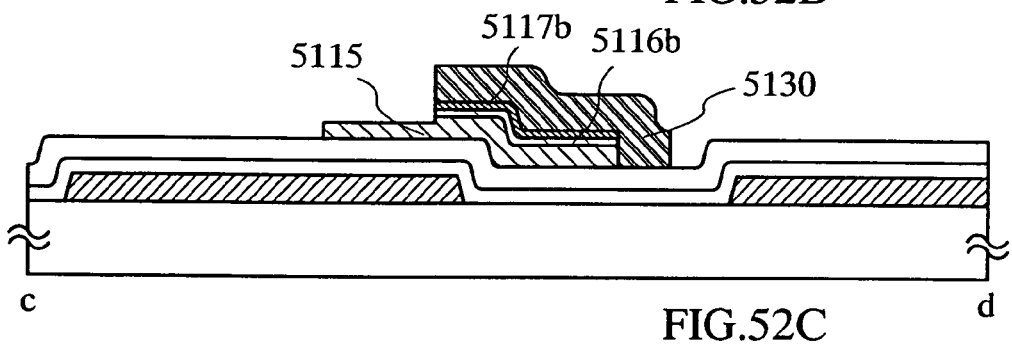
Figure 53A:
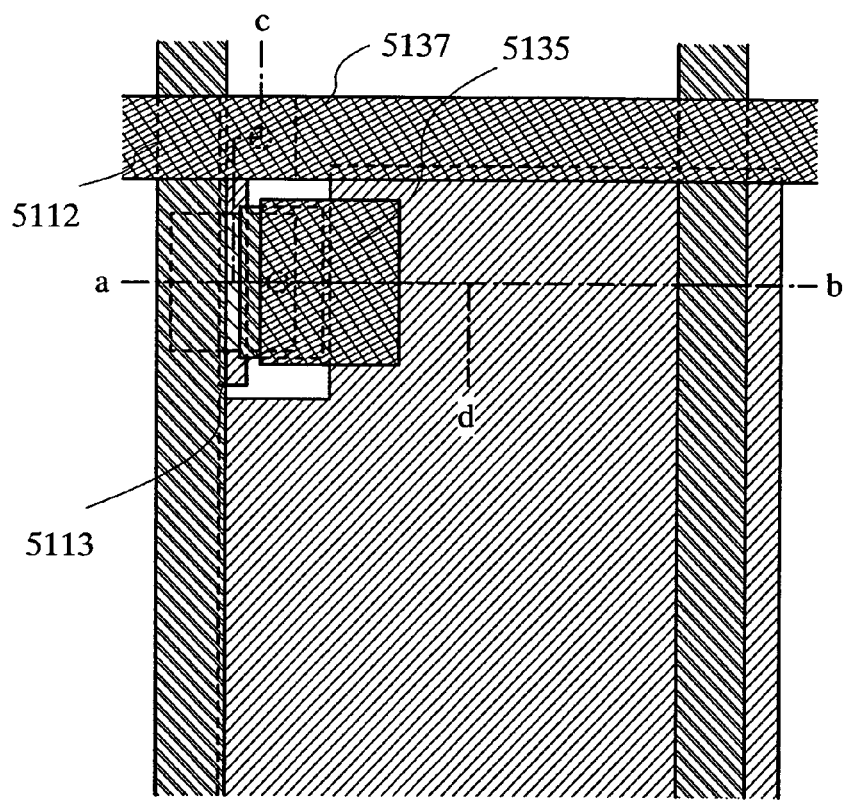
FIGS. 53A to 53C illustrate a manufacturing method of a display device of the invention.
Figure 53B:
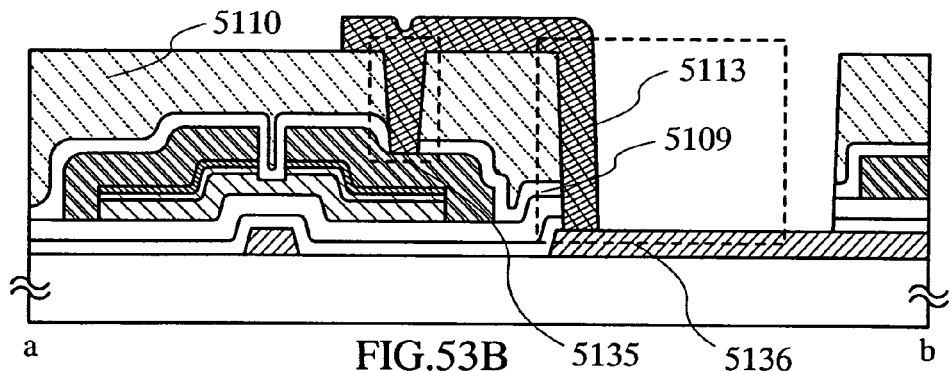
Figure 53C:
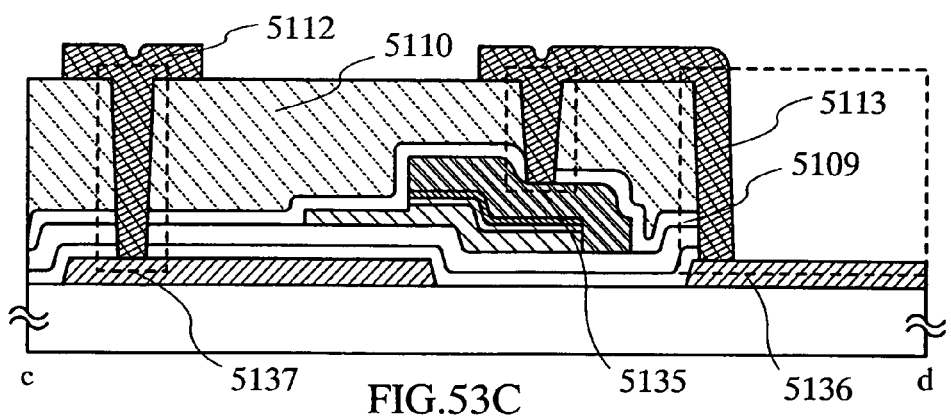

In this embodiment mode, a photomask is manufactured, and the semiconductor layer 5106, and the n-type semiconductor layers 5107a and 5107b are formed by a patterning process using photolithography (see FIGS. 51A to 51C). The photomask is formed by coating the whole surface with a resist by spin coating and the like or selectively formed by a droplet discharge method similarly to the case of forming the mask 5102a, followed by laser beam exposure to obtain a mask having a fine pattern. Using the mask having a fine pattern, the semiconductor films can be patterned finely and precisely into a desired shape.

In the case of forming the semiconductor lasers by selectively discharging compositions without exposing a mask to the light, a resin material can be used, such as an epoxy resin, an acrylic resin, a phenol resin, a novolac resin, an acrylic resin, a melamine resin, and an urethane rein. Alternatively, the pattern is formed by the droplet discharging method using an organic material (e.g., benzocyclobutene, parylene, flare, or light-transmissive polyimide), a compound material formed by polymerization of siloxane polymers or the like, and a composition material containing water-soluble homopolymers and water-soluble copolymers. In either case, the surface tension and viscosity are appropriately controlled by controlling the concentration of a solvent or adding a surface-active agent and the like.

The etching process for patterning may be performed either by plasma etching (dry etching) or wet etching; however, plasma etching is preferable for processing a large substrate. As the etching gas, a fluorine source gas such as $CF_4$, $NF_3$, $SF_6$, and $CHF_3$, a chlorine source gas such as $Cl_2$, $BCl_3$, $SiCl_4$, and $CCl_4$, or an $O_2$ gas is employed, which may be appropriately added with an inert gas such as He and Ar. Alternatively, electric discharge machining may be performed locally when adopting etching process using the atmospheric pressure discharge, in which case a mask layer is not required to be formed over the whole surface.

By discharging compositions containing a conductive material, the source/drain electrode layers 5130 and 5108, and a capacitor wiring layer 5104 are formed. Using the source/drain electrode layers 5130 and 5108 as masks, the semiconductor layer 5106, and the n-type semiconductor layers 5107a and 5107b are patterned, thereby the semiconductor layer 5115, and the n-type semiconductor layers 5116a, 5116b, 5117a, and 5117b are formed (see FIGS. 52A to 52C). The source/drain electrode layers 5130 and 5108 can be formed similarly to the aforementioned gate electrode layer 5103. The source/drain electrode layer 5130 also functions as a wiring layer.

As the conductive material for forming the source/drain electrode layers 5130 and 5108, a composition containing metal particles such as Ag (silver), Au (gold), Cu (copper), W (tungsten), and Al (aluminum) as its main component may be used. Further, light-transmissive indium tin oxide (ITO), indium tin oxide containing silicon oxide (ITSO), organic indium, organic tin, zinc oxide, titanium nitride and the like may be combined.

For the method for forming the source/drain electrode layers, Embodiment Mode 1 shown in FIGS. 7A to 7D and 8A to 8D is to be referred to. Therefore, the detailed description thereof is omitted here. The source/drain electrode layers 5130 and 5108 are formed with fine patterns, and are thus required to be formed with high controllability, which may otherwise cause manufacturing defects such as a short circuit. Accordingly, the fine patterning on the semiconductor layer is performed by fine processing with a laser beam. By forming a mask by the fine processing with a laser beam, and patterning a conductive film with the mask, the conductive film can be patterned precisely with high controllability, thereby a source electrode layer or a drain electrode layer can be formed to have a desired shape. Accordingly, no manufacturing defects occur, and the reliability of the thin film transistor can thus be improved.

Similarly to FIGS. 7A to 7D, FIGS. 8A to 8D illustrate a patterning method of a conductive film through exposure steps using a laser beam, in which the conductive film 205 is not formed over the whole surface unlike FIGS. 7A to 7D, but selectively formed by a droplet discharge method. In FIGS. 8A to 8D, the conductive films 215a and 215b are formed selectively by the droplet discharge method so as not to be in contact with each other; therefore, the opening 232b is not required to be formed unlike FIGS. 7A to 7D. In addition, since patterning by etching is not performed, the obtained source/drain electrode layers 218a, 218b, 218c, and 218d can have roundish end portions with curvature radii. Accordingly, the use of the droplet discharge method can reduce waste of materials, and simplify the manufacturing steps; thus, such advantage is provided that the cost is reduced while the productivity is increased.

Even after the source/drain electrode layers 5130 and 5180 are formed, a planarizing step may be performed by pressing and the like similarly to the case of the gate electrode layer 5103. Alternatively, if a pressing step is performed after discharging a source/drain electrode layer by a droplet discharge method, and prebaking it before baking completely, an advantageous effect can be obtained such that the electric resistance is decreased along with the decrease of oxygen concentration since the oxygen contained in the electrode layer is released as well as the electrode layer is planarized.

An insulating film 5109 to serve as a passivation film is preferably formed so as to cover the source/drain electrode layer, the semiconductor layer, the gate electrode layer, and the gate insulating layer. The insulating film 5109 is formed by a thin film formation method such as plasma CVD and sputtering, and can be formed using silicon nitride, silicon oxide, silicon nitride oxide, silicon oxynitride, aluminum oxynitride, aluminum oxide, diamond-like carbon (DLC), carbon containing nitrogen (CN), or other insulating materials. Note that the passivation film may have either a single-layer structure of a stacked-layer structure. Here, in view of the interfacial property of the semiconductor layer 5115, the stacked-layer structure is preferably employed, in which a silicon oxide film or a silicon oxynitride film is formed first, and a silicon nitride film or a silicon nitride oxide film is formed thereover so as to prevent diffusion of external impurities into the semiconductor elements. In this embodiment mode, the insulating film 5109 is formed to have a stacked-layer structure in such a manner that a silicon oxide film is formed first with a thickness of 150 nm so as to be in contact with the semiconductor layer 5115, and then a silicon nitride film is formed continuously with a thickness of 200 nm by switching the gas in the same chamber.

After that, the semiconductor layer 5115 is preferably heated in a hydrogen atmosphere or a nitrogen atmosphere to be hydrogenated. Note that in the case of heating the semiconductor layer 5115 in a nitrogen atmosphere, an insulating film containing hydrogen is preferably formed to be used as the insulating film 5109

Then, an insulating layer 5110 is formed. In this embodiment mode, the insulating layer 5110 is formed over the whole surface, and patterned then by etching with a resist mask and the like. In the case where the insulating layer 5110 is formed by a droplet discharge method or a printing method capable of directly selective deposition, the patterning by etching is not necessarily required.

The insulating layer 5110 can be formed using an inorganic insulating material such as silicon oxide, silicon nitride, silicon oxynitride, aluminum oxide, aluminum nitride, aluminum oxynitride, diamond-like carbon (DLC), and a carbon film containing nitrogen (CN), an organic insulating material such as acrylic acid, methacrylic acid, derivatives thereof, polyimide, aromatic polyamide, polybenzimidazole, benzocyclobutene, and polysilazane, and an insulating material such as inorganic siloxane as a compound of silicon, oxygen, and hydrogen, which is formed of a siloxane material as a starting material and has a Si—O—Si bond, or organic siloxane, the hydrogen on silicon of which is substituted with an organic group such as methyl and phenyl. Alternatively, a photosensitive or non-photosensitive material such as acrylic and polyimide may be used.

In this embodiment mode, the insulating layer 5110 may be formed using a siloxane resin.

In the insulating film 5109 and the insulating layer 5110, an opening 5135 is formed to reach the source/drain electrode layer 5108. Meanwhile, in the gate insulating layers 5105a and 5105b, the insulating film 5109, and the insulating layer 5110, an opening 5136 is formed to reach the pixel electrode layer 5111, and also an opening 5137 is formed to reach the gate electrode layer 5103. Such openings are also formed by etching with a resist mask. For the mask used for patterning, a mask which is exposed to a laser beam to have a fine shape may be used. A wiring layer 5113 is then formed in the openings 5135 and 5137 formed in the aforementioned manner so as to electrically connect the source/drain electrode layer 5108 to the pixel electrode layer 5111. In addition, a gate wiring layer 5112 is formed in the opening 5137 so as to electrically connect the gate electrode layer 5103 to the gate wiring layer 5112. By forming the gate wiring layer 5112 using a low-resistant material, high-speed operation is enabled even when the gate electrode layer 5103 is formed of a relatively high-resistant material, thereby a large current can be flown.

According to the aforementioned steps, a TFT substrate for a liquid crystal display panel is completed, in which a bottom-gate (also called an inversely staggered) thin film transistor and a pixel electrode are connected to each other over the substrate 5100. The thin film transistor in this embodiment mode is a channel-etch type thin film transistor.

Figure 48:
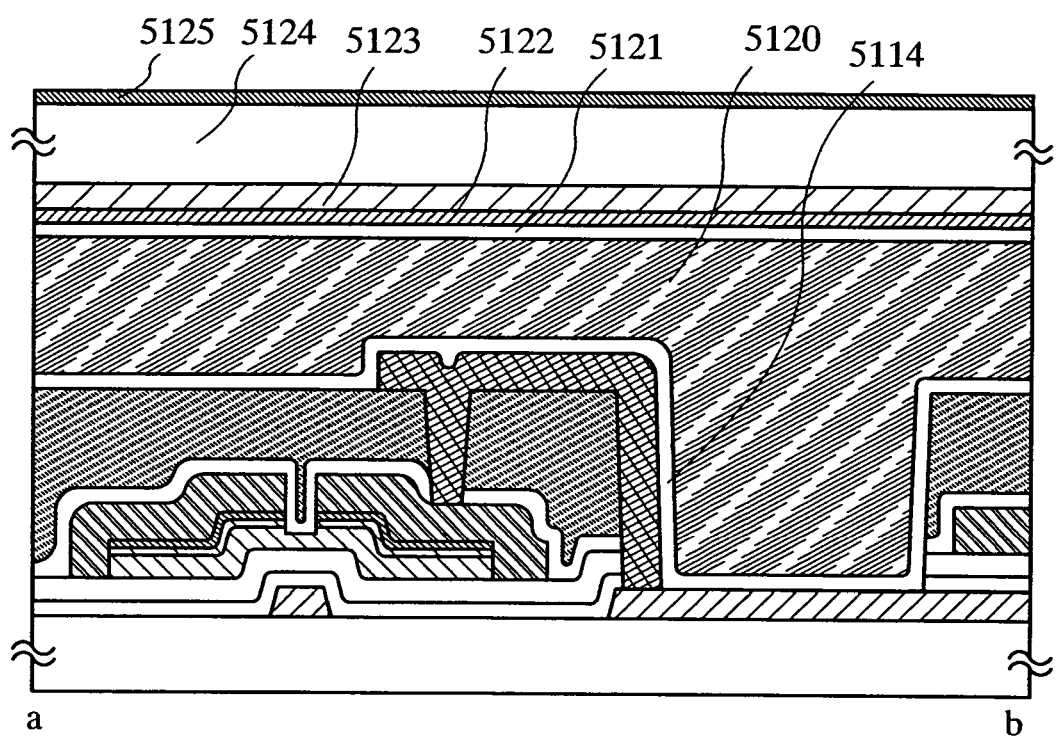
FIG. 48 illustrates a display device of the invention.
Figure 49A:
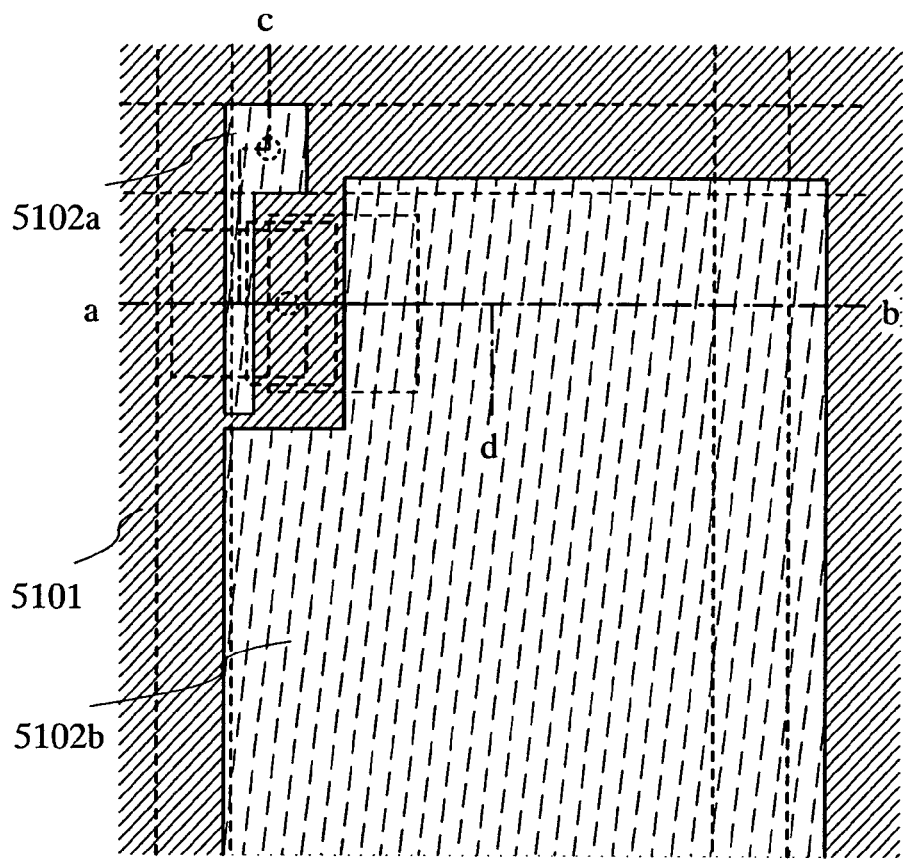
FIGS. 49A to 49C illustrate a manufacturing method of a display device of the invention.
Figure 49B:
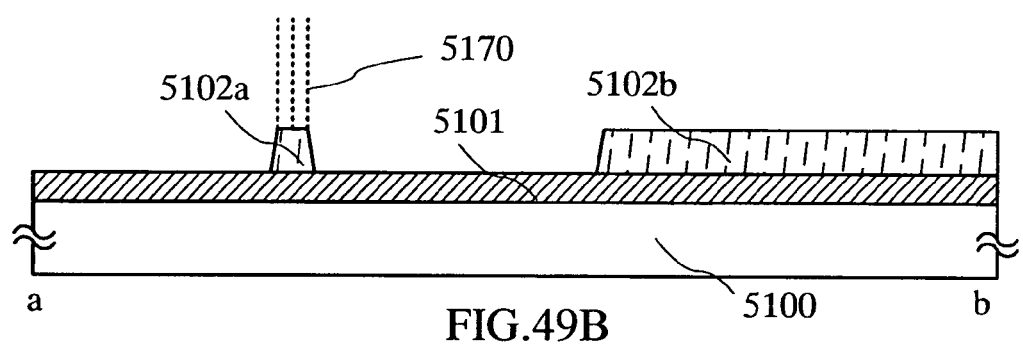
Figure 49C:
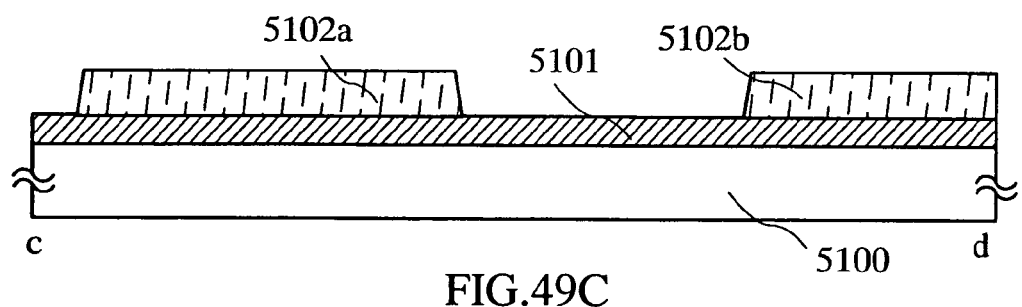

Subsequently, a shown in FIG. 48, an insulating layer 5114 called an alignment film is formed by printing or spin coating so as to cover the pixel electrode layer 5111. FIG. 48 is a cross-sectional view of the top views shown in FIGS. 49A to 53A along a line A-B, which is a final view of a liquid crystal display panel. Note that the insulating layer 5114 can be formed selectively if screen printing or offset printing is employed. Then, the insulating layer 5114 is rubbed. Subsequently, a sealant is formed in the peripheral region of the pixels by a droplet discharge method (not shown).

Subsequently, a counter substrate 5124 provided with an insulating layer 5121 functioning as an alignment film, a colored layer 5122 functioning as a color filter, a conductor layer 5123 functioning as a counter electrode, and a polarizing plate 5125 is stuck to the substrate 5100 having TFTs with a spacer interposed therebetween, and a liquid crystal layer 5120 is provided in the space between the substrates, thereby a liquid crystal display panel can be manufactured (see FIG. 48). The sealant may be mixed with a filler, and the counter substrate 5124 may be further provided with a shielding film (black matrix) and the like. Note that as a method for forming the crystal layer, a dispenser method (one drop fill method) may be used as well as a dip method (pump method) by which liquid crystals are injected by utilizing a capillary phenomenon after sticking the counter substrate 5124 to the substrate 5100.

Figure 60:
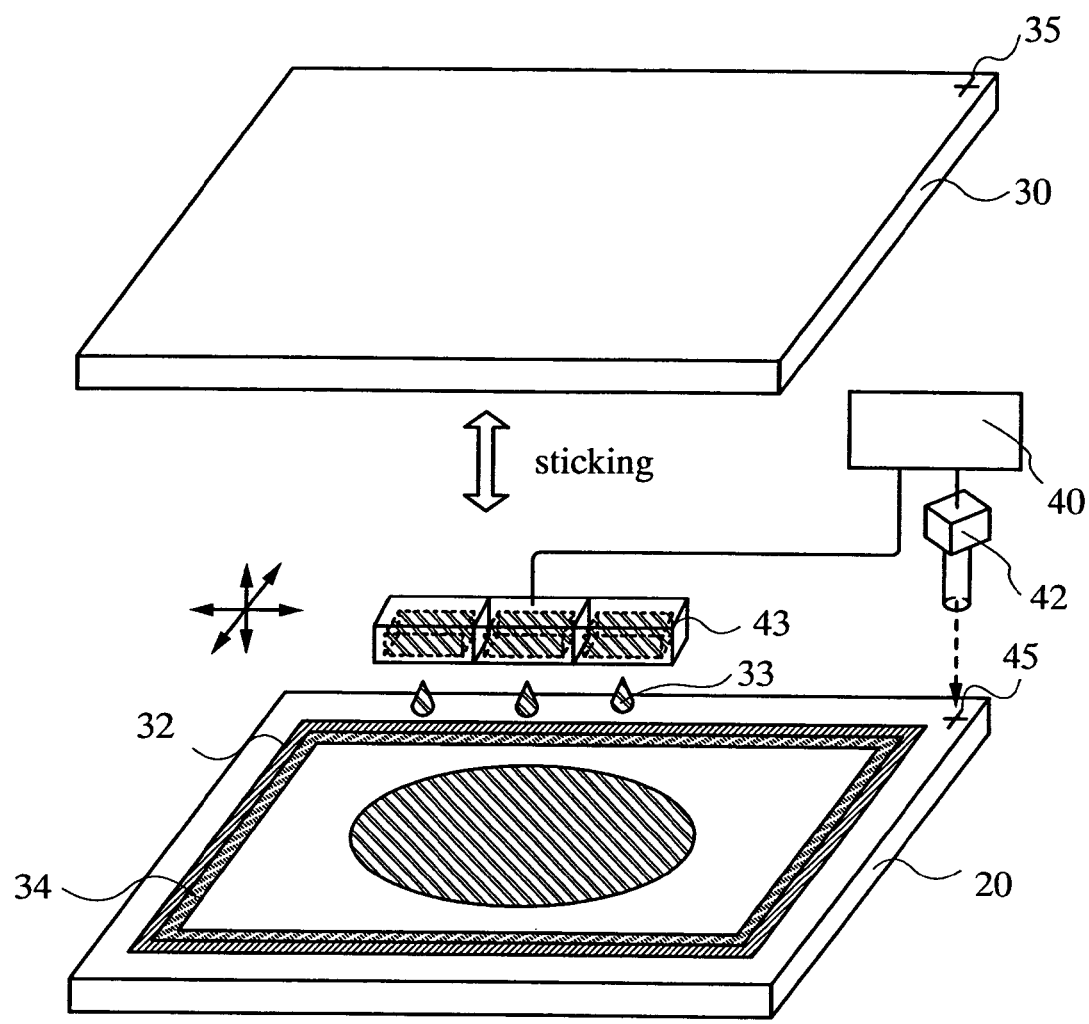
FIG. 60 illustrates a liquid crystal one drop fill method which can be applied to the invention.

Description is made with reference to FIG. 60 using a liquid crystal droplet injection method with the dispenser method. In FIG. 60, reference numeral 40 denotes a control device, 42 denotes a image pick-up means, 43 denotes a head, 33 denotes a liquid crystal, 35 and 41 denote markers, 34 denotes a barrier layer, 32 denotes a sealant, 30 denotes a TFT substrate, and 20 denotes a counter substrate. After forming a closed loop with the sealant 32, the liquid crystal 33 is dropped from the head 43 once or a plurality of times. The head 43 has a plurality of nozzles, and is capable of dropping liquid crystal materials in large quantities at one time; therefore, throughput can be improved. At this time, in order to prevent the reaction between the sealant 32 and the liquid crystal 33, the barrier layer 34 is provided. Subsequently, the substrates are stuck in vacuum and cured by ultraviolet curing to obtain such state that the space is filled with liquid crystals.

In order to connect the pixel portion formed through the aforementioned steps and an external wiring substrate, a connecting portion is formed. An insulator layer of the connecting portion is removed by ashing with an oxygen gas under the atmospheric pressure or the near-atmospheric pressure. This process is carried out using an oxygen gas, and one or more selected from hydrogen, $CF_4$, $NF_3$, $H_2O$, and $CHF_3$. In this step, ashing is carried out after sealing with a counter substrate in order to prevent electrostatic damage or breakdown; however, in the case where there are few effects of static electricity, the ashing may be carried at any timing.

Subsequently, a wiring substrate for connection is provided so as to be electrically connected to the wiring layer in the liquid crystal display device via an anisotropic conductor layer. The wiring substrate functions to transmit external signals and potentials, which may be an FPC (Flexible Printed Circuit) or the like. Through the aforementioned steps, a liquid crystal display panel including a channel-etch type switching TFT and a capacitor is completed. The capacitor is formed by the capacitor wiring layer 5104, the gate insulating layers 5105a and 5105b, and the pixel electrode layer 5111.

The wiring layer in the liquid crystal display device and the FPC are connected with a terminal electrode layer. The terminal electrode layer can be formed with any of the same material and steps as the gate electrode layer, as the source wiring layer which combines the source electrode layer and the drain electrode layer, and as the gate wiring layer. Examples of the connection between the FPC and the wiring layer of the liquid crystal display device are described with reference to FIGS. 69(1)A to 69C(2).

In FIGS. 69A(1) to 69C(2), a thin film transistor 709, and a pixel electrode layer 706 are formed over a substrate 701, which is stuck to a counter substrate 708 with a sealant 703. A wiring layer formed outside of the sealant extending from inside of the liquid crystal display device is stuck to FPCs 702b and 702a with anisotropic conductive films 707a and 707b.

FIGS. 69A(1), 69B(1), and 69C(1) are top views of a liquid crystal display device, and FIGS. 69A(2), 69B(2), and 69C(2) are cross-sectional views of FIGS. 69A(1), 69B(1), and 69C(1) respectively along lines O-P and R-Q. In FIGS. 69A(1) and 69A(2), terminal electrode layers 705a and 705b are formed using the same material and steps as a gate electrode layer. The terminal electrode layer 705a is connected to a source wiring layer 704a which is formed extending to the outside of the sealant, and the terminal electrode layer 705a is connected to the FPC 702a via the anisotropic conductive film 707a. On the other hand, the terminal electrode layer 705b is connected to a gate wiring layer 704b which is formed extending to the outside of the sealant, and the terminal electrode layer 705b is connected to the FPC 702b via the anisotropic conductive film 707b.

In FIGS. 69B(1) and 69B(2), terminal electrode layers 755a and 755b are formed using the same material and steps as a source wiring layer. The terminal electrode layer 755a is formed of a source wiring layer which is formed extending to the outside of the sealant, and the terminal electrode layer 755a is connected to the FPC 702a via the anisotropic conductive film 707a. On the other hand, the terminal electrode layer 755b is connected to a gate wiring layer 754b which is formed extending to the outside of the sealant, and the terminal electrode layer 755b is connected to the FPC 702b via the anisotropic conductive film 707b.

In FIGS. 69C(1) and 69C(2), terminal electrode layers 764a and 764b are formed using the same material and steps as a gate wiring layer. A source wiring layer 765a formed extending to the outside of the sealant is connected to the terminal electrode layer 764a, and the terminal electrode layer 764a is connected to the FPC 702a via the anisotropic conductive film 707a. On the other hand, the terminal electrode layer 764b is formed of a gate wiring layer which is formed extending to the outside of the sealant, and the terminal electrode layer 764b is connected to the FPC 702b via the anisotropic conductive film 707b.

In this embodiment mode, the switching TFT has a single-gate structure; however, it may have a multi-gate structure such as a double-gate structure.

Through the aforementioned steps, an inversely staggered thin film transistor having a crystalline semiconductor film can be formed. The thin film transistor in this embodiment mode is formed using a crystalline semiconductor film; therefore, it exhibits higher mobility (about 2 to 50 cm$^2$/Vsec) as compared to a thin film transistor formed using an amorphous semiconductor film. The source region and the drain region contain metal elements having a function to promote crystallization in addition to the impurity elements having one conductivity type. Therefore, the source region and the drain region having low resistivity can be formed. As a result, a display device capable of high-speed operation can be manufactured. Accordingly, a liquid crystal display device such as an OCB-mode liquid crystal display device can be manufactured, which exhibits high response while being capable of displaying images with a wide viewing angle.

In addition, in comparison with a thin film transistor formed using an amorphous semiconductor film, variations of threshold voltage hardly occur, resulting in the decrease in variations of the TFT characteristics.

Further, the metal elements which are mixed into the semiconductor film during the film deposition are also removed by the gettering step; therefore, off current can be decreased. Accordingly, by using such a TFT as a switching element of the liquid crystal display device, image contrast can be enhanced.

In addition, by the fine processing with laser irradiation, thinner wirings and the like can be designed freely. According to the invention, desired patterns can be formed with high controllability, and waste of materials can be reduced, resulting in cost saving. Thus, a high-performance and highly reliable display device can be manufactured with high yield.

Embodiment Mode 20

This embodiment mode is described with reference to FIGS. 54A to 59. This embodiment mode adopts the pixel region manufactured in Embodiment Mode 1, in the case where a thin film transistor included in the pixel is a multi-gate thin film transistor. In addition, the peripheral driver circuit region is also manufactured using a thin film transistor using the invention, and the CMOS having an n-channel thin film transistor and a p-channel thin film transistor manufactured in Embodiment Mode 2 is adopted. Therefore, common portions or portions having a common function will be described in no more detail.

Figure 59:
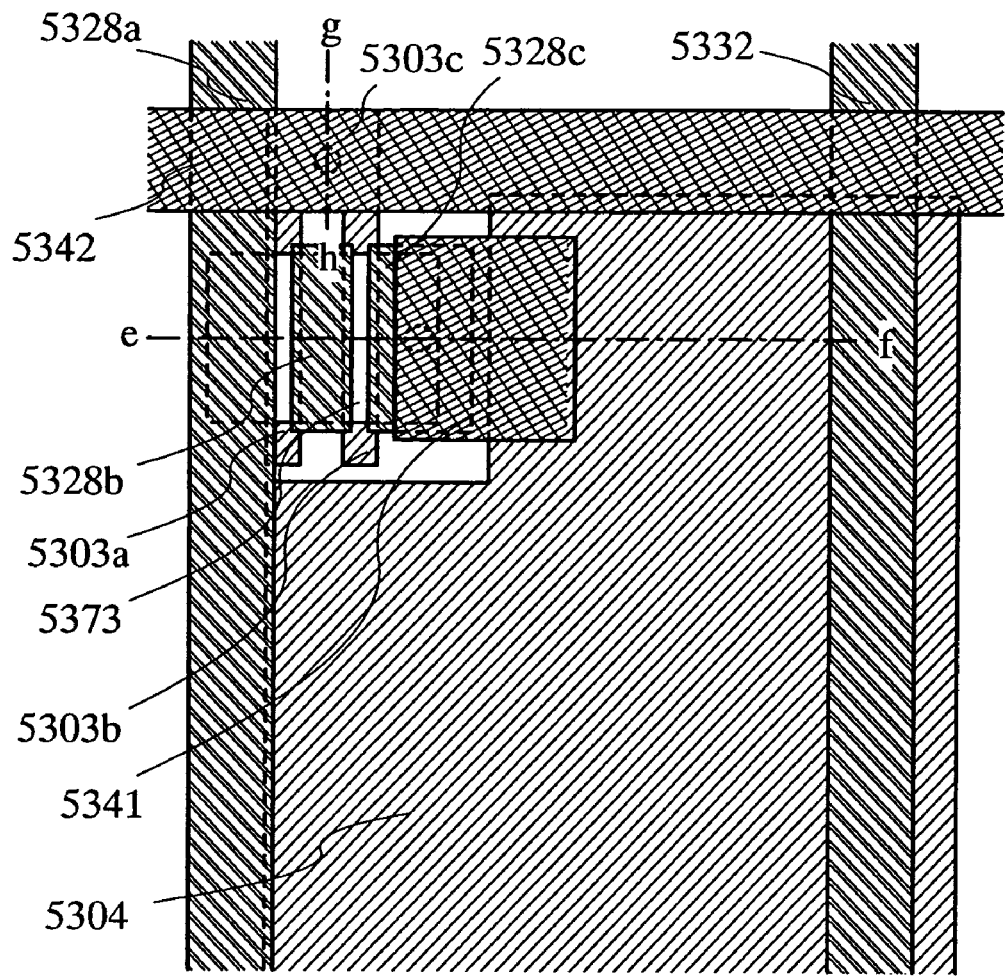
FIG. 59 illustrates a manufacturing method of a display device of the invention.

FIG. 59 is a top view of a pixel region of a liquid crystal display device manufactured in this embodiment mode, and FIGS. 54A to 57 and 58B are cross-sectional views of each step along lines e-f and g-h of FIG. 59. The region of i-j in FIGS. 54A to 57 correspond to lines l-s, t-k, and i-j as a peripheral driver circuit region of the liquid crystal display device of FIG. 58A.

A conductive film is formed over a substrate 5300, which is patterned then with a resist mask to form gate electrode layers 5301, 5302, 5303a, 5303b, and 5303c, and a pixel electrode layer 5304. In this embodiment mode, each gate electrode layer is formed in a single layer of a light-transmissive conductive film; however, it may have a stacked-layer structure. As the stacked-layer structure, stacked layers of Ta, Ti, W, Mo, and Cr, or a nitride film of such elements can be used. Specifically, stacked layers of TaN and W, stacked layers of TaN and Mo, stacked layers of TaN and Cr, stacked layers of TiN and W, stacked layers of TiN and Mo, stacked layers of TiN and Cr, and the like can be used. In this embodiment mode, compositions containing indium tin oxide containing silicon oxide (ITSO) are discharged by a droplet discharge method, and then baked to form a conductive film in the region for forming the gate electrode layers. The conductive film is patterned precisely using a mask which is finely processed by laser beam exposure, thereby the gate electrode layers 5301, 5302, 5303a, 5303b, and 5303c, and the pixel electrode layer 5304 are formed.

Over the gate electrode layers 5301, 5302, 5303a, 5303b, and 5303c, and the pixel electrode layer 5304, a gate insulating layer is formed, over which an amorphous semiconductor film 5306 is formed (see FIG. 54A). In this embodiment mode, a gate insulating layer 5305a formed of silicon nitride and a gate insulating layer 5305b formed of silicon oxide are stacked as the gate insulating layer. The amorphous semiconductor film 5306 is formed of an amorphous silicon film. The gate insulating layers 5305a and 5305b and the amorphous semiconductor film 5306 are continuously formed by plasma CVD only by switching the gas. By forming such films continuously, manufacturing steps thereof can be simplified, and it can be prevented that the contaminant in the atmosphere adheres to the surface or the interface of the films.

Over the amorphous semiconductor film 5306, a metal film 5307 is formed in order to introduce elements for promoting crystallization. The metal film 5307 is quite thin, and thus it might not be kept in the form of a film. In this embodiment mode, the amorphous semiconductor film 5306 is coated with a solution containing 100 ppm of Ni by spin coating to form the metal film 5307. The amorphous semiconductor film 5306 coated with the metal film 5307 is heated and crystallized. In this embodiment mode, thermal treatment is performed at 550° C. for 4 hours to form a crystalline semiconductor film 5309 (see FIG. 54B).

Over the crystalline semiconductor film 5309, an n-type semiconductor film 5308 is formed. In this embodiment mode, the n-type semiconductor film 5308 is formed by depositing an amorphous silicon film containing phosphorus (P) as n-type impurity elements by plasma CVD to have a thickness of 100 nm. Then, thermal treatment is performed using the n-type semiconductor film 5308 as a gettering sink to getter the metal elements in the crystalline semiconductor film 5309 (see FIG. 54C). By the thermal treatment, the metal elements in the crystalline semiconductor film 5309 travel in the direction of arrows to be trapped into the n-type semiconductor film 5308. Accordingly, the crystalline semiconductor film 5309 becomes a crystalline semiconductor film 5310 containing a reduced amount of metal elements while the n-type semiconductor film 5308 becomes an n-type semiconductor film 5311 containing n-type impurity elements (P in this embodiment mode) and metal elements (Ni in this embodiment mode).

The crystalline semiconductor film 5310 and the n-type semiconductor film 5311 are patterned to form semiconductor layers 5312, 5313, and 5314, and n-type semiconductor layers 5315, 5316, and 5317 (see FIG. 55A). The patterning of such semiconductor layers can be performed precisely by using a mask of the invention which is finely processed by laser beam exposure.

Then, a mask 5318a for covering the semiconductor layer 5312 and the n-type semiconductor layer 5315, a mask 5318b for covering a channel formation region of the semiconductor layer 5313, and a channel formation region of the n-type semiconductor layer 5316, and a mask 5318c for covering the semiconductor layer 5314 and the n-type semiconductor layer 5317 are formed. Then, p-type impurity elements 5319 are doped to form p-channel impurity regions 5320a and 5320b in the n-type semiconductor layer 5316 (see FIG. 55B). In this embodiment mode, p-type impurity elements are doped by ion doping. Then, thermal treatment is performed at 550° C. for 4 hours in order to activate the region doped with the impurity elements.

Then, the contact hole 890 as shown in FIG. 40 is formed by partially etching the gate insulating layers 5303a and 5305b with a photo mask in order to connect gate electrodes of several TFTs to source electrodes or drain electrodes thereof in the driver circuit region. Referring to FIG. 40 and this embodiment mode, the gate electrode layer 301 corresponds to the gate electrode layer 5301, the gate electrode layer 302 corresponds to the gate electrode layer 5302, the semiconductor layers 371 and 372 correspond to the semiconductor layers 5371 and 5372 respectively, and the source/drain electrode layers 327a, 327b, and 327c correspond to the source/drain electrode layers 5327a, 5327b, and 5327c respectively. In this embodiment mode, the pixel electrode layer and the source/drain electrode layer are connected via the contact hole formed in the interlayer insulating layer; however, they may be connected without the intermediary of the inter layer insulating layer. In such a case, an opening reaching the pixel electrode layer may be formed simultaneously with the contact hole 890. After that, a source electrode layer or a drain electrode layer is formed in each contact hole so as to be electrically connected to the gate electrode layer or the pixel electrode layer.

After removing the masks 5318a, 5318b, and 5318c, conductive layers 5321 and 5322 are formed over the semiconductor layers 5312, 5313, and 5314. In this embodiment mode, the conductive layers 5321 and 5322 are formed by a droplet discharge method, thereby waste of materials is reduced. As the conductive material, silver (Ag) is used, and compositions containing Ag are discharged from droplet discharge systems 5380a and 5380b, which are then baked at 300° C. to form the conductive layers 5321 and 5322 (see FIG. 55C). In addition, in the same step, a conductive layer 5370 to serve as a capacitor wiring layer is also formed over the gate insulating layer 5305b over the pixel electrode layer 5304.

As described in Embodiment Mode 1 with reference to FIGS. 8A to 8D, the conductive layers 5321 and 5322 are precisely patterned to form the source/drain electrode layers 5327a, 5327b, 5327c, 5328a, 5328b, and 5328c, and a capacitor wiring layer 5332. By using as masks the source/drain electrode layers 5327a, 5327b, 5327c, 5328a, 5328b, and 5328c, the semiconductor layers 5312, 5313, and 5314, and the n-type semiconductor layers 5315, 5316, and 5317 are etched to form semiconductor layers 5371, 5372, and 5373, n-type semiconductor layers 5324a and 5324b, p-type semiconductor layers 5325a and 5325b, and n-type semiconductor layers 5326a, 5326b, and 5326c. The etching may be performed by dry etching or wet etching. In this embodiment mode, dry etching is used.

Figures 56A, 56B, 56C:
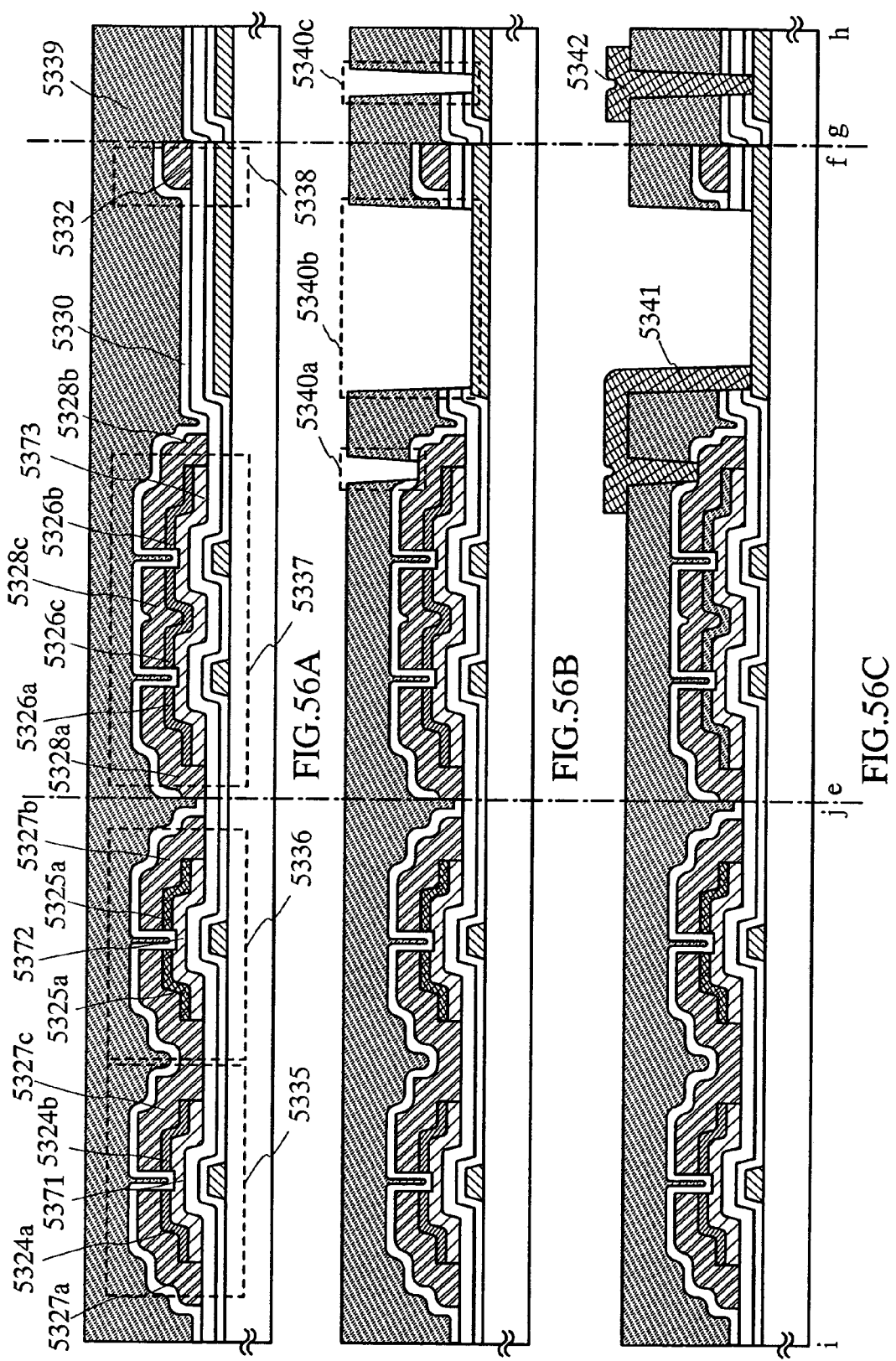
FIGS. 56A to 56C illustrate a manufacturing method of a display device of the invention.

Through the aforementioned steps, an n-channel thin film transistor 5335 and a p-channel thin film transistor 5336 which constitute the CMOS, an n-channel thin film transistor 5337, and a capacitor 5338 can be formed (see FIG. 56A). This embodiment employs a CMOS structure; however, the invention is not limited to this, and a PMOS or NMOS structure may be employed as well.

An insulating film 5330 to serve as a passivation film is formed. In this embodiment mode, the insulating film 5330 is formed in stacked layers of a silicon oxide film (thickness of 150 nm) and a silicon nitride film (thickness of 200 nm), which are formed in this order from the side in contact with the semiconductor layer. The insulating film 5330 may also be formed of other films containing silicon. For example, instead of using the silicon oxide film, a silicon oxynitride film may be used, and stacked with the silicon nitride film.

The insulating film 5330 is formed to contain oxygen, and applied with thermal treatment at 300 to 500° C. under a nitrogen atmosphere in order to hydrogenate the semiconductor layer.

Over the insulating film 5330, an insulating layer 5339 is formed. In this embodiment mode, a silicon oxide film containing an alkyl group is formed using a slit coater. In the insulating layer 5339 and the insulating film 5330, an opening 5340a is formed to reach the source/drain electrode layer 5328b. Meanwhile, in the insulating layer 5339, the insulating film 5330, and the gate insulating layers 5305a and 5305b, an opening 5340b is formed to reach the pixel electrode layer 5304 and also an opening 5340c is formed to reach the gate electrode layer 5303c (see FIG. 56B). The patterning for forming the openings can be performed by using the fine processing of the invention with a laser beam. In this embodiment mode, the openings are formed by dry etching.

Then, gate wiring layers 5341 and 5342 are formed. In this embodiment mode, the gate wiring layers are formed by a droplet discharge method using Ag. As the conductive material, compositions containing Ag are discharged into the openings 5340a, 5340b, and 5340c, and then baked at 300° C. According to the aforementioned steps, the gate wiring layer 5341 for electrically connecting the source/drain electrode layer 5328b to the pixel electrode layer 5304, and the gate wiring layer 5342 electrically which is connected to the gate electrode layer 5303c are formed (see FIG. 56C).

FIG. 59 is a top view of a pixel region of a liquid crystal display device manufactured in this embodiment mode. A thin film transistor provided in the pixel region is a multi-gate transistor. In the pixel region, the gate electrode layers 5303a and 5303b, the pixel electrode layer 5304, the semiconductor layer 5373, the source/drain electrode layers 5328a, 5328b, and 5328c, the capacitor wiring layer 5332, and the gate wiring layers 5342 and 5341 are formed.

Figure 57:
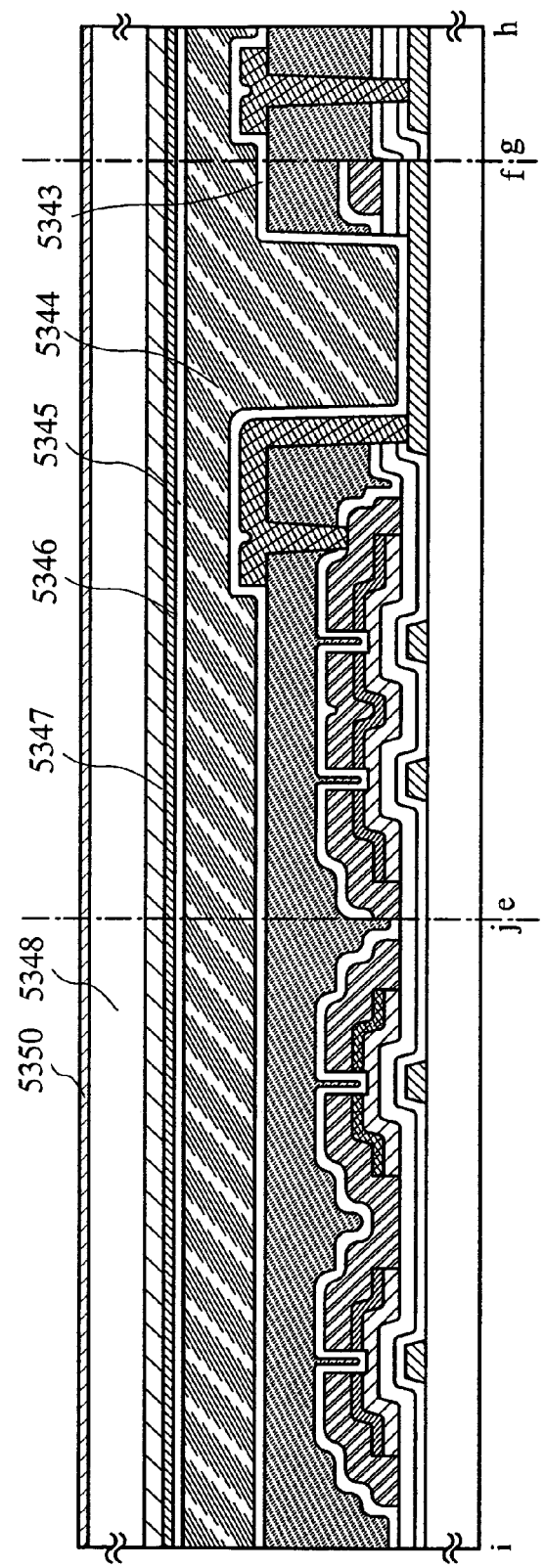
FIG. 57 illustrates a manufacturing method of a display device of the invention.

Then, as shown in FIG. 57, an insulating layer 5343 called an alignment film is formed by printing or spin coating, covering the pixel electrode layer 5304. Note that the insulating layer 5343 can be formed selectively if screen printing or offset printing is used. Then, the insulating layer 5343 is rubbed. Subsequently, a sealant 5351 is formed in the peripheral region of the pixels.

After that, a counter substrate 5348 provided with the insulating layer 5345 functioning as the alignment film, a colored layer 5346 functioning as a color filter, a conductor layer 5347 functioning as a counter electrode, and a polarizing plate 5350 is stuck to the substrate 5300 with a spacer 5375 interposed therebetween, and a liquid crystal layer 5344 is provided in the space between the substrates, thereby a liquid crystal display panel can be manufactured (see FIGS. 58A and 58B). The spacer may be provided by dispersing particles of several μm; however, in this embodiment mode, the spacer is provided by forming a resin film over the whole surface of the substrate and patterning it. After coating the substrate with such spacer material using a spinner, it is formed into a predetermined pattern by light exposure and developing treatment. Further, the pattern is hardened by heating at 150 to 200° C. with a clean oven. The spacer manufactured in this manner can have different shapes according to the conditions of the light exposure and developing treatment, and it is preferable that the spacer have a pillar shape with a flat top portion as it enables the mechanical strength to be secured as a liquid crystal display panel when the counter substrate is stuck to the substrate. The shape of the spacer is not specifically limited, and it may have a shape of a circular cone or a pyramid. The sealant may be mixed with a filler, and the counter substrate 5348 may be further provided with a shielding film (black matrix) and the like. In addition, an FPC 5354 is stuck to a terminal electrode layer 5352 for electrically connecting the inside of the display device to the outside thereof with an anisotropic conductive film 5353 to be electrically connected to the terminal electrode layer 5352.

FIG. 58A is a top view of a display device. As shown in FIG. 58A, a pixel region 5360, a scan line driver region 5361a, and a scan line driver region 5361b, are sealed between the substrate 5300 and the counter substrate 5348 with the sealant 5351, and a signal line driver circuit 5362 constructed of a driver IC is formed over the substrate 5300. In this embodiment mode, a polarizing plate is provided only on the side of the counter substrate 3548; however, another polarizing plate may be provided on the side of the substrate 5300.

Figure 70:
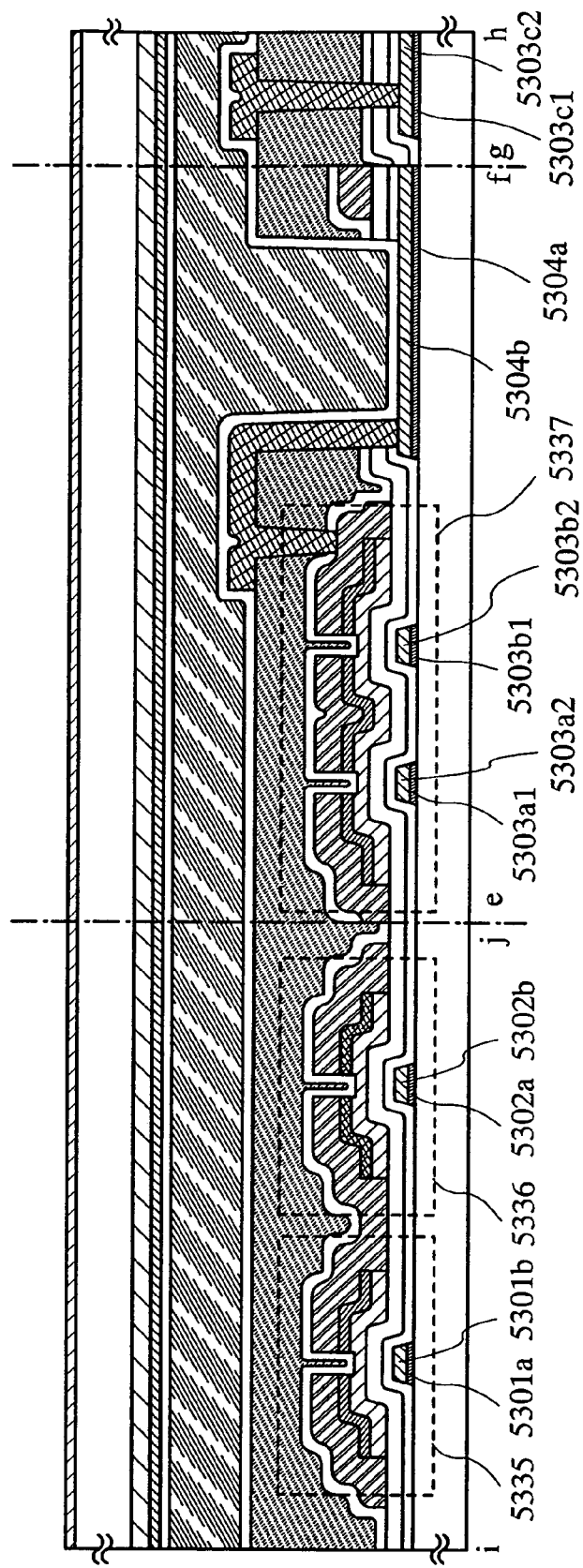
FIG. 70 illustrates a display device of the invention.

The liquid crystal display device of this embodiment mode shown in FIGS. 58A and 58B has the gate electrode layers 5301, 5302, 5303a, and 5303b, and the pixel electrode layer 5304 each having a single-layer structure; however, the gate electrode layers may have two or more stacked layers as set forth above. FIG. 70 illustrates an example in which a gate electrode layer and a pixel electrode layer each have a stacked-layer structure.

As the stacked-layer structure, stacked layers of Ta, Ti, W, Mo, and Cr, or a nitride film of such elements can be used. Specifically, stacked layers of TaN and W, stacked layers of TaN and Mo, stacked layers of TaN and Cr, stacked layers of TiN and W, stacked layers of TiN and Mo, stacked layers of TiN and Cr, and the like can be used. In this embodiment mode, first gate electrode layers 5301a, 5302a, 5303a1, 5303b1, and 5303c1 are formed of TaN while second gate electrode layers 5301b, 5302b, 5303a2, 5303b2, and 5303c2 are formed of W. As for a pixel electrode layer formed in the same step also, a first pixel electrode layer 5304a is formed of a TaN film while a first pixel electrode layer 5304b is formed of a W film. In this manner, each of the gate electrode layer and the pixel electrode layer can be formed to have a stacked-layer structure. Alternatively, the pixel electrode layer may be formed to have a single-layer structure while the gate electrode layer may be formed to have a stacked-layer structure. On the other hand, the pixel electrode layer may be formed to have a stacked-layer structure while the gate electrode layer may be formed to have a single-layer. Such structure may be appropriately determined in accordance with the required function of the liquid crystal display device.

Through the aforementioned steps, an inversely staggered thin film transistor having a crystalline semiconductor film can be formed. The thin film transistor in this embodiment mode is formed using a crystalline semiconductor film; therefore, it exhibits higher mobility as compared to a thin film transistor formed using an amorphous semiconductor film. The source region and the drain region contain metal elements in addition to the impurity elements having one conductivity type. Therefore, the source region and the drain region having low resistivity can be formed. As a result, a display device capable of high-speed operation can be manufactured. Accordingly, a liquid crystal display device such as an OCB-mode liquid crystal display device can be manufactured, which exhibits high response while being capable of displaying images with a wide viewing angle.

In addition, in comparison with a thin film transistor formed using an amorphous semiconductor film, variations of threshold voltage hardly occur, resulting in the decrease in variations of the TFT characteristics.

Further, the metal elements which are mixed into the semiconductor film during the film deposition are removed by the gettering step; therefore, off current can be decreased. Accordingly, by using such a thin film transistor as a switching element of the liquid crystal display device, image contrast can be enhanced.

Embodiment Mode 21

In Embodiment Mode 1, a multi-layer structure is adopted, in which a gate electrode layer, a source/drain electrode layer (including a source wiring layer), and a capacitor wiring layer are stacked with a gate insulating layer interposed therebetween, and the source/drain electrode layer (including the source wiring layer) and a gate wiring layer are stacked with an interlayer insulating layer interposed therebetween. In this embodiment mode, a different stacked-layer structure of such layers is described with reference to FIGS. 62A to 68B. FIGS. 62A, 63A, 64A, 65A, 66A and 67A are top views of a liquid crystal display device while FIGS. 62B, 63B and 64B are cross-sectional views thereof along lines x1-v1, x2-v2, and x3-v3 respectively. FIGS. 65A, 66A, 67A and 68A are top views of a liquid crystal display device while FIGS. 65B, 66B, 67B and 68B are cross-sectional views thereof along lines y1-z1, y2-z2, y3-z3, and y4-z4 respectively.

Figure 62A:
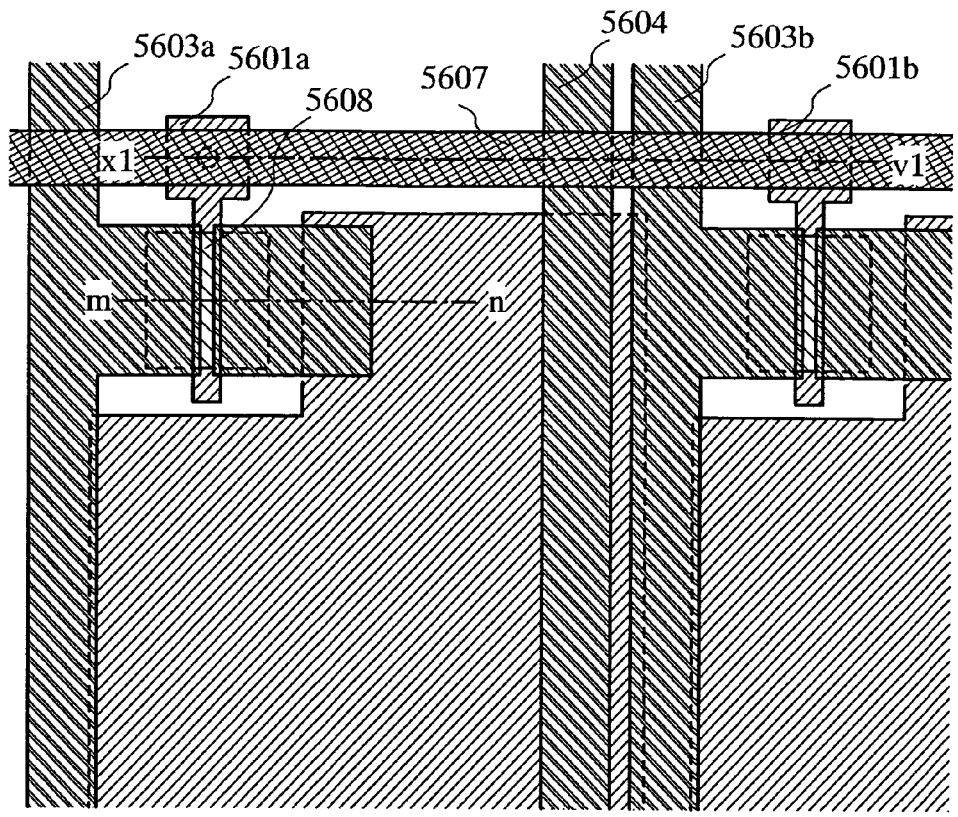
FIGS. 62A to 62C each illustrate a display device of the invention.
Figure 62B:
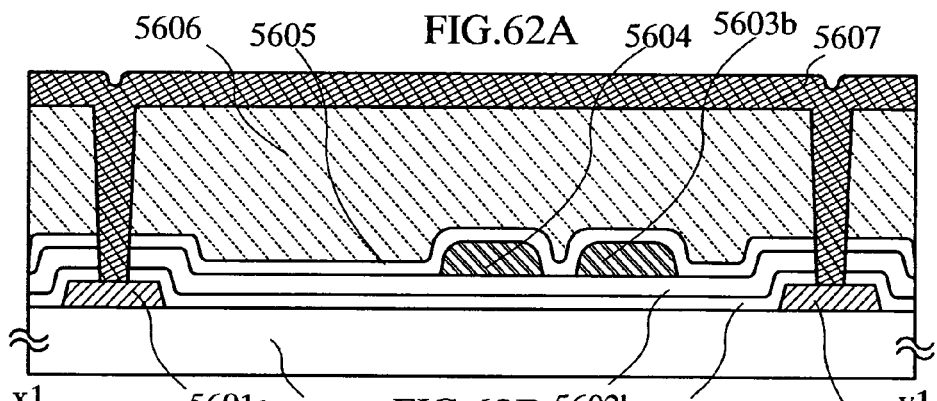
Figure 62C:
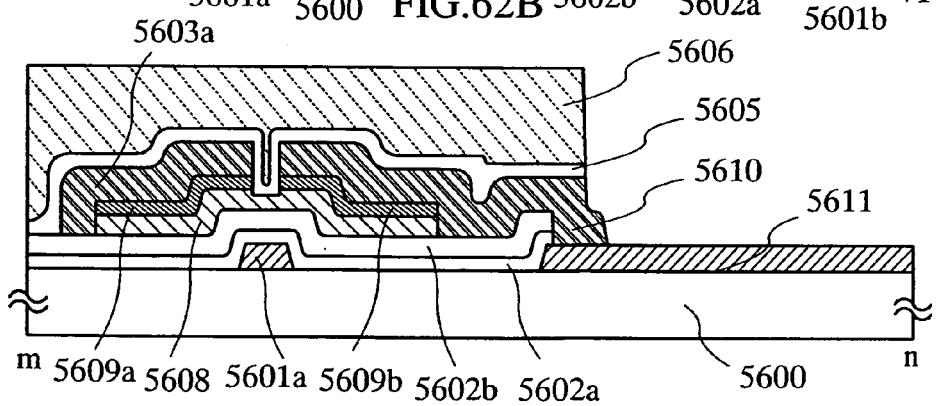

FIG. 62A is a top view of a liquid crystal display device, FIG. 62B is a cross-sectional view of FIG. 62A along a line x1-v1, and FIG. 62C is a cross-sectional view of FIG. 62A along a line m-n. In the liquid crystal display device shown in FIGS. 62A to 62C, a source/drain electrode layer and a pixel electrode layer are not electrically connected by a gate wiring layer unlike Embodiment Mode 1, but connected in such a manner that a source/drain electrode layer 5610 is directly connected to a pixel electrode layer 5611. In this manner, the source/drain electrode layer 5610 may be connected to the pixel electrode layer 5611. In the case of a reflective liquid crystal display device, the source/drain electrode layer 5610 may be formed of a reflective material and stacked with the pixel electrode layer 5611.

In FIGS. 62A to 62C, in a pixel region of the liquid crystal display device, gate electrode layers 5601a and 5601b, the pixel electrode layer 5611, gate insulating layers 5602a and 5602b, a capacitor wiring layer 5604, source/drain electrode layers 5603a and 5603b, a gate wiring layer 5607, a semiconductor layer 5608, n-type semiconductor layers 5609a and 5609b, an insulating film 5605 as a passivation film, and an insulating layer 5606 are formed over a substrate 5600.

The insulating film 5605 is not necessarily required; however, the provision of the insulating film 5605 can further improve the reliability of the display device as it functions as a passivation film. In addition, if the insulating film 5605 is formed and applied with thermal treatment, hydrogen contained in the insulating film 5605 can hydrogenate the semiconductor layer.

As shown in FIG. 62B, the source/drain electrode layer 5603b and the gate wiring layer 5607 are stacked with the insulating layer 5606 as an interlayer insulating layer interposed therebetween. The gate wiring layer 5607 is connected to the gate electrode layers 5601a and 5601b via contact holes formed in the insulating layer 5606, the insulating film 5605, and the gate insulating layers 5602a and 5602b. Accordingly, the gate wiring layer 5607 is not short-circuited to the source/drain electrode layer 5603b nor the capacitor wiring layer 5604.

Figure 63A:
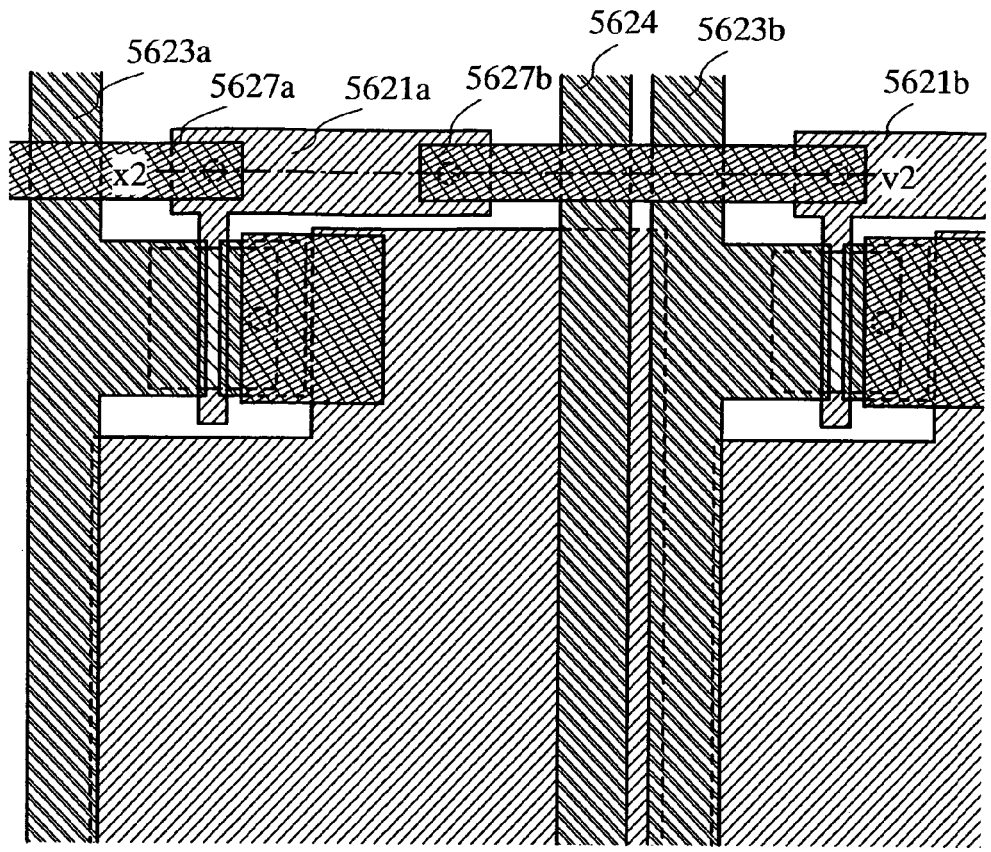
FIGS. 63A and 63B each illustrate a display device of the invention.
Figure 63B:
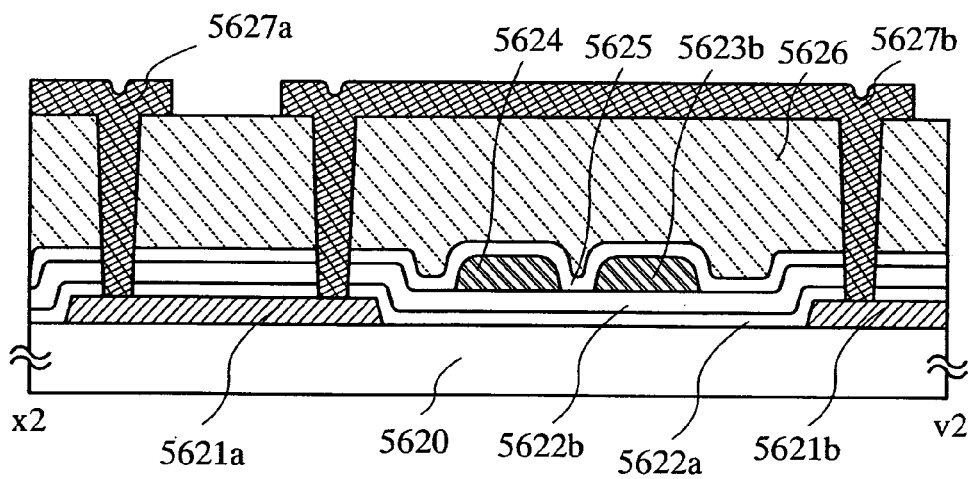

FIG. 63A is a top view of a liquid crystal display device while FIG. 63B is a cross-sectional view thereof along a line x2-v2. In FIGS. 63A and 63B, in a pixel region of the liquid crystal display device, gate electrode layers 5621a and 5621b, gate insulating layers 5622a and 5622b, a capacitor wiring layer 5624, source/drain electrode layers 5623a and 5623b, gate wiring layers 5627a and 5627b, an insulating film 5625 as a passivation film, and an insulating layer 5626 are formed over a substrate 5620.

As shown in FIG. 63B, the source/drain electrode layer 5623b and the gate wiring layer 5627b are stacked with the insulating layer 5626 as an interlayer insulating layer interposed therebetween. The gate wiring layer 5627b is connected to the gate electrode layers 5621a and 5621b via contact holes formed in the insulating layer 5626, the insulating film 5625, and the gate insulating layers 5622a and 5622b. Accordingly, the gate wiring layer 5627b is not short-circuited to the source/drain electrode layer 5623b nor the capacitor wiring layer 5624. In addition, the liquid crystal display device shown in FIGS. 63A and 63B has a structure that the gate wiring layer and the gate electrode layer are not formed continuously but formed intermittently, and they are formed while being electrically connected via contact holes. Accordingly, in the region where the source/drain electrode layer 5623b and the capacitor wiring layer 5624 are formed, the gate electrodes layers 5621a and 5621b are electrically connected by being connected to the gate wiring layer 5627b formed in the insulating layer 5626 in the contact holes.

Figure 64A:
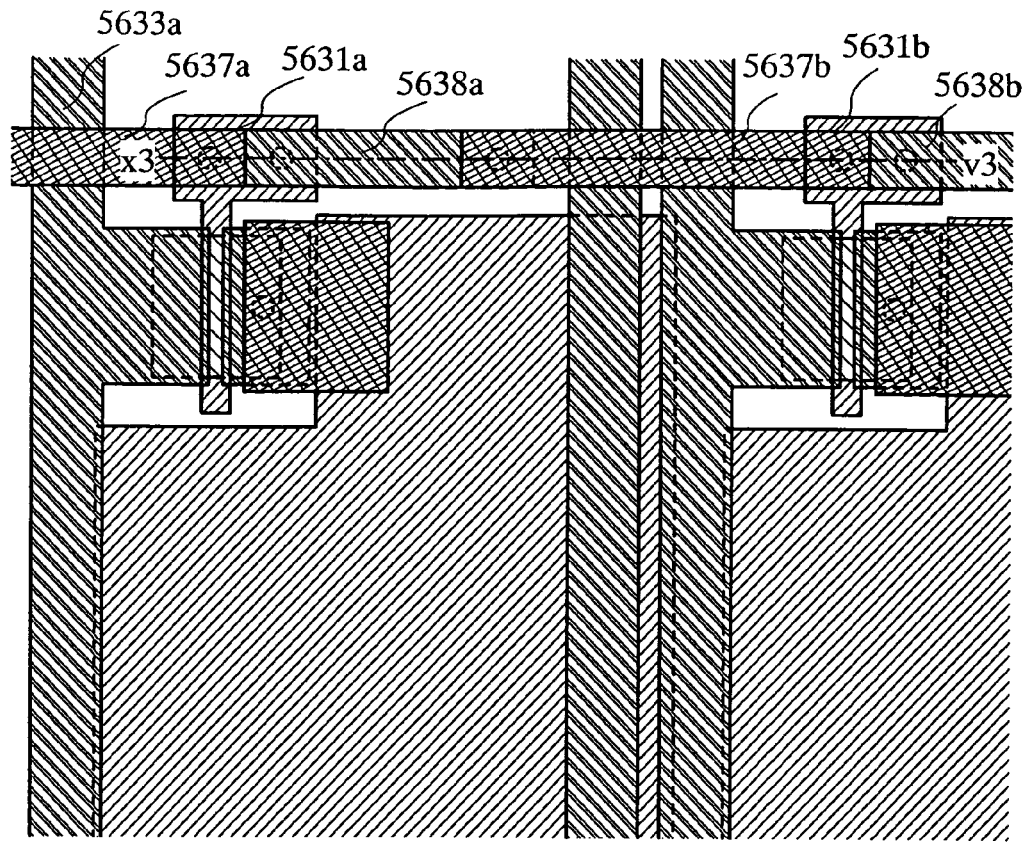
FIGS. 64A and 64B each illustrate a display device of the invention.
Figure 64B:
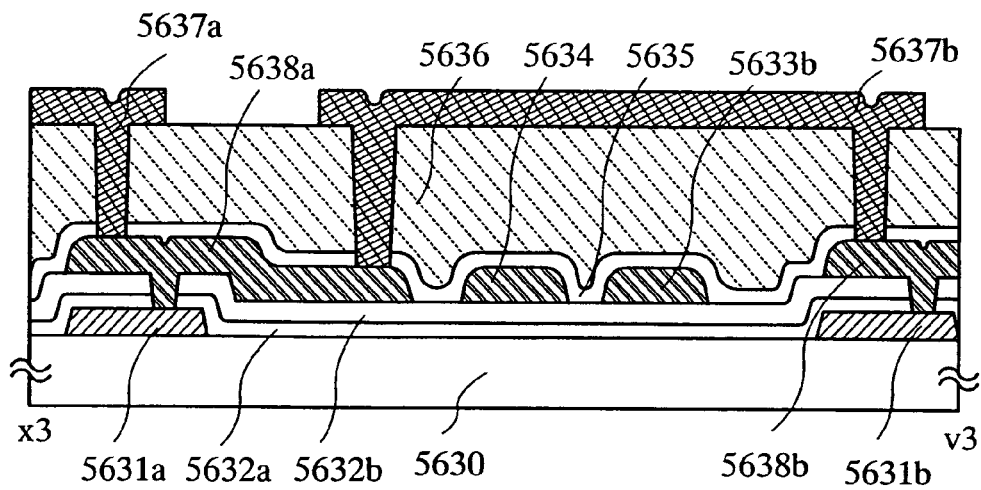

FIG. 64A is a top view of a liquid crystal display device while FIG. 64B is a cross-sectional view thereof along a line x3-v3. In FIGS. 64A and 64B, in a pixel region of the liquid crystal display device, gate electrode layers 5631a and 5631b, gate insulating layers 5632a and 5632b, a capacitor wiring layer 5634, source/drain electrode layers 5633a and 5633b, gate wiring layers 5637a and 5637b, wiring layers 5638a and 5638b, an insulating film 5636 as a passivation film, and an insulating layer 5636 are formed over a substrate 5630.

As shown in FIG. 64B, the source/drain electrode layer 5633b and the gate wiring layer 5637b are stacked with the insulating layer 5636 as an interlayer insulating layer interposed therebetween. In the liquid crystal display device shown in FIGS. 63A and 63B, the gate electrode layer 5621a is directly connected to the gate wiring layers 5627a and 5627b. However, in the liquid crystal display device shown in FIGS. 64A and 64B, the gate electrode layer 5631a is electrically connected to the gate wiring layers 5637a and 5637b via the wiring layer 5638a which is formed with the same material and steps as the source electrode layer. Accordingly, the gate electrode layer 5631a is connected to the wiring layer 5638a formed over the gate insulating layers 5632a and 5632b via a contact hole, and the wiring layer 5638a is connected to the gate wiring layers 5637a and 5637b via contact holes. Thus, the gate electrode layer 5631a is electrically connected to the gate wiring layers 5637a and 5637b. The source/drain electrode layer 5633b and the capacitor wiring layer 5634 are stacked with the gate wiring layer 5637b with the insulating layer 5636 as an interlayer insulating layer interposed therebetween; therefore, the source/drain electrode layer 5633b and the capacitor wiring layer 5634 are not short-circuited to the gate wiring layer 5637b.

FIGS. 62A to 64B illustrate the case where an insulating layer is formed as an interlayer insulating layer covering a wide range. FIGS. 65A to 67B illustrate an example in which an interlayer insulating layer which separates wiring layers is selectively formed using a droplet discharge method.

Figure 65A:
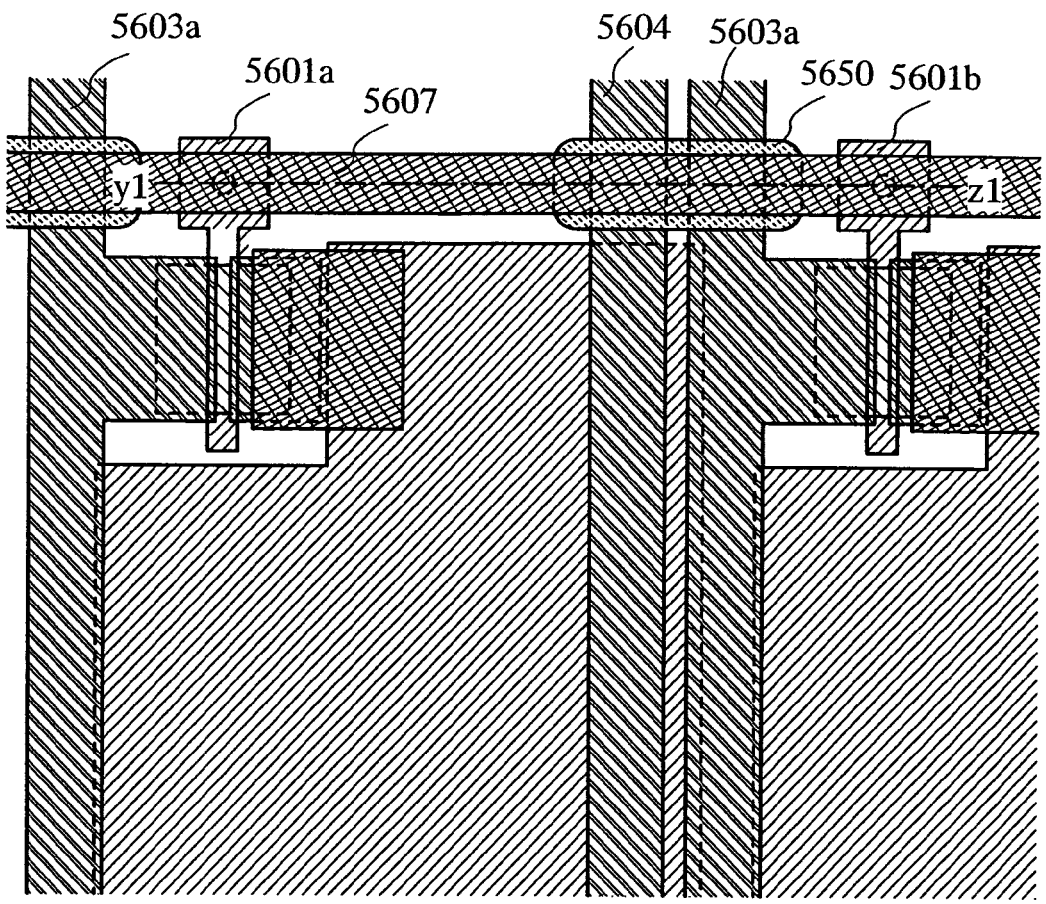
FIGS. 65A and 65B each illustrate a display device of the invention.
Figure 65B:
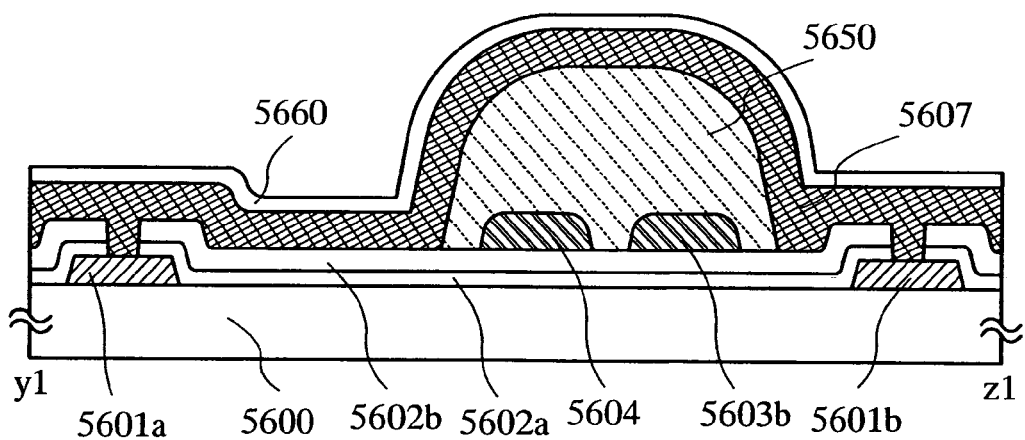
Figure 66A:
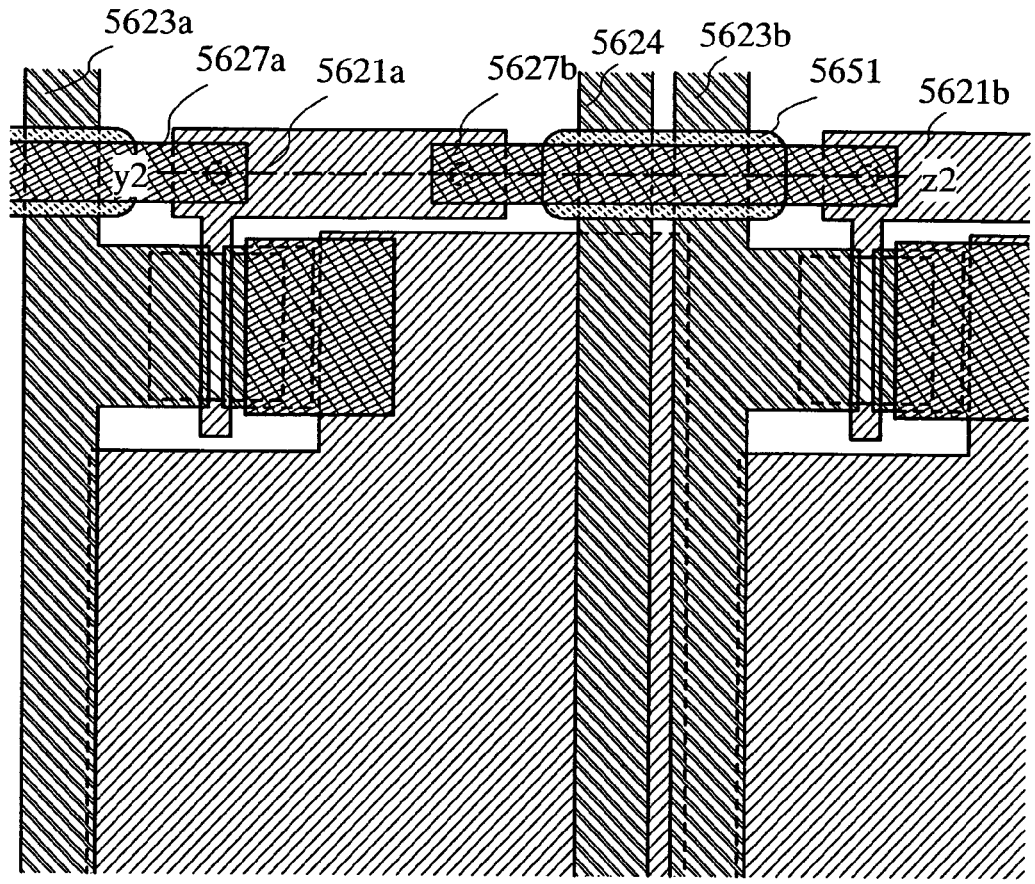
FIGS. 66A and 66B each illustrate a display device of the invention.
Figure 66B:
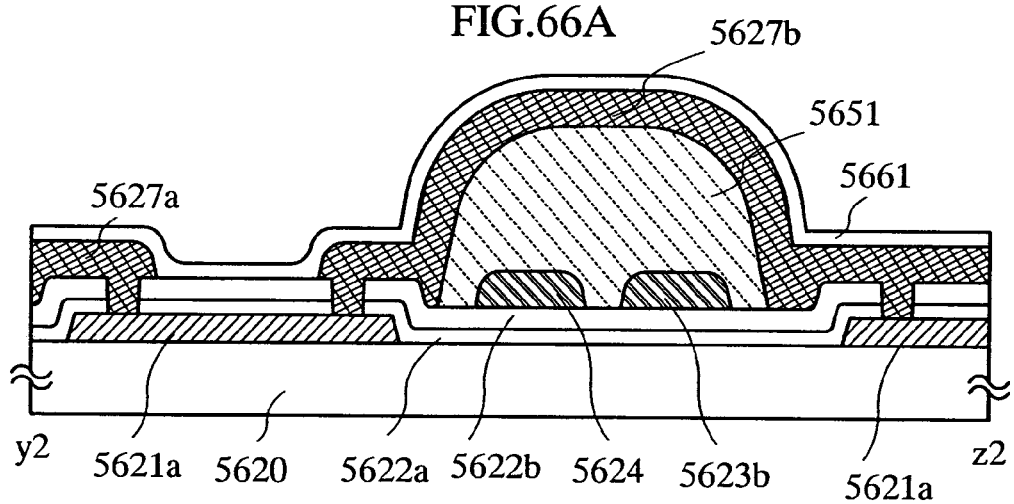
Figure 67A:
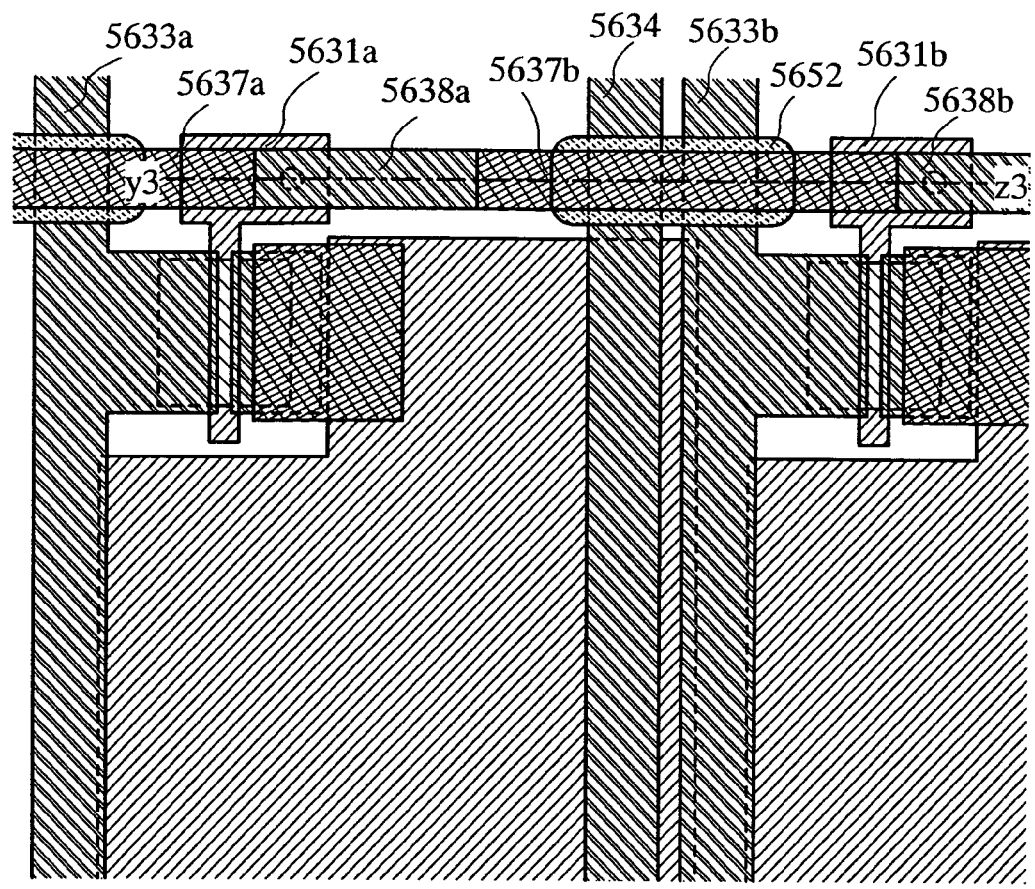
FIGS. 67A and 67B each illustrate a display device of the invention.
Figure 67B:
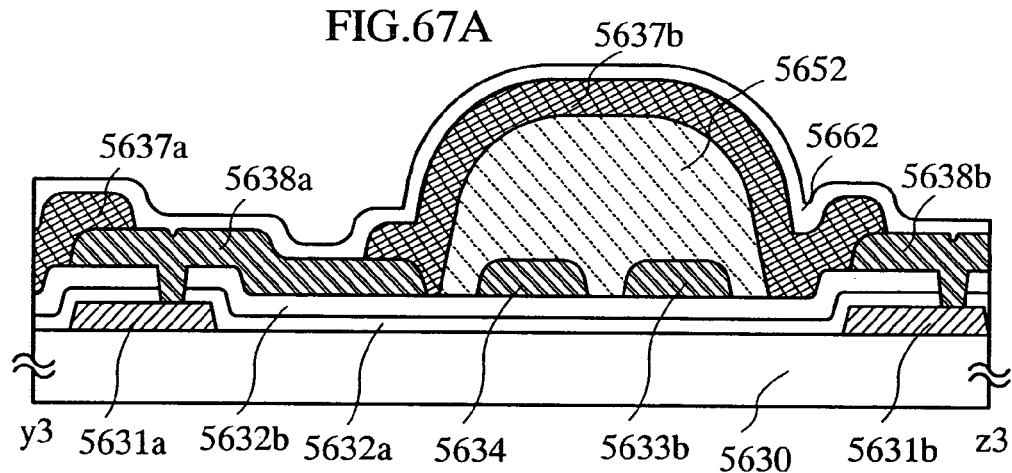

FIGS. 65A and 65B correspond to FIGS. 62A and 62B respectively, FIGS. 66A and 66B correspond to FIGS. 63A and 63B respectively, and FIGS. 67A and 67B correspond to FIGS. 64A and 64B respectively, each illustrating a liquid crystal display device having a different structure of interlayer insulating layers. FIG. 65A is a top view of a liquid crystal display device while FIG. 65B is a cross-sectional view thereof along a line y1-z1. In FIGS. 65A and 65B, the insulating layer 5650 is formed by a droplet discharge method, covering the source/drain electrode layer 5603b and the capacitor wiring layer 5604. Covering the insulating layer 5650, a gate wiring layer 5607 is formed. Over the gate wiring layer 5607, the insulating film 5660 is formed as a passivation film. The insulating film 5660 is not necessarily required; however, the provision thereof can improve the reliability. In addition, although the insulating film 5650 is formed in a single layer in this embodiment mode, the insulating layer 5650 may be formed to have a stacked-layer structure by forming an insulating film thereover or thereunder.

FIG. 66A is a top view of a liquid crystal display device while FIG. 66B is a cross-sectional view thereof along a line y2-z2. In FIGS. 66A and 66B, similarly to FIGS. 65A and 65B, the insulating layer 5651 is selectively formed by a droplet discharge method, covering the source/drain electrode layer 5623b and the capacitor wiring layer 5624. Covering the insulating layer 5651, the gate wiring layer 5627b is formed and connected to the gate electrode layer 5621a via a contact hole. Over the gate wiring layer 5627a, the insulating film 5661 is formed as a passivation film.

FIG. 67A is a top view of a liquid crystal display device while FIG. 67B is a cross-sectional view thereof along a line y3-z3. In FIGS. 67A and 67B, similarly to FIGS. 65A and 65B, the insulating layer 5652 is selectively formed by a droplet discharge method, covering the source/drain electrode layer 5633b and the capacitor wiring layer 5634. Covering the insulating layer 5652, the gate wiring layer 5637b is formed, and electrically connected to the gate wiring layer 5637a and the gate electrode layer 5631a via the wiring layer 5638a.

If an insulating layer such as the insulating layers 5650, 5651, and 5652 for preventing short circuit of wirings is selectively formed by a droplet discharge method, waste of materials can be reduced. In addition, since the wirings can be formed in direct contact with each other, the step for forming a contact hole in the insulating layer can be omitted. Accordingly, the manufacturing steps can be simplified, resulting in cost saving and higher productivity.

Figure 68A:
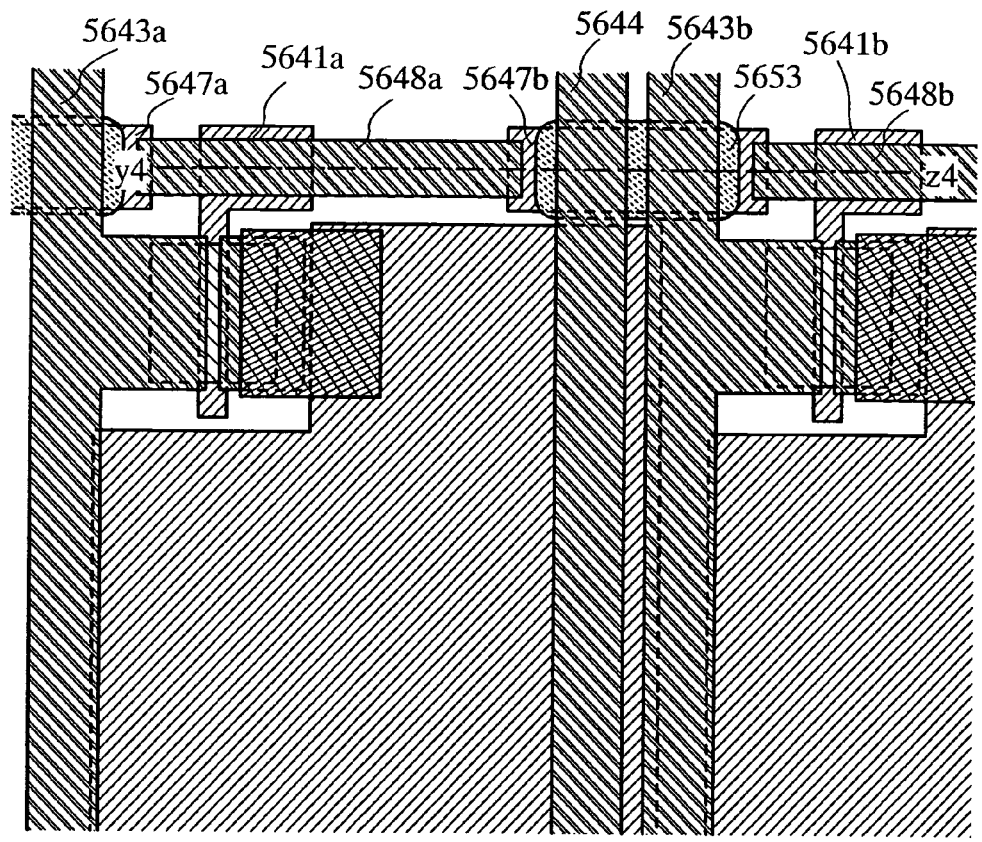
FIGS. 68A and 68B each illustrate a display device of the invention.
Figure 68B:
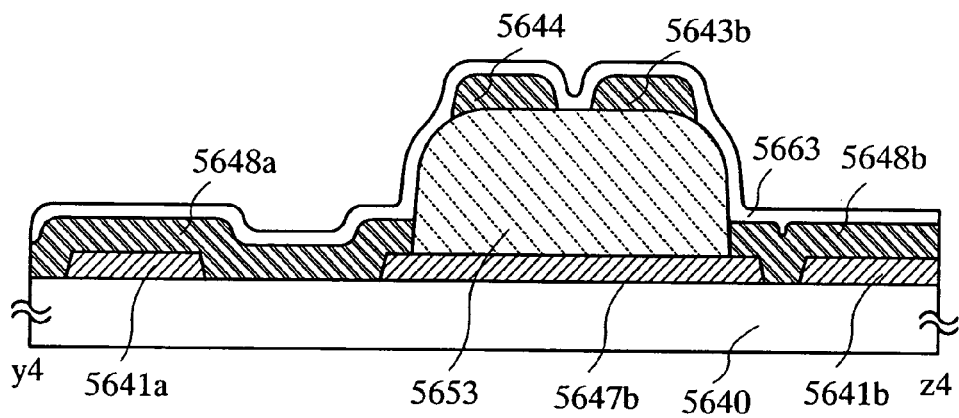

The liquid crystal display device in FIGS. 68A and 68B also illustrate an example in which an insulating layer 5653 for physically separating a source/drain electrode layer 5643b and a capacitor wiring layer 5644 from a wiring layer 5647b is selectively formed by a droplet discharge method. In the liquid crystal display devices shown in FIGS. 65A to 67B, short circuit between a source/drain electrode layer and a gate wiring layer is prevented by forming the gate wiring layer to cover an insulating layer. In the liquid crystal display device of FIGS. 68A and 68B, the wiring layers 5647a and 5647b are formed in the steps for forming the gate electrode layers 5641a and 5641b. Then, a gate insulating layer, which covers the wiring layers 5647a and 5647b, is partially etched to be removed before a source/drain electrode layer 5643a and the capacitor wiring layer 5644 are formed. On a part of the wiring layer 5647b, the insulating layer 5653 is selectively formed by a droplet discharge method, on which the source/drain electrode layer 5643a and the capacitor wiring layer 5644 are formed. Using the same steps for forming the source/drain electrode layer 5643b and the capacitor wiring layer 5644, the wiring layers 5648a and 5628b are formed to be in contact with the gate electrode layers 5641a and 5641b respectively. The wiring layers 5648a and 5648b are electrically connected by the wiring layer 5647b under the insulating layer 5653. In this manner, the gate wiring layer and the gate electrode layer can be electrically connected by the layer under the insulating layer 5653.

As described in the aforementioned steps, a highly reliable display device can be manufactured at low cost with high productivity.

The present application is based on Japanese Priority application No. 2004-227242 filed on Aug. 3, 2004 and No. 2004-234617 filed on Aug. 11, 2004 with the Japanese Patent Office, the entire contents of which are hereby incorporated by reference.

What is claimed is:

1. A display device comprising:
a gate electrode formed on an insulating surface;
a pixel electrode formed on the insulating surface;
a first gate insulating layer formed over the gate electrode;
a crystalline semiconductor layer formed over the first gate insulating layer;
a first semiconductor layer having one conductivity type formed on the crystalline semiconductor layer;
a second semiconductor layer having one conductivity type formed on the crystalline semiconductor layer;
a source electrode formed on the first semiconductor layer having one conductivity type;
a drain electrode formed on the second semiconductor layer having one conductivity type;
a second insulating layer formed over the source electrode, the drain electrode layer, and the pixel electrode;
a first opening formed in the second insulating layer to reach the source electrode or the drain electrode;
a second opening formed in the first gate insulating layer and the second insulating layer to reach the pixel electrode; and
a wiring layer formed in the first opening and the second opening to electrically connect the source electrode or the drain electrode to the pixel electrode,
wherein the gate electrode and the pixel electrode are formed with an identical material and are formed in the same plane.

2. A display device comprising:
a gate electrode formed on an insulating surface;
a first electrode formed on the insulating surface;
a first gate insulating layer formed over the gate electrode;
a crystalline semiconductor layer formed over the first gate insulating layer;
a first semiconductor layer having one conductivity type formed on the crystalline semiconductor layer;
a second semiconductor layer having one conductivity type formed on the crystalline semiconductor layer;
a source electrode formed on the first semiconductor layer having one conductivity type;
a drain electrode formed on the second semiconductor layer having one conductivity type;
a second insulating layer formed over the source electrode, the drain electrode, and the first electrode;
a first opening formed in the second insulating layer to reach the source electrode or the drain electrode;
a second opening formed in the first gate insulating layer and the second insulating layer to reach the first electrode;
a wiring layer formed in the first opening and the second opening to electrically connect the source electrode or the drain electrode to the first electrode;
a third insulating layer formed covering a part of the first electrode and the wiring layer;
an electroluminescent layer formed over the first electrode; and
a second electrode formed over the electroluminescent layer,
wherein the gate electrode and the first electrode are formed with an identical material and are formed in the same plane.

3. The display device according to claim 1, wherein the first semiconductor layer having one conductivity type and the second semiconductor layer having one conductivity type contain a metal element.

4. The display device according to claim 2, wherein the first semiconductor layer having one conductivity type and the second semiconductor layer having one conductivity type contain a metal element.

5. A display device comprising:
a gate electrode formed on an insulating surface;
a pixel electrode on the insulating surface;
a first gate insulating layer formed over the gate electrode;
a crystalline semiconductor layer provided with a source region and a drain region formed over the first gate insulating layer;
a source electrode and a drain electrode formed on the source region and the drain region respectively;
a second insulating layer formed over the source electrode, the drain electrode, and the pixel electrode;
a first opening formed in the second insulating layer to reach the source electrode or the drain electrode;
a second opening formed in the first gate insulating layer and the second insulating layer to reach the pixel electrode; and
a wiring layer formed in the first opening and the second opening to electrically connect the source electrode or the drain electrode to the pixel electrode,
wherein the gate electrode and the first electrode are formed with an identical material and are formed in the same plane.

6. A display device comprising:
a gate electrode formed on an insulating surface;
a first electrode formed on the insulating surface;
a first gate insulating layer formed over the gate electrode;
a crystalline semiconductor layer provided with a source region and a drain region formed over the first gate insulating layer;
a source electrode and a drain electrode formed on the source region and the drain region respectively;
a second insulating layer formed over the source electrode, the drain electrode, and the first electrode;
a first opening formed in the second insulating layer to reach the source electrode or the drain electrode;
a second opening formed in the first gate insulating layer and the second insulating layer to reach the pixel electrode;

a wiring layer formed in the first opening and the second opening to electrically connect the source electrode or the drain electrode to the first electrode;

a third insulating layer formed covering a part of the first electrode and the wiring layer;

an electroluminescent layer formed over the first electrode; and a second electrode formed over the electroluminescent layer, wherein the gate electrode and the first electrode are formed with an identical material and are formed in the same plane.

7. The display device according to claim 4, wherein each of the first semiconductor layer and the second semiconductor layer contains a metal element.

8. The display device according to claim 5, wherein each of the source region and the drain region contains a metal element.

9. The display device according to claim 1, wherein each of the gate electrode and the pixel electrode is formed of one or more of tungsten, molybdenum, zirconia, hafnium, bismuth, niobium, tantalum, chromium, cobalt, and nickel.

10. The display device according to claim 2, wherein each of the gate electrode and the first electrode is formed of one or more of tungsten, molybdenum, zirconia, hafnium, bismuth, niobium, tantalum, chromium, cobalt, and nickel.

11. The display device according to claim 5, wherein each of the gate electrode and the pixel electrode is formed of one or more of tungsten, molybdenum, zirconia, hafnium, bismuth, niobium, tantalum, chromium, cobalt, and nickel.

12. The display device according to claim 1, wherein each of the gate electrode and the pixel electrode is formed of indium tin oxide, indium tin oxide containing silicon oxide, zinc oxide, tin oxide, or indium zinc oxide.

13. The display device according to claim 2, wherein each of the gate electrode and the pixel electrode is formed of indium tin oxide, indium tin oxide containing silicon oxide, zinc oxide, tin oxide, or indium zinc oxide.

14. The display device according to claim 5, wherein each of the gate electrode and the pixel electrode is formed of indium tin oxide, indium tin oxide containing silicon oxide, zinc oxide, tin oxide, or indium zinc oxide.

15. The display device according to claim 6, wherein each of the gate electrode and the first electrode is formed of one or more of tungsten, molybdenum, zirconia, hafnium, bismuth, niobium, tantalum, chromium, cobalt, and nickel.

16. The display device according to claim 5, wherein each of the gate electrode and the first electrode is formed of indium tin oxide, indium tin oxide containing silicon oxide, zinc oxide, tin oxide, or indium zinc oxide.

17. The display device according to claim 6, wherein each of the gate electrode and the first electrode is formed of indium tin oxide, indium tin oxide containing silicon oxide, zinc oxide, tin oxide, or indium zinc oxide.

18. The display device according to claim 1, further comprising a third opening formed in the first gate electrode and the second insulating layer to reach the gate electrode, and a gate wiring layer formed in the third opening to be in contact with the gate electrode.

19. The display device according to claim 2, further comprising a third opening formed in the gate electrode and the second insulating layer to reach the gate electrode, and a gate wiring layer formed in the third opening to be in contact with the gate electrode.

20. The display device according to claim 5, further comprising a third opening formed in the gate electrode and the second insulating layer to reach the gate electrode, and a gate wiring layer formed in the third opening to be in contact with the gate electrode.

21. The display device according to claim 6, further comprising a third opening formed in the gate electrode and the second insulating layer to reach the gate electrode, and a gate wiring layer formed in the third opening to be in contact with the gate electrode.

22. A display device comprising a pixel region and a driver circuit region formed over a same substrate, wherein the driver circuit region includes:

a first gate electrode and a second gate electrode formed over the substrate;

a gate insulating layer formed over the first gate electrode and the second gate electrode;

a first crystalline semiconductor layer and a second crystalline semiconductor layer formed over the gate insulating layer;

an n-type semiconductor layer formed on the first crystalline semiconductor layer;

a p-type semiconductor layer formed on the second crystalline semiconductor layer;

a first source electrode layer and a first drain electrode formed in contact with the n-type semiconductor layer; and a second source electrode and a second drain electrode formed in contact with the p-type semiconductor layer; and wherein the pixel region includes:

a pixel electrode formed over the substrate, a part of the pixel electrode being covered with a gate insulating layer, wherein the first gate electrode, the second gate electrode and the pixel electrode are formed with an identical material and are formed in the same plane.

23. A display device comprising a pixel region and a driver circuit region formed over the same substrate, wherein the driver circuit region includes:

a first gate electrode and a second gate electrode formed on the substrate;

a gate insulating layer formed over the first gate electrode and the second gate electrode;

a first crystalline semiconductor layer and a second crystalline semiconductor layer formed over the gate insulating layer;

an n-type semiconductor layer formed on the first crystalline semiconductor layer;

a p-type semiconductor layer formed on the second crystalline semiconductor layer;

a first source electrode and a first drain electrode formed in contact with the n-type semiconductor layer; and a second source electrode and a second drain electrode formed in contact with the p-type semiconductor layer; and wherein the pixel region includes:

a first electrode formed on the substrate;

an electroluminescent layer formed on the first electrode; and a second electrode formed over the electroluminescent layer, a part of the first electrode being covered with the gate insulating layer, wherein the first gate electrode, the second gate electrode and the first electrode are formed with an identical material and are formed in the same plane.

24. A television set comprising a display screen constructed of the display device according to claim 1.

25. A television set comprising a display screen constructed of the display device according to claim 2.

26. A television set comprising a display screen constructed of the display device according to claim 5.

27. A television set comprising a display screen constructed of the display device according to claim 6.

28. A television set comprising a display screen constructed of the display device according to claim 22.

29. A television set comprising a display screen constructed of the display device according to claim 23.

* * * * *